US012320611B2

(12) United States Patent
Masarik et al.

(10) Patent No.: US 12,320,611 B2
(45) Date of Patent: Jun. 3, 2025

(54) FIREARM AMMUNITION AVAILABILITY DETECTION SYSTEM

(71) Applicant: Maztech Industries, LLC, Irvine, CA (US)

(72) Inventors: David Michael Masarik, Newport Beach, CA (US); Michael Raymond Masarik, Missoula, MT (US); Matthew James Masarik, Newport Beach, CA (US)

(73) Assignee: Maztech Industries, LLC, Irvine, CA (US)

( * ) Notice: Subject to any disclaimer, the term of this patent is extended or adjusted under 35 U.S.C. 154(b) by 0 days.

(21) Appl. No.: 18/657,555

(22) Filed: May 7, 2024

(65) Prior Publication Data

US 2024/0288239 A1    Aug. 29, 2024

Related U.S. Application Data

(63) Continuation of application No. PCT/US2022/079576, filed on Nov. 9, 2022.
(Continued)

(51) Int. Cl.
*F41A 9/62* (2006.01)

(52) U.S. Cl.
CPC ..................... *F41A 9/62* (2013.01)

(58) Field of Classification Search
CPC .......................................... F41A 9/62
See application file for complete search history.

(56) References Cited

U.S. PATENT DOCUMENTS

| 2,303,479 A | 4/1941 | Lesnick |
| 5,005,307 A | 4/1991 | Horne et al. |

(Continued)

FOREIGN PATENT DOCUMENTS

| CN | 101126615 | 2/2008 |
| CN | 102393704 | 3/2012 |

(Continued)

OTHER PUBLICATIONS

Aliens Ammo Counter! from Blasterparts—AKA The most Awesome accessory EVER!, GriffinMods, https://www.youtube.com/watch?v=N7U3xAo6obE, YouTube, published Nov. 23, 2013, 2 pages.
(Continued)

*Primary Examiner* — Gabriel J. Klein
(74) *Attorney, Agent, or Firm* — Knobbe, Martens, Olson & Bear, LLP

(57) ABSTRACT

A linear encoder may be used to accurately determine a number of cartridges within a magazine. Further, using a set of magnetic sensors within a buffer tube of a firearm, it is possible to determine whether a cartridge is loaded within a chamber of the weapon and/or whether the firearm is jammed. The determination of cartridges within the magazine in conjunction with the determination of whether a cartridge is in a chamber of a firearm can give a user an accurate ammunition count. Further, the use of the linear encoder makes it possible to accurately determine the cartridge count when different cartridges are loaded into the magazine or when the magazine degrades in quality over time. Moreover, the ability for magazines to communicate with a firearm enables a user to determine a total available ammunition to the user in a single display without individually checking each magazine.

11 Claims, 60 Drawing Sheets

Related U.S. Application Data

(60) Provisional application No. 63/278,961, filed on Nov. 12, 2021.

(56) References Cited

U.S. PATENT DOCUMENTS

| | | | |
|---|---|---|---|
| 5,052,138 A | 10/1991 | Crain | |
| 5,142,805 A | 9/1992 | Home et al. | |
| 5,303,495 A | 4/1994 | Harthcock | |
| 5,425,299 A | 6/1995 | Teetzel | |
| 5,566,486 A | 10/1996 | Brinkley | |
| 5,642,581 A * | 7/1997 | Herold | F41A 9/62 |
| | | | 42/1.02 |
| 5,735,070 A | 4/1998 | Vasquez et al. | |
| 5,799,432 A | 9/1998 | Wright, Sr. et al. | |
| 5,826,360 A * | 10/1998 | Herold | F41A 9/62 |
| | | | 42/1.02 |
| 5,918,304 A | 6/1999 | Gartz | |
| 6,062,208 A | 5/2000 | Seefeldt et al. | |
| 6,094,850 A | 8/2000 | Villani | |
| 6,321,478 B1 | 11/2001 | Klebes | |
| 6,360,468 B1 | 3/2002 | Constant et al. | |
| 6,397,508 B1 | 6/2002 | Constant et al. | |
| 6,421,944 B1 | 7/2002 | Klebes et al. | |
| 6,493,977 B1 | 12/2002 | Liebenberg et al. | |
| 6,643,968 B2 | 11/2003 | Glock | |
| 6,785,996 B2 | 9/2004 | Danner et al. | |
| 6,802,147 B2 | 10/2004 | Haefeli et al. | |
| 6,898,890 B2 | 5/2005 | Gaber | |
| RE38,794 E | 9/2005 | Danner | |
| 6,941,693 B2 | 9/2005 | Rice et al. | |
| 7,143,644 B2 | 12/2006 | Johnson et al. | |
| 7,158,167 B1 | 1/2007 | Yerazunis et al. | |
| 7,234,260 B2 | 6/2007 | Acarreta | |
| 7,356,956 B2 | 4/2008 | Schinazi et al. | |
| 7,509,766 B2 | 3/2009 | Vasquez | |
| 7,661,217 B2 | 2/2010 | Pikielny | |
| 7,669,356 B2 | 3/2010 | Joannes et al. | |
| 7,716,863 B1 | 5/2010 | Johnson et al. | |
| 7,730,654 B2 | 6/2010 | Kim | |
| 7,802,391 B2 | 9/2010 | Quinn et al. | |
| 7,810,273 B2 | 10/2010 | Koch et al. | |
| 7,926,219 B2 | 4/2011 | Reimer | |
| 7,927,102 B2 | 4/2011 | Jones et al. | |
| 8,009,060 B2 | 8/2011 | Kramer et al. | |
| 8,019,278 B2 | 9/2011 | Baraz et al. | |
| 8,046,946 B2 | 11/2011 | Packer et al. | |
| 8,166,698 B2 | 5/2012 | Raviv et al. | |
| 8,176,667 B2 | 5/2012 | Kamal et al. | |
| 8,186,086 B2 | 5/2012 | Gur-Ari et al. | |
| 8,191,297 B2 | 6/2012 | Gwillim, Jr. | |
| 8,196,331 B2 | 6/2012 | Chen et al. | |
| 8,215,044 B2 | 7/2012 | Arbouw | |
| 8,223,019 B2 | 7/2012 | August et al. | |
| 8,339,257 B2 | 12/2012 | Cazanas et al. | |
| 8,387,295 B2 | 3/2013 | Glock | |
| 8,418,388 B2 | 4/2013 | Ferrarini et al. | |
| 8,459,552 B2 | 6/2013 | Arbouw | |
| 8,464,451 B2 | 6/2013 | McRae | |
| 8,464,452 B2 | 6/2013 | Harper | |
| 8,469,824 B1 | 6/2013 | Farley | |
| 8,485,085 B2 | 7/2013 | Goree et al. | |
| 8,571,815 B2 | 10/2013 | Bar-David et al. | |
| 8,601,733 B2 | 12/2013 | Gabay et al. | |
| 8,656,820 B1 | 2/2014 | Kertis, Jr. et al. | |
| 8,720,092 B2 | 5/2014 | Beretta et al. | |
| 8,733,006 B2 | 5/2014 | Williams et al. | |
| 8,733,007 B2 | 5/2014 | Hatfield | |
| 8,738,330 B1 | 5/2014 | DiMartino et al. | |
| 8,770,978 B2 | 7/2014 | Botten | |
| 8,826,575 B2 | 9/2014 | Ufer et al. | |
| 8,827,706 B2 | 9/2014 | Hogan, Jr. | |
| 8,850,730 B2 | 10/2014 | Clark et al. | |
| 8,875,433 B2 | 11/2014 | Beckman | |
| 8,936,193 B2 | 1/2015 | McHale et al. | |
| 8,973,294 B2 | 3/2015 | Acarreta | |
| 9,068,785 B2 | 6/2015 | Ball | |
| 9,212,857 B2 | 12/2015 | Loreman | |
| 9,273,918 B2 | 3/2016 | Amit et al. | |
| 9,303,937 B2 | 4/2016 | Acarreta | |
| 9,316,461 B1 | 4/2016 | Gwillim, Jr. | |
| 9,354,011 B2 | 5/2016 | Cooke et al. | |
| 9,435,594 B2 | 9/2016 | Davison et al. | |
| 9,435,598 B2 | 9/2016 | Seckman | |
| 9,557,130 B2 | 1/2017 | ShneOrson et al. | |
| 9,612,068 B2 | 4/2017 | Burden | |
| 9,677,852 B2 | 6/2017 | Tikochinski et al. | |
| 9,759,505 B2 | 9/2017 | Al Abdouli et al. | |
| 9,784,511 B2 | 10/2017 | Faughn | |
| 9,797,667 B2 | 10/2017 | Demierre et al. | |
| 9,811,079 B2 | 11/2017 | Theiss | |
| 9,835,395 B2 | 12/2017 | Ruby et al. | |
| 10,197,349 B2 | 2/2019 | Acarreta et al. | |
| 10,254,066 B1 | 4/2019 | Petersen et al. | |
| 10,323,894 B2 | 6/2019 | Imbriano et al. | |
| 10,359,246 B2 | 7/2019 | Faughn | |
| 10,557,676 B2 | 2/2020 | Masarik et al. | |
| 10,584,929 B2 | 3/2020 | Masarik et al. | |
| 10,619,958 B2 | 4/2020 | Masarik et al. | |
| 10,845,142 B2 | 11/2020 | Flood | |
| 10,900,726 B2 | 1/2021 | Masarik et al. | |
| 10,900,727 B2 * | 1/2021 | Masarik | F41A 9/70 |
| 10,996,012 B2 | 5/2021 | Deng et al. | |
| 11,015,890 B2 * | 5/2021 | Czarnecki | F41A 19/01 |
| 11,069,227 B1 | 7/2021 | Hubatka | |
| 11,466,947 B2 | 10/2022 | Masarik et al. | |
| 11,719,497 B2 * | 8/2023 | Czarnecki | F41A 9/62 |
| | | | 42/1.02 |
| 11,859,935 B2 | 1/2024 | Masarik et al. | |
| 11,971,238 B2 * | 4/2024 | Czarnecki | G05B 15/02 |
| 2003/0195046 A1 | 10/2003 | Bartsch | |
| 2005/0000139 A1 | 1/2005 | Mauch | |
| 2006/0042142 A1 | 3/2006 | Sinha | |
| 2007/0000483 A1 | 1/2007 | Tsurumoto | |
| 2007/0089598 A1 | 4/2007 | Courty | |
| 2007/0264616 A1 | 11/2007 | Namgung | |
| 2008/0028660 A1 | 2/2008 | Beretta | |
| 2008/0039962 A1 | 2/2008 | McRae | |
| 2008/0127538 A1 | 6/2008 | Barrett et al. | |
| 2008/0131848 A1 | 6/2008 | Wilson et al. | |
| 2008/0276517 A1 | 11/2008 | Delgado Acarreta | |
| 2009/0084015 A1 | 4/2009 | Compton et al. | |
| 2010/0031808 A1 | 2/2010 | Whitlow et al. | |
| 2010/0281725 A1 | 11/2010 | Arbouw | |
| 2010/0299985 A1 | 12/2010 | Acarreta | |
| 2011/0078936 A1 | 4/2011 | Gates | |
| 2011/0252682 A1 * | 10/2011 | Delgado Acarreta | F41A 9/62 |
| | | | 42/1.02 |
| 2011/0252684 A1 | 10/2011 | Ufer et al. | |
| 2012/0060814 A1 | 3/2012 | Macy | |
| 2012/0131828 A1 | 5/2012 | August et al. | |
| 2012/0151814 A1 | 6/2012 | Dietel | |
| 2012/0152103 A1 | 6/2012 | Testa et al. | |
| 2012/0167423 A1 | 7/2012 | Kindt et al. | |
| 2013/0000473 A1 | 1/2013 | Schvartz | |
| 2013/0108991 A1 | 5/2013 | Walls | |
| 2013/0180143 A1 | 7/2013 | Acarreta | |
| 2013/0219762 A1 | 8/2013 | Acarreta | |
| 2014/0158763 A1 | 6/2014 | McHale et al. | |
| 2014/0311003 A1 | 10/2014 | Loreman | |
| 2015/0075047 A1 | 3/2015 | August et al. | |
| 2015/0267981 A1 * | 9/2015 | Faughn | F41A 9/62 |
| | | | 42/1.02 |
| 2015/0369553 A1 | 12/2015 | Stussak | |
| 2015/0377572 A1 | 12/2015 | Darragjati | |
| 2016/0069629 A1 | 3/2016 | Seckman | |
| 2016/0169608 A1 | 6/2016 | Schulz et al. | |
| 2016/0195351 A1 | 7/2016 | Burden | |
| 2016/0305740 A1 | 10/2016 | O'Donnell et al. | |
| 2016/0334177 A1 | 11/2016 | Green | |
| 2016/0349012 A1 | 12/2016 | Compton | |
| 2017/0051993 A1 * | 2/2017 | Imbriano | F41A 19/01 |
| 2017/0176139 A1 | 6/2017 | Zhang et al. | |
| 2017/0227310 A1 | 8/2017 | Gorza et al. | |

(56) References Cited

U.S. PATENT DOCUMENTS

| | | | |
|---|---|---|---|
| 2017/0336160 A1 | 11/2017 | Walther | |
| 2018/0128563 A1* | 5/2018 | Righi | F41A 9/62 |
| 2018/0196628 A1 | 7/2018 | Samo | |
| 2018/0299217 A1* | 10/2018 | Hedeen | F41C 23/10 |
| 2019/0170463 A1 | 6/2019 | Walther et al. | |
| 2019/0277590 A1* | 9/2019 | Masarik | F41A 9/62 |
| 2020/0173744 A1 | 6/2020 | Gueron | |
| 2020/0232762 A1 | 7/2020 | Hamilton et al. | |
| 2020/0355450 A1* | 11/2020 | Masarik | G01D 5/12 |
| 2021/0010769 A1* | 1/2021 | Czarnecki | F41A 19/01 |
| 2021/0215446 A1* | 7/2021 | Czarnecki | G05B 15/02 |
| 2021/0254916 A1* | 8/2021 | Czarnecki | F41A 19/01 |
| 2021/0341237 A1 | 11/2021 | Masarik et al. | |
| 2024/0288239 A1* | 8/2024 | Masarik | F41A 9/65 |

FOREIGN PATENT DOCUMENTS

| | | | |
|---|---|---|---|
| CN | 109579610 | 4/2019 | |
| CN | 109737800 | 5/2019 | |
| CN | 212300083 | 1/2021 | |
| DE | 3911804 C2 | 7/1993 | |
| DE | 4022038 C2 | 3/1999 | |
| DE | 10 2010 054245 | 6/2012 | |
| GB | 2182424 | 5/1987 | |
| GB | 2397128 | 7/2004 | |
| JP | H1089894 | 4/1998 | |
| JP | 2002277193 | 9/2002 | |
| JP | 3947167 | 7/2007 | |
| JP | 2007-240039 | 9/2007 | |
| JP | 2008064406 | 3/2008 | |
| JP | 2008175526 | 7/2008 | |
| JP | 04298615 | 7/2009 | |
| JP | 04395357 | 1/2010 | |
| JP | 04594334 | 12/2010 | |
| JP | 04923749 | 4/2012 | |
| JP | 04923750 | 4/2012 | |
| JP | 04996963 | 8/2012 | |
| JP | 2012215373 | 11/2012 | |
| JP | 2013130373 | 7/2013 | |
| KR | 100914270 | 8/2009 | |
| KR | 20110035058 | 4/2011 | |
| KR | 2014046853 | 4/2014 | |
| KR | 10-1825877 | 3/2018 | |
| RU | 2360208 C2 | 6/2009 | |
| TW | 202336405 A * | 9/2023 | F41A 9/62 |
| WO | WO 2009/151713 | 12/2009 | |
| WO | WO 2013/104807 | 7/2013 | |
| WO | WO 2014/184875 | 11/2014 | |
| WO | WO 2016/187713 | 1/2016 | |
| WO | WO 2016/181234 | 11/2016 | |
| WO | WO 2017/031426 | 2/2017 | |
| WO | WO 2018/172738 | 9/2018 | |
| WO | WO 2019/173791 | 9/2019 | |
| WO | WO 2020/141342 | 7/2020 | |
| WO | WO 2021/001720 | 1/2021 | |
| WO | WO 2023/086840 | 5/2023 | |

OTHER PUBLICATIONS

"Ammocontrol™ Digital Counter for 1911", Quick Start guide, 2013 Rade Tecnologias S.L., 2 pages.

"Ammocontrol™ Digital Counter", Rade Tecnologias S.L.—M1911, http://www.radetec.com/index.php?id=40, Dec. 2, 2014, 1 page.

Bullet Counter 2.0, https://www.youtube.com/watch?v=cnx9yT5py8E, YouTube, published Mar. 24, 2011, 1 page.

International Search Report and Written Opinion received in PCT Application No. PCT/US2022/079576 as mailed Mar. 2, 2023 in 14 pages.

Full-Auto Nerf Rayven, https://www.youtube.com/watch?v=44IWL_NJOQ8, YouTube, published Apr. 22, 2013, 4 pages.

Lage Manufacturing MAX-41A Real Aliens Pulse Rifle, Lage Manufacturing, LLC. https://www.youtube.com/watch?v=XT90YzPlhVE, YouTube, published Jan. 26, 2014, 4 pages.

MagCount Ammunition Counting Technology Demonstration, https://www.youtube.com/watch?v=6YWYs9bvt6Q, YouTube, published Oct. 13, 2010, 3 pages.

International Search Report and Written Opinion received in PCT Application No. PCT/US2019/021483 as mailed Jun. 11, 2019 in 13 pages.

* cited by examiner

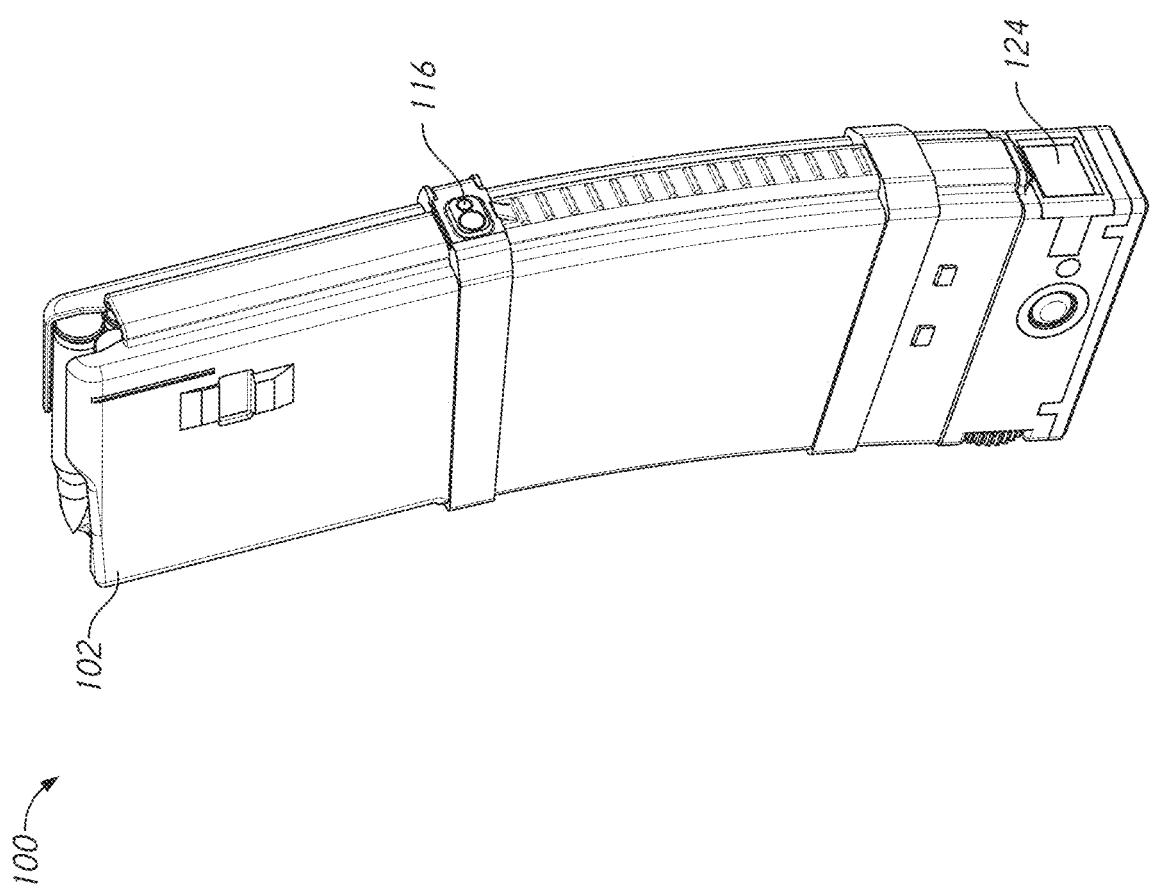

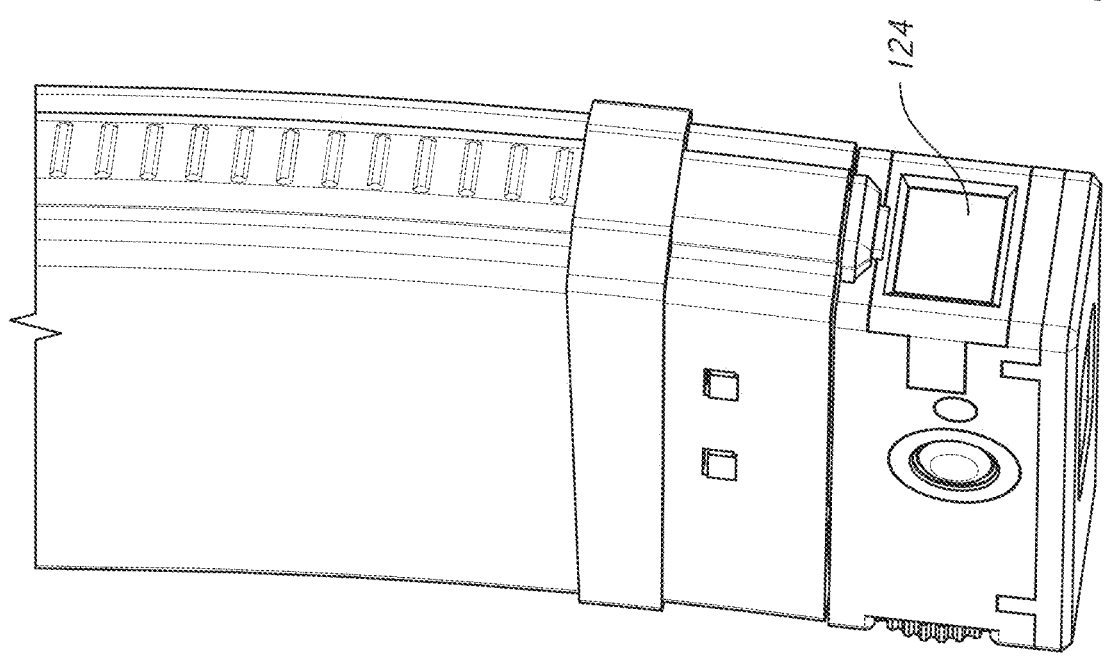

FIREARM AMMUNITION AVAILABILITY DETECTION SYSTEM

INCORPORATION BY REFERENCE

This application is a continuation of International Application PCT/US2022/079576 filed on Nov. 9, 2022, which is hereby incorporated by reference in its entirety and which claims priority to U.S. Provisional Patent Application No. 63/278,961, filed Nov. 12, 2021, which is hereby incorporated by reference in its entirety for all purposes and makes a part of the present application. Further, this application incorporates herein by reference in its entirety for all purposes and makes a part of the present application each of the following applications: U.S. Provisional Patent Application No. 62/640,451, filed Mar. 8, 2018, and titled "FIREARM AMMUNITION AVAILABILITY DETECTION SYSTEM;" U.S. application Ser. No. 16/297,288 (now U.S. Pat. No. 10,557,676), filed Mar. 8, 2019, and titled "FIREARM AMMUNITION AVAILABILITY DETECTION SYSTEM;" U.S. Provisional Patent Application No. 62/978,718, filed Feb. 19, 2020, and titled "WEAPON SYSTEM WITH MULTI-FUNCTION SINGLE-VIEW SCOPE;" U.S. application Ser. No. 17/178,990, filed Feb. 18, 2021, and titled "WEAPON SYSTEM WITH MULTI-FUNCTION SINGLE-VIEW SCOPE;" U.S. Provisional Patent Application No. 63/234,671, filed Aug. 18, 2021, and titled "WEAPON SIGHT SYSTEMS;" U.S. Provisional Patent Application No. 63/299,788, filed Jan. 14, 2022, and titled "WEAPON SIGHT SYSTEMS;" U.S. application Ser. No. 17/178,990 (now U.S. Pat. No. 11,473,874), filed Feb. 18, 2021, and titled "WEAPON SYSTEM WITH MULTI-FUNCTION SINGLE-VIEW SCOPE;" and International Application No. PCT/US2022/040664, filed on Aug. 17, 2022, and titled "WEAPON SIGHT SYSTEMS." Embodiments disclosed in any of the above incorporated applications may be combined with one or more of the embodiments disclosed herein. For example, one or more of the scopes described in the International Application No. PCT/US2022/040664 may be used to display ammunition count information of one or more magazines of a firearm as disclosed herein. Any and all applications, if any, for which a foreign or domestic priority claim is identified in the Application Data Sheet of the present application are hereby incorporated by reference in their entireties under 37 CFR 1.57.

TECHNICAL FIELD

This disclosure relates to tracking the number of rounds available for a firearm. More specifically, this disclosure relates to determining the number of bullets, shells, or cartridges within a magazine, weapon, and or other container for storing ammunition for a firearm.

BACKGROUND

Many weapons and firearms use magazines to provide access to multiple cartridges without the need to reload the weapons or firearms. Different magazines can hold different numbers of cartridges. Further, some weapons can support different size magazines.

It is often beneficial for a user to know how much ammunition is available to the user. For example, when hunting or in a firefight, it is important for the user to know whether the user has sufficient ammunition. This can often be determined by the user when loading a magazine as the user can count how many cartridges are placed in the magazine. However, when the user is in a situation where he or she is firing a weapon, the user may easily lose track of the amount of ammunition fired and/or remaining.

SUMMARY

The systems, methods and devices of this disclosure each have several innovative aspects, no single one of which is solely responsible for all of the desirable attributes disclosed herein. Details of one or more implementations of the subject matter described in this specification are set forth in the accompanying drawings and the description below.

Certain aspects of the present disclosure relate to a magazine configured to hold ammunition. The magazine can include: a housing comprising an ammunition chamber, wherein the ammunition chamber is configured to store one or more cartridges of a first ammunition type up to a first maximum number of cartridges of the first ammunition type; a linear encoder comprising a magnet and a plurality of magnetic sensors within the housing and positioned along a wall of the housing, wherein the plurality of magnetic sensors exceeds the first maximum number of cartridges in number, and wherein the magnet is configured to generate a magnetic field that is at least partially within the ammunition chamber; and a hardware processor configured to determine a count of an amount of cartridges of the first ammunition type within the magazine based at least in part on a signal generated by the linear encoder.

The magazine of the preceding paragraph can include any combination or sub-combination of the following features: where the signal generated by the linear encoder is generated by a magnetic sensor from the plurality of magnetic sensors in response to the magnetic field; where the signal generated by the linear encoder is generated based at least in part on a combination of a first signal generated by a first magnetic sensor and a second signal generated by a second magnetic sensor from the plurality of magnetic sensors; where the signal generated by the linear encoder is generated based at least in part on an interpolation of a first signal generated by a first magnetic sensor and a second signal generated by a second magnetic sensor from the plurality of magnetic sensors; where the plurality of magnetic sensors are positioned in a substantially vertical axis between a feed port of the magazine and a bottom cap of the magazine; where the magnet is disposed on a follower of the magazine such that the magnet moves towards a feed port of the magazine as cartridges are expelled from the magazine and moves towards a bottom cap of the magazine as cartridges are inserted into the magazine; where the plurality of magnetic sensors comprise Hall effect sensors or anisotropic magnetoresistive sensors; where the hardware processor is further configured to determine the count by at least: receiving the signal generated by the linear encoder; accessing an ammunition count table; and determining the count from the ammunition count table based at least in part on the signal; where the ammunition count table is selected from a plurality of ammunition count tables based at least in part on a determination of whether the magazine is inserted into a firearm; where the ammunition count table is selected from a plurality of ammunition count tables based at least in part on one or more of a type of cartridge loaded into the magazine, or a manufacturer of a cartridge loaded into the magazine; where the ammunition count table comprises a lookup table, and wherein the count is determined from the lookup table using a value generated from the signal as an index to the lookup table; and where the ammunition count table is a magazine-specific table that is calibrated for the magazine.

Additional aspects of the present disclosure relate to a magazine configured to hold ammunition. The magazine can include: a housing comprising an ammunition chamber, wherein the ammunition chamber is capable of holding between zero and 'N' cartridges of a first ammunition type, wherein 'N' corresponds to a maximum capacity of the magazine for holding cartridges of the first ammunition type; a hardware processor; and a linear encoder positioned within the housing and configured to provide an electrical signal to the hardware processor, the electrical signal corresponding to a location of a follower within the ammunition chamber; wherein the hardware processor is configured to: determine a location of the follower within the ammunition chamber based at least in part on the electrical signal; access a calibration table of the magazine; and determine a count of cartridges of the first ammunition type within the magazine based at least in part on the location of the follower and the calibration table.

The magazine of the preceding paragraph can include any combination or sub-combination of the following features: where the ammunition chamber is capable of holding cartridges of a second ammunition type; where a maximum capacity of the magazine for holding cartridges of the second ammunition type differs from the maximum capacity of the magazine for holding cartridges of the first ammunition type; where a size of a cartridge of the first ammunition type differs from a size of a cartridge of the second ammunition type; where the hardware processor is further configured to determine the count of cartridges by accessing an entry in the calibration table corresponding to the location of the follower; where the calibration table is selected from a plurality of calibration tables based at least in part on a determination that the cartridges within the ammunition table are of the first ammunition type; where the magazine further comprises a non-volatile memory configured to store the calibration table; and where the linear encoder is one of: an optical encoder, a magnetic encoder, a capacitive encoder, an inductive encoder, a magneto resistive encoder, or a resistive encoder.

Certain aspects of the present disclosure relate to a firearm or weapon capable of determining a quantity of ammunition registered to the firearm or weapon. The firearm can include a hardware processor configured to: determine an identity of one or more magazines registered to the firearm; communicate, using a transceiver, with each of the identified one or more magazines to obtain an ammunition count for each magazine of the one or more magazines; and aggregate the ammunition count for each magazine of the one or more magazines to obtain a total ammunition count registered to the firearm.

The firearm of the preceding paragraph can include any combination or sub-combination of the following features: where the hardware processor determines the identity of the one or more magazines by accessing a storage device of the firearm to obtain the identity of the one or more magazines; where the identity of each magazine from the one or more magazines comprises a combination of a firearm identifier of the firearm and a magazine identifier of the magazine, and wherein each magazine from the one or more magazines is associated with a different magazine identifier; where the transceiver is configured to use ultra-wide band communication to communicate with each of the identified one or more magazines; where the hardware processor is further configured to communicate with an inserted magazine that is inserted into the firearm to obtain an inserted magazine ammunition count, wherein aggregating the ammunition count for each magazine of the one or more magazines includes adding the inserted magazine ammunition count to the total ammunition count; where the hardware processor communicates with the inserted magazine using an optical transceiver; where the hardware processor communicates with the inserted magazine using inductive, electromagnetic, or electrical communication; where the hardware processor is further configured to: register an unregistered magazine with the firearm; communicate with the unregistered magazine to obtain an ammunition count of the unregistered magazine; and modify the total ammunition count to include the ammunition count of the unregistered magazine; where the hardware processor is further configured to register the unregistered magazine by: obtaining a magazine identifier for the unregistered magazine from the unregistered magazine; providing a firearm identifier to the unregistered magazine; combining at least the magazine identifier and the firearm identifier to obtain a network identifier for the unregistered magazine; and storing the network identifier for the unregistered magazine in a storage device of the firearm; where the hardware processor is further configured to provide the network identifier to the unregistered magazine, and wherein the firearm identifier is provided to the unregistered magazine as part of the network identifier; where the hardware processor is further configured to deregister a magazine of the one or more magazines registered to the firearm when an attempt to communicate with the magazine is unsuccessful for a threshold period of time; where the hardware processor is further configured to update the total ammunition count registered to the firearm when the magazine is deregistered; and where the transceiver is configured to use radio frequency communication to communicate with each of the identified one or more magazines.

Additional aspects of the present disclosure relate to a method of determining a quantity of ammunition registered to a firearm. The method may include obtaining, by a hardware processor, an identity of one or more magazines registered to the firearm, wherein the hardware processor accesses a storage device of the firearm to obtain the identity of the one or more magazines; communicating, using a transceiver, with each of the identified one or more magazines to obtain an ammunition count for each magazine of the one or more magazines; and aggregating, by the hardware processor, the ammunition count for each magazine of the one or more magazines to obtain a total ammunition count registered to the firearm.

The method of the preceding paragraph can include any combination or sub-combination of the following features: where the identity of each magazine from the one or more magazines comprises a combination of a firearm identifier associated with the firearm and a magazine identifier associated with the magazine, and wherein each magazine from the one or more magazines is associated with a different magazine identifier; where communicating with each of the identified one or more magazines comprises communicating using ultra-wide band communication; where the method further includes obtaining a loaded magazine ammunition count comprising a count of cartridges included in a magazine inserted into a loading port of the firearm, wherein aggregating the ammunition count for each magazine of the one or more magazines includes adding the loaded magazine ammunition count to the total ammunition count; where the method further includes determining whether a cartridge is within a chamber of the firearm, wherein aggregating the ammunition count for each magazine of the one or more magazines includes adjusting the total ammunition count based on the determination of whether the cartridge in within the chamber of the firearm; where the method further includes: registering an unregistered magazine with the firearm; communicating with the unregistered magazine to obtain an ammunition count of the unregistered magazine; and modifying the total ammunition count to include the ammunition count of the unregistered magazine; where registering the unregistered magazine comprises: receiving a magazine identifier for the unregistered magazine; providing a firearm identifier to the unregistered magazine; combining at least the magazine identifier and the firearm identifier to obtain a network identifier for the unregistered magazine; and storing the network identifier for the unregistered magazine in the storage device of the firearm; where the network identifier is used to communicate with the unregistered magazine after the unregistered magazine is registered with the firearm; where registering the unregistered magazine occurs in response to insertion of the unregistered magazine into an insertion port of the firearm; where the method further includes: attempting to communicate with a magazine from the one or more magazines registered to the firearm; failing to receive a response from the magazine within a time period subsequent to attempting to communicate with the magazine; and responsive to failing to receive the response from the magazine, removing the identity of the magazine from the storage device; where the method further includes modifying the total ammunition count to remove the ammunition count for the magazine from the total ammunition count; where the method further includes using encrypted communication when communicating with each of the identified one or more magazines; and where the method further includes outputting the total ammunition count for display to a user on a scope of the firearm.

Certain aspects of the present disclosure relate to a magazine capable of updating a calibration table used to determine a quantity of cartridges loaded in the magazine. The magazine can include: a storage device configured to store one or more calibration tables, wherein a calibration table of the one or more calibration tables maps linear encoder position values to cartridge counts corresponding to quantities of cartridges loaded in the magazine; a linear encoder configured to generate one or more signals corresponding to the one or more linear encoder position values; and a hardware processor configured to: detect a trigger to recalibrate the magazine; access the calibration table of the magazine from the storage device; determine a quantity of cartridges loaded in the magazine; receive a signal from the linear encoder corresponding to a linear encoder position value; update the calibration table based at least in part on the signal from the linear encoder; and store the updated calibration table at the storage device, wherein the updated calibration table is useable to automatically determine the quantity of cartridges loaded in the magazine without user action.

The magazine of the preceding paragraph can include any combination or sub-combination of the following features: where the hardware processor is further configured to determine the quantity of cartridges loaded in the magazine based on a user interaction with a user interface; where the hardware processor is further configured to: determine a type of cartridge loaded in the magazine; and select the calibration table from a plurality of calibration tables stored at the storage device based at least in part on the type of cartridge; where the hardware processor is further configured to: determine that the magazine is loaded into a firearm; and select the calibration table from a plurality of calibration tables stored at the storage device based at least in part on the determination that the magazine is loaded into the firearm and/or based at least in part on a determination that a bolt of the firearm is open or closed, wherein values in the calibration table differ from a second calibration table of the plurality of calibration tables, and wherein the second calibration table is selected when it is determined that the magazine is not loaded into the firearm; where the hardware processor is further configured to: determine, for each position value in a set of linear encoder position values in the calibration table, an adjustment factor based at least in part on the signal, the set of linear encoder position values comprising one or more position values; and adjust each linear encoder position value of the set of linear encoder position values based on the adjustment factor for the position value; where the adjustment factor varies for at least some of the linear encoder position values of the set of linear encoder position values; where the one or more linear encoder position values correspond to positions of a follower of the magazine with respect to a set of sensors included in the magazine; where the hardware processor is further configured to update the calibration table by: generating a new calibration table based at least in part on the signal value from the linear encoder; and replacing the calibration table with the new calibration table; where the trigger comprises one or more of a passage of time, an operation of a magazine control interface (such as, for example, activation of a button, receipt of a command via a wired or wireless user interface, detection of a control gesture or movement of the magazine, or detection of other user control actions), an occurrence of an error when determining the quantity of cartridges loaded in the magazine; a difference between a value corresponding to the signal and a position value in the calibration table exceeding a threshold, or interaction by a user with a user interface of the magazine; and where the hardware processor automatically recalibrates the magazine after a time period has elapsed, and wherein the trigger comprises the elapse of the time period.

Additional aspects of the present disclosure relate to a method of recalibrating a magazine configured to count a number of cartridges within the magazine. The method may include: detecting, by a hardware processor included in a magazine, a trigger to recalibrate the magazine; accessing, by the hardware processor, a calibration table of the magazine from a storage device of the magazine; determining, by the hardware processor, a count of a number of cartridges loaded in the magazine; receiving, by the hardware processor, a signal from a linear encoder within the magazine; modifying, by the hardware processor, the calibration table based at least in part on the signal from the linear encoder; and storing, by the hardware processor, the modified calibration table at the storage device, wherein the modified calibration table is useable to automatically determine a quantity of cartridges loaded in the magazine without user action.

The method of the preceding paragraph can include any combination or sub-combination of the following features: where the count of the number of cartridges is determined based on a user input; where the count of the number of cartridges is obtained from the storage device of the magazine, wherein the storage device stores a pre-specified count to be used during recalibration of the magazine; where the method further includes determining a type of cartridge loaded in the magazine; and selecting the calibration table based at least in part on the type of cartridge; where the method further includes determining a manufacturer of a cartridge loaded in the magazine; and selecting the calibration table based at least in part on the manufacturer of the cartridge; where the method further includes determining whether the magazine is loaded into a firearm; and selecting the calibration table based at least in part on the determination of whether the magazine is loaded into the firearm; where the method further includes determining a second count of a second number of cartridges loaded in the magazine; and receiving a second signal from the linear encoder within the magazine, wherein the calibration table is modified based at least in part on the signal and the second signal from the linear encoder; where modifying the calibration table based at least in part on the signal from the linear encoder comprises: determining an adjustment factor for a set of position values in the calibration table based at least in part on the signal, the set of position values comprising one or more position values; and adjusting each position value of the set of position values based on the adjustment factor for the set of position values; where the adjustment factor differs for at least some of the position values of the set of position values; where the set of position values correspond to positions of a magnet of the linear encoder within the magazine corresponding to different quantities of cartridges within the magazine; where the set of position values is a subset of position values in the calibration table; where determining the adjustment factor for the set of position values comprises determining a difference between a value corresponding to the signal and at least one position value from the set of position values in the calibration table; and where the trigger comprises one or more of a passage of time, a command received via a magazine control interface, an occurrence of an error when determining the quantity of cartridges loaded in the magazine; a difference between a value corresponding to the signal and a position value in the calibration table exceeding a threshold, or interaction by a user with a user interface of the magazine.

Certain aspects of the present disclosure relate to an ammunition magazine. The ammunition magazine may include: a hardware processor comprising an optical transceiver interface and an ammunition sensor interface, wherein the ammunition sensor interface is configured to receive sensor outputs used to determine a number of cartridges in the ammunition magazine, and wherein the optical transceiver interface is configured to transmit a digital data signal indicating a count of the number of cartridges in the ammunition magazine; an ammunition sensor positioned and configured to sense the presence of cartridges loaded in the ammunition magazine; and an optical transceiver configured to receive the digital data signal from the hardware processor and generate an optical digital data signal configured to be transmitted through a transmission window of the ammunition magazine.

The ammunition magazine of the preceding paragraph can include any combination or sub-combination of the following features: where the ammunition sensor is part of a linear encoder included in the ammunition magazine; where the optical transceiver comprises: an optical transmitter that converts the digital data signal to the optical digital data signal and transmits the optical digital data signal through the transmission window; and an optical receiver that receives a second optical digital data signal and converts the second optical digital data signal to a second digital data signal that is provided to the hardware processor; where the second digital data signal comprises a command to obtain the count of the number of cartridges in the ammunition magazine; where the second optical digital data signal is received from a second transmission window of the ammunition magazine; where the ammunition magazine further includes a collimating lens configured to collimate the optical digital data signal to be transmitted through the transmission window; and where the ammunition sensor comprises a linear encoder.

Additional aspects of the present disclosure relate to a firearm system. The firearm system may include a magazine configured to hold one or more cartridges; and a firearm comprising: an insertion port configured to accept the magazine, wherein the magazine is configured to be inserted into the insertion port and to provide the one or more cartridges to the firearm; and a firearm optical port within a housing of the insertion port, the firearm optical port configured to align with a magazine optical port of the magazine when the magazine is inserted into the insertion port and to receive a signal from the magazine optical port.

The firearm system of the preceding paragraph can include any combination or sub-combination of the following features: where the firearm further comprises a hardware processor configured to determine a count of cartridges available in the firearm based at least in part on the signal; where the signal is an optical signal and wherein the firearm further comprises a convertor that converts the optical signal to an electrical signal and provides the electrical signal to the hardware processor; where the convertor comprises a transceiver configured to receive the signal from the magazine optical port and to transmit a second signal to the magazine via the firearm optical port; where the hardware processor is located within a handle of the firearm; where the hardware processor is further configured to determine the count of the cartridges available in the firearm based at least in part on a determination of whether a cartridge exists in a chamber of the firearm; where the firearm further comprises a plurality of magnetic sensors within a buffer tube of the firearm and a magnet attached to a bolt of the firearm; where a hardware processor of the firearm determines whether a cartridge is within a chamber based at least in part on a motion and a position of the bolt as detected by the plurality of magnetic sensors; where the firearm further comprises a battery located within a handle of the firearm; where the firearm further comprises a wireless transceiver configured to communicate with one or more magazines using ultra-wideband communications; where the firearm further comprises a wireless transceiver configured to communicate over a network; where the firearm optical port comprises a transmission window; where the magazine comprises an optical transceiver that converts a digital data signal to an optical digital data signal that is transmitted to the firearm as the signal through the magazine optical port; and where a gap exists between the firearm optical port and the magazine optical port when the magazine is inserted into the firearm.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure. In addition, various features of different disclosed embodiments can be combined to form additional embodiments, which are part of this disclosure. Any feature or structure can be removed or omitted.

FIG. 7 illustrates an embodiment of the outside of a magazine.

FIG. 10 illustrates an embodiment of a display included as part of the magazine.

DETAILED DESCRIPTION

The headings provided herein, if any, are for convenience only and do not necessarily affect the scope or meaning of the claimed invention. For the purpose of the present disclosure, the terms mobile devices and wireless devices are used interchangeably.

INTRODUCTION

In a number of situations, it can be beneficial to maintain an accurate count of available ammunition within a magazine of a weapon. For example, a soldier will often want to know how much ammunition is available to him or her. Although the soldier may be aware of the amount of ordinance assigned to the soldier, during a firefight, the soldier may lose track of how many shots have been taken and how much ammunition remains.

Certain embodiments described herein provide an improved ammunition tracking system that determines the amount of ammunition within a magazine and outputs the information for display to a user. The system includes a magnet and a set of Hall effect sensors that determine a location of the magnet within the magazine. Based at least in part on the determination of the location of the magnet, the system determines the amount of ammunition within the magazine.

Further, in certain embodiments disclosed herein, the system can track the total amount of ammunition available to a user (e.g., a soldier, policeman, or hunter). The system can register one or more magazines to a user or a particular weapon. The system can then maintain a count of ammunition available to the user or the weapon based on the ammunition within the one or more magazines. Advantageously, in certain embodiments, by monitoring ammunition within each magazine as well as the number of magazines available, a user can be presented with an accurate count of the total ammunition available to the user without the user needing to track the amount of ammunition fired or used.

In addition, in certain embodiments, a magazine installed or inserted within the weapon can communicate a count of the ammunition within the magazine to the weapon and/or to one or more accessories installed on the weapon or within proximity of the weapon. This communication can be accomplished using an optical transceiver, and/or radio included in the magazine. Advantageously, in certain embodiments, using the optical transceiver eliminates cables that can be susceptible to damage during manufacture and/or use.

Additional features and embodiments of the magazine and weapon system are described below with respect to the figures.

Example Magazine

Figure 1:
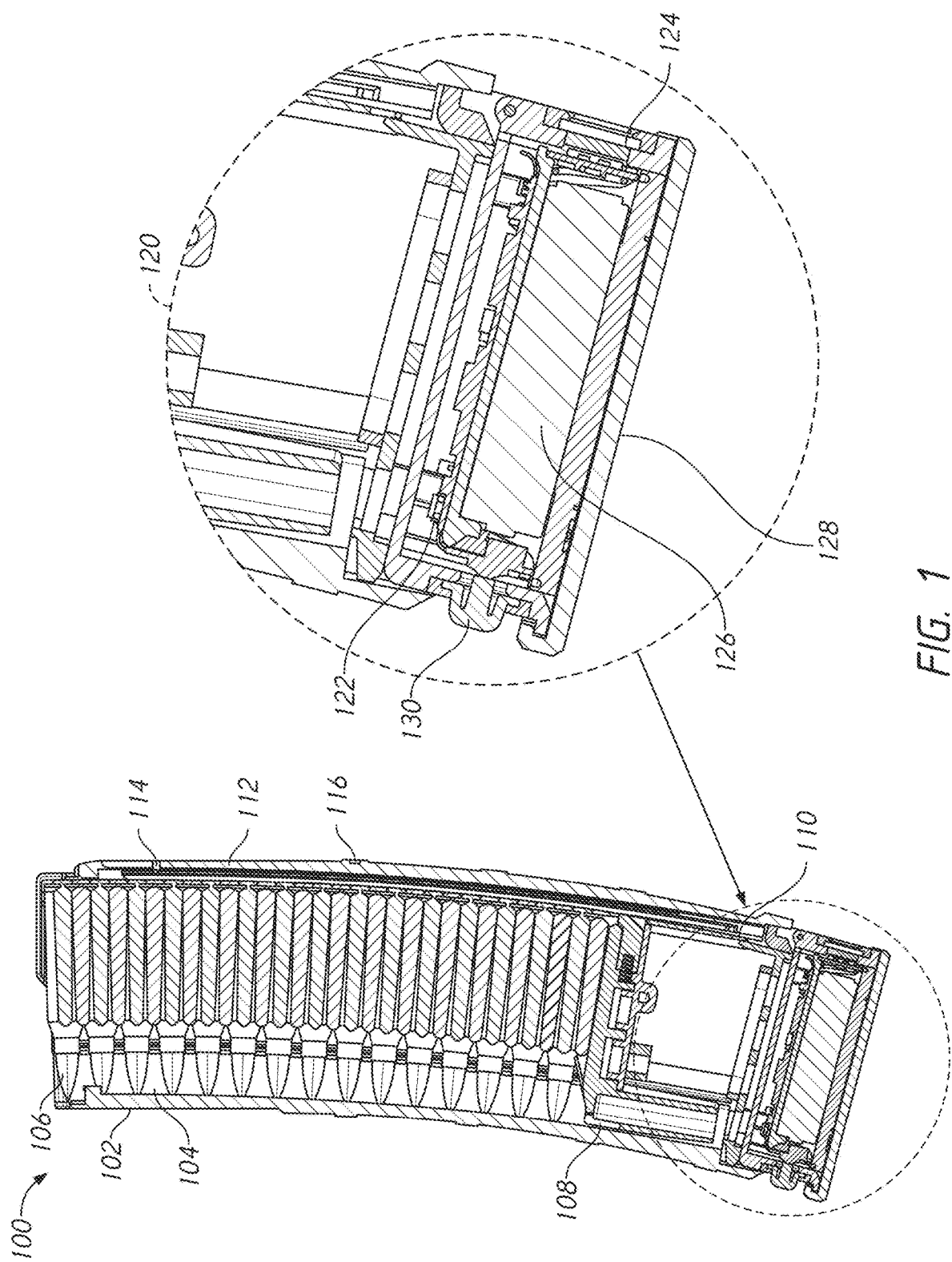
FIG. 1 illustrates a cross-section of an embodiment of the inside of a magazine.
Figure 2:
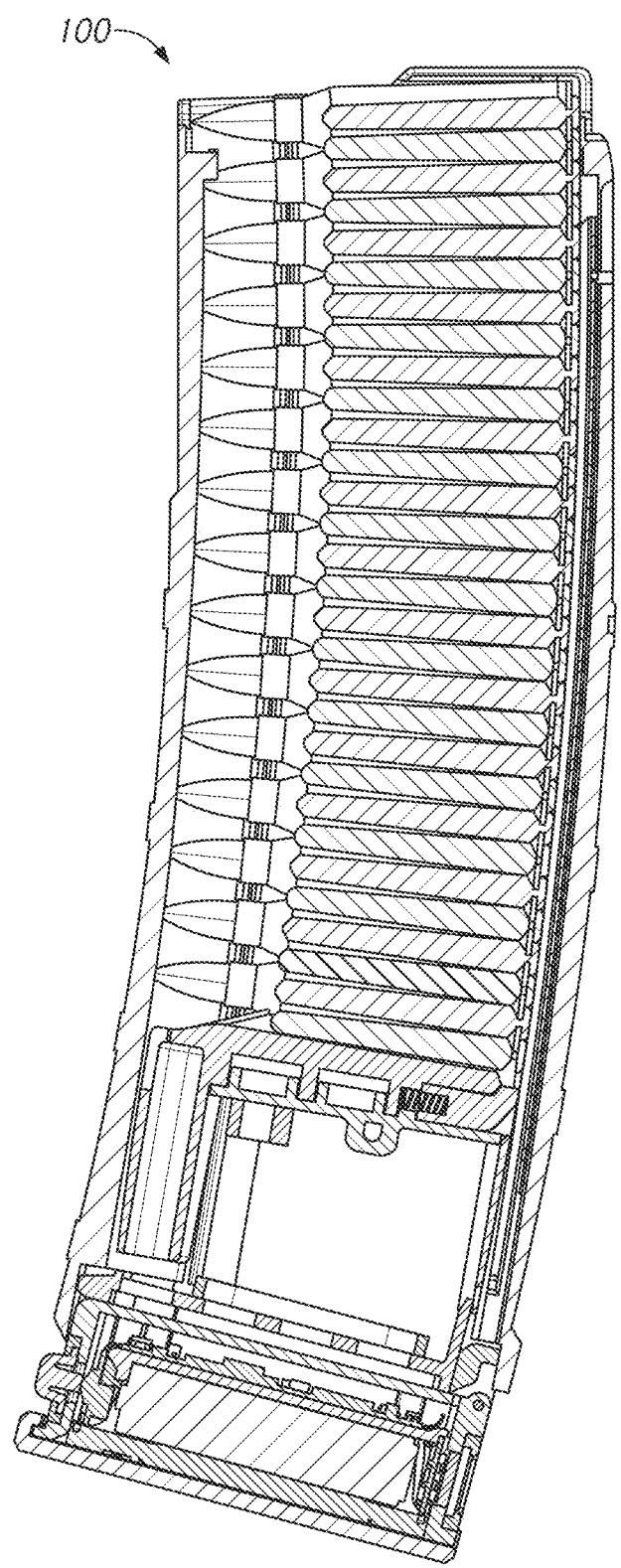
FIG. 2 illustrates a line drawing of the embodiment of the cross-section of the magazine illustrated in FIG. 1.

FIG. 1 illustrates a cross-section of an embodiment of the inside of a magazine 100 that may be used with certain embodiments disclosed herein. Further, FIG. 2 illustrates a line drawing of the embodiment of the cross-section of the magazine 100 illustrated in FIG. 1.

With respect to FIG. 1, the magazine 100 can include a housing 102 that includes a chamber 104 for holding one or more bullets or cartridges 106 of ammunition. It should be understood that the features disclosed herein can be used with any type of magazine capable of holding any type of ammunition.

As illustrated, the magazine includes a follower 108 that is configured to push the cartridges 106 towards an egress point of the magazine 100. The follower 108 includes a magnet 110. As cartridges 106 are removed from the magazine (e.g., when a cartridge 106 is fired), the follower 108 moves towards the egress point of the magazine 100 shrinking the size of the chamber 104 that holds cartridges 106 within the magazine 100. Consequently, as the follower 108 moves, so does the magnet 110, thereby altering the location of the magnet 110 within the magazine 100.

The location of the magnet 110 can be used to determine the number of cartridges 106 within the housing 102 of the magazine 100. To determine the magnet's 110 location, the magazine 100 includes a number of Hall effect sensors 112. The Hall effect sensors 112 can detect the location of the magnet 110 using the Hall effect. The Hall effect relates to the production of a voltage difference across an electrical conductor when a magnetic field is perpendicular to a current in the conductor. Thus, as the magnet 110 approaches a Hall effect sensor 112 within the magazine 100, a voltage will be produced that can be measured by electronic circuitry within, and/or external to, the magazine 100. Based on the detected voltage, the location of the magnet 110 can be determined and consequently, the location of the follower 108. This information can be used to determine the quantity of ammunition within the chamber 104. In certain embodiments, the Hall effect sensors 112 may be replaced by any type of transducer, electrical, magnetic, or electromagnetic sensor that produces or modifies an electrical signal or measurable electrical property (e.g., a voltage, a current, or a resistance) based at least in part on a detected magnetic field from a magnet. For example, in some embodiments, an anisotropic magnetoresistive or anisotropic magnetoresistance (AMR) sensor may replace or complement the Hall effect sensors 112. In some embodiments, the microelectromechanical systems (MEMS) magnetic field sensor may be used instead of, or in addition to, the Hall effect sensors 112. Other examples of sensors that may be used in place of or in addition to the Hall effect sensors 112 may include sensors that measure or detect negative magnetoresistance, giant magnetoresistance, tunnel magnetoresistance, or extraordinary magnetoresistance. In some embodiments, the change in the type of sensor 112 may be paired with a change of the type of magnet 110.

The combination of the Hall effect sensors 112 and the magnet 110 may create a linear encoder. The set of sensors 112 may be used to encode or identify particular locations within the magazine 100. Based on the location of the magnet 110 with respect to the set of sensors 112, the number of cartridges loaded within the magazine 100 can be determined. The position or location of the magnet 110 may change as the number of cartridges within the magazine 100 changes. Based on the change in location of the magnet 110, as determined by the one or more Hall effect sensors 112 that generate electrical signals, the number of cartridges within the magazine 100 can be determined. In some embodiments, each, or all, of the sensors 112 may generate an electrical signal based on the sensors relative location to the magnet 110. In some such cases, the location of the magnet 110 may be determined based on the respective signals generated by the set of sensors 112. In some embodiments, the one or more electrical signals generated by the one or more sensors 112 may be compared to a table that is stored in the circuitry or memory of the magazine 100. Based on the comparison between the generated electrical signals and the data stored in the table, the location of the magnet 110 may be determined. In some embodiments, the signals generated by the sensors 112 are compared to data stored within the table. In other embodiments, values that are generated or determined based on the signals generated by the sensors 112 are compared to data stored within the table.

Although the linear encoder is primarily described herein as being formed from a magnet and a set of magnetic sensors, the linear encoder is not limited as such. For example, the linear encoder may use an optical, capacitive, inductive, or resistive system. For instance, with an optical system, the magnet may be replaced with a light source, such as an LED. The magnetic sensors may be replaced with light sensors that are capable of determining the linear encoder position based on the one or more light sensors that detect light from the light source. A capacitive system may similarly be implemented to detect a capacitance between an element attached to the follower and an element aligned with the cartridges in the magazine. Further, the linear encoder may be an absolute encoder or an incremental encoder.

In some embodiments, the number of sensors 112 included within the magazine corresponds to the maximum number of cartridges that can be loaded into the magazine 100. Thus, if the bottommost sensor that is closest to the butt of the magazine 100 generates an electrical signal, it can be determined that the magazine includes the maximum number of cartridges. In another example, if the sensor 112 closest to the feed point or ingress/egress point of the magazine 100 generates an electrical signal, it can be determined that the magazine 100 is empty. It should be understood that multiple sensors 112 may generate a signal. The number of cartridges within the magazine 100 may be determined by interpolating or averaging the signals, or by selecting the sensor 112 that generates the strongest electrical signal.

However, with some magazines, having a one-to-one correspondence between the number of sensors 112 and the maximum number of cartridges that the magazine 100 can hold is insufficient to accurately determine the number of cartridges within the magazine 100. There are several reasons why having a one-to-one correspondence between the number of sensors 112 included in the magazine 100 and the number of cartridges the magazine 100 can hold when fully loaded is insufficient. For example, one reason why having a one-to-one correspondence between sensors and cartridges is that, even for a particular size cartridge, there may be variation in cartridge size between manufacturers such that the alignment between the cartridges within the magazine 100 and the sensors 112 may vary for different manufacturers of the same ammunition type. As another example, some magazines are capable of holding different types of cartridges, which may vary in size and may result in a different position of the magnet 110 for the same number of cartridges. For instance, the magazine 100 may be capable of holding both .458 SOCOM rounds and .223 rounds, which differ in size, thereby causing a location of the magnet 110 with respect to the sensors 112 to differ for the same number of cartridges.

In some cases, even if the same type of ammunition from the same manufacturer is consistently used with the magazine 100, wear and tear of the magazine 100 over time may cause the alignment of the magnet 110 with respect to the sensors 112 to change for the same number of cartridges. For example, the rigidity of the plastic or the strength of the spring in the follower may change over time. In some cases, environmental conditions, such as temperature, may cause a change in the magazine 100 that affects the alignment of the magnet 110 with the sensors 112 for a particular number of cartridges inserted into the magazine 100. Further, with many weapons, inserting the magazine 100 into the weapon may cause pressure to be applied to the cartridges within the magazine 100. This pressure may shift the cartridges compared to when the magazine 100 is not inserted into the weapon, thereby modifying the alignment of the magnet 110 with the sensors 112. As such, in certain embodiments, the determination of the number of cartridges within the magazine 100 may change based on whether the magazine 100 is inserted into the weapon resulting in an inaccurate count of the cartridges either when the magazine 100 is inserted into the weapon or when the magazine 100 is not inserted into the weapon.

For at least the above reasons, in some cases having a one-to-one correspondence between the number of sensors included in the magazine 100 and the maximum number of cartridges that the magazine 100 can support may be insufficient. Thus, in certain embodiments, the magazine 100 may include more sensors 112 than the total number of cartridges that the magazine 100 can hold or is designed to hold. Advantageously, in certain embodiments, by including a greater number of sensors in the magazine 100 than the number of cartridges the magazine 100 can hold when at capacity, the accuracy of the measurements made by the linear encoder of the magazine 100 may be increased, thereby reducing or eliminating the problems associated with having a one-to-one correspondence between the sensors and the number of cartridges that the magazine 100 can support. To determine the number of cartridges within the magazine 100, the linear encoder may further include a hardware processor that can compare the signals generated by the sensors 112 with the calibration table stored in a memory to determine the number of cartridges within the magazine 100. The hardware processor may generate a value, such as a coordinate value indicating a relative location of the magnet 110 with respect to a coordinate system associated with the sensors 112. The hardware processor may compare the value to values within the calibration table to identify a number of cartridges corresponding to the value. In certain embodiments, the hardware processor may interpolate signal values from the sensors 112 to more accurately identify the location of the magnet 110, and consequently the number of cartridges loaded within the magazine 100.

In certain embodiments, the number of sensors within the magazine may match the number of cartridges the magazine is capable of holding. In some such embodiments, a linear encoder may be used to determine the number of cartridges in the magazine. In certain embodiments, the linear encoder may eliminate the problems described above when the granularity of sensors matches the maximum ammunition capacity of a magazine. The location of the magnet in the magazine with respect to the sensors in the magazine may be determined based on the electrical signals received from two or more sensors. This location may be mapped to a calibration table to determine the number of cartridges within the magazine. By mapping the location to the calibration table, instead of using the exact position of the magnet with respect to the sensors to determine an ammunition count, a range of positions may be used to determine the ammunition count enabling the linear encoder to account for wear and tear of the magazine and differences in cartridge sizes. Thus, instead of determining that a magazine includes X cartridges because sensor X detects the magnet, it can be determined that because the magnet is between sensors X and Y, the magazine includes X cartridges. With magazines that require a one-to-one correspondence between the sensor and the ammunition count, a change in the position of the magnet due to, for example, wear and tear may cause an error in determining the ammunition count in the magazine. However, with a magazine that includes a linear encoder, the amount of ammunition in the magazine can be determined even when the magnet does not align with a particular sensor.

As described above, the number of cartridges 106 in the magazine 100 can be determined based on the location of the magnet 110 with respect to the one or more Hall effect sensors 112. Thus, to determine the number of cartridges 106, it is desirable that the Hall effect sensors 112 maintain particular positions within the magazine 100. However, during manufacture and/or over time, the position of the Hall effect sensors 112 may shift. For example, vibrations caused by the firing of the weapon within which the magazine 100 is loaded may result in movement of the Hall effect sensors 112. To maintain the position of the Hall effect sensors 112, one or more alignment pins 114 can be used to maintain the position of the circuit board that includes the Hall effect sensors 112.

In some embodiments, the use of an alignment pin is unnecessary, and the alignment pin may be omitted. For example, the Hall effect sensors may be secured or built into the housing of the magazine 100 such that the sensors 112 do not shift over time. Alternatively, or in addition, the calibration table may be updated or modified over time using a calibration or recalibration process. The calibration process may be used to determine the location of the magnet 110 with respect to the sensors 112. By calibrating or recalibrating the magazine 100, the table that identifies the number of cartridges loaded within the magazine 100 based on a determination of the location of the magnet 110 with respect to the sensors 112 may be updated. Thus, changes in location of the magnet 110 with respect to the sensors 112 for a particular number of cartridges loaded within the magazine 100 may be captured by the calibration process, thereby reducing or eliminating inaccuracies in the measurement of the number of cartridges loaded into the magazine that may be introduced by wear and tear of the magazine or variation in ammunition loaded into the magazine. This calibration processes described in more detail below with respect to FIG. 32.

As is described further herein, the amount of cartridges within the magazine can be presented to a user via a display included in the magazine 100. However, in some cases, it may be desirable to transmit information associated with the magazine, such as the number of cartridges within the magazine or the state of a battery used to power the circuitry included in the magazine, to the weapon or another system. In some embodiments, the magazine 100 can include an optical transceiver 116 or radio to transmit the information to the weapon or another device. Further, the magazine 100 may include a digital to optical signal adapter enabling the conversion of a digital signal created by the electronic circuitry 122 to an optical signal for transmission by the optical receiver 116. Moreover, the magazine 100 may include an optical to digital signal adapter enabling the conversion of an optical signal received at the optical transceiver 116 capable of being processed by electronic circuitry 122.

The enlarged portion 120 of the bottom of the magazine 100 illustrates additional details of the magazine 100. As illustrated within the enlarged portion 120, the magazine includes electronic circuitry 122 that receives one or more electrical signals from the one or more Hall effect sensors 112. Based on the one or more electrical signals, the electronic circuitry 122 determines the position of the magnet 110 and/or follower 108 within the magazine 100 and consequently, the number of cartridges 106 within the magazine 100. The electronic circuitry 122 may include a hardware processor or programmable hardware, such as a field programmable gate array (FPGA), which may be configured to interpret the signals received from the sensors 112 and determine the location of the magnet 110 and consequently the number of cartridges within the magazine. Further, the hardware processor or programmable hardware of the electronic circuitry 122 may be configured to perform one or more of the processes described herein.

Further, the magazine 100 includes a display 124, which as illustrated may be a 7-segment light emitting diode (LED) display. However, it should be understood that the display 124 is not limited to a 7 segment LED display and can include any type of display that can output, among other things, the number of cartridges within the magazine 100 to a user.

The electronic circuitry 122 and/or the Hall effect sensors 112 can be powered by a battery 126 that can be included within the magazine 100. In some embodiments, the battery 126 is rechargeable using, for example, wireless charging. Alternatively, and/or in addition, the battery may be replaced by opening a cap 128. The cap 128 can be a sealing cap that is configured to prevent any moisture or detritus from entering the magazine 100.

Further, the magazine 100 may include a control interface 130 (such as, for example, a control button) that can be used to activate or deactivate the system for measuring the cartridges in the magazine 100. Moreover, the control interface 130 may be used to modify the brightness of the display 124. In some embodiments, the control interface 130 can be used to show or hide the display of the number of cartridges within the magazine 100. In some cases, a user may determine that light from the display 124 is undesirable. For example, in some combat situations, it may be desirable to reduce as much light as possible emanating from the soldier. Advantageously, in certain embodiments, by being able to control the display of the ammunition within the magazine 100, or other information, a user can determine whether or not the display 124 is active. Moreover, in some cases, the control interface 130 can be used to control whether ammunition information is displayed on an alternative display, such as via a scope attached to the weapon or a helmet worn by the user. In some embodiments, the control interface 130 is disposed on a portion of the magazine 100 that is inserted into the firearm. In such embodiments, the control interface 130 can only be accessed by the user when the magazine 100 is not in the firearm. This configuration can help reduce or eliminate false readings that may occur if the control interface 130 is operated while the magazine is inserted in the firearm. In certain embodiments, the control interface 130 comprises one or more of a control panel, a control button, a wired control interface, a wireless control interface, or a combination of interfaces. For example, the control interface 130 may include a cell phone, laptop, or other wireless device. A user may interact with the control interface 130 to request a count of ammunition within one or more magazines. Further, a user may interact with the control interface 130 to trigger calibration or recalibration of one or more magazines to update a calibration or linear encoder table used to determine a number of cartridges within a magazine.

Figure 3:
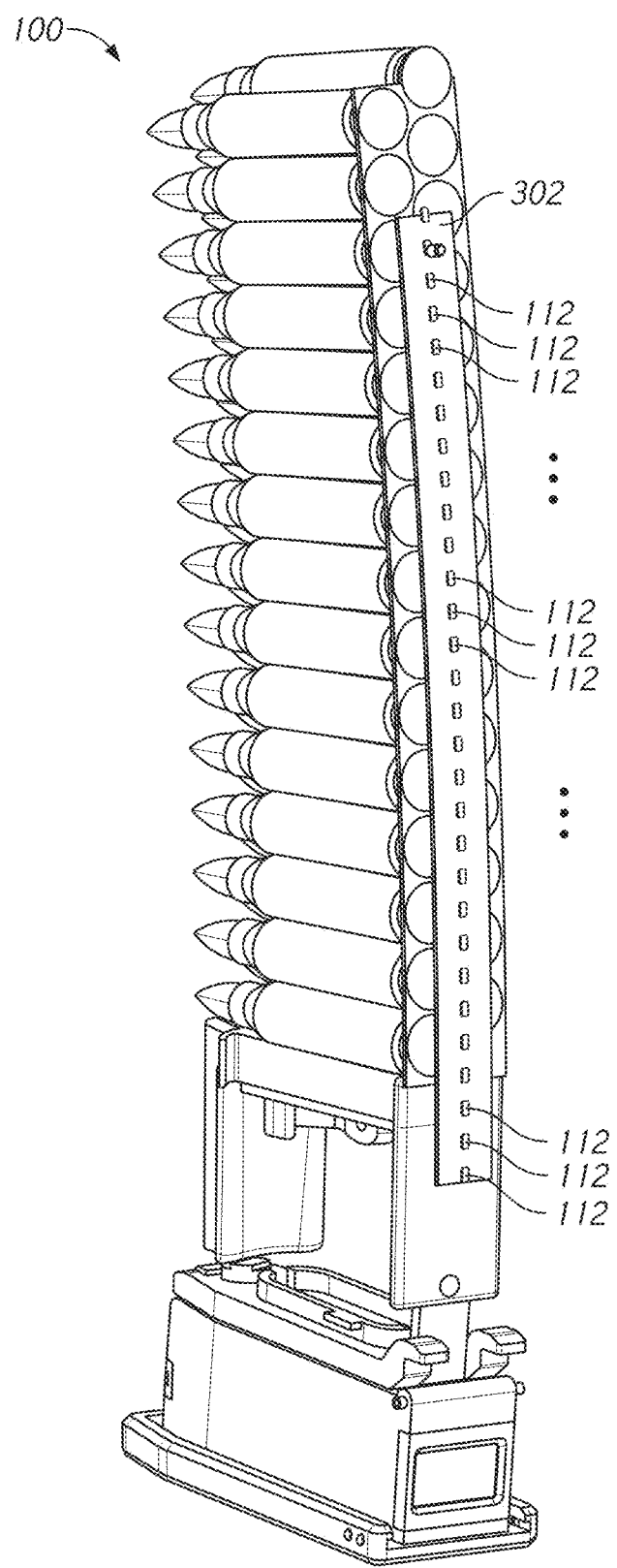
FIG. 3 illustrates an embodiment of the Hall effect sensors within an embodiment of the magazine.

FIG. 3 illustrates an embodiment of the Hall effect sensors 112 within an embodiment of the magazine 100. As illustrated, the Hall effect sensors 112 may include a plurality of sensors 112 that can each provide a signal to the electronic circuitry 122 (see FIG. 1) of the magazine 100. In some cases, each Hall effect sensor 112 provides a signal to the electronic circuitry 122. In other cases, a subset of the Hall effect sensors 112, such as those within a threshold distance of the magnet 110, provide a signal to the electronic circuitry 122.

The Hall effect sensors 112 may be included as part of a circuit board 302. The circuit board 302 may be designed to precisely place, within a threshold degree of tolerance, the Hall effect sensors 112 with respect to the location of the magnet 110 when the magazine 100 is loaded with a particular amount and type (e.g., size) of ammunition. Alternatively, or in addition, the electronic circuitry 122 may be calibrated based on the position of the Hall effect sensors 112 and the magnet 110. In some embodiments, the circuit board 302 may be a flexible circuit board. Advantageously, in certain embodiments, by using a flexible circuit board, the circuit board 302 can be shaped to match the curvature of the magazine 100 and to maintain the Hall effect sensors 112 at a particular distance from the magnet 110 when the magnet is positioned perpendicular to a particular Hall effect sensor 112.

Figure 4A:
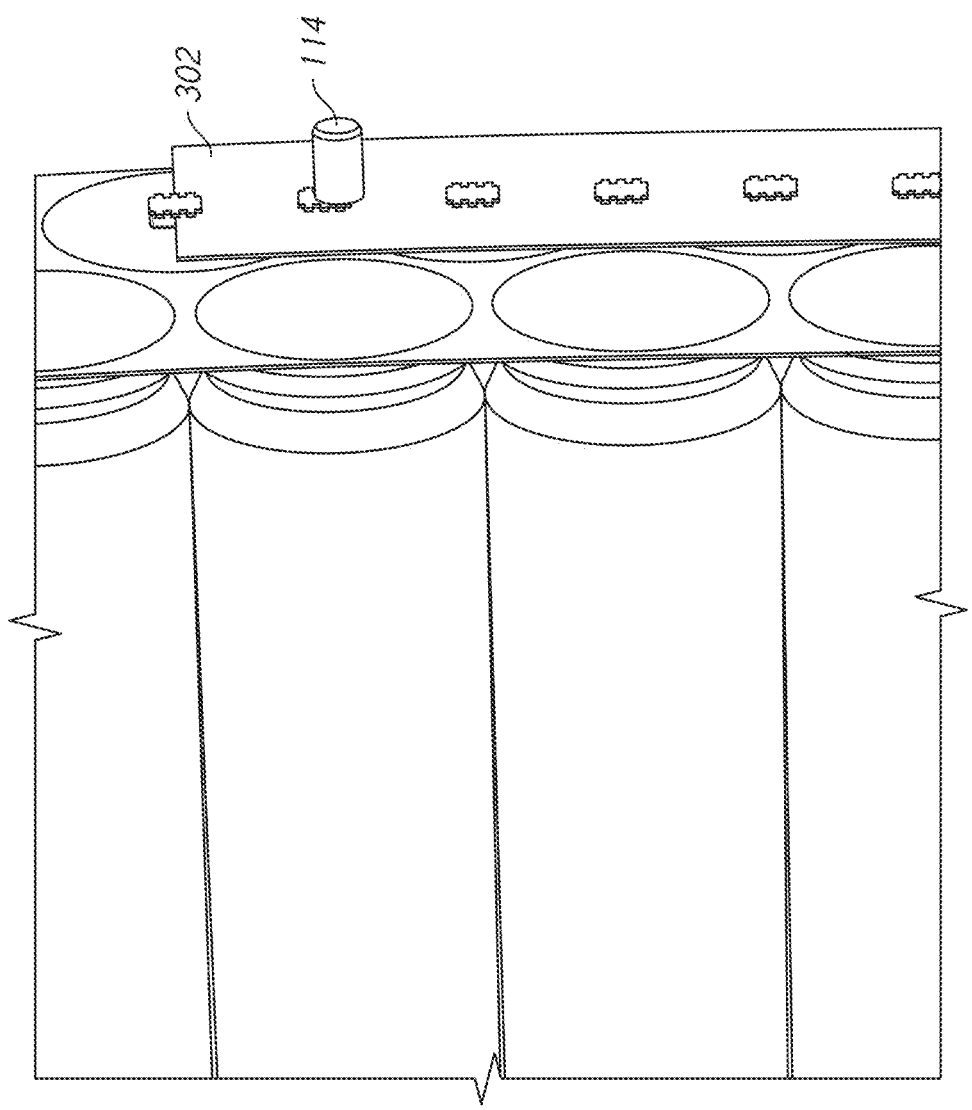
FIG. 4A illustrates an embodiment of the alignment pin within an embodiment of the magazine.

As previously mentioned, one or more alignment pins 114 may be used to position the circuit board 302 within the magazine 100. FIG. 4A illustrates an embodiment of the alignment pin 114 within an embodiment of the magazine 100. Although the alignment pin 114 is illustrated as a rod, it should be understood that other shapes may be used. For example, the alignment pin 114 may include fingers or other protrusions from the pin 114 that can be used to grip or further hold the circuit board 302 in place. Further, in the embodiments of FIG. 4A, the Hall effect sensors 112 are positioned at the rear of the magazine 100 and the magnet 110 is positioned at the rear.

Figure 4B:
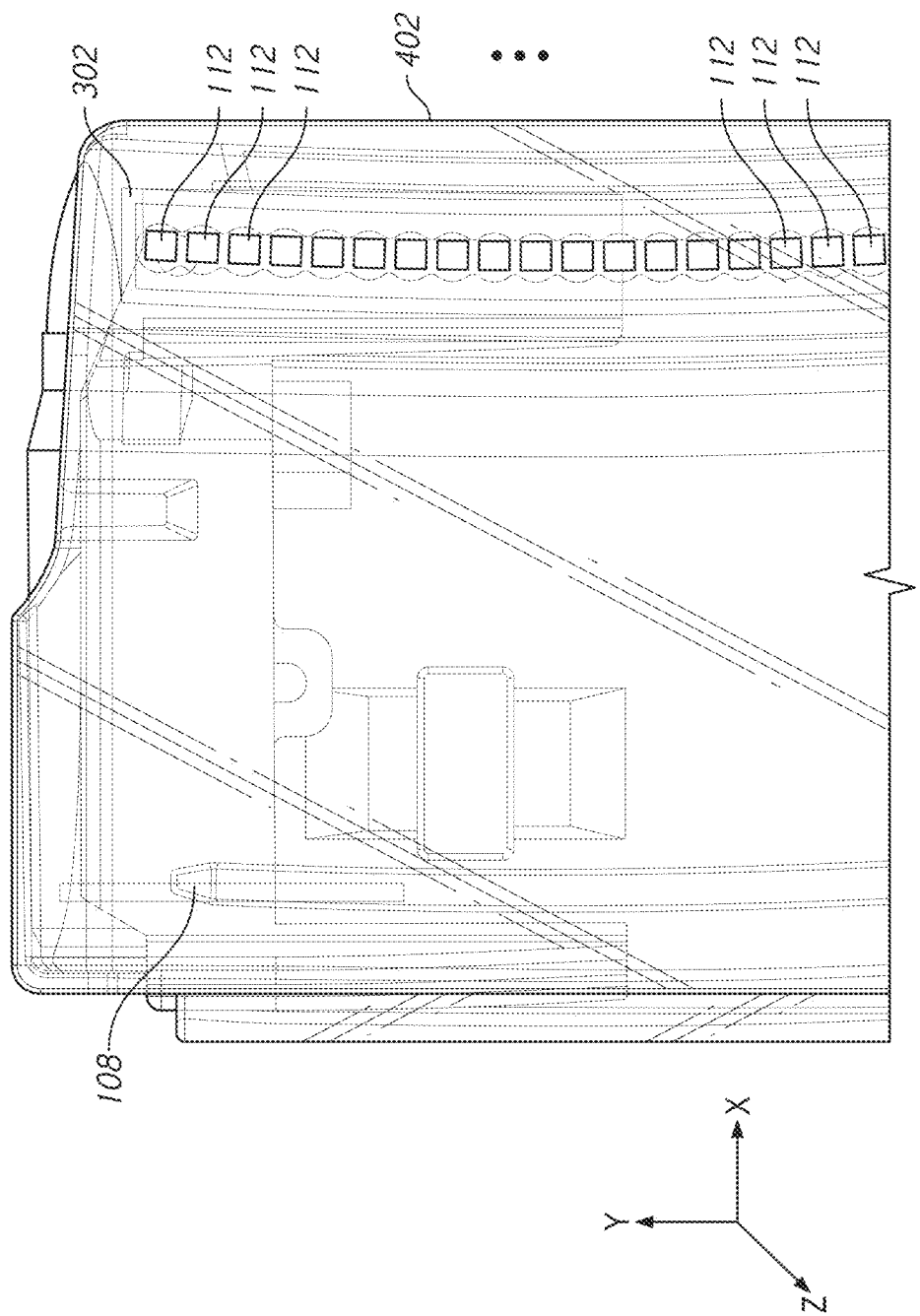
FIG. 4B illustrates another embodiment of the Hall effect sensors within an embodiment of the magazine without an alignment pin.

In some embodiments, the alignment pin 114 is omitted. FIG. 4B illustrates another embodiment of the Hall effect sensors 112 within an embodiment of the magazine without an alignment pin. As illustrated in FIG. 4B, in some implementations, the circuit board 302, and associated Hall effect sensors 112, may be positioned on a side of the housing of the magazine as opposed to the back of the magazine behind the cartridges. In some embodiments, the Hall effect sensors 112 may be positioned near the front face 402 of the magazine, where the front is defined as the direction in which the cartridges are ejected when fired from a firearm, or in the positive x-direction as illustrated in FIG. 4B. As described in more detail below, by positioning the Hall effect sensors 112 near the front of the magazine, another Hall effect sensor may be positioned at the rear of the magazine for determining when the magazine is inserted into a weapon or firearm without the additional Hall effect sensor detecting the magnet 110 positioned near or adjacent to the front face 402 (e.g., the edge or face of the magazine in which the cartridges are pointing when loaded within the magazine 100) of the magazine 100. Further, the Hall effect sensors 112 may be positioned along the vertical or y-axis of the magazine to form a vertical column of sensors. Many magazines are not completely rectangular in shape, but are instead curved to some degree. Accordingly, in certain embodiments, the Hall effect sensors may be positioned substantially vertically along an axis that matches the curvature of the magazine.

In certain embodiments, a magnet attached to a follower 108 may align in the horizontal or x-axis of the magazine with one or more of the Hall effect sensors 112 when one or more cartridges are loaded in the magazine. In certain implementations, one or more of the Hall effect sensors 112 may align with the magnet attached to the follower 108 when no cartridges are loaded in the magazine.

Figure 5:
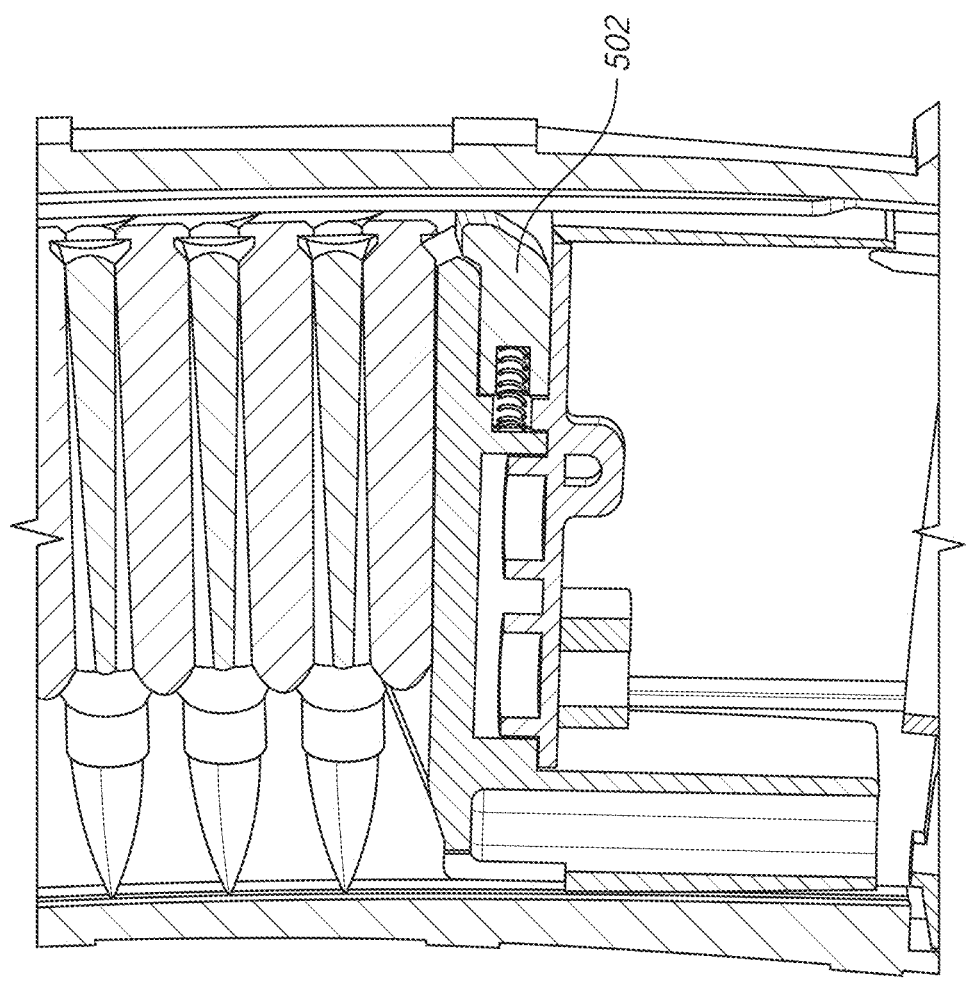
FIG. 5 illustrates an embodiment of the follower within an embodiment of the magazine.
Figure 6:
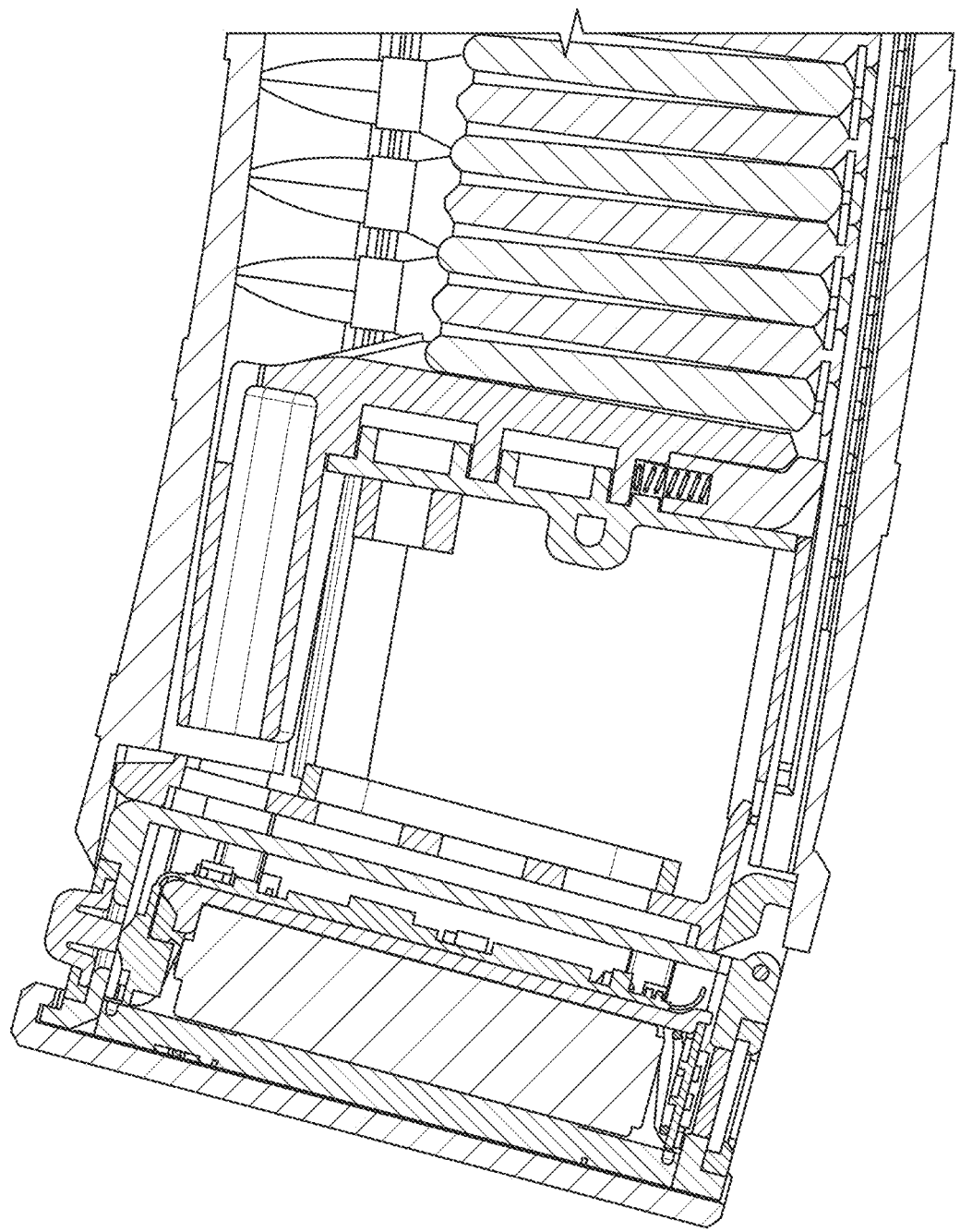
FIG. 6 illustrates a line drawing of the embodiment of the follower illustrated in FIG. 5.

FIG. 5 illustrates an embodiment of the follower 108 within an embodiment of the magazine 100. Often, followers include a solid protrusion from the follower body that pushes cartridges within the magazine towards the egress of the magazine. In certain embodiments of the follower 108, the solid protrusion is replaced by a spring-loaded plunger 502. Advantageously, in certain embodiments, replacing the solid protrusion with the spring-loaded plunger 502 creates a space for inclusion of the electronic circuitry 122. Thus, in certain embodiments, the magazine 100 can include the electronic circuitry 122 for automatically and electronically monitoring the number of cartridges within the magazine with minimal or no increase in the size of the magazine 100 compared to magazines that are not capable of electronically monitoring the number of cartridges within the magazine. FIG. 6 illustrates a line drawing of the embodiment of the follower illustrated in FIG. 5.

Example Magazine Housing

Figure 8A:
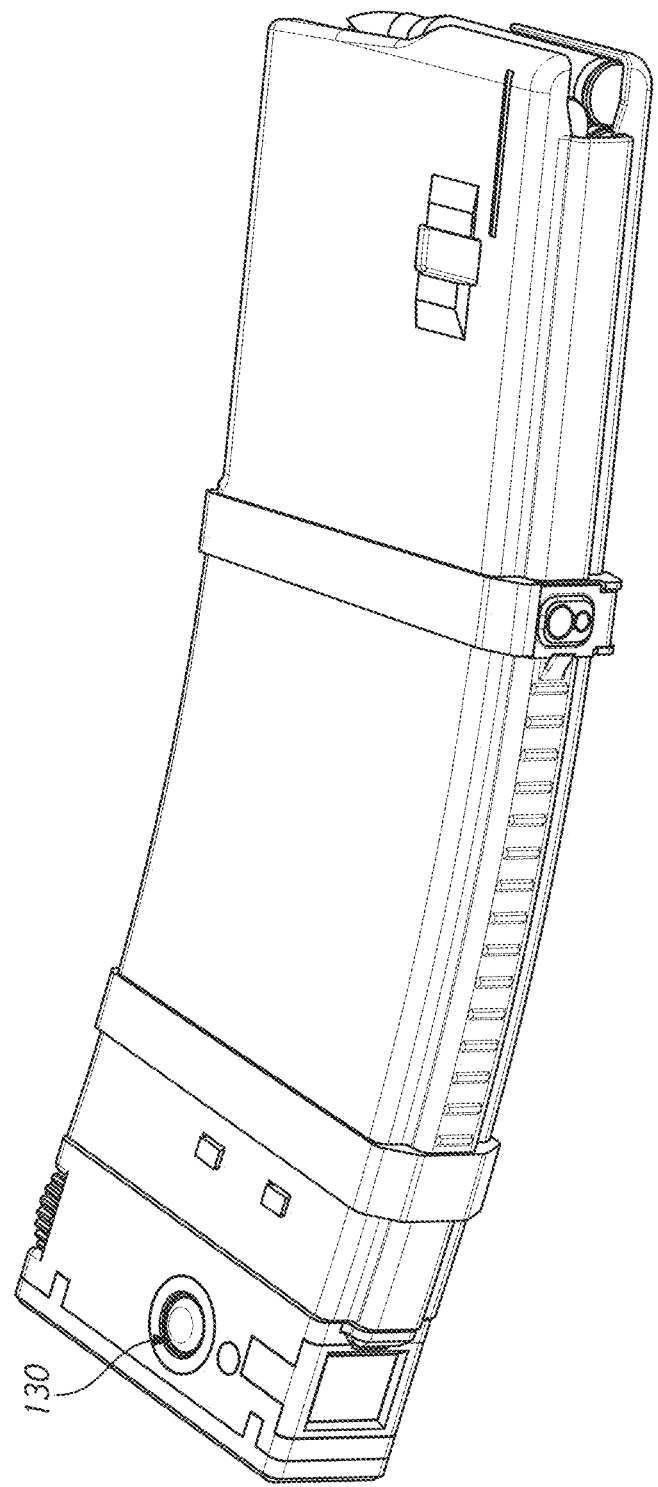
FIG. 8A illustrates a line drawing of another perspective of the outside of the magazine illustrated in FIG. 7.

FIG. 7 illustrates an embodiment of the outside of a magazine 100. FIG. 8A illustrates a line drawing of another perspective of the outside of the magazine illustrated in FIG. 7. As previously described, the magazine 100 may include a display 124 and an optical transceiver 116. One or more of the display 124 and the optical transceiver 116 may be part of the housing 102. Alternatively, the display 124 and/or the optical transceiver 116 may be inserted into gaps or spaces within the housing 102.

In some embodiments, the magazine 100 may include a machine-readable code that includes a unique identifier for the magazine. This machine-readable code may be a bar code, a matrix code, a quick response (QR) code, or any other type of machine-readable code. Alternatively, or in addition, the magazine 100 may include a radio frequency identification (RFID). Advantageously, in certain embodiments, by including a machine-readable code and/or tag on the magazine 100, the magazine 100 can be registered with a weapon enabling a user, such as a soldier, to track the total ammunition available to the user. In some embodiments, the magazine 100 may be registered with the weapon upon insertion of the magazine 100 within the weapon. When the magazine is loaded into the weapon, circuitry within the weapon may communicate with circuitry within the magazine to register the magazine with the weapon.

Tracking the total ammunition enables a user to monitor ammunition while in a particular environment. For example, a soldier in the field can monitor ammunition without needing to remember how many magazines are in the soldier's gear or how many magazines or cartridges the soldier has used. In some embodiments, the machine-readable code and/or RFID tag can be modified to reflect the amount of ammunition remaining in the magazine. Alternatively, or in addition, an indicator may provide a status of the magazine. For example, when the magazine is empty or has less than a threshold number of cartridges, the indicator may turn red informing the user that the cartridge is empty or has below a threshold number of cartridges. Thus, for example, when a soldier is in the field, he or she can easily determine whether a magazine is a loaded magazine or a spent magazine that is now empty or is close to empty.

In some use cases, a user may register a magazine that is currently registered with one weapon with another weapon. For example, a first soldier may take a magazine registered to the soldier's weapon and give it to a second soldier, who may then register the magazine with his or her weapon. In certain embodiments, when the second soldier registers the magazine with his or her weapon, the magazine may be deregistered from the first soldier's weapon. In some embodiments, the magazine may send a signal to the first soldier's weapon to indicate that the magazine should be deregistered from the first soldier's weapon. In other embodiments, the weapon of the first soldier may deregister the magazine from the weapon and the weapon is no longer able to communicate with the magazine. In some cases, the weapon may no longer be able to communicate with the magazine because the magazine moves outside of communication range of the weapon. Alternatively, or in addition, the weapon may no longer be able to communicate with the magazine because when the magazine is registered with the second weapon, the second weapon changes an identifier of the magazine. For example, each weapon may provide an identifier to the magazine that is based at least in part on the weapon's identifier. Thus, when a magazine is registered to a weapon, the magazine's identifier may change and the magazine may no longer respond to attempts to communicate with the magazine from another weapon with which the magazine was previously registered.

In some embodiments, the magazine 100 may include a carbon fiber casing. The use of a carbon fiber casing can reduce the weight of the magazine 100 offsetting any added weight from the additional sensors and electronics. Further, in some embodiments, the magazine 100 may include a rubber sleeve. The rubber sleeve can improve the strength and durability of the magazine 100 as well as provide additional protection for the added electronics to help prevent damage during impacts (e.g., if the magazine is dropped).

As illustrated in FIG. 8A, the control interface 130 may be a button or other interface element positioned near the base of the magazine. A user may interact with the control interface 130 to cause a cartridge count to be displayed on a display of the magazine 100, on a display of a weapon, or any other display that can present the cartridge count.

In some cases, the magazine may be inserted into a traditional weapon, or a weapon that does not support one or more of the embodiments described herein. In some such cases, the magazine 100 may present an inaccurate count of the cartridges within the magazine 100 when the user interacts with the control interface 130 because, for example, the pressure applied to the cartridges in the magazine by the weapon or because of the inability to determine when a cartridge is within a chamber of the weapon. In some cases, the weapon may support embodiments disclosed herein, but the battery may be drained or the circuitry of the weapon may be off. In such cases, an inaccurate cartridge count may also be displayed because the status of the bolt and/or chamber may be unknown.

Figure 8B:
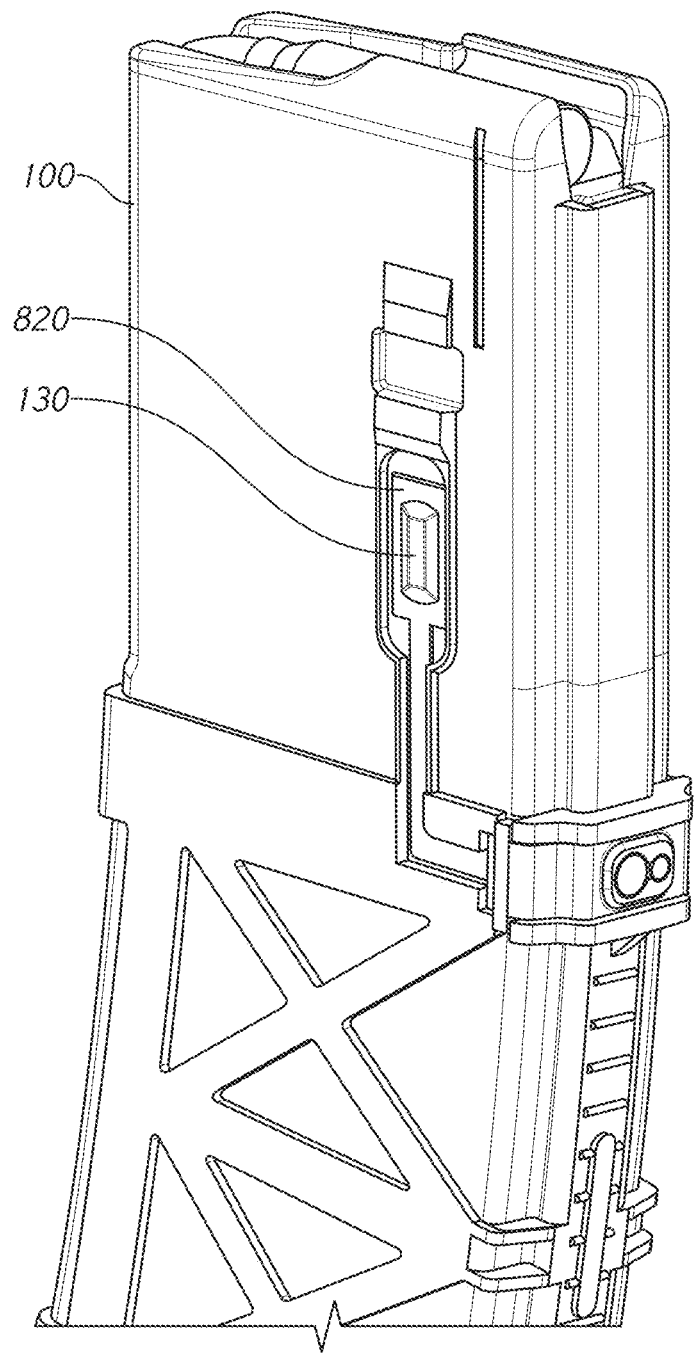
FIG. 8B illustrates an embodiment of a magazine with a control interface positioned near the egress of the magazine in accordance with certain embodiments.

FIG. 8B illustrates an embodiment of a magazine with a control interface 130 positioned near the egress of the magazine in accordance with certain embodiments. In particular the control interface 130 is positioned at a location on the magazine 100 that is inaccessible when the magazine 100 is inserted into a weapon. Advantageously, by moving the control interface 130 to a location the magazine that is inaccessible when the magazine 100 is inserted into the weapon, a user cannot interact with the control interface 130 and therefore, cannot obtain a cartridge count without removing the magazine 100 from the weapon. Thus, a magazine is prevented from displaying an inaccurate cartridge count in cases where the magazine is inserted into a weapon that does not support embodiments disclosed herein, or in cases where the weapon does support the embodiments disclosed herein, but in which the battery of the weapon is drained or dead, or in which the circuitry of the weapon is inactive or turned off. Further, the control interface 130 may be positioned within a recess 820 preventing the weapon from interacting with the control interface 130 when the magazine is inserted into the weapon.

Figure 8C:
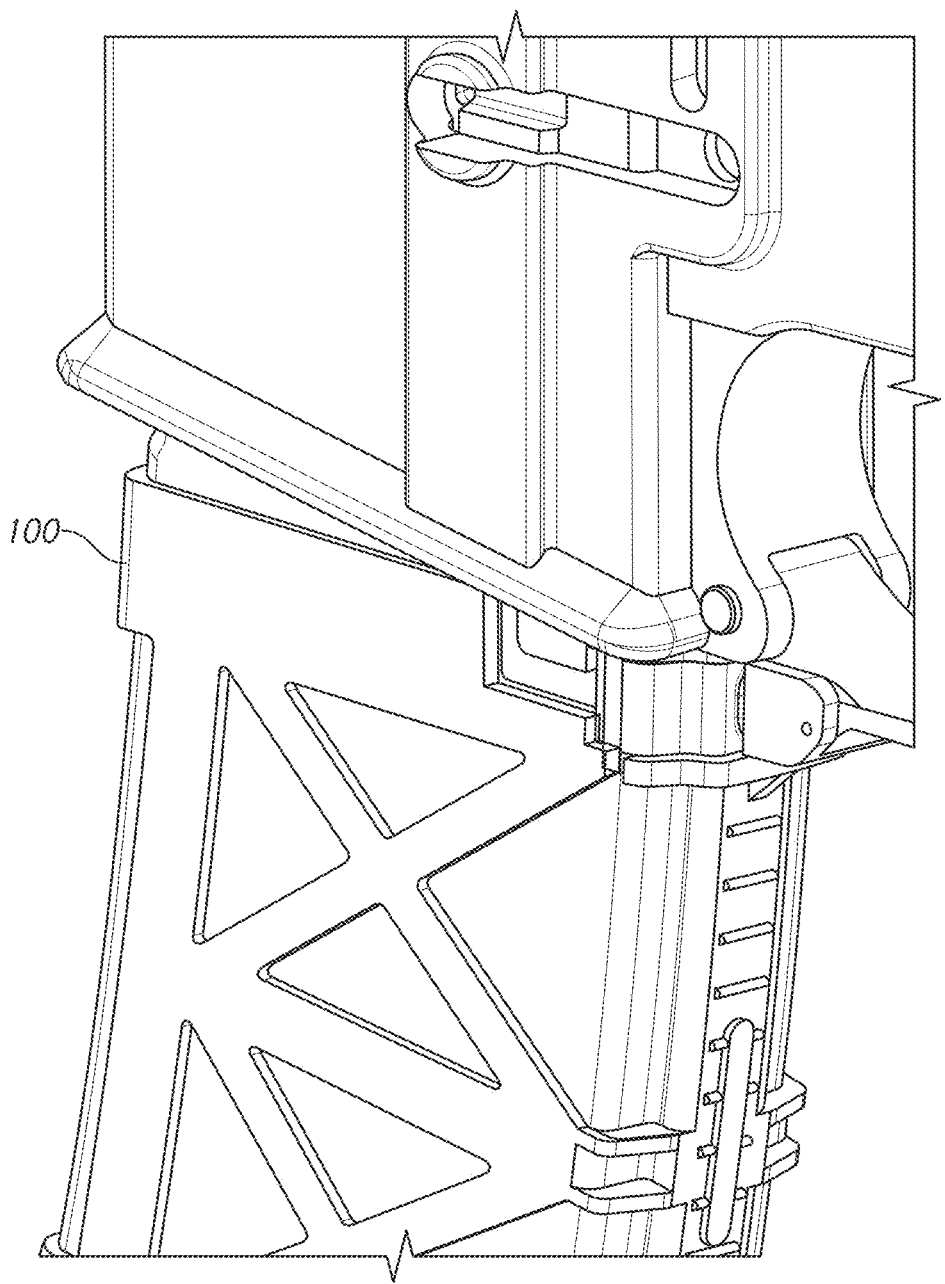
FIG. 8C illustrates the magazine of FIG. 8B inserted into a weapon.

FIG. 8C illustrates the magazine of FIG. 8B inserted into a weapon. As illustrated, the control interface 130 is not accessible when the magazine 100 is inserted into the weapon. Accordingly, a user cannot interact with the control interface 130 to obtain a cartridge count within the magazine. It should be understood that the cartridge or ammunition count may be obtained by either removing the magazine, or interacting with a weapon that includes the embodiments disclosed herein for obtaining the ammunition count from the magazine and for determining the status of the chamber and/or bolt of the weapon.

Example Non-Contact Connector

In some embodiments, the magazine 100 can communicate with a weapon using a non-contact connector, such as an optical connector. In some embodiments, wireless radio frequency communication or electrical communication may be used between the magazine and the weapon. However, in some embodiments, the weapon may be fired at a faster rate than the speed of the RF communication leading to an inaccurate ammunition count being displayed to the user. Further, electrical communication connections may become damaged by the environment. Advantageously, in certain embodiments, using an optical connector may enable faster communication compared to radio communication. Further, optical connectors can be cleaned using water and are less susceptible to damage by the environment or rough handling compared to electrical connectors.

Figure 9A:
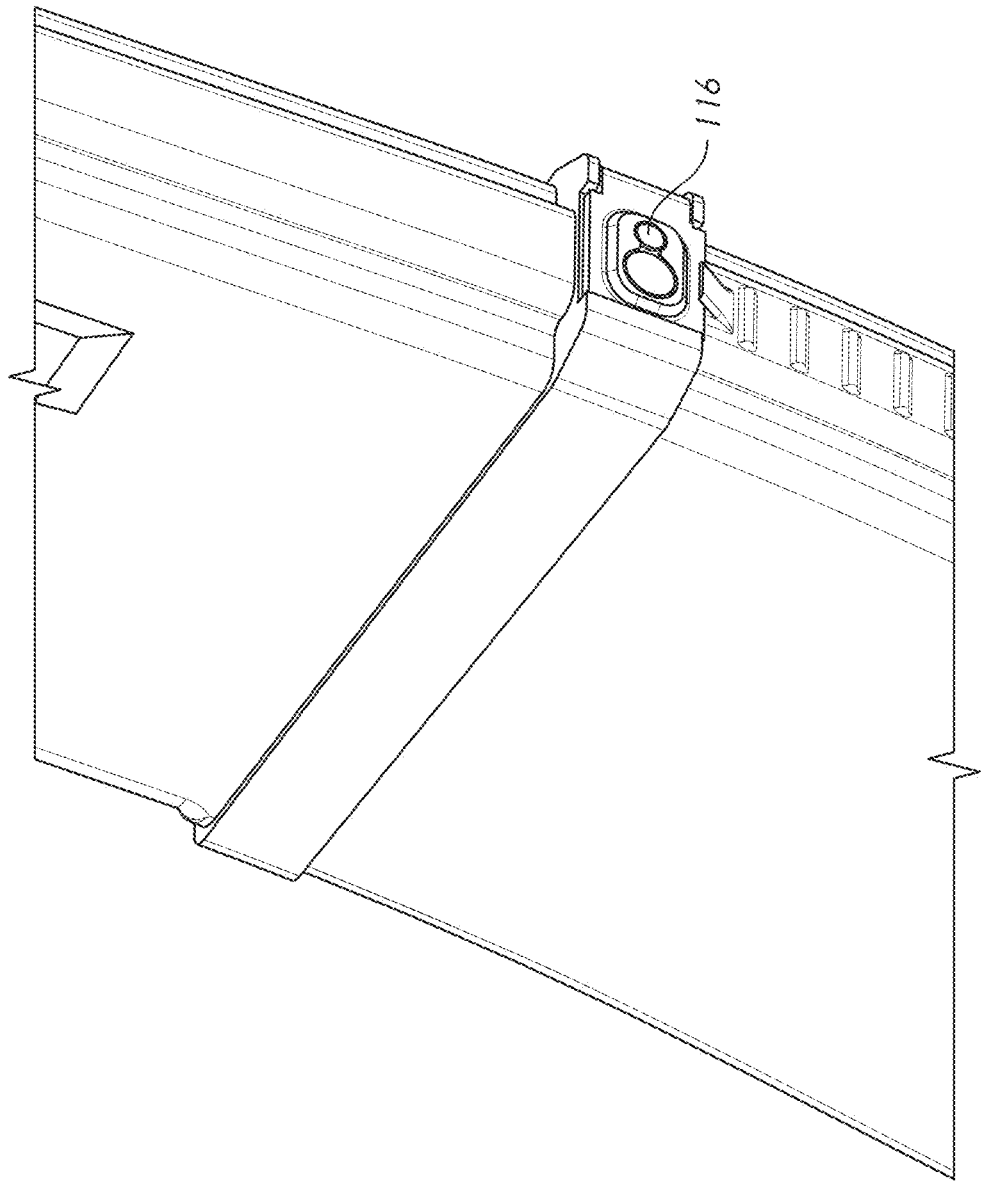
FIG. 9A illustrates an embodiment of a non-contact optical connector included as part of the magazine.

FIG. 9A illustrates an embodiment of a non-contact optical connector 116 included as part of the magazine. The optical transceiver 116 may be positioned at a location that enables the optical transceiver 116 to line up or mate with an optical transceiver included in a weapon that is designed to be used with the magazine 100, or for which the magazine 100 is designed. The optical transceiver 116 is configured to communicate using light and thus, can mate with another optical transceiver without making physical contact. However, in some cases, the optical transceiver 116 may be in physical contact with another optical transceiver to minimize or eliminate potential interference from ambient light.

Further, while there are advantages to using an optical transceiver 116, such as the elimination of breaks in a wire-based communication system, in some embodiments the optical transceiver 116 may be supplemented by or replaced by other types of transceivers, such as a wireless transceiver, or a wire-line transceiver configured to communicate with the weapon when metal contacts included in the transceiver of the magazine contact corresponding metal contacts in a transceiver of the weapon. In some embodiments, the magazine 100 may communicate with a weapon using inductive, electromagnetic, or electrical communication. For example, an alignment of inductive elements may enable a data and/or power transfer between the weapon and the magazine 100. As another example, when the magazine is inserted into the weapon, pins or other contact points of a transceiver on the magazine may align with corresponding pins or contact points on the weapon enabling electrical communication.

In some cases, the transceiver 116 may use near field communications (NFC) and/or radio frequency communication. Alternatively, or in addition, the transceiver 116 may use ultra-wide band communication to reduce the impact of interference on the communications and/or to reduce the chance of eavesdropping. The ultra-wide band communication may communicate over a larger bandwidth than conventional narrowband communication or carrier wave transmission. In some embodiments, the ultra-wide band communication may occur over a bandwidth exceeding 500 MHz. In some embodiments, the transceiver 116 may use spread spectrum communication. Further, in some embodiments, the transceiver 116 may use encrypted communications or a secure channel during communication. In some embodiments, the transceiver 116 may use Bluetooth®, Wi-Fi®, the RADIUS protocol, or any other type of narrow band or wide band communication protocols.

Figure 9B:
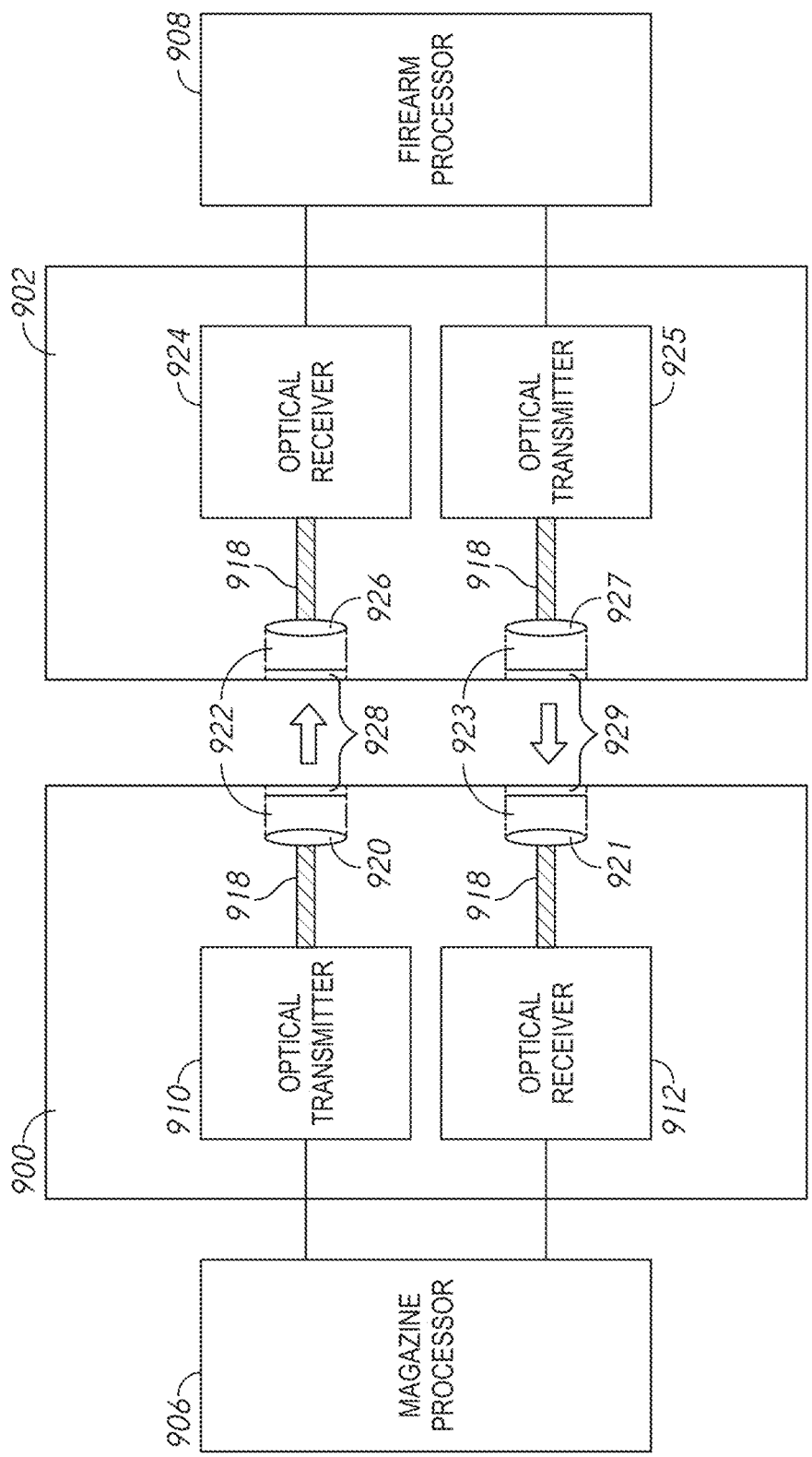
FIG. 9B illustrates an embodiment of a signal convertor within a magazine and a signal converter within a weapon that enables optical communication between the magazine and the weapon.
Figure 16:
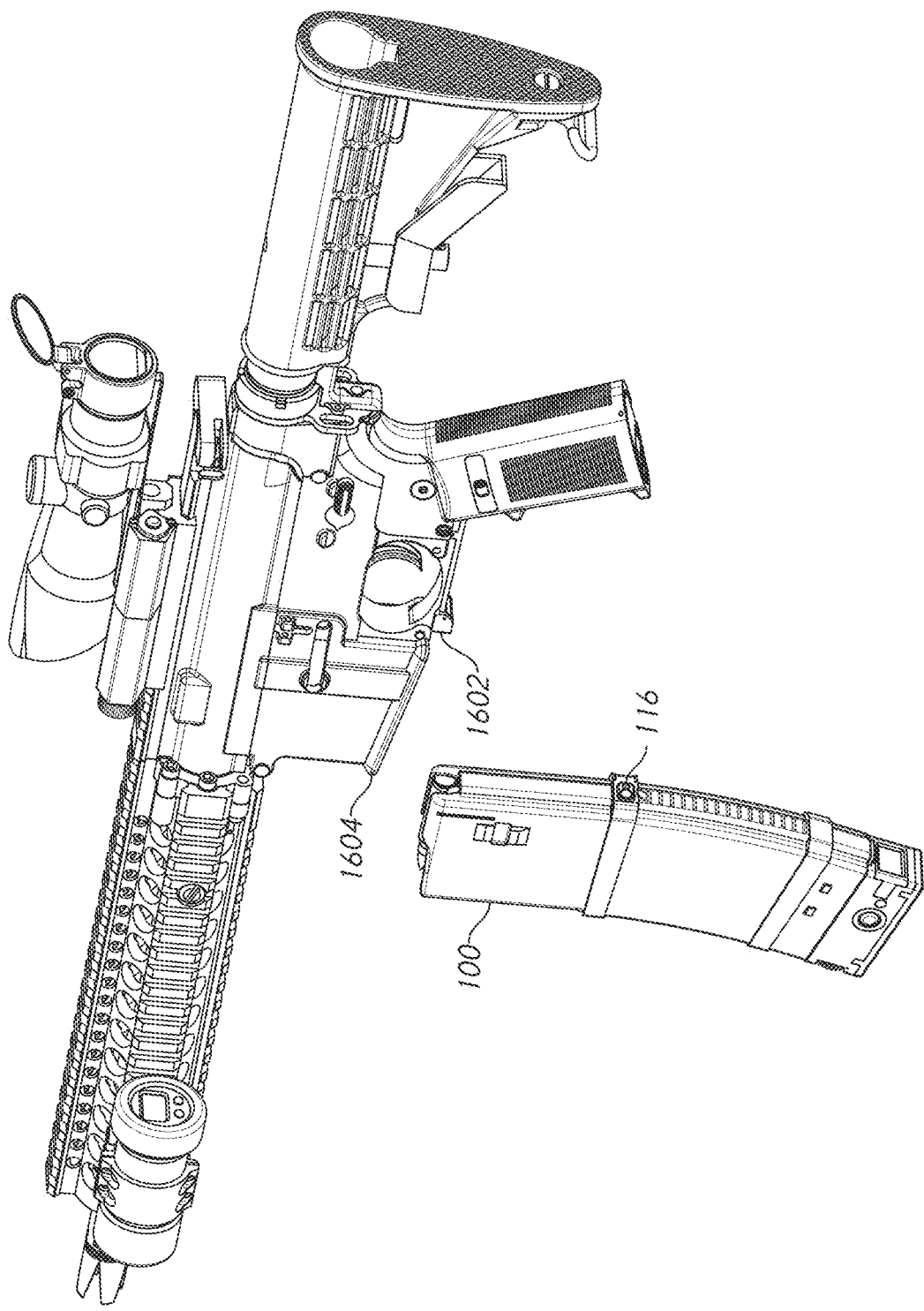
FIG. 16 illustrates a line drawing of the embodiment of the weapon of FIG. 13 and an un-inserted magazine.

FIG. 9B illustrates an embodiment of a signal converter 900 within a magazine and a signal converter 902 within a weapon that enables communication between the optical transceiver 116 of the magazine and an optical transceiver of a weapon, such as the optical transceiver within the lip 1602 described with respect to FIG. 16 below. In certain embodiments, the signal converter 900 may be or may be included as part of the optical transceiver 116.

The signal converter 900 can be configured to convert between electrical digital signals received from a magazine processor 906 and optical digital signals, which can be transmitted optically to a signal converter 902 of a weapon. It should be understood that the reverse process is possible as well. In other words, the signal converter 902 of the weapon may communicate optically with the signal converter 900 of the magazine.

An electrical signal can be passed from a magazine processor 906 to an optical transmitter 910. This electrical signal may be a digital signal used to provide information about the magazine 100 to a weapon. For example, the magazine may communicate a cartridge count to the weapon. The optical transmitter 910 can be configured to convert an electrical digital signal into a corresponding optical digital signal. The optical transmitter 910 can convert electrical signals to optical signals using appropriate techniques, such as, for example, by outputting an optical signal proportional to the input electrical current. The optical transmitter 910 can be any suitable component for converting electrical digital signals to optical digital signals, such as, for example, HXT4101A-DNT manufactured by GigOptix, Inc. of San Jose, CA. The output of the optical transmitter 910 is an optical digital signal that can be coupled to a collimating lens 920.

In some embodiments, an input optical digital signal passes through a focusing lens 921 configured to substantially focus a collimated optical signal onto an optical receiver 912. The focused optical digital signal can be substantially directed and focused onto the optical receiver 912 configured to convert an optical digital signal into a corresponding electrical digital signal. The corresponding electrical digital signal can be provided to the magazine processor 906. This electrical digital signal may be an acknowledgement of the ammunition count, a command to obtain a magazine count, an updated calibration table for a linear encoder of the magazine, or any other command or data that the weapon may supply to a magazine. The optical receiver 912 can convert optical signals to electrical signals using any appropriate technique such as, for example, outputting an electrical current that is proportional to the input power of the optical signal. The optical receiver can be any suitable component for converting optical digital signals to electrical digital signals, such as, for example HXR-4101A-DNT-T manufactured by GigOptix, Inc. of San Jose, CA.

The output optical digital signal output by the optical transmitter 910 can be collimated by collimating lens 920. The collimated optical signal may pass through an output gap 922 before passing through a focusing lens. The collimated optical signal passes through an input gap 923 before being focused by focusing lens 921. In some embodiments, the output and input gaps 922 and 923 can be about 1 mm between lens elements. In some embodiments, the gaps 922 and 923 may be greater than or equal to about 2 mm, less than or equal to about 1 mm, about 0.5 mm, or about 1.5 mm. In some embodiments, the gaps 922 and 923 can have differing distances between lens elements, such as, for example, there can be about 1.5 mm between lens elements 920 and 926 in output gap 922 and there can be about 0.8 mm between lens elements 921 and 927 in input gap 923. In some embodiments, the non-contact optical connection can include transparent windows 928 and 929 of the signal converter 900 that are configured to have an exterior surface that is substantially aligned with an exterior surface of the corresponding transparent windows 928 and 929 of the signal converter 902. The transparent windows 928 and 929 can be configured to be substantially transmissive for wavelengths that correspond to wavelengths of light used in the optical-transceiver 918 of the magazine and the weapon. The transparent windows 928 and 929 can be treated with coatings to make them more durable, scratch resistant, hydrophobic, polarized, filtered, and the like. The transparent windows 928 and 929 can provide a protective surface for the lens elements 920, 921, 926 and 927. The transparent windows 928 and 929 can provide a surface that is cleaned with relative ease to maintain optical coupling between components of the magazine and the weapon.

In some embodiments, the signal converters 900 and 902 may include power connectors and power transmission lines that can optionally be used to supply power to the magazine and/or to the weapon. In some such embodiments, the power may be used to power a processor in the magazine or the weapon. Alternatively, or in addition, the power may be used to charge a battery in the magazine or the weapon.

In certain embodiments, the magazine processor 906 of the magazine may be the electronic circuitry 122 or may be included in the electronic circuitry 122 of the magazine 100. The magazine processor 906 may be an FPGA, a microprocessor, or a custom processor configured to at least determine the ammunition count for cartridges inserted into the magazine 100. Further, the magazine processor 906 may control a display of the magazine 100.

Figure 20:
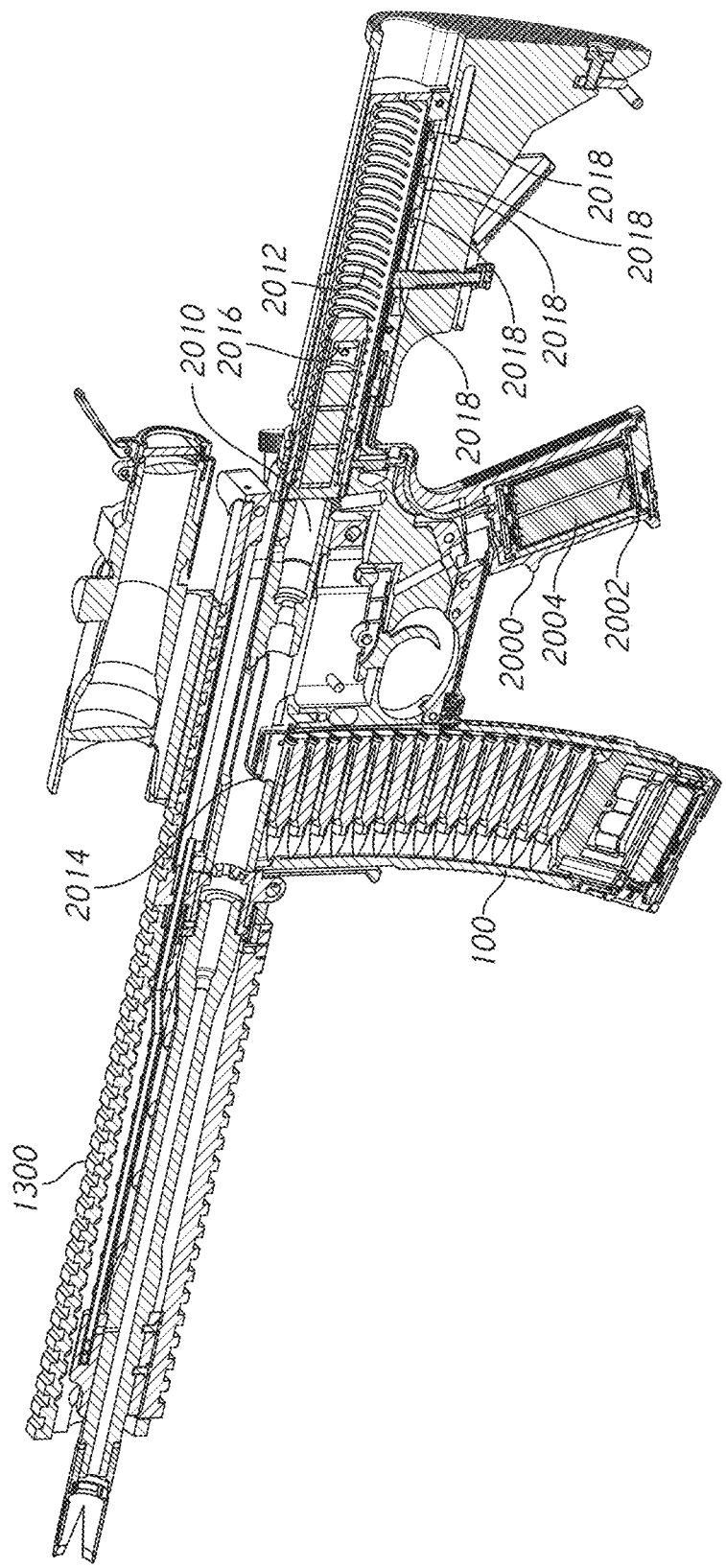
FIG. 20 illustrates a cross-section of an embodiment of the weapon with the magazine installed.

The firearm processor 908 of the weapon may be or may be included in the electronic circuitry 2002 described in more detail in FIG. 20. The firearm processor 908 may be an FPGA, a microprocessor, or a custom processor configured to perform one or more of the embodiments described herein. Further, the firearm processor 908 may determine a number of cartridges registered to the firearm or weapon via the inclusion of the cartridges in one or more magazines registered with the firearm or weapon. In some embodiments, the firearm processor 908 may determine whether a cartridge is loaded within a chamber of the firearm. In addition, the firearm processor 908 may determine whether the firearm is jammed.

Example Magazine Display

FIG. 10 illustrates an embodiment of a display 124 included as part of the magazine. The display 124 is positioned at the bottom of the side of the magazine 100 that faces the user so that the user can view the display 124 while creating minimal interference with the chamber that includes the cartridges and to prevent blockage from the weapon when the magazine 100 is inserted into the weapon. However, the location of the display 124 is not limited as such and may be positioned elsewhere on the magazine 100. For example, the display 124 may be positioned closer to the optical transceiver 116 (see FIG. 7) so that the display 124 is closer to eye level with a user when the user is using the weapon. In some cases, the display 124 may extend outwards from the housing 102 providing room for installation of the display 124 without interfering with the placement of cartridges within the magazine 100.

As illustrated in FIG. 10, the display 124 may be inset. Advantageously, in certain embodiments, the inset display 124 can improve visibility to the user while reducing visibility of the display 124 by other observers, such as enemy combatants. Further, the display 124 may comprise an LED display, an LCD display, an OLED display, a touchscreen display, or any other type of display. Moreover, the display 124 may display one or more data items to a user. For example, the display 124 may display a number of cartridges within the magazine, a number of cartridges fired from the magazine, a number of shots fired by the weapon, a number of magazines available to the user, a jam state of the weapon, whether a cartridge is within a chamber of the weapon, and any other information relating to the status of the magazine loaded in the weapon, magazines available to the user, and/or the weapon itself. In some embodiments, the display 124 may be optional and/or may supplement an additional display associated with the weapon and/or other gear (e.g., a helmet or goggles) of the user.

In certain embodiments, the output of the number of cartridges within a magazine, or a number of cartridges available to a user across magazines, maybe an auditory output that is received via a user's radio or headset. In some cases, the user may receive both a visual and audio indicator of the number of cartridges available.

Example Magazine Circuitry

Figure 11A:
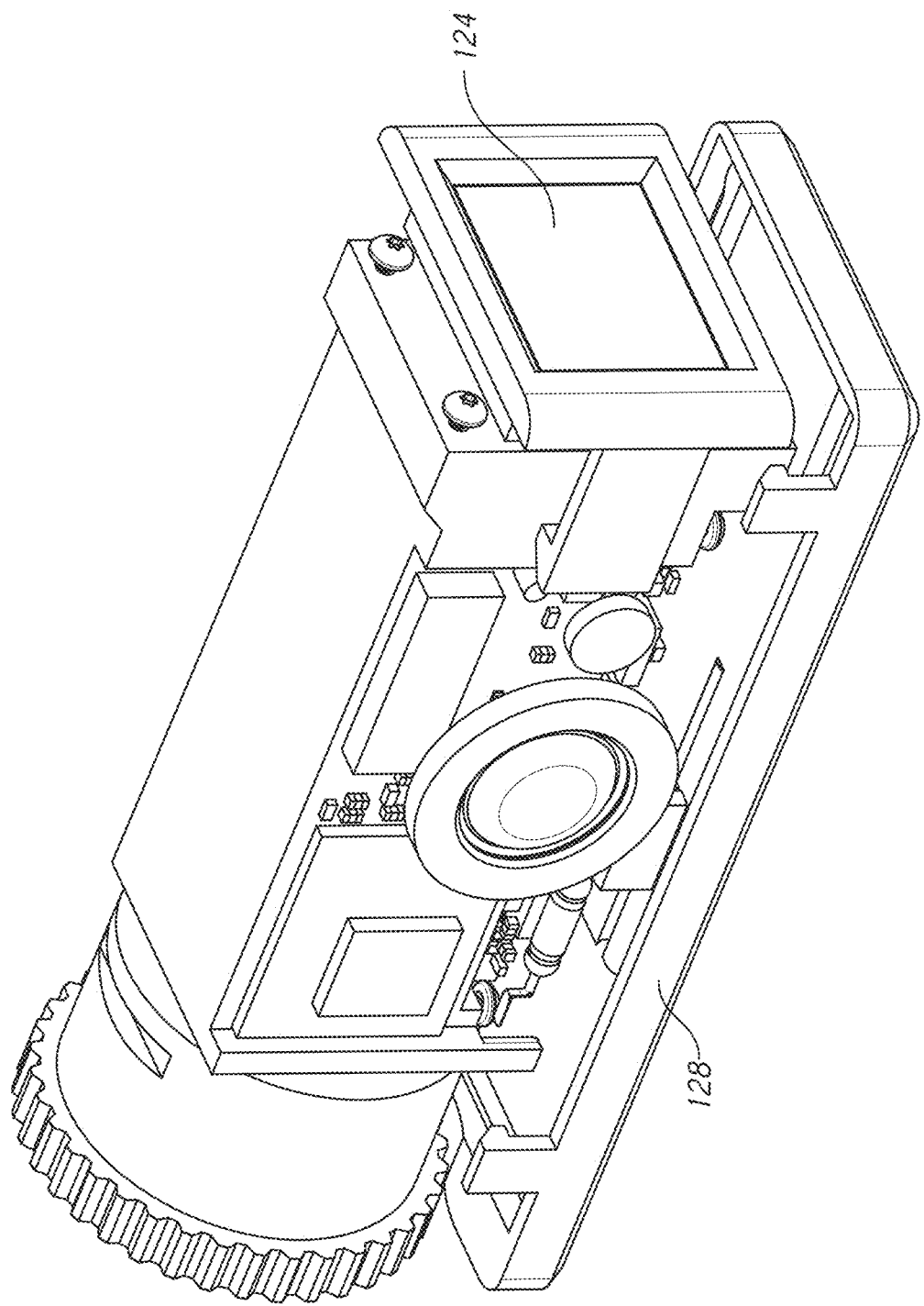
FIG. 11A illustrates an embodiment of the electronic circuit and display included as part of the magazine.
Figure 11B:
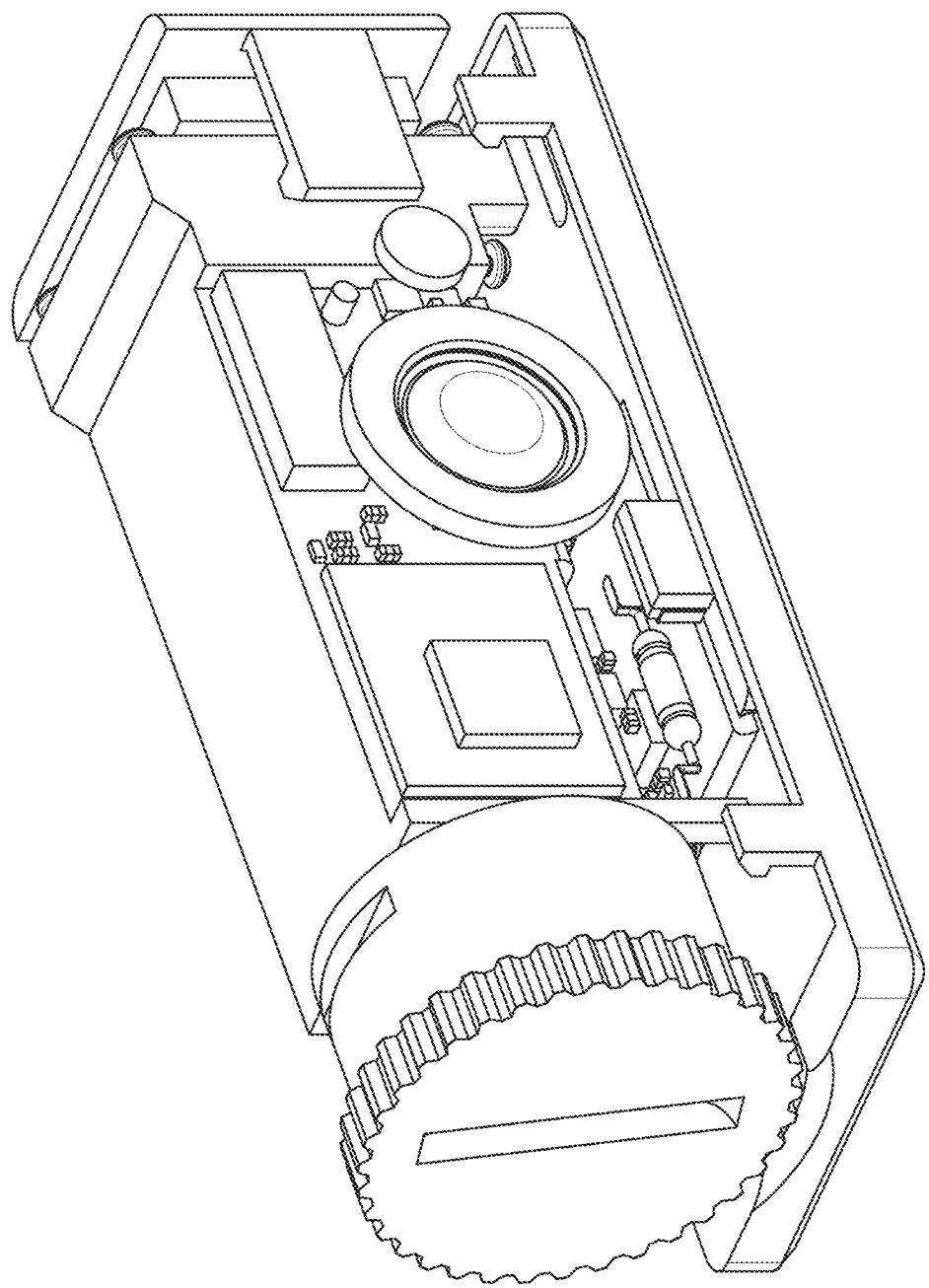
FIG. 11B illustrates an alternative view of the embodiment of the electronic circuit and display of FIG. 11A.

FIG. 11A illustrates an embodiment of the electronic circuitry 122 and display 124 included as part of the magazine. As illustrated, the electronic circuitry 122 may be fit into the base or cap 128 of the magazine. FIG. 11B illustrates an alternative view of the embodiment of the electronic circuitry 122 and display of FIG. 11A. As previously illustrated with respect to FIG. 1, the battery 126 may be or may be shaped as an AA or AAA battery. Alternatively, the battery may be a discus or circular shaped battery, similar to a watch battery in shape. The battery may be a lithium-ion battery, an alkaline battery, a nickel cadmium battery, a nickel metal hydride battery, or any other type of battery. In some cases, the battery may be a rechargeable battery. In embodiments where the battery is a rechargeable battery, the battery may be recharged by placing the magazine on a recharger or a charging pad. In some embodiments, the battery may be removed from the magazine for replacement or charging purposes. In other embodiments, the battery may not be removed from the magazine. For example, in some cases, the electronics of the magazine may be housed in a waterproof housing, and the battery may be sealed within the housing.

Figure 12:
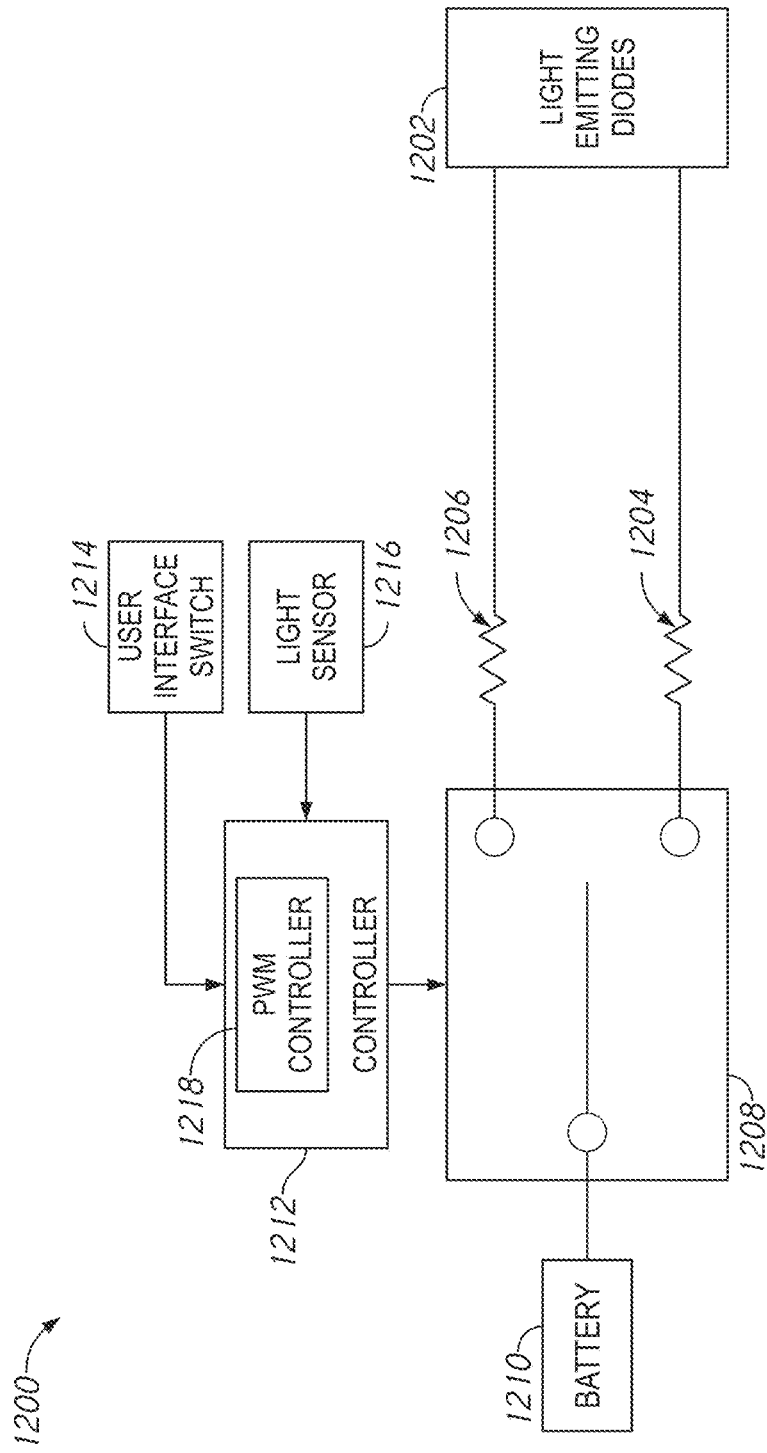
FIG. 12 illustrates an embodiment of a display circuit for a display.

FIG. 12 illustrates an embodiment of a display circuit 1200 for a display. The display may be part of a magazine, a weapon, a scope, or other component of a weapon or weapon system. The display circuit 1200 may be included as part of the display or may be in communication with the display. In some embodiments, the display circuit 1200 may be included as part of the electronic circuitry of the weapon, such as the electronic circuitry 2002 described below with respect to FIG. 20.

The display circuit 1200 may include a plurality of light emitting diodes (LEDs) 1202. Alternatively, or in addition, these light emitting diodes 1202 may be included as part of the display and may be in electrical communication with the display circuit 1200. The LEDs 1202 may include ultra-bright LEDs that are visible when a user is in full daylight. The ultra-bright LEDs 1202 may have a very bright output enabling them to be viewable during the daytime. For example, ultra-bright LEDs 1202 may have a luminosity of 100 millicandelas (mcd), 200 mcd, 300 mcd, 500 mcd, or more, or any range between the foregoing. Further, the ultra-bright LEDs 1202 may be dimmed to a very low level enabling them to be viewed through night vision goggles without interfering with the user's ability to use the night vision goggles. For example, the ultra-bright LEDs 1202 may be configured to consume milliwatts of power during the daytime and may be configured to consume microwatts of power when a user is wearing night vision goggles. Further, the ultra-bright LEDs 1202 may be configured to output light and varying degrees of magnitude. Thus, there may be one brightness level during a sunny day, another brightness level during a cloudy day, another brightness level at night, and another brightness level when a user is wearing night vision goggles. In some embodiments, the LEDs 1202 may be dual-mode or multi-mode LEDs that are capable of functioning at different levels of brightness based at least in part on an amount of power received and/or on a control signal. In other words, the LEDs 1202 may provide different brightness outputs based at least in part on the amount of power received.

In certain embodiments, the LEDs 1202 are configured to provide a seven segment display. Further, the LEDs 1202 may display multiple numbers. In some embodiments, the LEDs 1202 may be configured to display characters and/or symbols instead of or in addition to the numbers.

The display circuit 1200 may control the LEDs 1202 to make them viewable during the daytime, at nighttime, or as previously described when a user is wearing a vision goggles. To enable the different viewable modes, the display circuit 1200 includes multiple resistor paths or other current driving device that are in communication with a battery 1210. For example, the display circuit 1200 may include two resistor paths: a first path that includes the resistor 1204 and a second path that includes resistor 1206. The resistor 1204 may be relatively small resistor (e.g., a 10, 20, 50, or 100 ohm (Ω) resistor, or any value between the foregoing resistances) compared to the resistor 1206 which may be a relatively large resistor (e.g., a 1, 2, 10, or 50 mega-ohm (MΩ) resistor, or any value between the foregoing resistances). Further, the display circuit 1200 may include a switch 1208 that may connect the battery 1210 to the light emitting diodes 1202 via the path that includes the resistor 1206 or the path includes the resistor 1204.

In certain embodiments, when a user is not wearing night vision goggles, the LEDs 1202 may be connected to the battery 1210 via the path that includes the smaller resistor 1204 resulting in a brighter output compared to when the LEDs 1202 are connected to the battery 1210 via the path that includes the larger resistor 1206. In contrast, when it is determined that the user is wearing night vision goggles, LEDs 1202 may be connected to the battery 1210 via the path includes the larger resistor 1206 resulting in a dimmer output compared to the when the LEDs 1202 are connected to the battery 1210 via the path includes the smaller resistor 1204. In some embodiments, the display circuit 1200 may include additional resistor paths or other driver circuitry that connect the battery 1210 to the light emitting diodes 1202 depending on the brightness of the ambient light and/or whether the user is wearing night vision goggles.

The switch 1208 may select the resistor paths to connect the battery 1210 to the light emitting diodes 1202 based on a control signal received from a controller 1212. The controller 1212 may configure the switch 1208 based on input from a user interface switch 1214. The user interface switch 1214 may enable a user to turn off the light emitting diodes 1202, identify that the user is wearing night vision goggles, or select a brightness auto adjustment mode that automatically selects a resistor path so as to adjust the brightness of the LEDs 1202 based on an ambient light detected by the light sensor 1216.

In some embodiments, the display circuit 1200 may support pulse width modulation (PWM). In some such embodiments, the controller 1212 may include a pulse width modulation (PWM) controller 1218. PWM may be used to set or adjust a duty cycle for the power supplied to the LEDs 1202. In other words, instead of supplying power from the battery 1210 to the LEDs 1202 at a constant level, the PWM controller 1218 can alternate between supplying power and not supplying power to the LEDs 1202. For example, when the display controlled by the display circuit 1202 is activated or turned on, the PWM controller 1218 can alternate equally between supplying and not supplying power to the LEDs 1202 (e.g., 50% duty cycle) for a repeating set of time periods (e.g., a set of clock cycles). As another example, the PWM controller 1218 may supply power 75% of the time (e.g., 75% duty cycle) or 25% of the time (e.g., 25% duty cycle) for a repeating set of time periods (e.g., a set of clock cycles). Advantageously, in certain embodiments, by using PWM, greater control over the brightness of the LEDs 1202 can be achieved. Further, a greater variety of brightness levels can be achieved. Thus, the LEDs 1202 can be made bright or dim based on the amount of sunlight. Further, the LEDs 1202 can be dimmed to very low levels when the user is wearing night vision goggles. In some embodiments, the LEDs 1202 may be dimmed to a level not visible to the human eye, but that is visible to a user wearing night vision goggles. In certain embodiments, the PWM controller 1218 may implement PWM by adjusting the switch 1208 between an open position (as illustrated in FIG. 12) and a closed position with the path that includes the larger resistor 1206 (when in night vision mode) or the smaller resistor 1204 (when not in night vision mode).

In some embodiments, the display circuit 1200 may include a controller for controlling an augmented reality display. In some embodiments, the output of the display may be projected onto a scope generating an augmented reality display interface. In other embodiments, the augmented reality display may be output via another display of the user, such as via the user's goggles or night vision helmet.

In certain embodiments, the magazine may include an accelerometer, a gyroscope, and/or other types of motion sensors that can detect when a user has picked up the magazine or when the magazine is in motion. When it is determined that the magazine is in motion, the magazine circuitry can be transitioned from an off-state to an on-state or from a sleep-mode to an on-state. Transitioning to an on-state may include turning on a processor of the magazine to enable a determination of cartridge count within the magazine. However, in certain embodiments, the display 124 of LEDs 1202 remain unpowered to prevent the emission of light at an undesired time.

Example Weapon System

Figure 13:
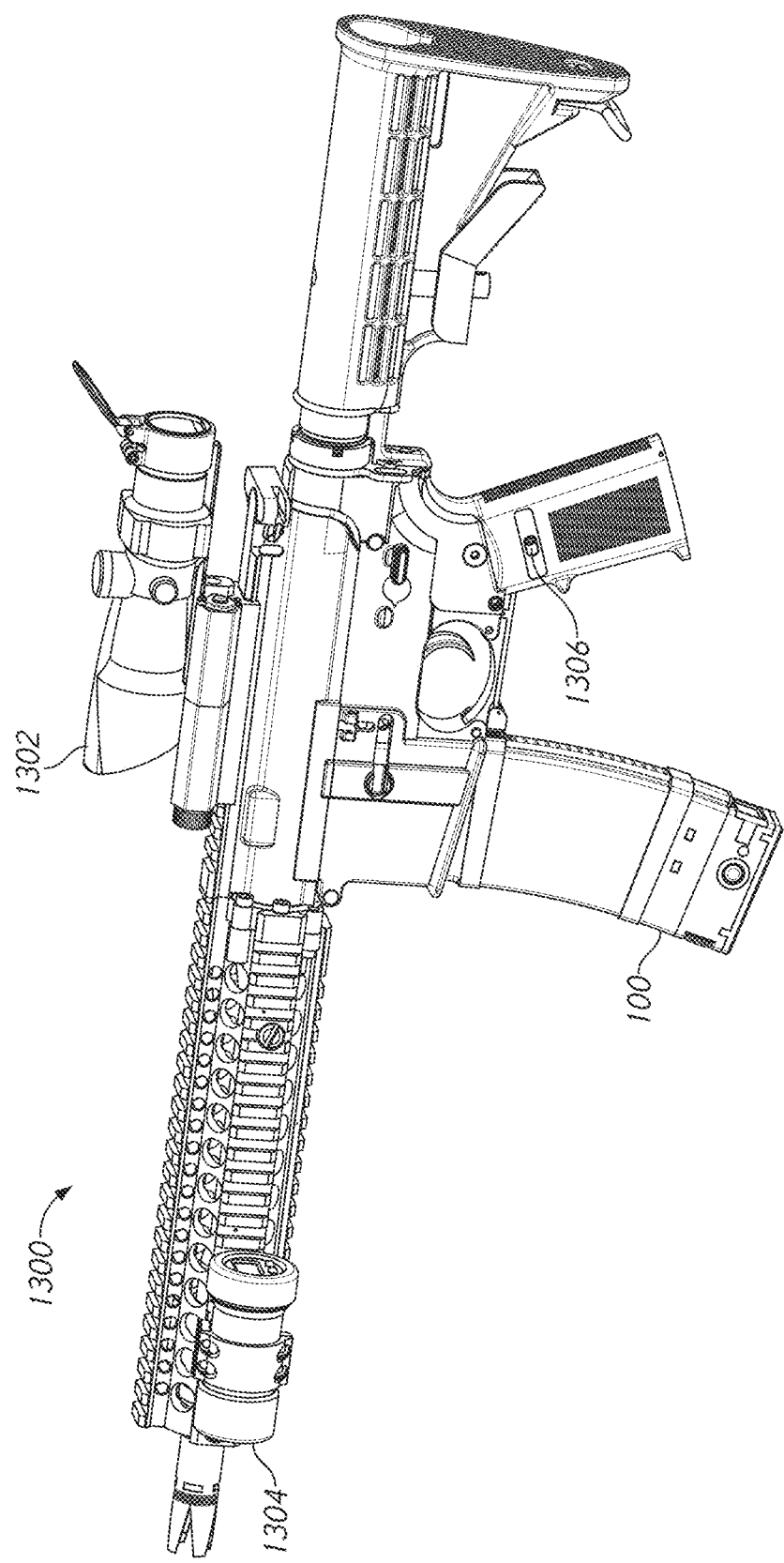
FIG. 13 illustrates an embodiment of a weapon with the magazine inserted.
Figure 14:
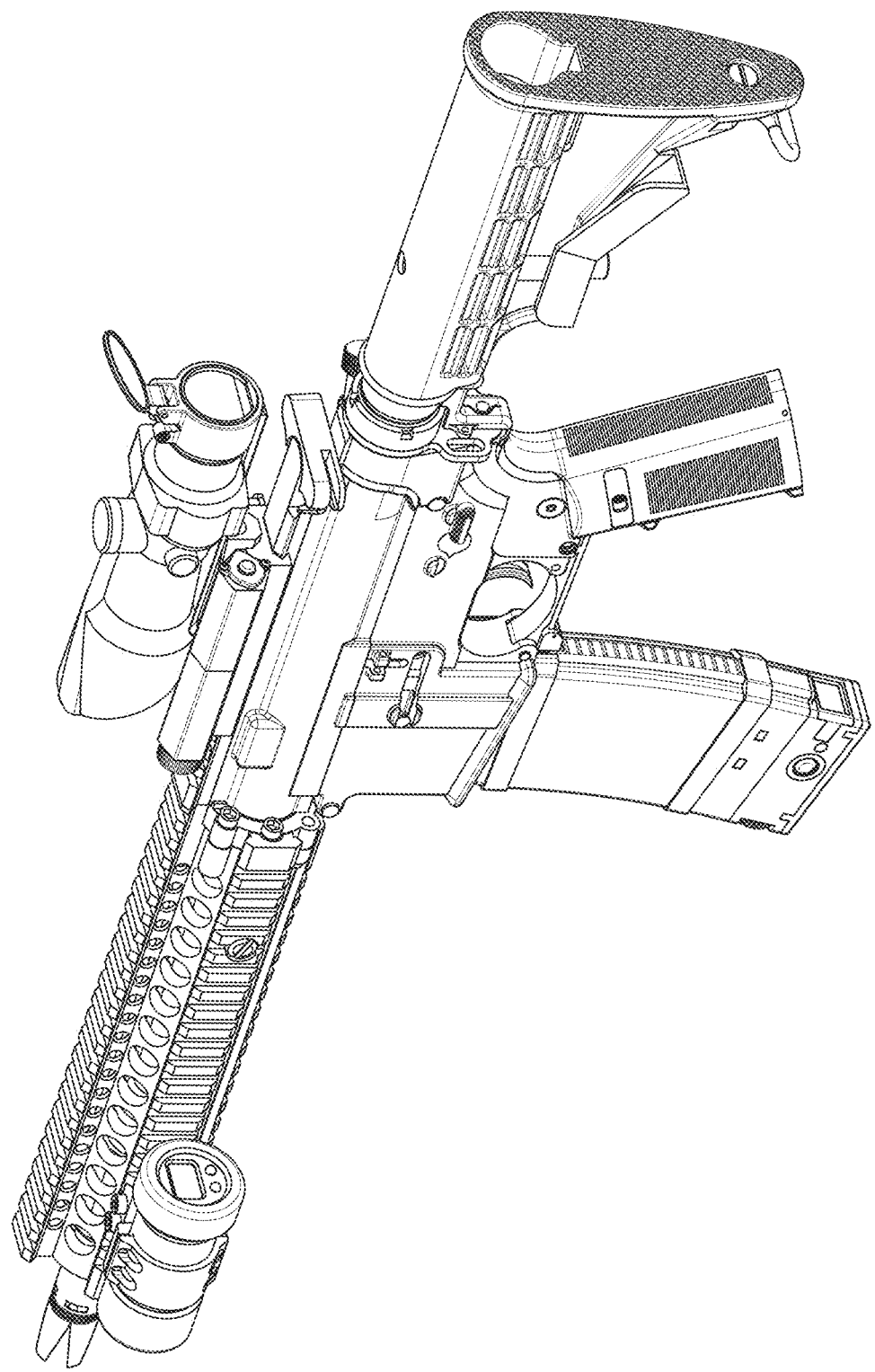
FIG. 14 illustrates a modified view of the embodiment of the weapon of FIG. 13.

FIG. 13 illustrates an embodiment of a weapon 1300 with the magazine 100 inserted. FIG. 14 illustrates a modified view of the embodiment of the weapon of FIG. 13. Referring to FIG. 13, the weapon may optionally include a scope 1302 and/or a rail mounted display 1304. In certain embodiments, the scope 1302 and/or display 1304 may present a user with some or all of the information that can be displayed on the display 124. Further, in some cases, the scope 1302 and/or display 1304 may display additional and/or complementary information from what is displayed on the display 124 and/or another display. For example, the display 124 may display the amount of cartridges within the magazine 100, the scope 1302 may display the amount of cartridges within the loaded magazine and the number of magazines available to the user, and the display 1304 may display the number of shots fired.

Electronics for controlling the additional displays, such as the scope 1302 and the display 1304 may be located within the handle of the weapon 1300. The handle, which may also be referred to as a grip or pistol grip, may include a control 1306 for activating or deactivating electronics included in the weapon 1300. Further, the control 1306 may be used to cycle between different display options including the data to display and the display sources (e.g., the scope 1302 or the display 1304). In some cases, the control 1306 may also control the display 124 of the magazine 100.

To display data and to control the various display sources, the weapon 1300 may include one or more optical transceivers, similar to the optical transceiver 116 of the magazine 100. Cables or wires may be used to communicate between the electronics within the handle of the weapon 1300 and various connection points in the weapon 1300 that enables accessories connected to the weapon 1300 to serve as display devices. For example, a cable may connect the electronics to an optical transceiver that communicates with a transceiver on the scope 1302.

Figure 15:
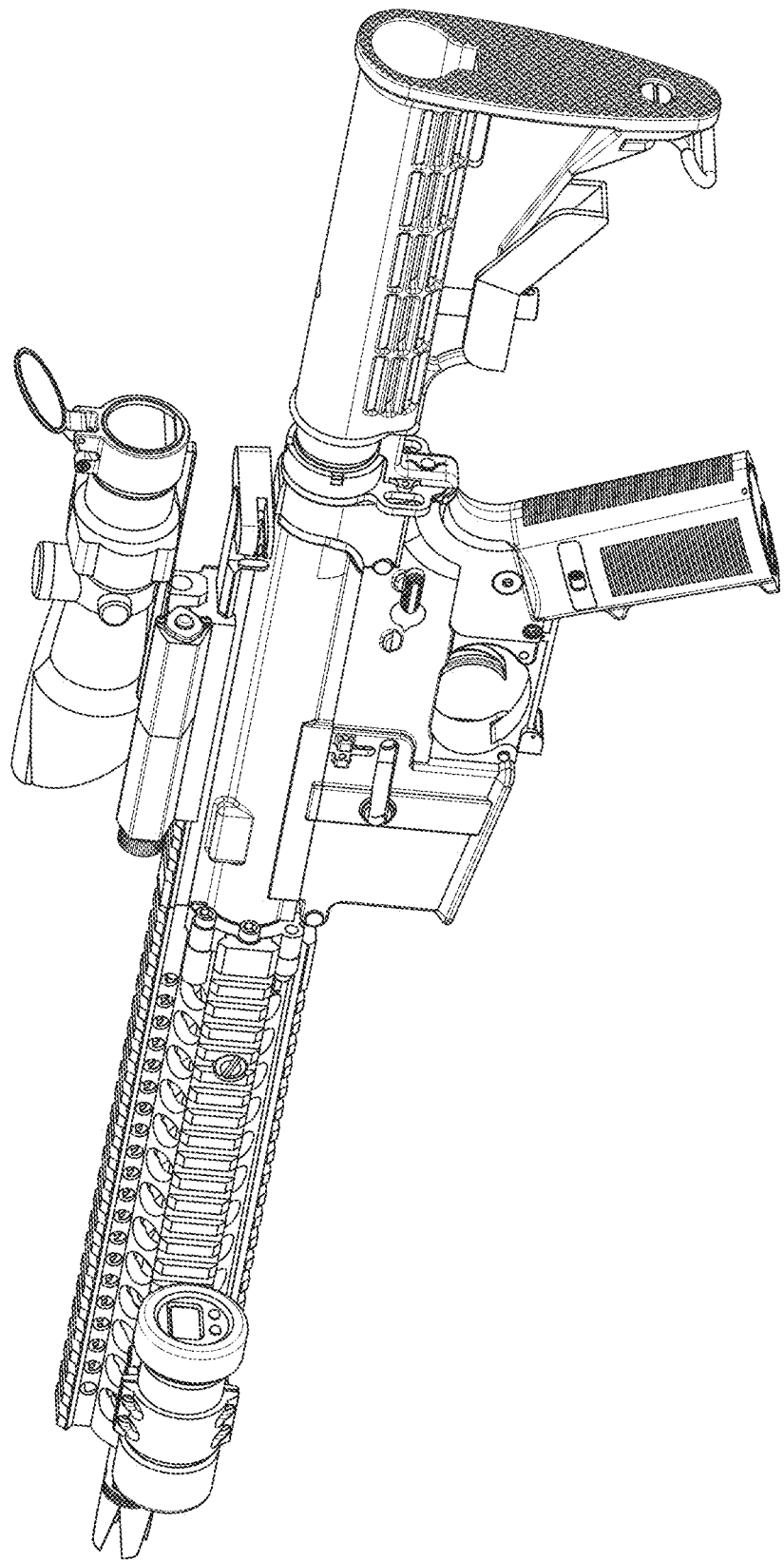
FIG. 15 illustrates a line drawing of the embodiment of the weapon of FIG. 13 without the inserted magazine.

FIG. 15 illustrates a line drawing of the embodiment of the weapon of FIG. 13 without the inserted magazine. FIG. 16 illustrates a line drawing of the embodiment of the weapon of FIG. 13 and an un-inserted magazine. As can be seen with respect to FIG. 16, the weapon includes a lip 1602 that extends from the insertion port 1604 where the magazine 100 is inserted into the weapon 1300. The lip 1602 and the magazine 100 may be designed to align the optical transceiver 116 of the magazine 100 and an optical transceiver that may be included in the lip 1602 of the weapon 1300. The mating of the optical transceiver 116 and the transceiver in the lip 1602 of the weapon 1300 can be seen in FIG. 17, which illustrates an embodiment of the weapon handle of the weapon 1300 and the magazine 100. In some embodiments, the optical transceiver 116 may be configured to communicate using infrared communications. Alternatively, or in addition, the optical transceiver 160 may be configured to communicate using other optical or frequency communication bands.

In certain embodiments, as previously described with respect to the optical transceiver 116, the transceiver included in the lip 1602 may be a contactless transceiver. Further, in some implementations of the weapon 1300, the transceiver included in the lip 1602 may be a non-optical transceiver, such as a near field communications (NFC) reader.

In some embodiments, the weapon 1300 may further include an optical scanner that can scan or otherwise access a machine-readable code included on the magazine 100. The weapon 1300 can register one or more magazines by scanning the machine-readable code included on each magazine. Alternatively, the weapon 1300 can access an RFID tag on the magazine to register the magazine. Once the magazine has been registered with the weapon 1300, the weapon 1300 can monitor the status of the magazine, such as whether the magazine has been inserted into the weapon, whether the magazine is empty, or the number of cartridges included in the magazine. In some cases, the weapon 1300 may use near-field communication, Bluetooth™, Wi-Fi™, or any other type of communication to communicate with one or more magazines within a particular distance of the weapon 1300.

In some embodiments, the weapon 1300 can receive one or more status signals from one or more magazines registered with the weapon. Advantageously, in certain embodiments, the weapon 1300 can aggregate the information received in the status signals to determine a status of a user's total ammunition. For example, the weapon 1300 can determine and present to the user a total quantity of ammunition available to the user, the total number of magazines available to the user, the number of loaded and/or empty magazines in the user's gear, etc.

Figure 18:
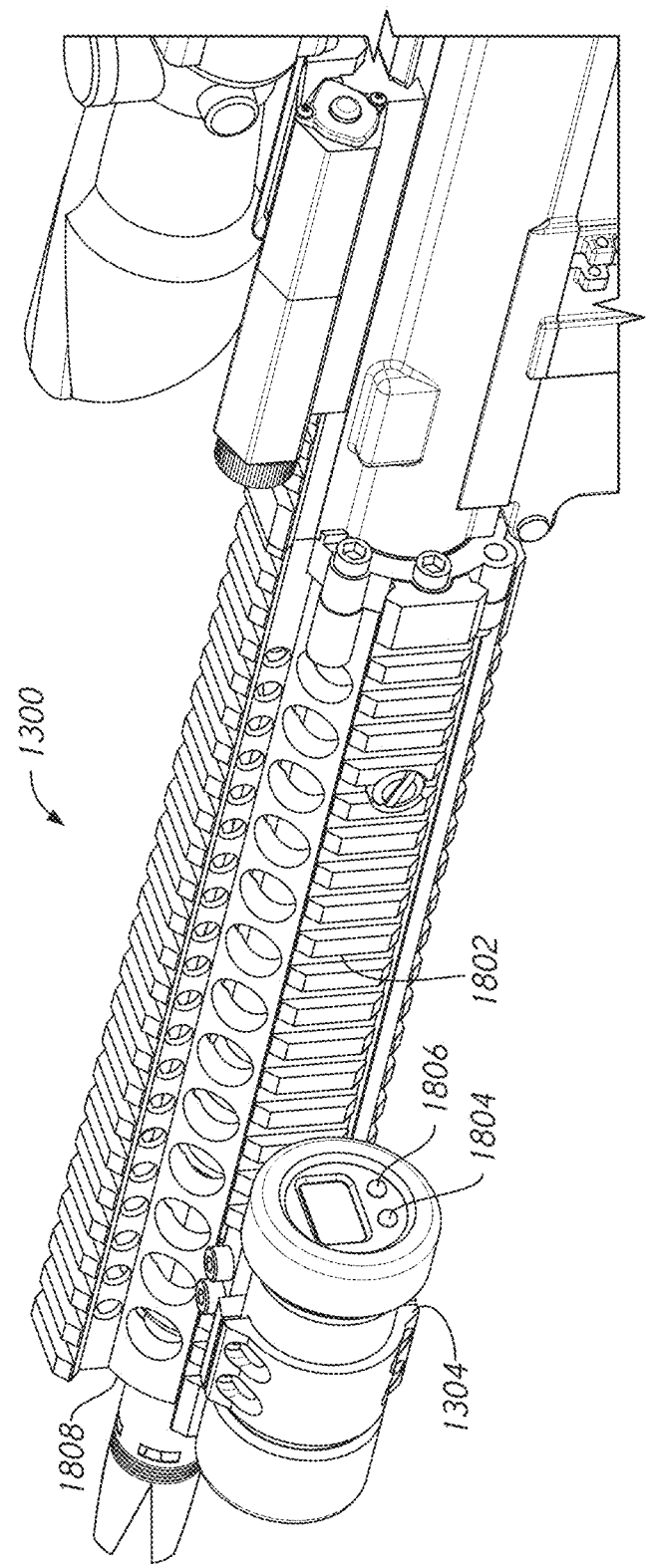
FIG. 18 illustrates an embodiment of the ammunition status display attached to a rail of the weapon.
Figure 19:
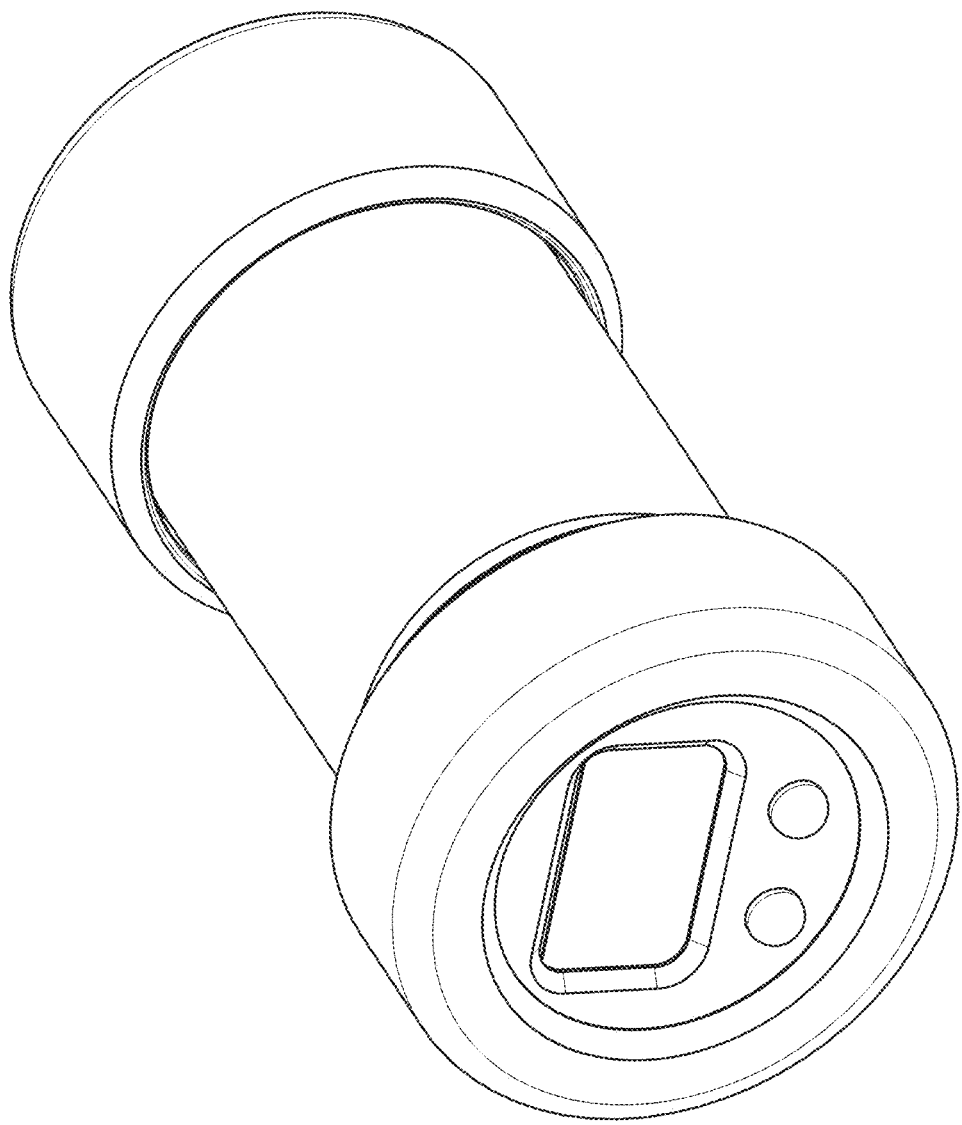
FIG. 19 illustrates an embodiment of the ammunition status display separate from the weapon.

FIG. 18 illustrates an embodiment of the ammunition status display 1304 attached to a rail 1802 of the weapon 1300. FIG. 19 illustrates an embodiment of the ammunition status display 1304 separate from the weapon 1300. It should be understood that the display 1304 may be attached to other locations of the weapon 1300. The display 1304 may include a number of controls 1804 and 1806 for configuring the data that is presented on the display 1304. For example, the display 1304 may present a count of shots fired, a count of ammunition available, and/or a count of ammunition within a loaded magazine. Further, the display 1304 may include circuitry for detecting when shots have been fired. For example, the display 1304 may include circuitry for detecting vibrations within the barrel 1808 of the weapon 1300 and/or audio from a bullet being fired. Using the detected vibrations and/or audio, the display 1304 can count shots fired.

Example Weapon Internals

Figure 21:
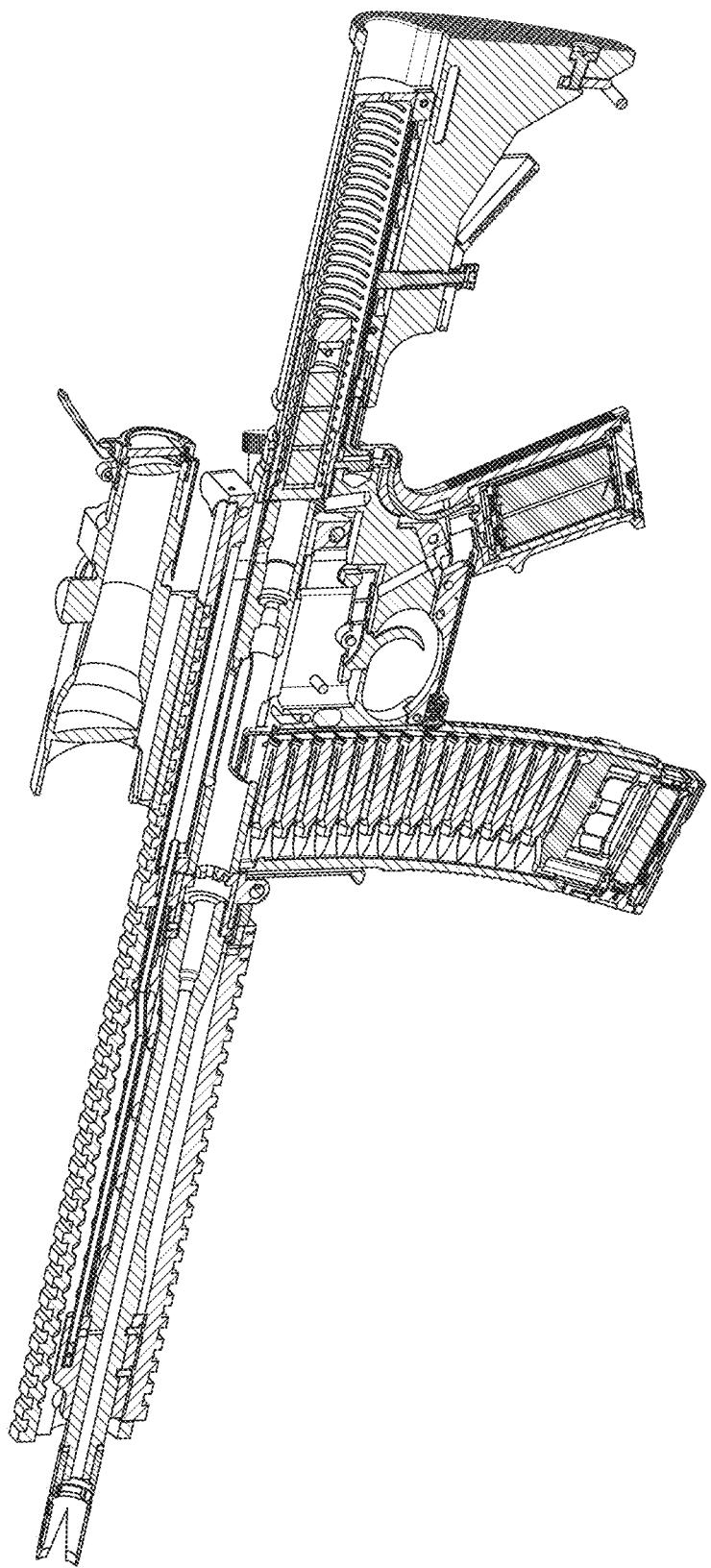
FIG. 21 illustrates a line drawing of the cross-section of the embodiment of the weapon of FIG. 20 with the magazine installed.

FIG. 20 illustrates a cross-section of an embodiment of the weapon 1300 with the magazine 100 installed. FIG. 21 illustrates a line drawing of the cross-section of the embodiment of the weapon of FIG. 20 with the magazine installed. Referring to FIG. 20, as illustrated, the handle 2000 may include electronic circuitry 2002 that can process data received from the magazine 100. This electronic circuitry 2002 may be powered by a battery 2004 (or plurality of batteries) that can be installed in the handle. In certain embodiments, the battery 2004 may also power the electronic circuitry included in the magazine 100. In some such embodiments, the battery 126 of the magazine 100 may be optional or omitted. In other embodiments, the battery 2004 may be used to charge the battery 126 and/or vice versa. The battery within the weapon used to power the electronic circuitry 2002 may be of the same type as the battery in the magazine 100. In other cases, the battery used for the weapon may differ from the battery used for the magazine 100.

In addition to processing data relating to the amount of cartridges within the magazine 100, the electronic circuitry 2002 can track a number of magazines available to a user; the status of the magazines, such as cartridges per magazine, empty or full status, etc.; the number of rounds fired since a particular time, such as per day, during a particular mission, since manufactured, etc.; and the position of a bolt 2010 within a buffer tube 2012. In some embodiments, the electronic circuitry 2002 may include a transmitter for transmitting some or all of the data to a display that is separate from the weapon 1300. For example, the data may be transmitted to a heads up display (HUD) within a helmet or goggles of a user. In some embodiments, data may be transmitted to a command center enabling a commanding officer to monitor ammunition count of soldiers, or other users, in the field or during a mission.

In certain embodiments, electronic circuitry 2002 of the weapon may be configured to determine a number of shots fired by the weapon. The electronic circuitry 2002 may determine the number of shots fired by tracking a change in the cartridges available to the user. For example, if it is determined that a magazine has 12 cartridges at the first point in time and at a second point in time it is determined that the magazine has 5 cartridges, the electronic circuitry 2002 may determine that seven cartridges have been fired by the weapon. However, if electronic circuitry 2002 determines a change in the cartridges available in a magazine that is not inserted into the weapon, the electronic circuitry 2002 may determine that a user has added or removed cartridges without firing the cartridges from the weapon. Similarly, if electronic circuitry 2002 determines that the magazine is no longer registered to the weapon, the total count of cartridges available to the user may be reduced without increasing a shot count for the weapon. In some embodiments, the electronic circuitry 2002 may determine the number of shots fired based at least in part on the number of measured movements of a bolt in the weapon. The bolt may include a cylinder, a rod, or other movable portion of the weapon located within a buffer tube. In certain embodiments, the movement of the bolt can be used to open or close the chamber of the weapon. Further, movement of the bolt may facilitate loading a cartridge into a chamber and/or expelling a spent cartridge from the chamber or the weapon. If the bolt is moved, but a trigger is not pulled, electronic circuitry 2002 may determine that a shot was not fired despite movement of the bolt. Similarly, if the bolt is moved, but a magazine has not been inserted into the weapon or a magazine inserted into the weapon has no cartridges, the electronic circuitry 2002 may determine that a shot was not fired despite movement of the bolt.

In some embodiments, the electronic circuitry 2002 may be configured to communicate with different magazines to obtain a total count of magazines registered with the weapon. The electronic circuitry 2002 may include a wireless transceiver to communicate with the magazines registered with the weapon. This wireless transceiver may use ultra-wideband communications to reduce the possibility of interference by other systems or users and/or to reduce the possibility that the communications are captured by other systems or users. In some embodiments, the communication may be encrypted or use a secure channel. Further, communication between the weapon and systems of another user or a command center may be encrypted. Thus, in some instances, electronic circuitry 2002 of the weapon of one user may use encrypted ultra-wide band communication to communicate with a system of another user or a computing system at a command center.

In some implementations of the magazine 100, data may be transmitted from the magazine 100 to a display that is separate from the magazine 100 and the weapon 1300. For example, as described above with respect to the electronic circuitry 2002 in the handle 2000, data from the magazine 100 may be transmitted to a HUD in a helmet or eyewear.

As previously described, the magazine 100 and/or weapon 1300 can track ammunition within the magazine 100. Further, the electronic circuitry 2002 can determine whether a cartridge or bullet is loaded into a chamber 2014 of the weapon 1300. The weapon 1300 may include a magnet 2016 positioned within the buffer tube 2012. Further, the weapon 1300 may include one or more Hall effect sensors 2018 within the buffer tube 2012. The Hall effect sensors 2018 can be used to determine a location of the magnet 2016 within the buffer tube 2012. Using the location of the magnet 2016, the electronic circuitry 2002 can determine whether a cartridge has been loaded into the chamber 2014. Similar to the electronic circuitry 122, the electronic circuitry 2002 may include a hardware processor, or programmable hardware, and may be configured to perform one or more of the processes described herein.

In some cases, a user may insert a magazine 100 that includes the features disclosed herein for determining a cartridge count into a traditional weapon that does not include the features disclosed herein. Although the magazine 100 can still determine the cartridge count in the magazine, the weapon may be unable to communicate whether a cartridge is loaded into the buffer tube. To prevent a user from obtaining a false reading of the cartridge count within the weapon (e.g., the cartridges in the magazine combined with the cartridge, if any, in the buffer tube), a button or other deactivation trigger may be positioned on the magazine 100. When the magazine 100 is inserted into a weapon that does not include the capability of detecting a cartridge in the buffer tube, the button or other deactivation trigger may be activated causing the electronics of the magazine 100 to be deactivated. This button may be positioned such that when the magazine 100 is inserted into the weapon, a portion of the weapon presses against the button. For example, the button may be positioned near the top of the magazine such that the button is inserted within the weapon along with the magazine and is pressed against an inner surface of the insertion port of the weapon.

Accordingly, a user will not obtain a cartridge count of cartridges within the weapon. To determine the number of cartridges within the magazine, a user can eject the magazine 100 and reactivate the circuitry to determine the cartridge count within the magazine 100. The circuitry may automatically be reactivated when the magazine is ejected as the button, or other deactivation trigger, will no longer be in contact with the weapon.

A weapon configured to detect a cartridge in a chamber may be configured to not press against the button of the magazine thereby preventing the cartridge count circuitry from being deactivate. For example, the insertion port may include a gap or notch that prevents the button on the magazine from being depressed. As an alternative, the circuitry of the weapon may communicate its functionality to the circuitry of the magazine. Upon receipt of a message form the weapon that it is capable of detecting a cartridge in the chamber, the magazine may activate its cartridge counting capabilities. In some embodiments, the control interface of the magazine can be positioned on a portion of the magazine that is inaccessible to the user when the magazine is inserted into the firearm.

In some embodiments, the electronic circuitry 2002 may track a number of times a weapon has been fired. Accordingly, the electronic circuitry 2002 may provide maintenance information to a user or maintenance warnings alerting the user when one or more portions of the weapon should be serviced. In some cases, the electronic circuitry 2002 may track a number of times a weapon is by an fired since the weapon, or a portion thereof, was last serviced.

The electronic circuitry 2002 may be capable of processing auxiliary data received from auxiliary sources and/or output to auxiliary systems. For example, the weapon 1300 may include a receiver or transceiver that can receive information from a range finder or a global positioning system (e.g., GPS). This information may be provided on a display, such as one integrated with a scope of the weapon. Thus, a user can view the cartridges available to the user in one or more magazines, a position of the user within a geographic area, and a distance to a target. Advantageously, by displaying the auxiliary information on a scope of the weapon, a user can obtain or view the information without removing his or her focus from a potential target. In another example, the weapon 1300 may communicate information obtained by the weapon 1300 or determined by the electronic circuitry 2002 to a radio of the user for transmission to another user, such as a unit leader or commander. For instance, an ammunition count may be communicated over the radio to a user.

Figure 22:
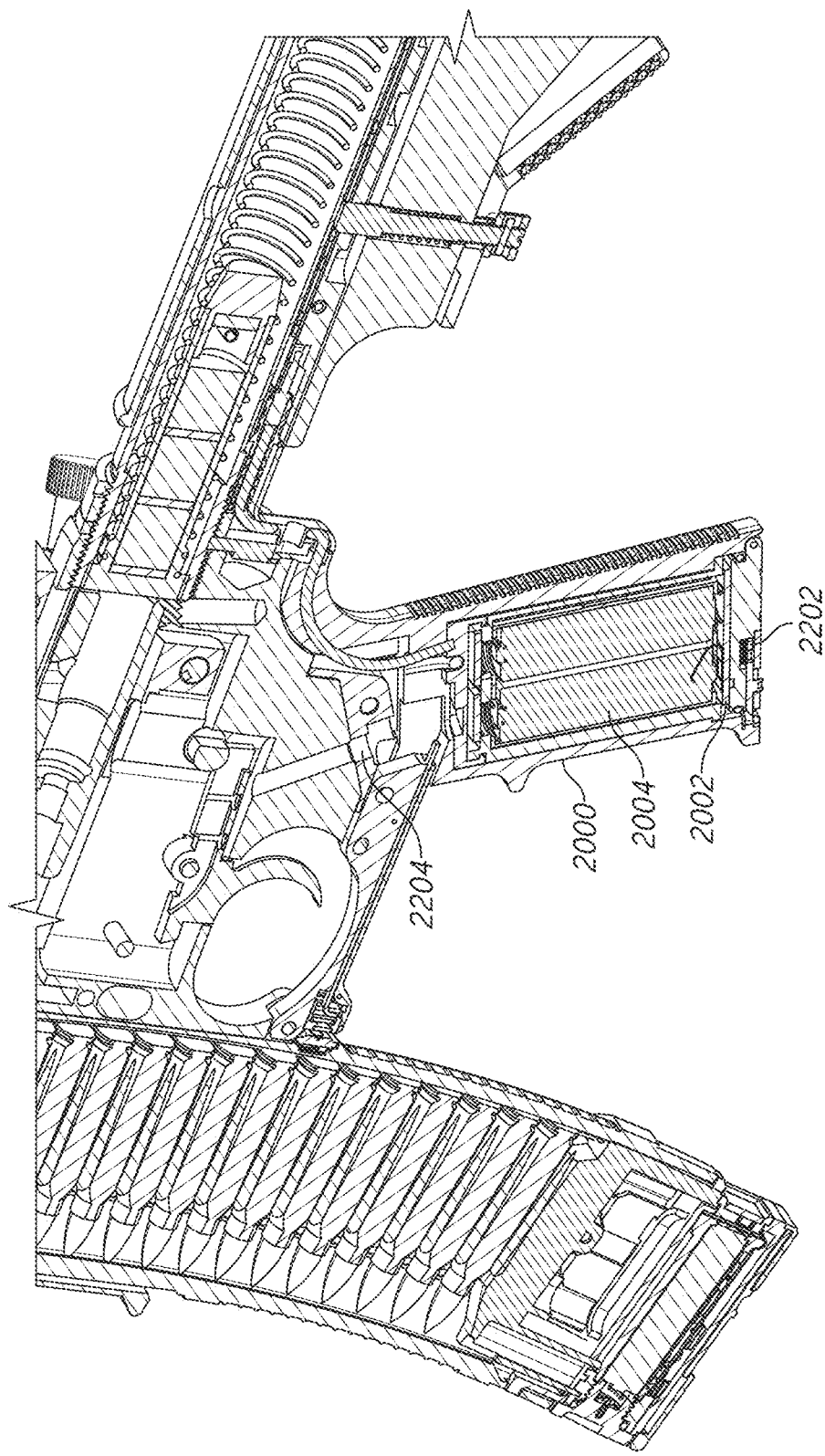
FIG. 22 illustrates a line drawing of a cross-section of an embodiment of the handle and magazine inserted into the weapon.
Figure 23:
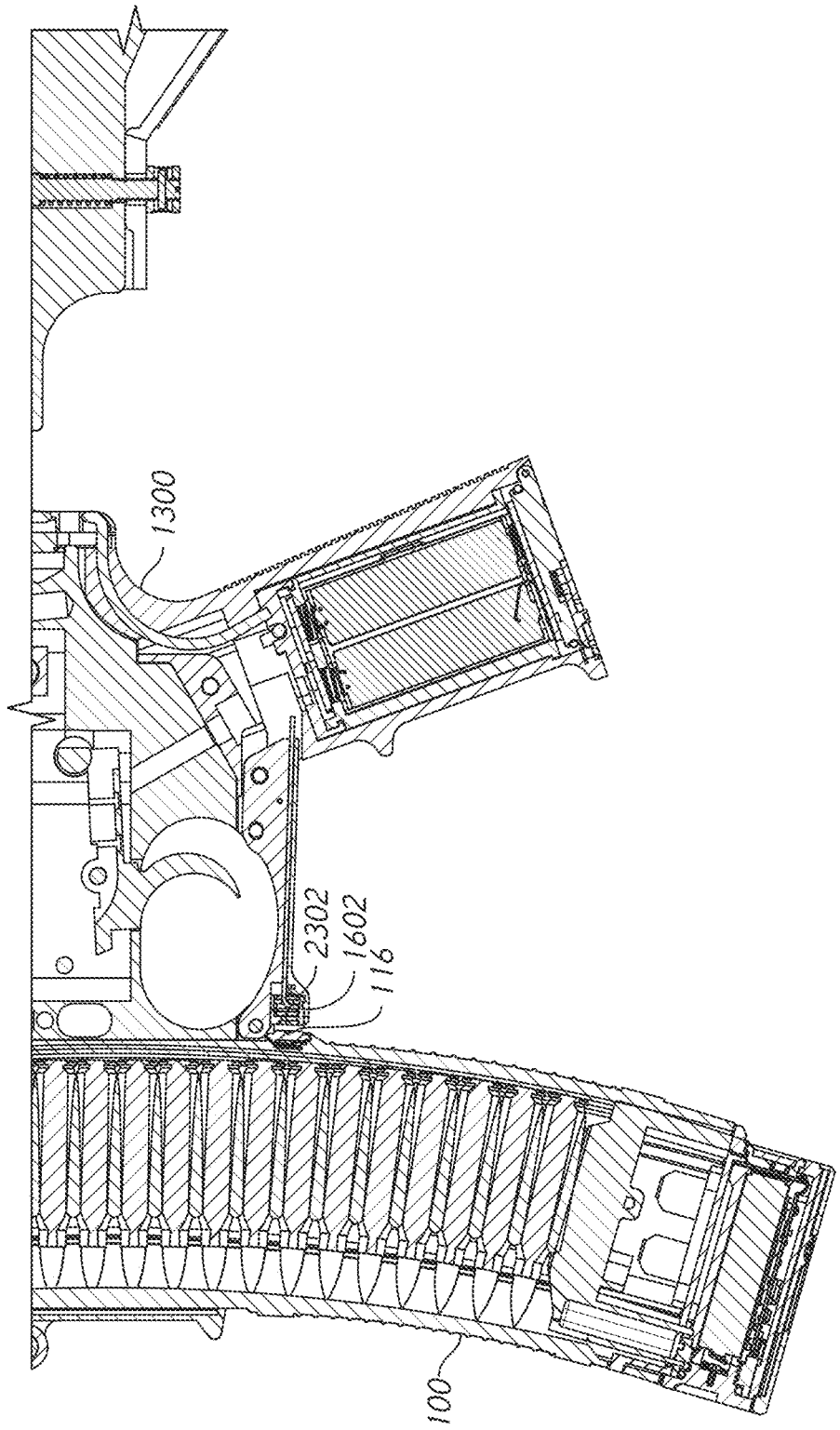
FIG. 23 illustrates a line drawing of another perspective of the cross-section of the embodiment of the handle and magazine inserted into the weapon of FIG. 22.

FIG. 22 illustrates a line drawing of a cross-section of an embodiment of the handle 2000, or pistol grip, and magazine 100 inserted into the weapon 1300. FIG. 23 illustrates a line drawing of another perspective of the cross-section of the embodiment of the handle and magazine inserted into the weapon of FIG. 22. With reference to FIG. 22, the handle 2000 can further include a cap 2202 that can be opened to replace the battery 2004 that powers the electronic circuitry 2002. Further, the handle 2000 may include optical connections 2204 that communicate data to one or more optical transceivers that provide the data to one or more displays (e.g., the display 1304 or scope 1302) for display to a user.

FIG. 23 illustrates a line drawing of another perspective of the cross-section of the embodiment of the handle and magazine inserted into the weapon of FIG. 22. FIG. 23 further illustrates the alignment of the optical transceiver 116 of the magazine 100 and the optical transceiver 2302 located in the lip 1602 of the weapon 1300. As illustrated by the line drawing, when inserted into the weapon 1300, the magazine 100 is aligned such that the optical transceiver 116 aligns with the optical transceiver 2302. Further, the spacing between the magazine 100 and the weapon 1300 may be sufficiently small to prevent ambient light from interfering with the optical connection.

Figure 24A:
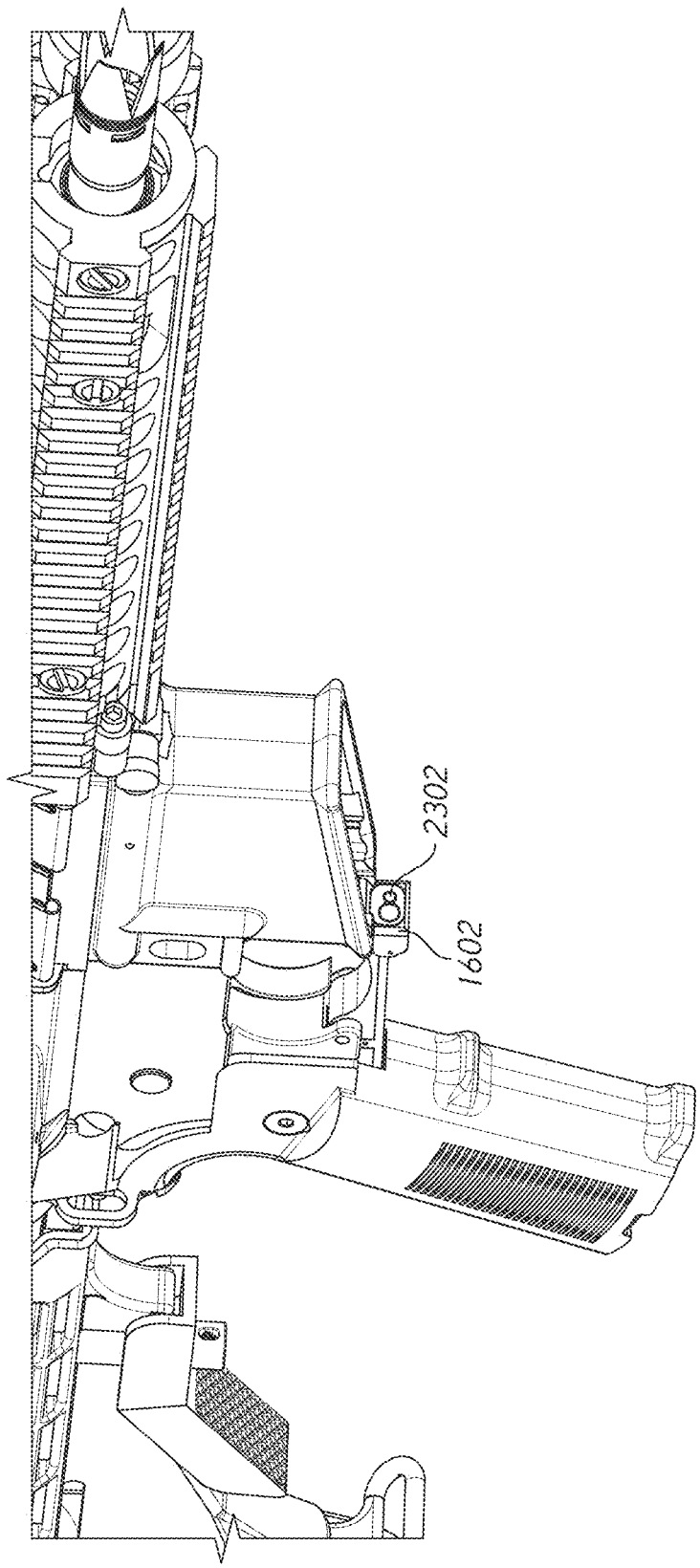
FIG. 24A illustrates an embodiment of a non-contact optical connector included in the lip of the insertion point for inserting a magazine into the weapon.

FIG. 24A illustrates an embodiment of a non-contact optical connector 2302 included in the lip 1602 of the insertion point for inserting a magazine 100 into the weapon 1300. This non-contact optical connector 2302 can function as a transceiver for receiving data from a magazine 100 when the magazine 100 is inserted into the weapon 1300. Although typically the optical transceiver 116 transmits data and the optical transceiver 2302 receives data, in some embodiments, the optical transceiver 116 may also receive data and/or the optical transceiver 2302 may also transmit data. Advantageously, in certain embodiments, by enabling the weapon 1300 to transmit data to the magazine 100, the display 124 of the magazine 100 can display data gathered by the weapon 1300, such as shot count or total magazines available.

In certain embodiments, it is desirable to confirm whether the magazine 100 is inserted into the weapon 1300. For example, a different calibration table for a linear encoder may be used when the magazine is inserted into the weapon 1300. In some cases, the magazine 100 can determine it is positioned within the weapon 1300 by communicating via the optical transceiver. But in some cases, the magazine 100 may not be able to communicate using the optical transceiver because, for example, the weapon is deactivated or the battery within the weapon 1300 is uncharged or dead. One method of determining whether the magazine is inserted into the weapon 1300 is to use a magnetic sensor, such as a Hall effect sensor that can detect when it is within a threshold distance of a magnet positioned within the insertion port of the weapon 1300 or at a location that is within a threshold distance of the magazine 100 when the magazine 100 is inserted into the insertion port of the weapon 1300.

Figure 24B:
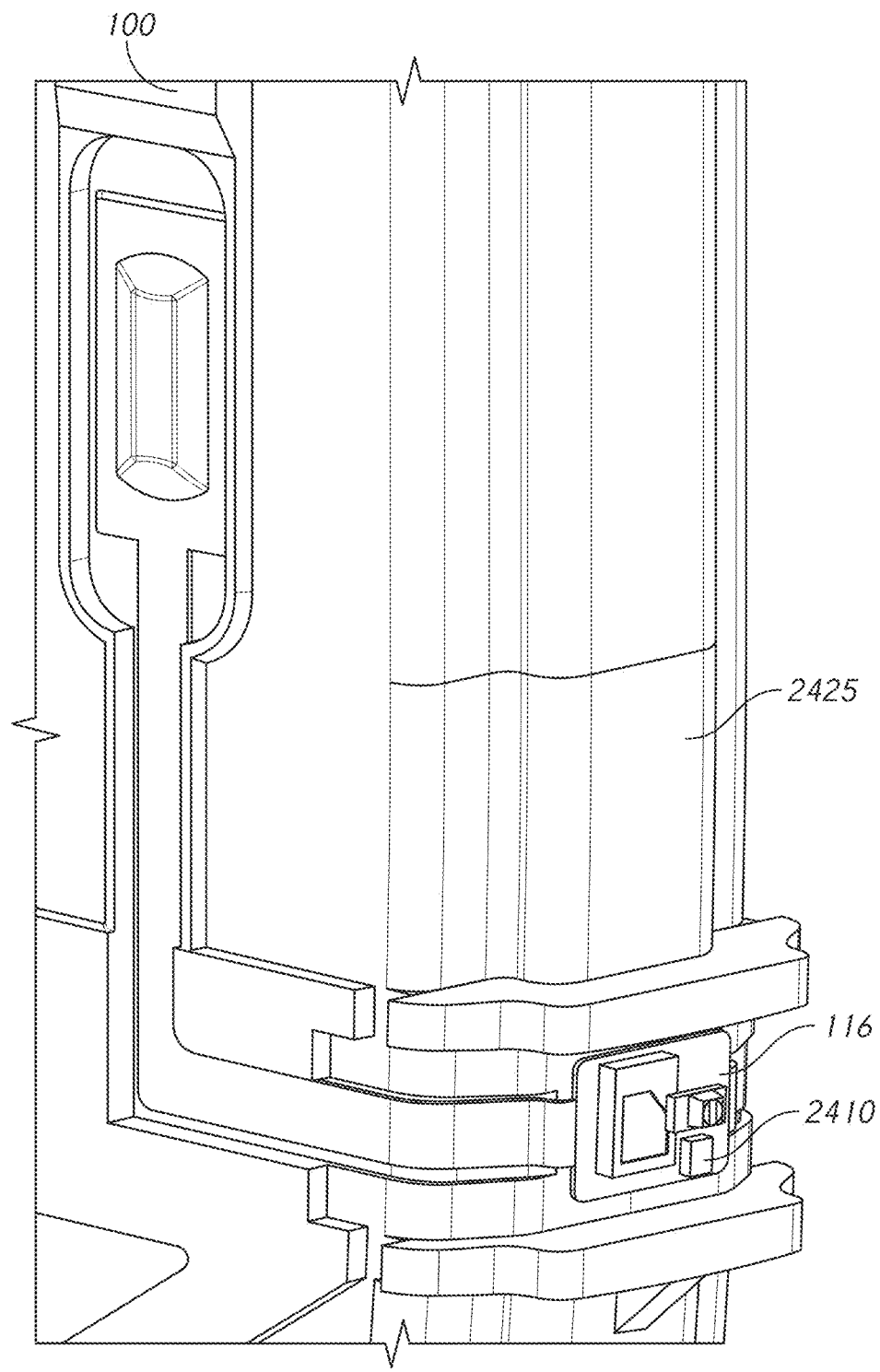
FIG. 24B illustrates a portion of the magazine with a transceiver and a magnetic sensor in accordance with certain embodiments.

FIG. 24B illustrates a portion of the magazine 100 with a transceiver 116 and a magnetic sensor 2410. The magnetic sensor 2410 may be a Hall effect sensor. Because the magnetic sensor 2410 is collocated with the transceiver 116, the magnetic sensor 2410 may be aligned with a corresponding transceiver 2302 when the magazine 100 is inserted into a weapon 1300.

Figure 24C:
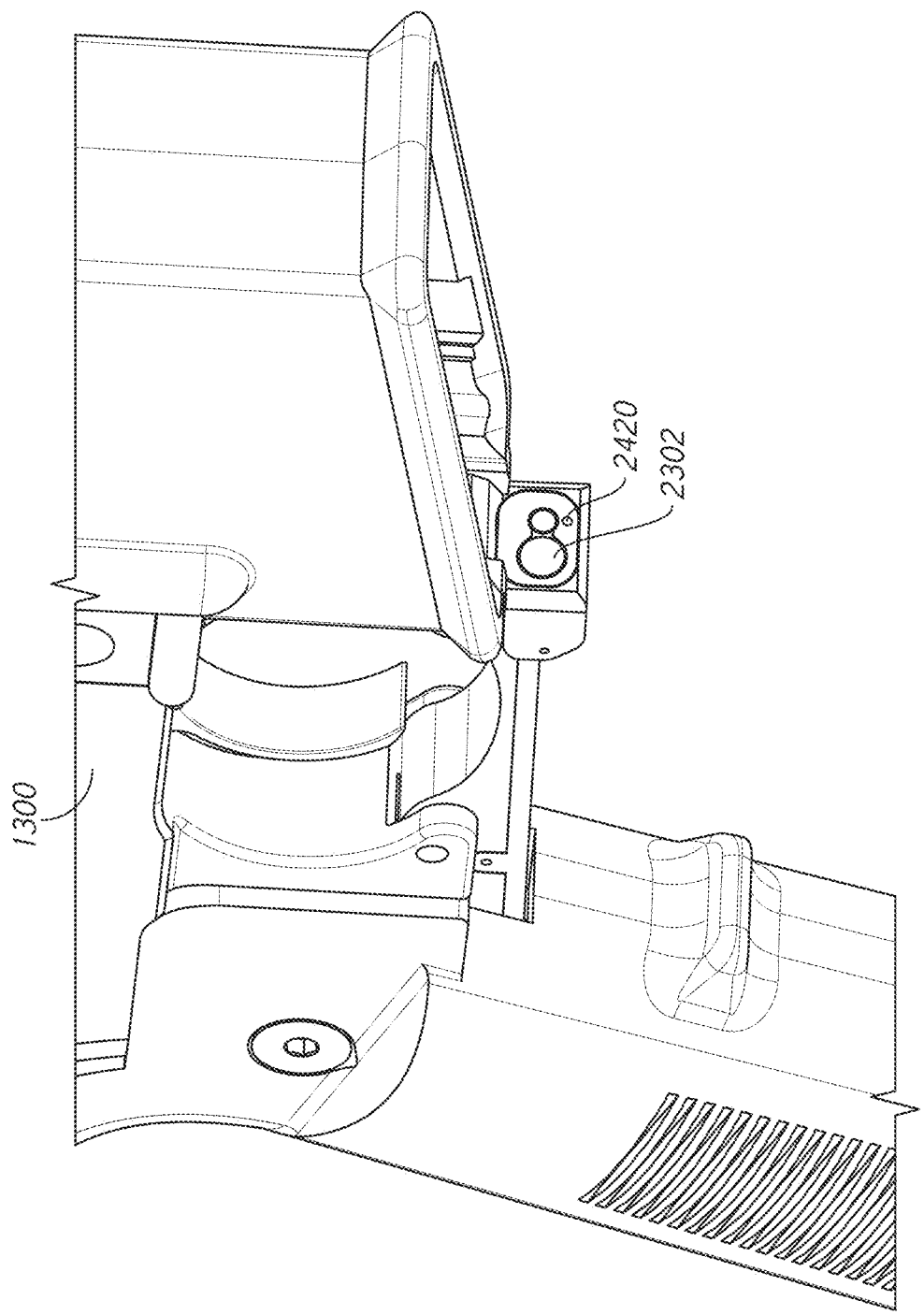
FIG. 24C illustrates a portion of the weapon with a transceiver 2302 and a magnet in accordance with certain embodiments.

FIG. 24C illustrates a portion of the weapon 1300 with an optical connect or optical transceiver 2302 and a magnet 2420. Because the magnet 2420 is collocated with the transceiver 2302, the magnet 2420 may be aligned with the magnetic sensor 2410 and the transceiver 116 when the magazine 100 is inserted into the weapon 1300. Thus, the magazine 100 can determine from a signal generated by the magnetic sensor 2410 when the magazine is inserted into the weapon 1300. The magazine 100 can then determine whether to load a calibration table associated with an inserted magazine or a calibration table associated with an uninserted magazine when determining an ammunition count.

Further, as the magnetic sensor 2410 is located at the rear 2425 of the magazine 100, while the magnetic sensors 112 of the linear encoder and magnet 110 are located near the front face 402 of the magazine, the magnetic field generated by the magnet 110 will not be detected, or will not generate a strong enough signal in the magnetic sensor 2410 to cause an incorrect determination of insertion status. Similarly, as the magnet 2420 in the weapon 1300 is located adjacent to the rear of the magazine when the magazine is inserted into the weapon, the magnetic field generated by the magnet 2420 will not be detected by the sensors 112 or will not generate a strong enough signal in the magnetic sensors 112 to cause an incorrect determination of ammunition count.

Figure 25:
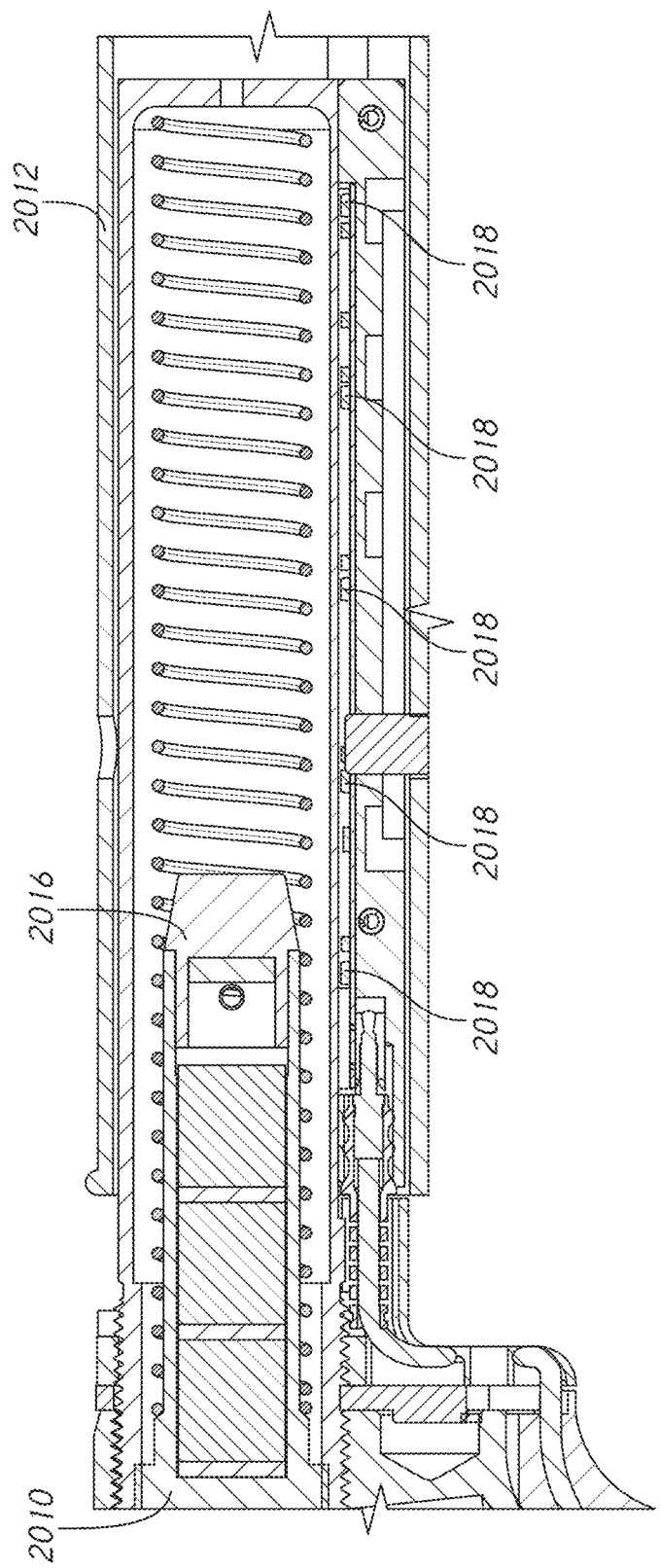
FIG. 25 illustrates an embodiment of a buffer tube within a weapon.

FIG. 25 illustrates an embodiment of a buffer tube 2012 within a weapon 1300. As previously described, the buffer tube may have a set or series of Hall effect sensors 2018. In certain embodiments, the Hall effect sensors 2018 may be supplemented and/or replaced by other types of sensors, such as optical sensors. Using the Hall effect, the sensors 2018 can detect the motion or action of a bolt 2010 based on the movement of a magnet 2016 attached to the bolt 2010. Based on the position of the bolt 2010, a hardware processor included, for example, in the handle of the weapon, can determine whether a cartridge has been loaded into a chamber of the weapon. Thus, advantageously, the weapon can determine the total ammunition count within the weapon based on a summation of the ammunition in a magazine loaded into the weapon and the amount of cartridges within the chamber of the weapon. Although the number of cartridges within a chamber of the weapon is typically 0 or 1, embodiments disclosed herein can be adapted for use with weapons that may load multiple cartridges into a chamber or multiple chambers of the weapon, such as with a combination gun that has chambers configured to load different types of ammunition (e.g., a combination shotgun and rifle). In some embodiments, the movement of the bolt 2010 can be detected based on principles other than the Hall effect. For example, if the sensors 2018 are light sensors, the movement of the bolt 2010 can be detected based on the change of light around the sensors 2018. This light may filter in via the barrel of the weapon and/or the chamber. Alternatively, or in addition, the light may be based on a light source (e.g., an LED) attached to the bolt 2010.

Figure 26:
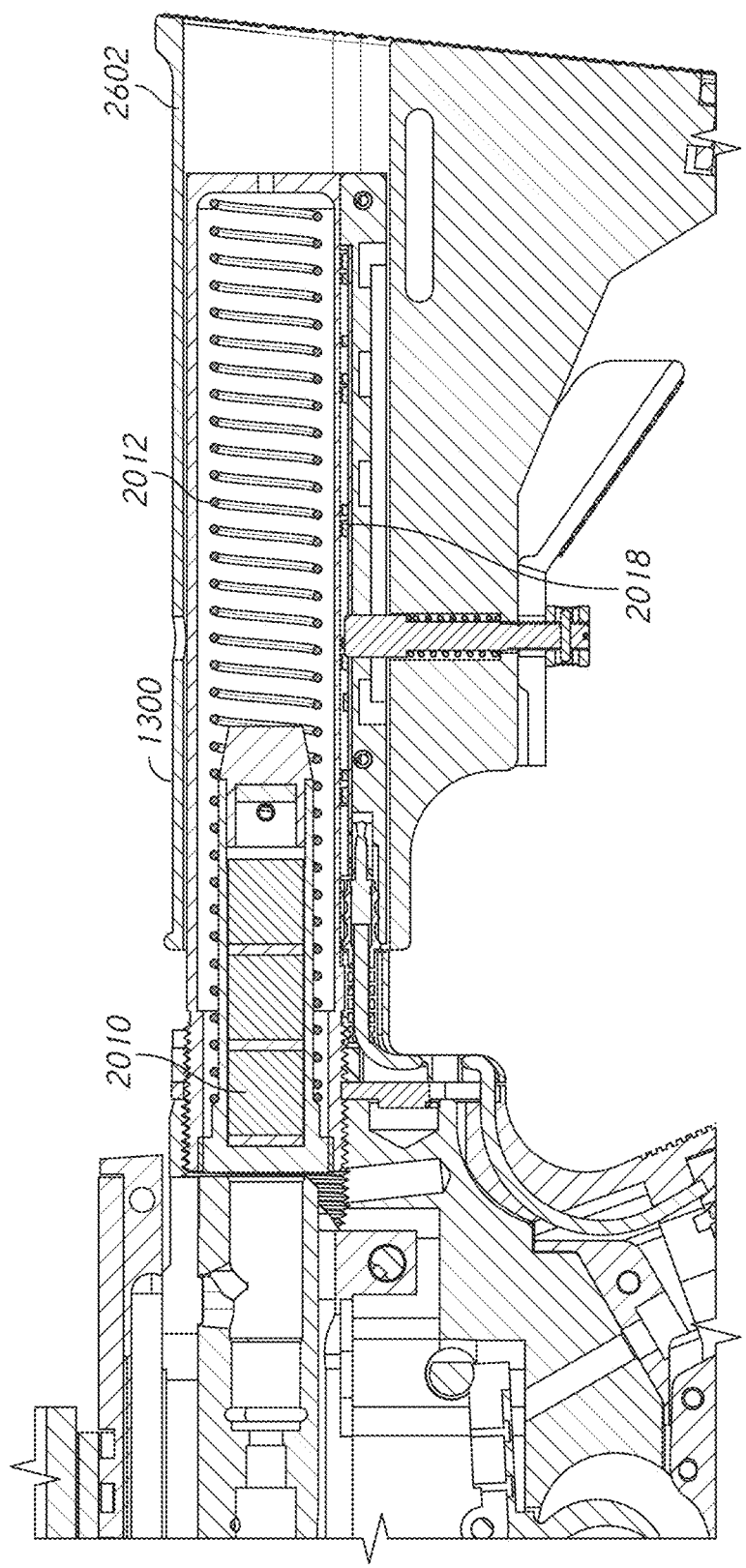
FIG. 26 illustrates a line drawing of an embodiment of a buffer tube and stock of a weapon.

FIG. 26 illustrates a line drawing of an embodiment of a buffer tube 2012 and stock 2602 of a weapon 1300. As illustrated, the stock 2602 may be at least partially hollow allowing for the buffer tube 2012 to extend into the stock 2602 and providing room for the bolt 2010 to move into the stock 2602. In some embodiments, the bolt 2010 may be extended compared to other bolts to enable the bolt to travel through the extended buffer tube. Advantageously, by extending the buffer tube 2012 into the stock 2602, additional space may exist in the weapon 1300 compared to weapons that use a solid stock. This additional room may be used to insert the sensors 2018. Further, using a hollow stock enables the weapon 1300 to maintain its weight despite the addition of the magnet, sensors, electronic circuitry, and/or batteries. It should be understood that in certain embodiments, the weapon 1300 can implement features of the present disclosure without modification to the stock of the weapon. For example, the sensors may be positioned between the chamber and the stock.

Example Use Case

Figure 27:
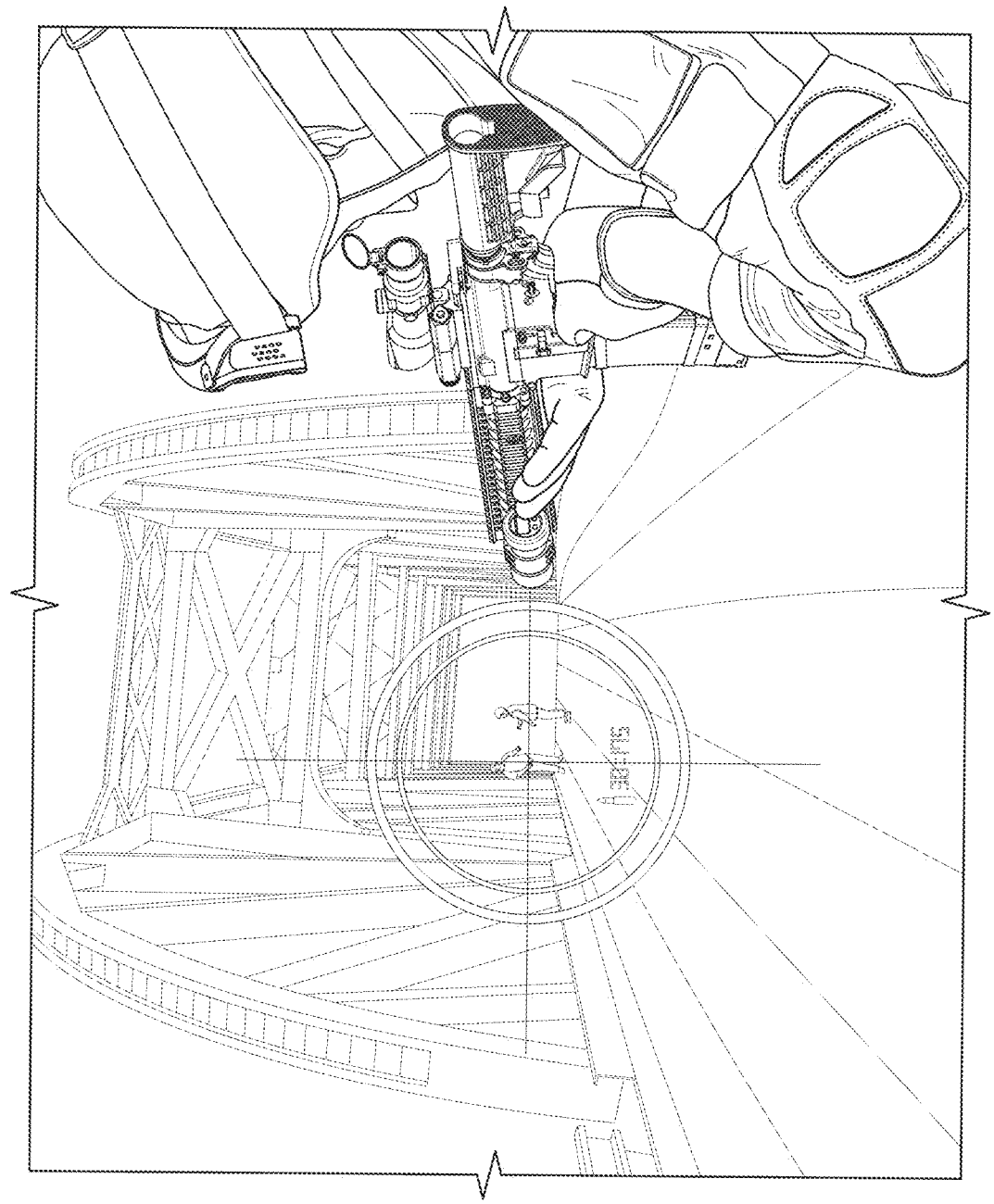
FIG. 27 illustrates an example use case of certain embodiments described herein.

FIG. 27 illustrates an example use case of certain embodiments described herein. In this non-limiting example use case, a soldier is approaching enemy combatants on a bridge. The soldier may consider engaging the enemy combatants, but does not wish to engage without a minimum quantity of ammunition loaded in the soldier's weapon. To ensure a minimum ammunition quantity in the weapon, the soldier could replace the magazine with a new magazine. However, this could result the soldier carrying a number of partially filled magazines without knowing how much ammunition is available in total to the soldier.

Alternatively, using embodiments disclosed herein, the user can look at a display, such as via the scope and see the total ammunition count within the weapon including the magazine and chamber of the weapon (e.g., 30 cartridges in the illustrated example). Further, the soldier can be presented with a total ammunition count available to the soldier via additional magazines the soldier is carrying (e.g., 175 cartridges in the illustrated example). Alternatively, the numbers illustrated via the display in the scope may represent the cartridges available in the weapon out of the total capacity of the magazine.

As illustrated in FIG. 27, the information presented to the soldier is presented in as part of a HUD and/or augmented reality display observable through a scope on the weapon. Thus, when the soldier looks through the scope, the soldier can see the targets in front of the weapon, and also see information provided by the weapon to the scope regarding the cartridges available to the user in, for example, the loaded magazine.

The use case presented in FIG. 27 is one non-limiting example use case. Other uses cases are possible. For example, a police force can use embodiments disclosed herein to monitor the ammunition available to its officers. Further, a hunter could use embodiments disclosed herein to monitor the ammunition available during a hunt.

Moreover, in certain embodiments, the weapon can include a transmitter for transmitting ammunition information to a command post or other location monitored by users (e.g., commanders) associated with the carrier of the weapon. Alternatively, or in addition, the weapon may communicate with another system of the user, such as the user's helmet, which may communicate the ammunition information to the command post. Advantageously, the ability to monitor ammunition at a command post or other location enables a user, such as a commander or police captain, to monitor the ammunition of a user (e.g., a solider or policeman) to determine whether reinforcements are needed, additional ammunition is needed, or if an unexpected firefight is occurring. For instance, a police captain can determine if a traffic officer has fired his weapon by receiving an alert that an amount of ammunition carried by an officer has changed. As another example, a field commander can determine that soldiers have been ambushed while guarding supplies based on an unexpected change in ammunition.

Example Ammunition Count Determination Process

Figure 28:
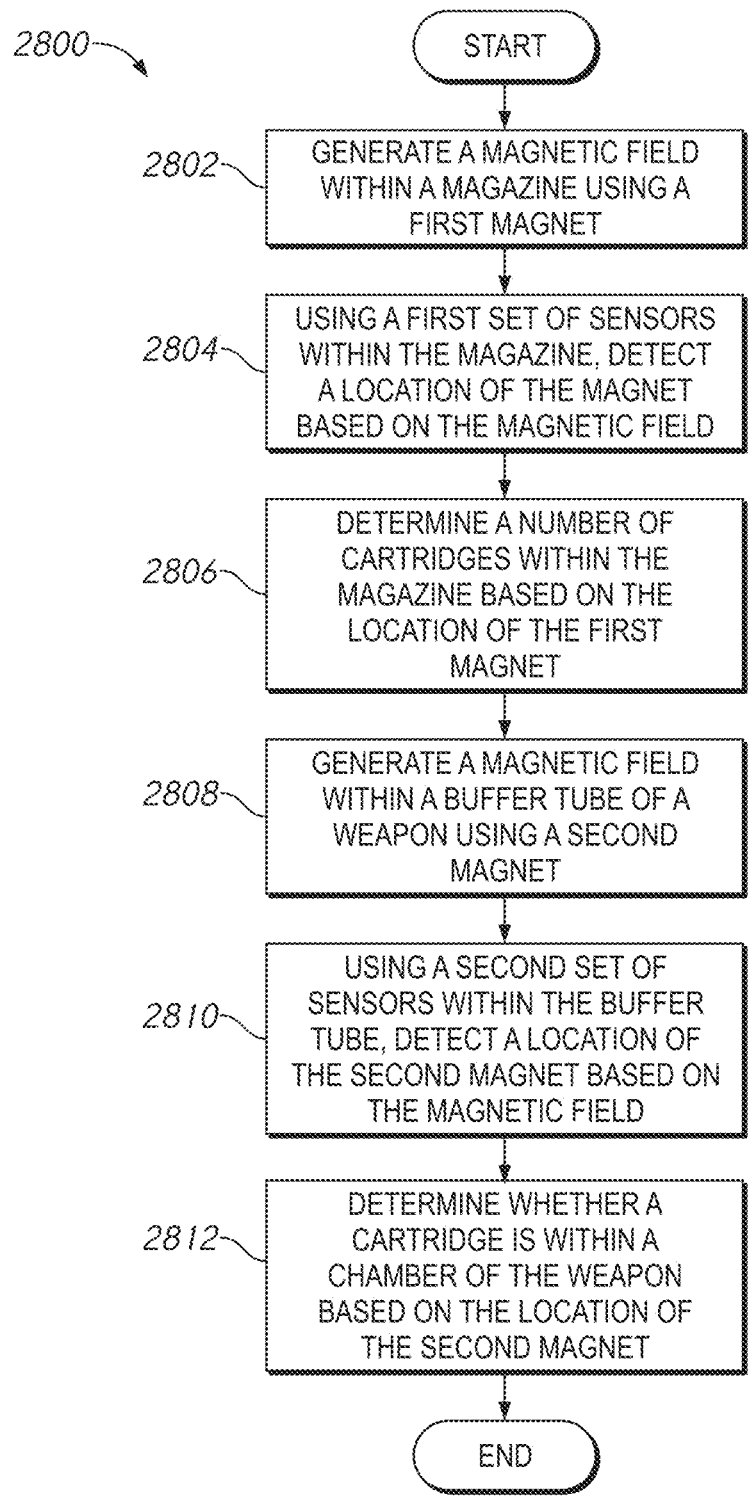
FIG. 28 presents a flowchart of an embodiment of an ammunition count determination process.

FIG. 28 presents a flowchart of an embodiment of an ammunition count determination process 2800. The process 2800 can be implemented by any system that can determine a count of the number of cartridges within a magazine. For example, the process 2800, in whole or in part, can be implemented by electronic circuitry included in the magazine, such as the electronic circuitry 122 included in the magazine 100. This electronic circuitry 122 can include hardware, such as a hardware processor, that can perform the process 2800. In some embodiments, the electronic circuitry 122 includes application-specific hardware configured to perform the process 2800. In other embodiments, the hardware may include a computer processor programmed with special instructions configured to perform the process 2800. Further, the electronic circuitry 122 may include control circuitry for controlling one or more of the magnet 110 and/or the sensors 112. In some embodiments, some or all of the process 2800 may be performed by electronic circuitry in the weapon, such as the electronic circuitry 2002. The electronic circuitry 2002 may include some or all of the embodiments of the electronic circuitry 122. To simplify discussion and not to limit the disclosure, portions of the process 2800 will be described with respect to particular systems, such as the electronic circuitry 122 or 2002. However, it should be understood that operations of the process 2800 may be performed by other systems. For example, operations described as being performed by the electronic circuitry 122 may alternatively be performed by the electronic circuitry 2002.

The process 2800 begins at block 2802 where, for example, the electronic circuitry 122 generates a magnetic field within a magazine 100 using a first magnet 110. In certain embodiments generating the magnetic field may include producing an electric current in a wire that surrounds the magnet, such as with an electromagnet. In other embodiments, the magnetic field is generated by the magnet 110. In some such cases, the electronic circuitry 122 may not be involved in generating the magnetic field. However, electronic circuitry 122 may be involved in determining the strength of the magnetic field.

Using a first set of sensors 112 within the magazine 100, the electronic circuitry 122 at block 2804 detects a location of the magnet 110 based at least in part on the magnetic field measured by the set of sensors 112. In certain embodiments, the location of the magnet 110 is determined based on the particular sensor from the set of sensors that detects the magnetic field of the magnet 110. In other embodiments, the location of the magnet 110 is determined based on the strength of the magnetic field as detected by a plurality of the sensors 112.

At block 2806, the electronic circuitry 122 determines a number of cartridges within the magazine 100 based at least in part on the location of the first magnet as determined at the block 2804. For example, if it is determined that the location of the first magnet 110 is at a particular location, the electronic circuitry 122 can determine that there are a particular number of cartridges within the magazine 100 based on a correspondence between the locations of the magnet 110 within the magazine 100 and the quantity of cartridges remaining within the magazine 100.

In some embodiments, the electronic circuitry 122 may access a number of tables stored in a memory of the electronic circuitry 122 that identify a corresponding between one or more signals generated by sensors included in the magazine 100 and the number of cartridges loaded in the magazine 100. In some embodiments, the electronic circuitry 122 may perform an interpolation process to determine a position of a magnet within the magazine 100 based on a plurality of signals received from sensors of the magazine 100.

At block 2808, the electronic circuitry 2002 generates a magnetic field within a buffer tube 2012 of a weapon 1300 using a second magnet 2016. In certain embodiments, the block 2808 may include one or more of the embodiments described with respect to the block 2802.

Using a second set of sensors 2018 within the buffer tube 2012, the electronic circuitry 2002 at block 2810 detects a location of the second magnet 2016 based at least in part on the magnetic field generated at block 2808. In certain embodiments, the block 2810 may include one or more of the embodiments described with respect to the block 2804.

At block 2812, electronic circuitry 2002 determines whether a cartridge is within a chamber 2014 of the weapon 1300 based at least in part on the location of the second magnet 2016. Determining whether a cartridge is within the chamber 2014 may include determining whether a bolt 2010 has fully cycled or is within a particular position as determined based at least in part on the position of the magnet 2016 within the buffer tube 2012 and/or the stock 2602. In certain embodiments, the block 2812 may include one or more of the embodiments described with respect to the block 2806. In certain embodiments, the number of cartridges within the magazine and/or whether a cartridge exists within a chamber of the weapon may be output on a display on the magazine, on the weapon, on another device of a user of the weapon, or on a device in another location, such as a command station. In some embodiments, the count of ammunition or cartridges in the weapon may be displayed using the example process 2900 described below with respect to FIG. 29.

In certain embodiments, one or more of the blocks 2808 through 2812 may be optional or omitted. For example, in some embodiments, the number of cartridges within the magazine may be determined without the magazine being inserted into a weapon.

Example Ammunition Count Display Process

Figure 29:
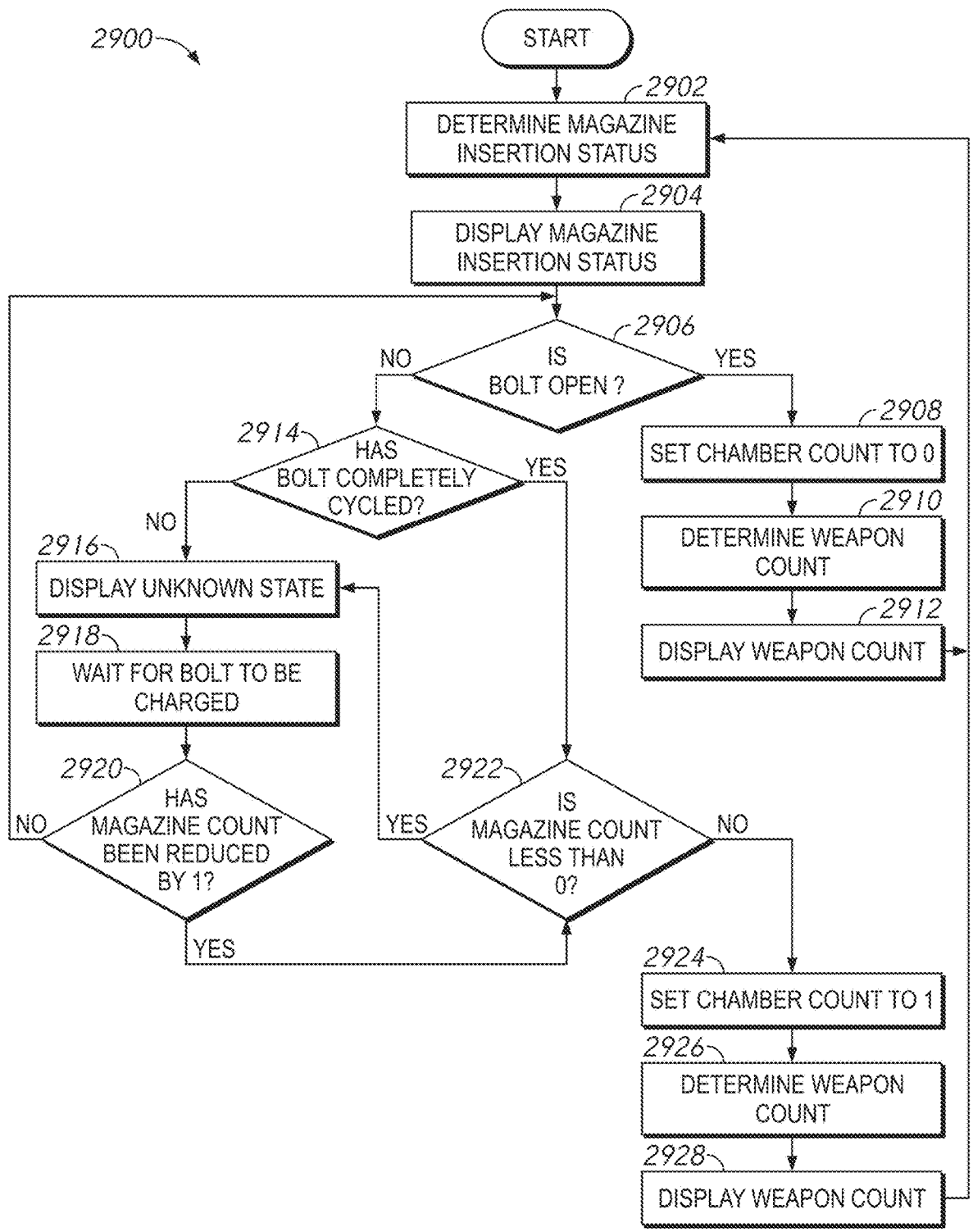
FIG. 29 presents a flowchart of an embodiment of an ammunition count display process.

FIG. 29 presents a flowchart of an embodiment of an ammunition count display process 2900. The process 2900 can be implemented by any system that can display a count of the number of cartridges within a weapon including a chamber of the weapon and a magazine inserted into the weapon. For example, the process 2900, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 2800 will be described with respect to particular systems, such as the electronic circuitry 122 or 2002. However, it should be understood that operations of the process 2800 may be performed by other systems. For example, operations described as being performed by the electronic circuitry 122 may alternatively be performed by the electronic circuitry 2002 and vice versa.

The process 2900 begins at block 2902 wherein, for example, the electronic circuitry 2002 determines a magazine insertion status. Determining the magazine insertion status may include detecting whether a signal is received at the optical receiver 2302 of the weapon 1300. At block 2904, a display of the weapon 1300, such as the display 1304, displays the magazine insertion status.

At decision block 2906, electronic circuitry 2002 determines whether the bolt 2010 is open. Determining whether the bolt 2010 is open may include determining the position of the magnet 2016 as described with respect to the process 2800. If it is determined at decision block 2906 that the bolt 2010 is open, electronic circuitry 2002 determines that the chamber 2014 is empty and may set a chamber counter corresponding to whether a cartridge exists within the chamber 2014 to 0. At block 2910, electronic circuitry 2002 determines a weapon count, or a count of the cartridges within the weapon 1300. In some cases, determining a count of the cartridges within the weapon 1300 includes determining a number of cartridges within a magazine inserted into the weapon 1300. Thus, the count of cartridges within the weapon, or the weapon count, may include the number of cartridges within the chamber 2014 and the number of cartridges within a magazine 100, when inserted into the weapon 1300. In cases where no magazine is inserted into the weapon, the weapon count will be equal to the number of cartridges, if any, within the chamber 2014.

At block 2912, a display, such as a HUD display of a scope 1302, displays the total count of cartridges within the weapon 1300. The count of cartridges within the weapon 1300 may be displayed for a particular period of time or until there is a change in a count of cartridges, such as by a removal or insertion of a magazine or the firing of the weapon. Alternatively, or in addition, the count of cartridges may be displayed in response to an interaction by a user with a user interface, such as a user pressing a button on the weapon or on the display device. In some cases, the count of cartridges may be displayed on multiple displays, such as on a display attached to the rail of the weapon, a display integrated into the magazine, and/or a display generated in the scope 1302. Upon completion of, or in parallel with, operations associated with the block 2912, the process 2900 may return to the block 2902. In some embodiments, the process 2900 advances from the block 2912 to the block 2902 in response to detecting a change in the status of the weapon, such as the removal or addition of a magazine, a firing of a cartridge, or a detection of a change in the position of the bolt 2010.

If it is determined at the decision block 2906 that the bolt 2010 is not open, electronic circuitry 2002 determines at the decision block 2914 whether the bolt 2010 has completely cycled. In some cases, when the bolt is completely cycled, a cartridge is inserted into the chamber 2014. In certain embodiments, the decision block 2914 may also include determining whether a magazine is inserted into the weapon. Determining whether the bolt has completely cycled includes determining a position of the magnet 2016 within a buffer tube 2012 as previously described with respect to the process 2800.

If it is determined at the decision block 2914 that the bolt is not completely cycled, a display of the weapon 1300, such as the scope 1302, displays a message or indicator corresponding to an unknown state at block 2916. At block 2918, electronic circuitry 2002 waits until it detects that the bolt is charged, or completely cycled indicating that cartridge may have been loaded into the chamber 2014. In some embodiments, if the bolt does not completely cycle for a threshold period of time, it may be determined that the weapon is jammed. If it is determined that the weapon is jammed, a display of the weapon, or other display in communication with the weapon, such as an augmented reality display of a user's helmet, may output a weapon jammed indicator.

At decision block 2920, electronic circuitry 2002 determines whether the magazine count has been reduced by 1. The magazine count corresponds to the number of cartridges within the magazine 100. In some embodiments, the decision block 2920 may include determining whether the magazine count has been reduced by some value other than one. If it is determined that the magazine count has not been reduced by one, the process 2900 returns to the decision block 2906.

If it is determined at the decision block 2920 that the magazine count has been reduced by one or if it is determined at the decision block 2914 that the bolt has completely cycled, the process 2900 proceeds to the decision block 2922. At decision block 2922, electronic circuitry 2002 determines whether the magazine count is less than zero. If it is determined that the magazine count is less than zero, indicating negative cartridges within the magazine, then the process 2900 proceeds to the block 2916 where a message or indicator corresponding to an unknown state is displayed.

In some embodiments, an unknown state indicator may be triggered in other circumstances. For example, when an error occurs in the electronic circuitry 2002 or if a conventional magazine is inserted into the weapon that does not include the features disclosed herein, an unknown state flag may be set and displayed to the user. In some embodiments, if a conventional magazine is inserted into the weapon, a display of the weapon may indicate that the magazine does not support the cartridge counting features, or other features, disclosed herein.

If it is determined that the decision block 2922 that the magazine count is not less than zero, and the process 2900 proceeds to the block 2924 where the chamber count is set to one. At block 2926, the electronic circuitry 2002 determines the weapon count indicating the number of cartridges within the weapon 1300. In certain embodiments, the block 2926 can include one or more of the embodiments of the block 2910. At block 2928 a display of the weapon 1300 displays the weapon count or the number of cartridges within the weapon 1300 inclusive of both the chamber and a magazine, if any, installed within the weapon 1300. In certain embodiments, the block 2928 can include one or more embodiments of the block 2912.

Example Magazine Calibration Process

Figure 30:
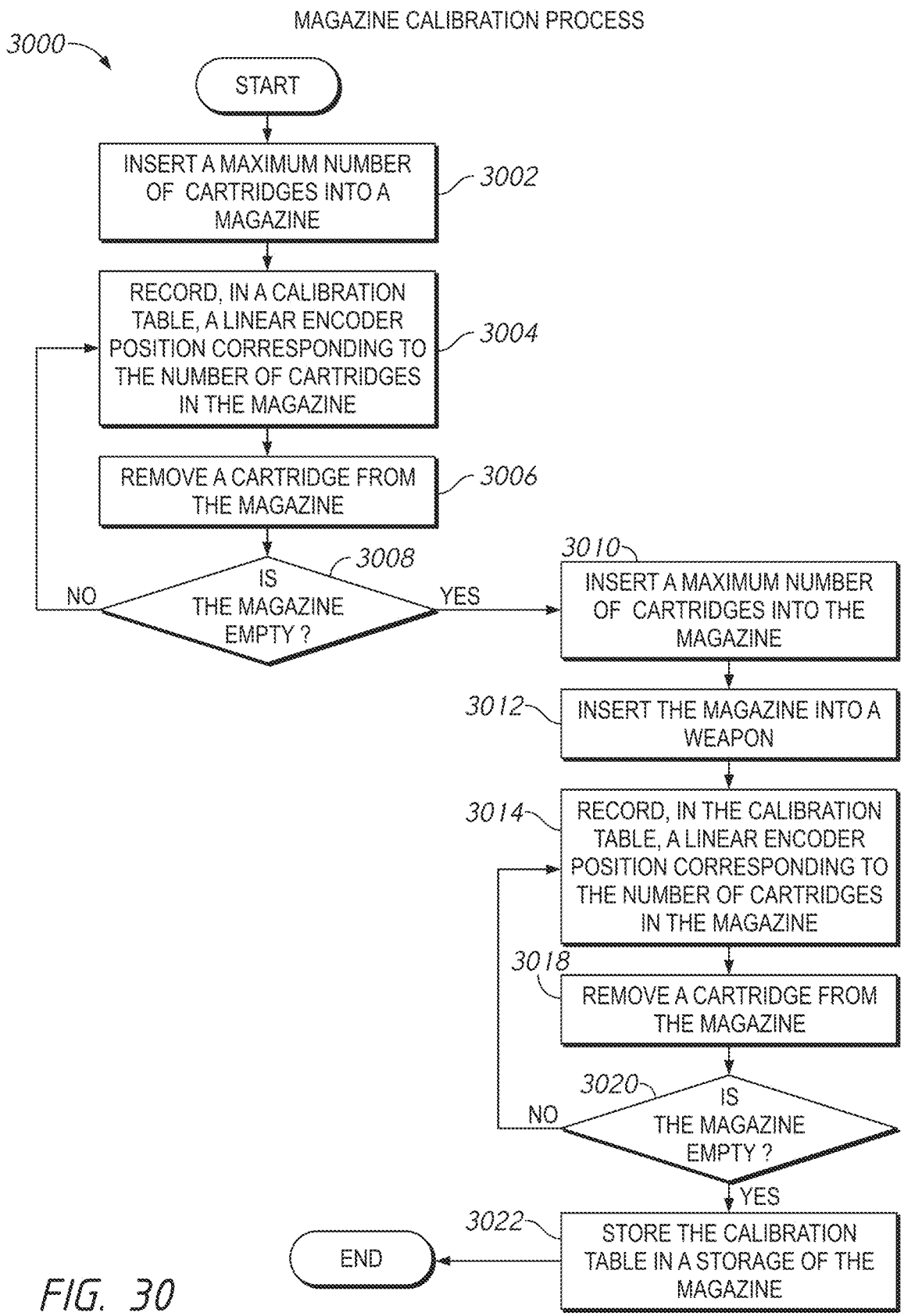
FIG. 30 presents a flowchart of an embodiment of a magazine calibration process.

FIG. 30 presents a flowchart of an embodiment of a magazine calibration process 3000. The process 3000 can be implemented by any system that can calibrate an ammunition count system of a magazine. For example, the process 3000, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3000 will be described with respect to particular systems, such as the electronic circuitry 122 or 2002. However, it should be understood that operations of the process 3000 may be performed by other systems. For example, one or more operations of the process 3000 may be performed by a computing device that is configured to communicate with the magazine 100.

In some embodiments, the process 3000 is performed by a manufacturer of the magazine 100. The process may be an automated process performed as part of the process of manufacturing the magazine 100. Alternatively, the process 3000 may be performed in whole or in part by a user calibrating the magazine 100 prior to sale or distribution, or by a user that has purchased or otherwise obtained the magazine 100. For example, a user can instruct the magazine 100 to enter a calibration mode before performing a calibration process 3000. In some embodiments, the calibration process 3000 can be repeated for a magazine. Repeating the process 3000 can improve the calibration if the magazine 100 has become worn and/or if a different type of ammunition is loaded into the magazine. Thus, in some embodiments, some or all of the operations of the calibration process 3000 can be used as a recalibration process and/or be used in place of some or all of the operations of the process 3200 described with reference to FIG. 32.

The process 3000 begins at block 3002 where a maximum number of cartridges is inserted into a magazine. The maximum number of cartridges may be the maximum number of cartridges that the magazine is designed or configured to hold. In some embodiments the maximum number of cartridges may differ based on the manufacturer of the cartridges or the type of cartridges. The insertion of the cartridges into the magazine may be performed by an automatic magazine loader or other automated machine. Further, the loading of the cartridges into the magazine may be performed as part of the manufacturing process for the magazine. In some embodiments, the cartridges may be manually loaded into the magazine.

At block 3004, a linear encoder position corresponding to the number of cartridges in the magazine is recorded in a calibration table. The linear encoder position may be determined from one or more signals received from one or more magnetic sensors, such as Hall effect sensors 112, by a hardware processor. This hardware processor may be included within the electronic circuitry of the magazine, such as the electronic circuitry 122. Determining the linear encoder position may include determining a position of a magnet, such as a magnet attached to a follower of the magazine. The detected position of the magnet, as determined by the signals received from the one or more Hall effect sensors 112, is associated with the number of cartridges inserted into the magazine. The relationship between the linear encoder position, or the detected position of the magnet, and the number of cartridges in the magazine is stored in the calibration table. Thus, after loading the magazine with a maximum number of cartridges, the linear encoder position recorded at the block 3004 is associated with the maximum number of cartridges can be loaded into the magazine. In some embodiments, the operations of the block 3004 may be performed one more time after determining that the magazine is empty in order to store a linear encoder position for when the magazine is empty.

At block 3006, a cartridge is removed from the magazine. The cartridge may be removed from the magazine by an automated machine. For example, a machine used during the manufacturing process of the magazine may be used to add and/or remove cartridges from the magazine during the magazine calibration process 3000. Alternatively, in certain embodiments, the cartridge may manually be removed from the magazine.

At decision block 3008, it is determined whether the magazine is empty. In certain embodiments, a machine used during manufacturing of the magazine determines whether the magazine is empty. Alternatively, or in addition, electronic circuitry of the magazine determines whether the magazine is empty based at least in part on a number of cartridges that have been ejected from the magazine or a location of the linear encoder. In some embodiments, a user indicates that the magazine is empty.

If the magazine is not empty, the process returns to the block 3004 where an updated linear encoder position corresponding to the updated number of cartridges in the magazine is recorded in the calibration table. The operations associated with the blocks 3004, 3006, and 3008 may be repeated until it is determined that the magazine is empty.

If it is determined at the decision block 3008 that the magazine is empty, a maximum number of cartridges is inserted into the magazine at the block 3010. The block 3010 may include one or more of the embodiments described with respect to the block 3002.

At block 3012, the magazine is inserted into a weapon. The magazine may be inserted into a weapon as part of an automated manufacturing process for the magazine. Alternatively, the magazine may be inserted into the weapon by a user.

At block 3014, a linear encoder position corresponding to the number of cartridges in the magazine is recorded in the calibration table. The block 3014 may include one or more of the embodiments described with respect to the block 3004. In some embodiments, the block 3014 may include recording the linear encoder position in a different calibration table in the calibration table of the block 3004. Alternatively, the linear encoder positions recorded at the block 3014 may be recorded in a different portion of the calibration table. In some embodiments, the linear encoder positions recorded at the blocks 3004 and 3014 may be marked or otherwise tagged to identify that the linear encoder positions are associated, respectively, for the magazine not being inserted into the weapon and with the magazine being inserted into the weapon.

At block 3018, a cartridge is removed from the magazine. Removing a cartridge from the magazine may include cycling a bolt in the weapon to load a cartridge from the magazine into a chamber of the weapon and/or to expel a cartridge from a chamber of the weapon. In some embodiments, the magazine may be removed from the weapon, a cartridge may then be removed from the magazine, and the magazine may be re-inserted into the weapon. In some such embodiments, the block 3018 may include one or more of the embodiments previously described with respect to the block 3006.

At decision block 3020, it is determined whether the magazine is empty. The decision block 3020 may include one or more of the embodiments previously described with respect to the decision block 3008.

If the magazine is not empty, the process returns to the block 3014 where a new linear encoder position is recorded in the calibration table for the current number of cartridges within the magazine. The operations associated with the blocks 3014, 3018, and 3020 may be repeated until it is determined that the magazine is empty.

If it is determined at the decision block 3020 that the magazine is empty, the calibration table is stored in a storage of the magazine at block 3022. In some embodiments, the operations of the block 3014 may be performed one more time after determining that the magazine is empty in order to store a linear encoder position for when the magazine is empty. The storage of the magazine may be a non-volatile storage. The calibration table may be identified as a default or manufacturer default calibration table in the non-volatile storage. In some embodiments, the calibration table may be stored in a storage that is external or independent of the magazine. For example, copies of the calibration table may be stored in a manufacturer database.

Advantageously, in certain embodiments, by recording linear encoder positions for each load state of the magazine corresponding to the quantity of cartridges in the magazine, it is possible during use of the magazine to determine the number of cartridges within the magazine. Thus, a user can determine the number of cartridges within the magazine without manually counting the cartridges or keeping track of the number of shots fired. Further, by generating calibration table for when the magazine is inserted into a weapon and when the magazine is not inserted into a weapon, it is possible to more accurately track a number of cartridges loaded within the magazine. Typically, different pressures are applied to cartridges within the magazine when the magazine is loaded into the weapon compared to the when the magazine is not loaded into the weapon. These different pressures may cause the cartridges within the magazine to move. Thus, using the same calibration table or linear encoder positions stored within the calibration table for when the magazine is both inserted and not inserted may lead to an inaccurate count of cartridges loaded within the magazine. By separately recording the linear encoder positions for when the magazine is loaded into the weapon and when the magazine is not loaded into the weapon, a more accurate ammunition count can be determined for the magazine.

In some embodiments, the pressure on the cartridges in the magazine varies based on a position of the bolt of the weapon. For example, when the bolt is drawn back into the buffer tube of the stock and the chamber is open, the pressure applied to the cartridges in the magazine inserted into the weapon may differ from the pressure applied to the cartridges when the bolt is pushed forward towards the barrel of the weapon and slides over the top cartridge, or cartridge closest to the feed point, of the magazine. In some embodiments, the pressure applied to the cartridges in the magazine when the magazine is not inserted into the weapon may be the same as the pressure applied to the cartridges when the magazine is inserted into the weapon, but the bolt is slid back, or the chamber is open. The movement of the cartridges because of the additional pressure that may be applied to the cartridges by the bolt when it is slid forward over the cartridges in the magazine may be 1, 2, or 3 millimeters, or any range of values between the foregoing distances. In some embodiments, the movement of the cartridges may be more or less and may depend, for example, on how large the bolt is relative to the buffer tube and/or the strength of the spring within the magazine. In certain embodiments, the process 3000 may include creating a first calibration table for when the magazine is inserted into the weapon and the bolt is closed and a second calibration table for when the magazine is inserted into the weapon and the bolt is open. The number of cartridges within the magazine may then be determined with reference to the first calibration table when the bolt is closed and with reference to the second calibration table when the bolt is open. In some cases, the second calibration table may also be used when the magazine is not inserted into the weapon. Alternatively, a third calibration table may be used for determining a number of cartridges in the magazine for when the magazine is not inserted into the weapon.

In certain embodiments, the block 3012 may include identifying the weapon that the magazine is loaded into. In some cases, different weapons may have different impacts on the magazine and the relative position of the linear encoder for a particular number of cartridges loaded within the magazine. Thus, in certain embodiments, different calibration tables may be generated for the magazine for different weapons. In such cases, the process 3000, or parts thereof, may be repeated for different weapons and each calibration table generated for each weapon may be stored separately along with an identifier of the type of weapon in the storage or non-volatile memory of the magazine.

Further, in certain embodiments, a particular magazine may be capable of supporting different types of ammunition or the same type of ammunition manufactured by different manufacturers. In some such cases, the different types of ammunition, or ammunition manufactured by different manufacturers, may differ in the impact on the position of the linear encoder when a particular number of cartridges are loaded in the magazine. In some such cases the process 3000 may be repeated for each type of ammunition that is capable of being loaded into the magazine and/or for each manufacturer's version of a particular type of ammunition. For example, a particular magazine may be capable of holding .458 SOCOM, .223, 5.56, .50 Beowulf, or 6.5 Grendel ammunition. Because the size of the different types of ammunition may vary, the position of the linear encoder for a particular number of cartridges in the magazine may vary. Thus, in certain embodiments, the process 3000 may be repeated for each type of ammunition capable of being loaded into a particular magazine to create a calibration table, or other data structure, for each type of supported ammunition type. The identity of the ammunition or manufacturer may be stored with the calibration table corresponding to the ammunition type or manufacturer.

Example Calibration Table Based Ammunition Count Process

Figure 31:
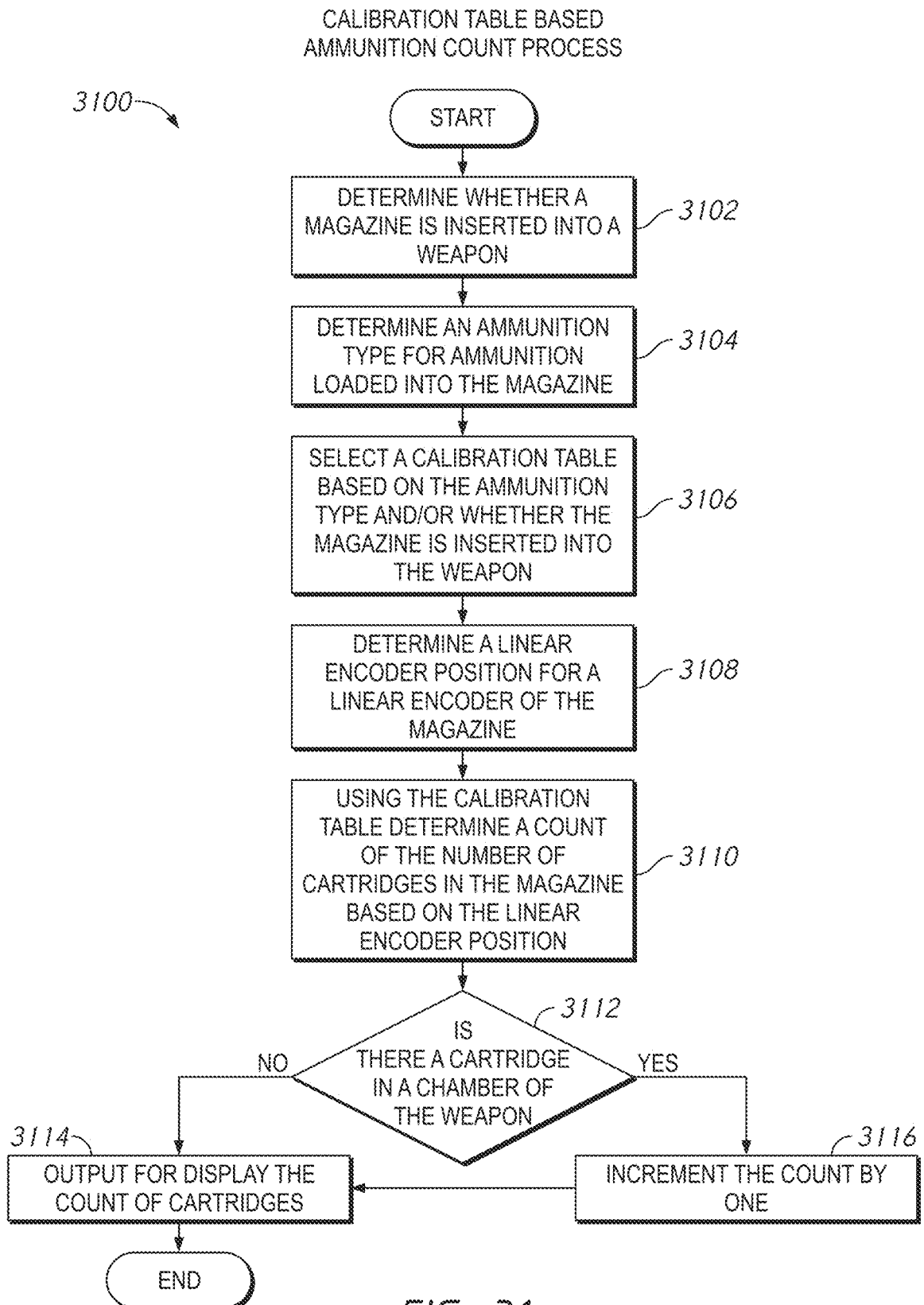
FIG. 31 presents a flowchart of an embodiment of a calibration table based ammunition count process.

FIG. 31 presents a flowchart of an embodiment of a calibration table based ammunition count process. The process 3100 can be implemented by any system that can determine an amount of ammunition in a magazine or in a weapon with the magazine inserted using a calibration table. For example, the process 3100, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3100 will be described with respect to particular systems, such as the electronic circuitry 122 or 2002. However, it should be understood that operations of the process 3100 may be performed by other systems. For example, one or more operations of the process 3100 may be performed by a computing device that is configured to communicate with the magazine 100.

The process 3100 begins at block 3102 where, for example, a hardware processor included in the electronic circuitry 122 determines whether a magazine 100 is inserted into a weapon 1300. This hardware processor may be a field programmable gate array (FPGA) processor, a general-purpose processor, an application specific integrated circuit (ASIC), a microcontroller, a single board computer, or any other type of processor or computing device that may be used to determine the amount of ammunition in the magazine and/or in the weapon using a calibration table. The hardware processor may determine that the magazine is inserted into the weapon by communicating with electronic circuitry 2002 within the weapon. Alternatively, or in addition, the hardware processor of the electronic circuitry 122 may determine that the magazine is inserted into the weapon 1300 based at least in part on pressure detected on a pressure sensor of the magazine 100. In some embodiments, the hardware processor of the electronic circuitry 122 may determine that the magazine is inserted into the weapon 1300 based at least in part on one or more signals received from one or more magnetic sensors within the magazine 100. In some implementations the magazine determines whether it is inserted into the weapon 1300 based on input from a user.

At block 3104, the hardware processor determines an ammunition type for cartridges or ammunition loaded into the magazine. Alternatively, or in addition, a user may provide input that identifies an ammunition type for cartridges or ammunition loaded into the magazine. Determining the ammunition type may include determining a type of the ammunition loaded into the magazine and/or the manufacturer of the ammunition loaded into the magazine. In some cases, determining the ammunition type for cartridges loaded in the magazine may include determining the ammunition type for cartridges that are capable of being loaded into the magazine, but which may not currently be loaded into the magazine because, for example, the magazine has yet to be loaded with ammunition or all of the ammunition that was loaded into the magazine has been fired. In some cases, ammunition type is determined automatically by scanning a code, such as a quick response (QR) code or other type of machine-readable code on a cartridge or on a box that included the cartridge. In some embodiments, the block 3104 is optional or omitted. For example, in some embodiments, the magazine 100 is capable of being loaded with only one type of ammunition or variation between manufacturers of a particular type of ammunition is sufficiently small enough to not impact the ability of the hardware processor to count the number of cartridges within the magazine.

At block 3106, the hardware processor selects a calibration table based at least in part on the ammunition type and/or whether the magazine is inserted into the weapon. In some embodiments, the calibration table may be selected based at least in part on whether the bolt of the weapon is open or closed. The calibration table may be loaded from a non-volatile memory within the magazine 100 and/or within the weapon 1300. The calibration table may be selected from one or more calibration tables generated for the magazine. In some embodiments, the magazine 100 includes a single calibration table because, for example, the magazine 100 supports being loaded by only a single type of ammunition or because calibration tables were only generated for a single type of ammunition. In cases where the magazine 100 can only be loaded by a single type of ammunition, the calibration table may be selected at the block 3106 based on whether the magazine is inserted into the weapon. In some embodiments, the portion of the calibration table accessed may be based on whether the magazine 100 is inserted into the weapon.

At block 3108, the hardware processor determines a linear encoder position for a linear encoder of the magazine 100. Determining the linear encoder position may include determining a position of a magnet attached to a follower of the magazine. In some embodiments, the magnet is not attached to the follower, but moves as the follower moves. The follower may move towards an entry or egress point of the magazine as cartridges are expelled from the magazine. Conversely, the follower may move towards the base of the magazine as cartridges are loaded into the magazine. Thus, as cartridges are loaded or expelled from the magazine, a magnet or linear encoder position may change. In certain embodiments, the hardware processor determines the linear encoder position by mapping one or more signals received from one or more magnetic sensors to data stored in the calibration table. As the signals produced by the one or more magnetic sensors vary based on a location of a magnet with respect to the magnetic sensors, the linear encoder position can be determined based on the signals received from the one or more magnetic sensors.

At block 3110, hardware processor uses the calibration table to determine a count of the number of cartridges in the magazine based at least in part a linear encoder position. Determining the count of the number of cartridges in the magazine may include comparing the linear encoder position to the calibration table to determine a number of cartridges corresponding to the linear encoder position. In some embodiments, the hardware processor may use the linear encoder position as an index for accessing the calibration table to determine a number of cartridges associated with the linear encoder position. In some embodiments, the hardware processor may determine a range of values stored in the calibration table that includes the linear encoder position. A number assigned to the range of values indicate the number of cartridges associated with the linear encoder position. In some embodiments, the linear encoder position correlates to the number of cartridges loaded in the magazine. For example, if the linear encoder position is identified as five, indicates that there are five cartridges loaded within the magazine. In other embodiments, the linear encoder position does not directly correlate to the number of cartridges within the magazine, but is instead mapped within the calibration table to the corresponding number of cartridges within the magazine. For example, a linear encoder position between 5.1 and 5.3 may be mapped to a count of seven cartridges within the magazine, and a linear encoder position between 5.3 and 5.7 may be mapped to a count of the cartridges within the magazine.

At decision block 3112, the hardware processor determines whether there is a cartridge in a chamber of the weapon. Determining whether there is a cartridge in the chamber of the weapon may include determining whether an electrical signal is received from one or more magnetic sensors within the buffer tube of the weapon. In certain embodiments, the hardware processor of the magazine receives the electrical signal from the one or more magnetic sensors of the buffer tube to determine a position of the bolt and consequently, whether there is a cartridge within a chamber of the weapon. In other embodiments, a hardware processor of the weapon itself, such as a hardware processor within a handle of the weapon, determines whether there is a cartridge in the chamber of the weapon. In certain embodiments, the decision block 3112 is optional or omitted. For example, if it is determined that the magazine is not inserted into the weapon, the decision block 3112 may be omitted. In other embodiments, the decision block 3112 may be performed by the weapon regardless of whether a magazine is inserted into the weapon. It can typically be determined whether a cartridge is in the chamber of the weapon based on magnetic sensor from the plurality of magnetic sensors that provides a signal to the hardware processor. Thus, is generally unnecessary to have a calibration table for the weapon and to determine whether a cartridge is in the chamber. However, in certain embodiments, the calibration table may be generated for the weapon to facilitate determining whether a cartridge is in the chamber.

If it is determined at the decision block 3112 that there is not a cartridge in the chamber of the weapon, the hardware processor outputs for display a count of the cartridges at the block 3114 that is included in the magazine. The block 3114 may include providing a count of the cartridges to a display or a display controller for output to a user. For example, the count of the cartridges may be provided to the controller 1212 which may cause the cartridge count to be displayed by the light emitting diodes 1202.

If it is determined at the decision block 3112 that there is a cartridge in the chamber of the weapon, the hardware processor increments the count by one at the block 3116. In certain embodiments, the count may be incremented by more than one. For example, if the weapon is a multi-chambered weapon or is a weapon that loads multiple cartridges at a time into a corresponding number of chambers, the count may be incremented by one for each chamber that is determined to be loaded. The incremented count of cartridges may then be output for display at the block 3114. Further, in some embodiments, the block 3114 may output separately or together a count of the number of cartridges in the magazine and a count of the number of cartridges within a chamber of the weapon. In some embodiments, the number of cartridges within the magazine and/or chamber is stored within a memory at the block 3114 instead of or in addition to being displayed. For example, in some embodiments, the count of cartridges is stored within a memory and is only displayed upon request by a user or in response to an event, such as the firing of a cartridge, a loading of the magazine, or the clearing of a jam in the weapon.

Example Magazine Recalibration Process

Figure 32:
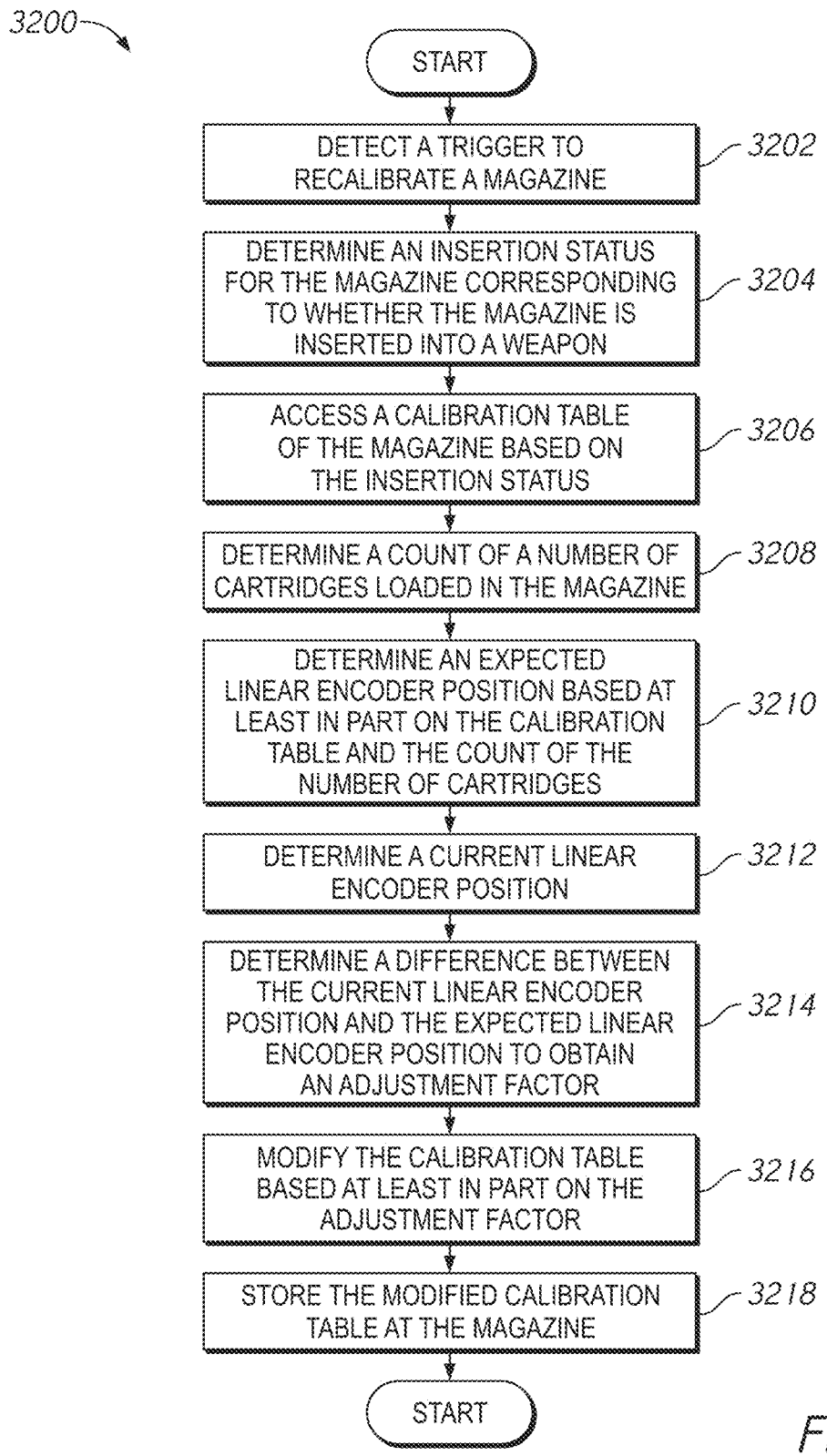
FIG. 32 presents a flowchart of an embodiment of a magazine recalibration process.

FIG. 32 presents a flowchart of an embodiment of a magazine recalibration process. The process 3200 can be implemented by any system that can recalibrate a magazine or an ammunition count system of the magazine. For example, the process 3200, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3200 will be described with respect to particular systems, such as the electronic circuitry 122 or 2002. However, it should be understood that operations of the process 3200 may be performed by other systems. For example, one or more operations of the process 3200 may be performed by a computing device that is configured to communicate with the magazine 100.

The process 3200 begins at block 3202 where, for example, a hardware processor included in the electronic circuitry 122 detects a trigger to recalibrate the magazine 100. The trigger may include interaction by a user with a user interface, such as a pressing a button or a powering on of circuitry within the magazine. Alternatively, or in addition, the trigger may be related to a passage of time. For example, the magazine may be recalibrated once a day, once a week, once a month, or some other determined time. In some cases, the trigger may be the loading or unloading of the magazine a particular number of times. The amount of force applied to cartridges within the magazine may differ for each weapon. In some cases, even weapons of the same manufacturer may apply a different amount of force to the cartridges within the magazine because, for example, of manufacturing tolerances or wear and tear of the weapon. Thus, in some embodiments, the process 3200 may be triggered or initiated each time a user uses a different weapon with the magazine. In some cases, when the magazine 100 is first obtained by a user, or at any other time the user selects, the user may initiate the process 3200. In some embodiments, the trigger may be a command received in response to a user interacting with a user interface on a magazine, on a weapon, or on any type of wireless device that can communicate with the magazine. For example, a user may access a user interface on a smartphone or a laptop to request recalibration of a set of magazines. The wireless device may communicate wirelessly with each magazine registered to the user, or a subset of identified magazines, to trigger the recalibration process for the magazines.

At block 3204, the hardware processor determines an insertion status for the magazine corresponding to whether the magazine is inserted into a weapon. The insertion status may be determined based at least in part on the ability of the hardware processor in the magazine to communicate with electronic circuitry of the weapon. In some cases, a mechanical switch in the magazine may be triggered based on the insertion of the magazine into the weapon, thereby indicating whether or not the magazine is inserted into the weapon. In other cases, an optical or electrical switch is triggered based on the insertion of the magazine into the weapon, thereby indicating whether or not the magazine is inserted into the weapon. In some cases, a user may indicate the insertion status of the magazine by interacting with a user interface on the magazine or on a system in communication with the magazine.

At block 3206, hardware processor accesses a calibration table of the magazine based at least in part on the insertion status. The calibration table may be accessed from a memory of the magazine. In some embodiments, the calibration table may be accessed from a memory of the weapon. In some embodiments, the calibration table may be selected from a plurality of calibration tables based at least in part on the insertion status of the magazine, and identity of a type of cartridges loaded into the magazine, or a manufacturer of the cartridges loaded into the magazine.

At block 3208, the hardware processor determines a count of a number of cartridges loaded in the magazine. The count of the number of cartridges loaded into the magazine may be identified by a user interacting with a user interface of the magazine. Alternatively, in certain embodiments, the number of cartridges loaded into the magazine is assumed to be a particular number of cartridges required for recalibrating the magazine. For example, a user may be instructed to load the magazine with a particular number of cartridges corresponding to the maximum number of cartridges may be loaded into the magazine. In some embodiments, the process 3200, or certain operations thereof, may be repeated using different numbers of cartridges within the magazine. For example, the process may be repeated using zero cartridges, the maximum number of cartridges, the number of cartridges corresponding to the magazine being half-full, or a number of cartridges corresponding to the magazine being one third full. In some embodiments, a user may be instructed, such as via a user interface of the magazine, to load a particular number of cartridges into the magazine. The user may be instructed to load different numbers of cartridges into the magazine across multiple performances of portions of the process 3200 to generate the modified calibration table.

At block 3210, the hardware processor determines an expected linear encoder position based at least in part on the calibration table and the count of the number of cartridges. Determining the expected linear encoder position may include determining in the calibration table where the linear encoder is expected to be within the magazine for the identified number of cartridges loaded into the magazine. In some cases, the hardware processor may use the number of cartridges as an index value to access the calibration table to determine the expected or anticipated linear encoder position for the linear encoder of the magazine.

At block 3212, the hardware processor determines a linear encoder position. In some embodiments, the block 3212 may include one or more of the embodiments previously described with respect to the block 3108.

At block 3214, the hardware processor determines a difference between the current linear encoder position and the expected linear encoder position to obtain an adjustment factor. In certain embodiments, the difference between the current linear encoder position and the expected linear encoder position is zero and consequently the adjustment factor is zero. However, in other embodiments, the difference between the current linear encoder position and expected linear encoder position is nonzero. The difference between the two encoder positions may be nonzero because, for example, the ammunition used to calibrate the magazine initially and the ammunition used during the recalibration process 3200 may differ in type or a manufacturer. In some cases, the difference may be attributable to tolerances for the ammunition manufactured by a manufacturer. In some cases, the magazine is loaded with a default calibration table created using a model magazine for some magazine other than the current magazine being recalibrated. In some such cases variations may occur during the manufacturing process resulting in the linear encoder position for a particular number of cartridges loaded in the magazine differing from that of the default calibration table. Moreover, in some cases, the structure of the magazine may change over time due to wear and tear of the magazine. For example, the stiffness of the magazine housing or the springiness of the spring may change over time as the magazine is used or is exposed to different environmental factors. In some such cases, the position of the linear encoder for a particular number of cartridges loaded in the magazine may change over time as the as the condition of the magazine evolves over time.

At block 3216, the hardware processor modifies the calibration table based at least in part on the adjustment factor. In some embodiments, the hardware processor may modify the calibration table only if the adjustment factor exceeds a threshold. In other embodiments, the hardware processor modifies the calibration table based on any non-zero adjustment factor. In some cases, the adjustment factor is the same for the entire calibration table. In other words, the linear encoder position may be modified based on the adjustment factor for each entry associated with each number of cartridges loaded within the magazine. Alternatively, in certain embodiments, the adjustment factor may vary for different amounts of cartridges loaded within the magazine. For example, the adjustment factor for the linear encoder may be smaller when the magazine is empty or has a fewer number of cartridges loaded compared to when the magazine has a greater number of cartridges loaded. For instance, he adjustment factor for the linear encoder may be zero when the magazine is empty, 1 µm when one cartridge is loaded in the magazine, 2 µm when to cartridges are loaded in the magazine, 4 µm when three cartridges are loaded in the magazine, and 1 mm when four cartridges are loaded in the magazine. In some embodiments, the hardware processor may modify the calibration table associated with the magazine being inserted into the weapon and the calibration table associated with the magazine not being inserted into the weapon based on the adjustment factor. In other embodiments, the process 3200 is repeated once for the magazine being inserted the weapon and once the magazine not being inserted into the weapon.

At block 3218, the hardware processor stores the modified calibration table at the magazine. The modified calibration table may replace the existing calibration table or may be stored as an additional calibration table. The calibration table may be stored in a memory of the magazine.

Example Process of Obtaining a Total Ammunition Count

Figure 33:
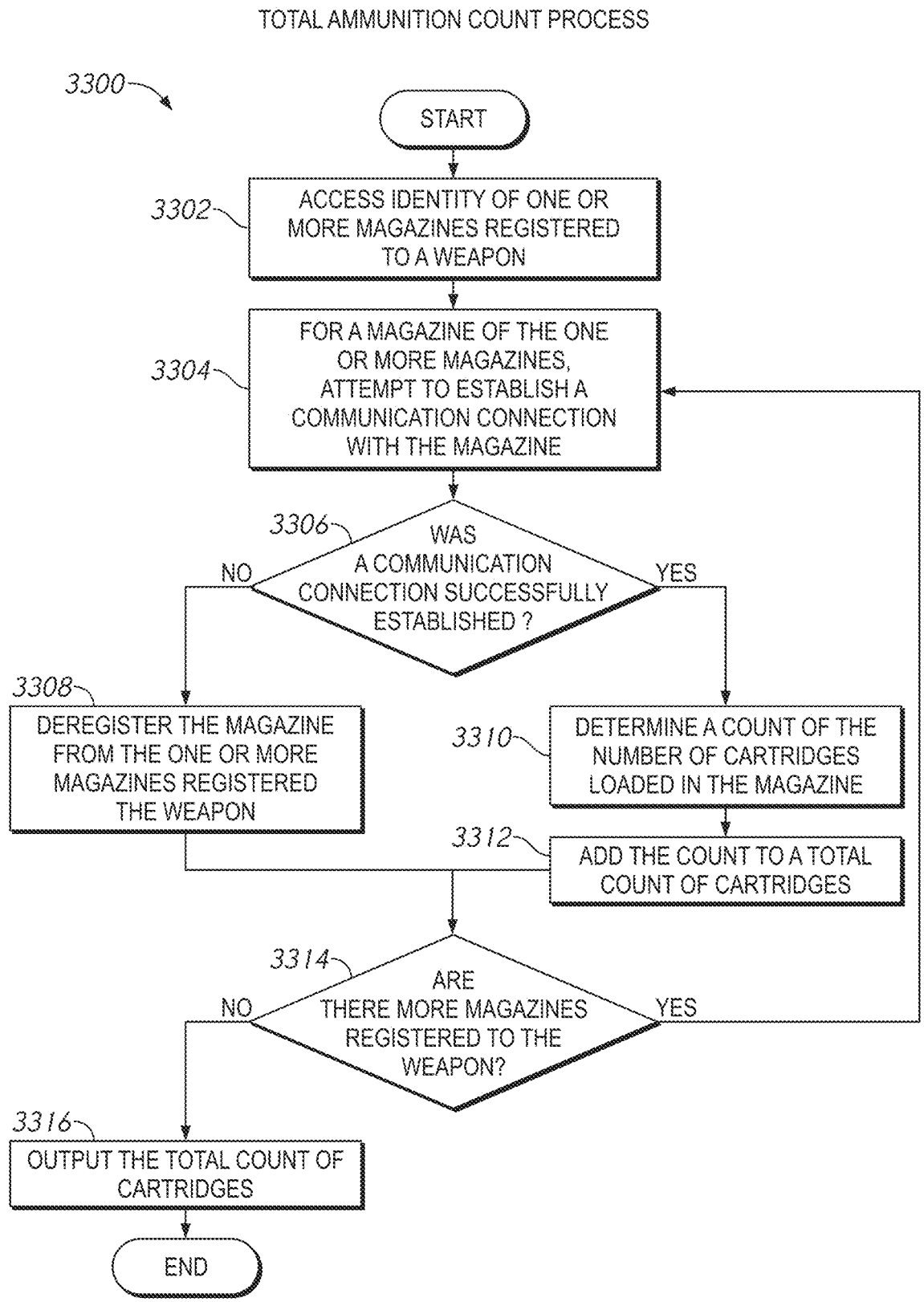
FIG. 33 presents a flowchart of an embodiment of a total ammunition count process.

FIG. 33 presents a flowchart of an embodiment of a total ammunition count process 3300. The process 3300 can be implemented by any system that can obtain a total ammunition count available to a user across one or more magazines registered to a weapon of the user. For example, the process 3300, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3300 will be described with respect to particular systems, such as the electronic circuitry 122 or 2002. However, it should be understood that operations of the process 3300 may be performed by other systems. For example, one or more operations of the process 3300 may be performed by a computing device that is configured to communicate with a weapon 1300 or one or more magazines.

Performance of the process 300 may occur in response to a trigger. This trigger may be a request from a user, a passage of time, the addition or removal of a magazine from a set of magazines registered to a weapon or to a user, or the insertion or removal of a magazine from an insertion port of the weapon.

The process 3300 begins at block 3302 where, for example, a hardware processor included in the electronic circuitry 2002 accesses the identity of one or more magazines registered to a weapon. The identity of the one or more magazines may be obtained from a memory, such as a non-volatile memory, located within the weapon. This memory may be located within a handle of the weapon, or a stock of the weapon. In some embodiments, the memory may be located within hardware other than the weapon carried by the user, such as a helmet or personal communication device included in the user's kit. The identity of the one or more magazines may include a network address for accessing the one or more magazines via an ad hoc network. The network address may be formed from a combination of an identifier of the weapon and an identifier of the magazine.

In some such embodiments, the weapon may serve as a router or hub that can communicate with the one or more magazines. This communication may be performed using ultra-wide band (UWB) communication. Further, the range of communication may be limited to a particular range of the user carrying the weapon creating a small personal network for the user. For example, the range of communication may be limited to 100 meters, 50 meters, 25 meters, 10 meters, or 3 meters or less. In some embodiments, although the transceiver in the weapon may be capable of communicating over a larger distance, the power supplied may be sufficiently small to limit communication to 1 to 2 meters to prevent eavesdropping or interference. Communication range may be limited based on the amount of power supplied to the networking equipment of the weapon. In some embodiments, the router or hub may be included and other equipment carried by the user, such as a helmet of the user. In some embodiments, the weapon may implement a low probability of intercept/low probability of detect (LPI/LPD) protocol to reduce eavesdropping or interference by malicious users.

At block 3304, the hardware processor, using a transceiver, attempts to establish a communication connection with a magazine from the one or more magazines identified at the block 3302. In some embodiments, the operations associated with the block 3304 may be performed in parallel or substantially in parallel for a plurality of magazines of the one or more magazines. In some cases, a magazine inserted into the weapon may be omitted from the operations of the block 3304 because, for example, a count of cartridges loaded in the magazine inserted into the weapon may be obtained via alternative communication channels between the magazine and the weapon and/or alternative processes available for the magazine inserted into the weapon. For example, an optical communication connection may be established between the weapon and the magazine inserted into the weapon enabling the weapon to obtain the cartridge count for the magazine inserted into the weapon by requesting the cartridge count from the hardware processor of the magazine. As another example, the magazine may automatically provide the cartridge count to the weapon when inserted into the weapon via an optical connection to the weapon. In some embodiments, communication between the magazine and the weapon is encrypted or occurs over a secure channel. Further, the attempt to establish the communication connection with the magazine may occur over a particular time period. For example, the weapon may attempt to communicate with a magazine for 5, 10, 15, or 30 seconds or a minute.

At decision block 3306, the hardware processor determines whether a communication connection was successfully established with the magazine. The hardware processor may determine whether the attempt to establish the communication connection was successful based at least in part on whether the transceiver receives an acknowledgment packet or response from the magazine. In some cases, the hardware processor determines whether the attempt to establish a communication connection was successful based on whether the acknowledgment packet or other response from the magazine is received within a particular time period.

If it is determined at the decision block 3306 that a communication connection was not successfully established with the magazine, the hardware processor deregisters the magazine from the one or more magazines registered to the weapon at block 3308. Deregistering the magazine may include removing the identification of the magazine in a memory of the weapon. Alternatively, or in addition, deregistering the magazine may include marking an identifier of the magazine in the memory as no longer available. Further, in certain embodiments, deregistering the magazine may include removing a number of cartridges associated with the deregistered magazine from a total count of cartridges available to the user.

If it is determined that the decision block 3306 that a communication connection was successfully established, the hardware processor determines at the block 3310 a count of the number of cartridges loaded in the magazine. Determining the count of the number of cartridges loaded in the magazine may include requesting account information from the magazine. Requesting the account information of the number of cartridges loaded in the magazine may cause the magazine to access its memory to determine the count of cartridges and to transmit the count information to the weapon. Alternatively, or in addition, requesting the count information of the number of cartridges loaded in the magazine may cause the magazine to perform a cartridge count process, such as the process 3100.

At block 3312, the hardware processor adds the count obtained at the block 3310 to a total count of cartridges. The total count of cartridges may represent the total number of cartridges available to a user. Alternatively, or in addition, the total count of cartridges may represent the total number of cartridges loaded into all of the magazines registered with the user or registered to the weapon. In other words, if there are five magazines registered to the weapon or to the user, the total count of cartridges may represent the cumulative number of cartridges loaded into the five registers combined.

At the decision block 3314, the hardware processor determines whether there are more magazines registered to the weapon. If there are more magazines registered to the weapon, the process 3300 returns to the block 3304 where the hardware processor repeats the operations of the block 3304 for a different magazine of the one or more magazines.

If there are no more magazines registered to the weapon, the hardware processor outputs the total count of cartridges at the block 3316. The block 3316 may include one or more of the embodiments previously described with respect to the block 3114. In some embodiments, the total count of cartridges may be displayed on a display of the magazine inserted into the weapon, on a scope attached to the weapon, on a heads up display of the helmet, or any other display accessible to the user. In some embodiments, the total count of cartridges may be transmitted wirelessly to another user other than the user carrying the weapon or otherwise associated with the weapon. For example, the total cartridge count may be transmitted to a display or system of a squad commander or other supervising user of the user carrying the weapon. In some embodiments, the total cartridge count may be transmitted to another location, such as a command center or other monitoring location. In some cases, the total count of cartridges is not output for display or is only output for display upon a request by a user. In some such cases, the total count of cartridges may be stored in a nonvolatile memory of the weapon or in other nonvolatile memory available to the user, such as non-volatile memory may be included in a helmet (e.g., a helmet with a heads up display) of the user.

In some embodiments, the total cartridge count may also include the cartridges loaded in a magazine that is inserted into the weapon. In some such cases, a count of the cartridges loaded in the magazine is inserted into the weapon may be determined using the process 3100. To determine the count of cartridges loaded in the magazine that is inserted into the weapon may be added to the total count of cartridges available to a user across all magazines registered to the weapon. Further, in some embodiments, the total count of cartridges may include a cartridge in a chamber of the weapon.

In some embodiments, the process 3300 or a modified version of the process 3300 may be used to identify ammunition count for different types of ammunition carried by the user. For example, when each magazine is registered with the weapon, the type of ammunition loaded in the magazine may also be identified. Thus, when calculating the total count of cartridges available to the user, the hardware processor may separately count magazines that are loaded with different types of ammunition. In some such cases, the weapon may display the total ammunition available to the user and the total ammunition of each type of ammunition available to the user. Thus, for example, the weapon may display the total amount of round nose cartridges and the total number of hollowpoint cartridges available to the user.

In some embodiments, the weapon may count the total number of cartridges available to a user for magazines the user carries for a different weapon. For example, the user may register each magazine the user carries with a weapon that includes the ammunition count hardware. The weapon may then communicate with each of the magazines to determine the total cartridges available to the user regardless of whether the weapon can load each of the magazines. Advantageously, in certain embodiments, the weapon can count the total number of cartridges available for the user's rifle as well as the user's handgun or other weapon and display it on a single display enabling the user to track the total ammunition available to the user. The display may identify separately the cartridge counts for the different weapons of the user.

Example Magazine Registration Process

Figure 34:
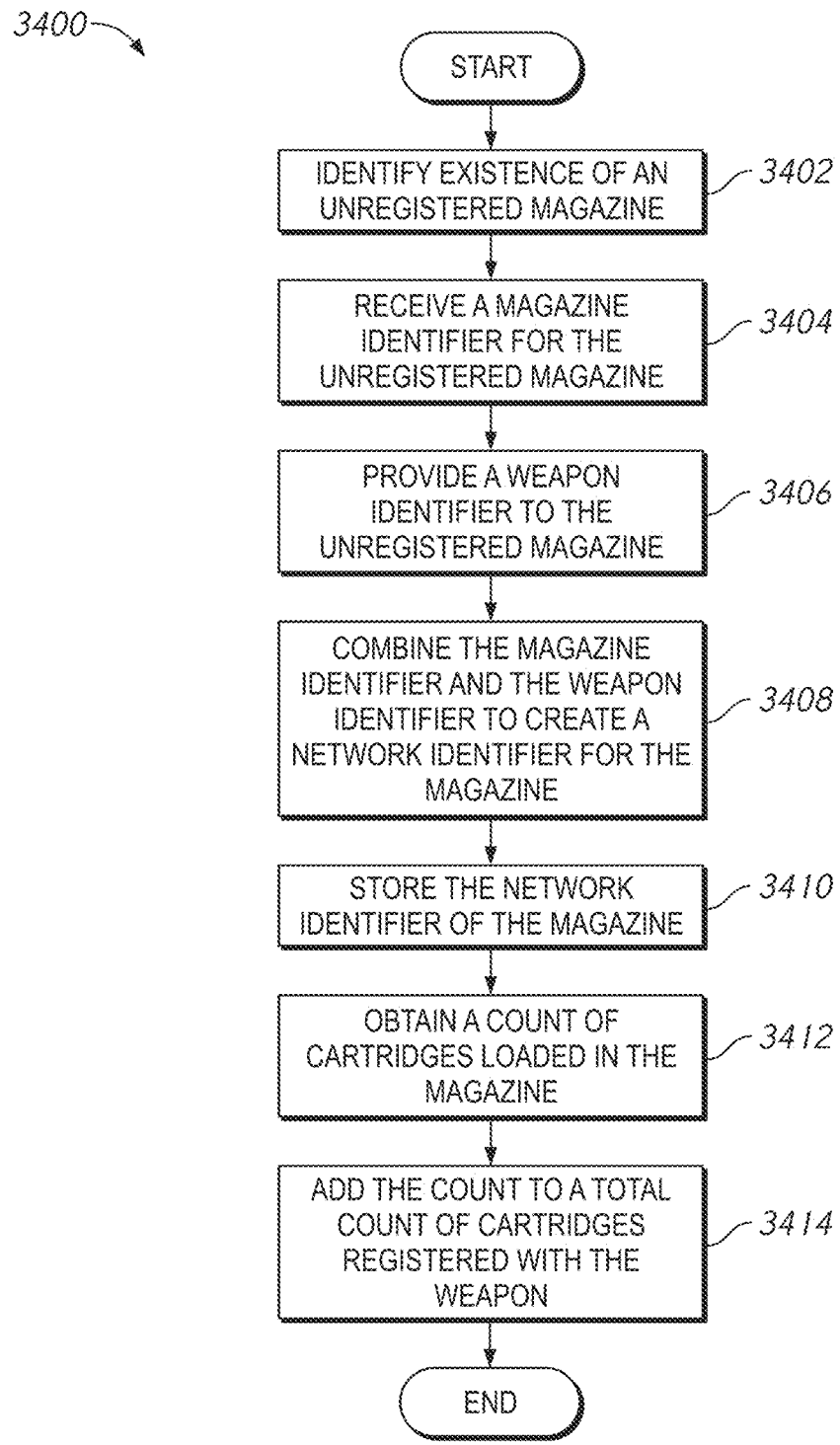
FIG. 34 presents a flowchart of an embodiment of a magazine registration process.

FIG. 34 presents a flowchart of an embodiment of a magazine registration process 3400. The process 3400 can be implemented by any system that can register a magazine with a weapon. For example, the process 3400, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3400 will be described with respect to particular systems, such as the electronic circuitry 122 or 2002. However, it should be understood that operations of the process 3400 may be performed by other systems. For example, one or more operations of the process 3400 may be performed by a computing device that is configured to communicate with a weapon 1300 or one or more magazines.

The process 3400 begins at block 3402 where, for example, a hardware processor included in the electronic circuitry 2002 identifies the existence of an unregistered magazine. The unregistered magazine may include any magazine that is not currently registered with the weapon regardless of whether the magazine was registered with the weapon at some previous point in time. The hardware processor may identify the existence of the unregistered magazine when the unregistered magazine is inserted into the weapon. Upon insertion of the magazine into the weapon, the hardware processor may obtain an identifier for the magazine. The hardware processor may access a list or other data structure stored within a memory of the weapon and may determine whether the identifier for the magazine is included in the list or the data structure to determine whether the magazine is unregistered with the weapon.

Alternatively, or in addition, the existence of an unregistered magazine may be determined when the magazine is brought within a particular distance of the weapon. For example, when the unregistered magazine is brought within radio distance of the weapon, the weapon may access radio frequency identifier (RFID) tag or other type of tag of the magazine to obtain identifier of the magazine. Using the identifier of the magazine, the hardware processor can determine whether the magazine is registered with the weapon. In some embodiments, when a user presses a button on the magazine or interacts with the user interface of the magazine, the magazine may transmit an identifier within a particular distance. In certain embodiments, this particular distance is generally a short distance (e.g., 10 feet or less) to prevent weapons of other users from receiving the identifier from the magazine. Further, the identifier may be used by the weapon to determine whether the magazine is registered with the weapon. Further, the identifier may be used to facilitate the weapon communicating with the magazine to establish a network identifier for further communication between the magazine and the weapon.

In certain embodiments, the user may deregister a magazine with the weapon by interacting with the user interface to indicate that a magazine inserted into the weapon is to be deregistered. Alternatively, or in addition, the user may interact with the user interface of the magazine to indicate to the weapon that the magazine within RFID communication distance of the weapon is to be deregistered from the weapon.

At block 3404, the hardware processor receives a magazine identifier for the unregistered magazine. The magazine identifier may be a unique identifier associated with the magazine of the weapon and can be used to distinguish the magazine from other magazines that may be within communication distance of the weapon. In some cases, the magazine identifier is a default identifier associated with any magazine that is not registered to a weapon. Upon registering the magazine with a weapon, the default identifier may be replaced with a unique identifier assigned by the weapon. Upon the registering the magazine with a weapon or upon the magazine no longer being within communication distance with the weapon, the identifier assigned by the weapon may be reset or replaced with the default identifier. In some embodiments, the identifier of the magazine may be or may be similar to a media access control (MAC) address.

At block 3406, the hardware processor provides a weapon identifier to the unregistered magazine. The weapon identifier may be a unique identifier associated with the weapon that is registering the magazine. In some embodiments, the weapon identifier of the weapon may be or may be similar to a media access control (MAC) address. In certain embodiments, the magazine may combine the weapon identifier with the magazine identifier to create an identifier used for further communication with the weapon. In certain embodiments, instead of providing the weapon identifier to the unregistered magazine, the block 3406 may include providing a unique identifier to the unregistered magazine that is based at least in part on the magazine identifier and the weapon identifier, and which may be used to uniquely identify the magazine. In some embodiments, the block 3406 may be optional or omitted. For example, in some embodiments, the weapon may provide the network identifier created at the block 3408 below to the magazine.

At block 3408, the hardware processor combines the magazine identifier and the weapon identifier to create a network identifier for the magazine. The network identifier may be a unique identifier that the weapon uses to identify the magazine. In some embodiments the weapon may use the network identifier is a network address to establish communication with the magazine. Advantageously, in certain embodiments, by assigning each magazine a unique network identifier, each magazine within communication range of the weapon can determine whether a communication is intended for the magazine or another magazine registered with the weapon.

At block 3410, the hardware processor stores the network identifier of the magazine. The network identifier may be stored in a non-volatile memory of the weapon.

At block 3412, the hardware processor obtains a count of cartridges loaded into the magazine. In certain embodiments, the block 3412 may include performing the process 3100, or portions thereof. In some cases, the hardware processor may request the count of cartridges from the magazine by establishing a communication connection with the magazine via a secure channel and using the network identifier assigned to the magazine. In some embodiments the block 3412 may include one or more of the embodiments described with respect to the block 3310.

At block 3414, the hardware processor adds the count to a total count of cartridges registered with the weapon. The total count of cartridges registered with the weapon may be stored in the nonvolatile memory of the weapon. In some embodiments, performing the block 3414 may include performing the process 3300, or parts thereof. In some embodiments determining the total count of cartridges registered with the weapon may include aggregating the count of cartridges loaded within each magazine registered with the weapon including a magazine inserted into the weapon. Further, determining the total count of cartridges registered with the weapon may include determining whether the cartridge is within a chamber of the weapon. In some embodiments, the block 3414 may include adding the count of cartridges for the magazine newly registered to the weapon to a running count of cartridges previously determined to be registered with the weapon. In other embodiments, the block 3414 may include performing a new count of cartridges available across all magazines registered with the weapon. In some embodiments determining the total count of cartridges registered with the weapon may include subtracting the count of cartridges loaded into a magazine that is determined to be deregistered or no longer registered with the weapon. The deregistered magazine may include a magazine that the weapon is no longer able to indicate with to you, for example, a distance between the weapon in the magazine.

Example Weapon Display State Machine

Figure 35:
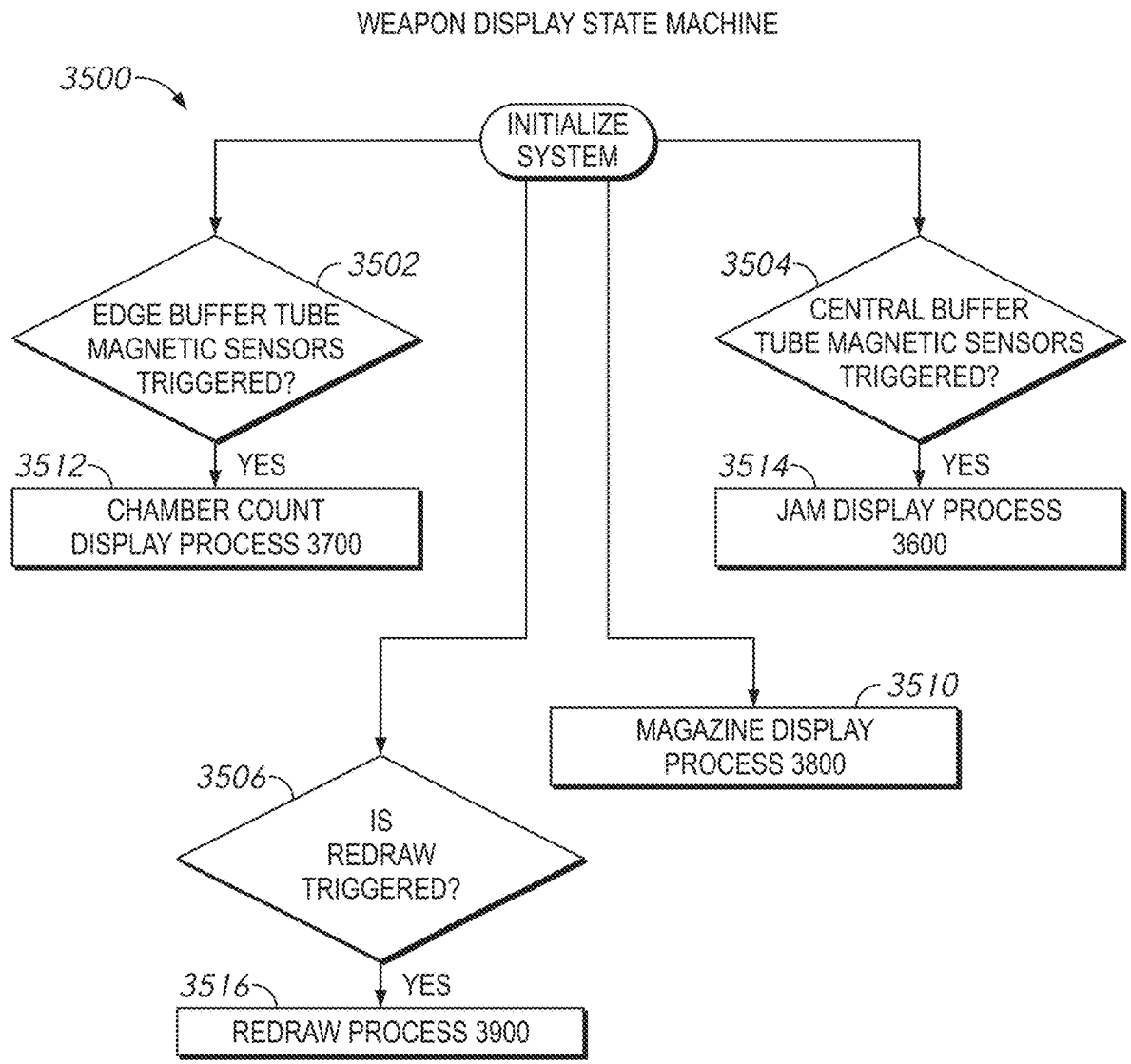
FIG. 35 presents a flowchart of an embodiment of a weapon display state machine.

FIG. 35 presents a flowchart of an embodiment of a weapon display state machine 3500. The weapon display state machine 3500 includes a number of states and decision points for a controller of a display of a weapon system and/or a hardware processor included in the weapon system. Each of the states is associated with performing a process as described herein. The process may be performed by a weapon system or a hardware processor of a weapon system. Although particular processes are identified, it should be understood that in certain embodiments, alternative embodiments of the processes described herein may be performed.

When the weapon system is initialized a magazine display state 3510 may be entered causing performance of a magazine display process 3800. Further, the magazine display process 3800 may be performed continuously or intermittently while a hardware processor and/or display controller is powered or active. Moreover, the weapon system may remain in a magazine display state 3510 when each of the decisions blocks 3502-3506 return a "no" determination. The magazine display process 3800 is described in more detail below with respect to FIG. 38.

At decision block 3502, it is determined whether an edge buffer tube magnetic sensor has been triggered. If one or more edge buffer tube magnetic sensors have been triggered, the weapon system enters the chamber count display state 3512 causing performance of a chamber count display process 3700. The chamber count display process 3700 is described in more detail below with respect to FIG. 37.

At decision block 3504, it is determined whether a central buffer tube magnetic sensor has been triggered. If one or more central buffer tube magnetic sensors have been triggered, the weapon system enters a jam display state 3514 causing performance of the jam display process 3600. The jam display process 3600 is described in more detail below with respect to FIG. 36.

At decision block 3506, it is determined whether a redraw has been triggered. If it is determined that a redraw has been triggered, the weapon system enters a redraw state causing performance of the redraw process 3900. The redraw process 3900 is described in more detail below with respect to FIG. 39.

Example Jam Display Process

Figure 36:
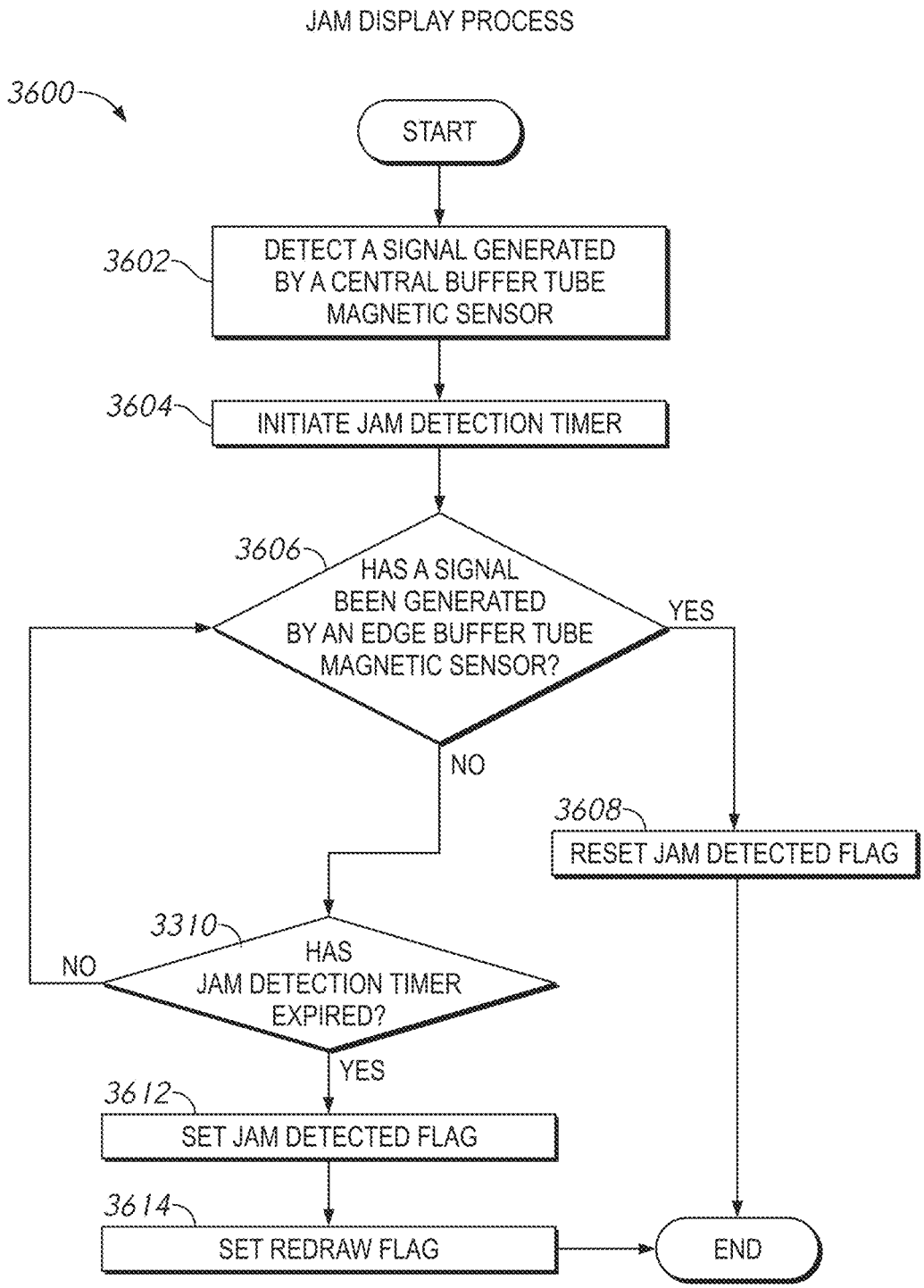
FIG. 36 presents a flowchart of an embodiment of a jam display process.

FIG. 36 presents a flowchart of an embodiment of a jam display process 3600. The process 3600 can be implemented by any system that can determine whether a weapon is jammed and display a jam state of the weapon. For example, the process 3600, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3600 will be described with respect to particular systems, such as the electronic circuitry 122 or 2002. However, it should be understood that operations of the process 3600 may be performed by other systems. For example, one or more operations of the process 3600 may be performed by a computing device that is configured to communicate with a weapon 1300 or one or more magazines.

The process 3600 begins at block 3602 where, for example, a hardware processor included in the electronic circuitry 2002 detects a signal generated by a central buffer tube magnetic sensor. Detecting a signal at the central buffer tube magnetic sensor may include determining that the central buffer tube magnetic sensor generated a signal based on a magnet or magnetic field detected by the magnetic sensor. The signal may be generated by a magnetic sensor within the buffer tube that is between the two ends of the buffer tube in response to a magnetic field produced by a magnet within sensor detection range of the magnetic sensor.

The central buffer tube magnetic sensor may include any of the magnetic sensors that are between the two ends of the buffer tube. For example, with reference to FIG. 20, some weapons may include five magnetic sensors 2018 within the buffer tube 2012 of the weapon 1300. The central buffer tube magnetic sensors may include the middle three magnetic sensors 2018 that are between the magnetic sensors at each end of the buffer tube 2012. In certain embodiments, the magnetic sensors 2018 may generate a signal regardless of detection of a magnet 2016. In some such embodiments, detecting the signal generated at the central buffer tube magnetic sensor 2018 may include determining that the signal generated by one of the central buffer tube magnetic sensors 2018 is stronger than a signal generated by an edge buffer tube sensor.

At block 3604, the hardware processor initiates a jam detection timer. The jam detection timer may include a timer that counts the length of time that the signal is received from one or more of the central buffer tube magnetic sensors. Alternatively, or in addition, the jam detection timer may measure the amount of time that the strongest signal is received from one of the central buffer tube magnetic sensors as supposed to one of the edge buffer tube magnetic sensors. Initiating the jam detection timer may include setting the timer to a value of zero and starting the timer.

At decision block 3606, the hardware processor determines whether a signal has been generated at an edge buffer tube magnetic sensor. Determining whether a signal has been generated at the edge buffer tube magnetic sensor may comprise determining whether an edge buffer tube magnetic sensor has generated a signal in response to a magnet or magnetic field. In certain embodiments, the decision block 3606 includes determining whether the signal has been generated at a particular edge buffer tube magnetic sensor. In other words, the decision block 3606 includes determining whether the signal has been generated at the magnetic sensor 2018 at one edge of the buffer tube or by the magnetic sensor 2018 at the opposite edge of the buffer tube of FIG. 20. In other embodiments, the decision block 3606 includes determining whether a signal has been detected as being generated at either of the edge buffer tube magnetic sensors. In some embodiments, the decision block 3606 may include one or more of the embodiments associated with the block 3602, but with respect to the edge sensors instead of the central buffer tube magnetic sensors.

In some embodiments, the decision block 3606 may include determining whether a signal generated at an edge buffer tube magnetic sensor is stronger than one or more signals that may be generated by one or more other buffer tube magnetic sensors 2018. In some cases, the magnetic field generated by the magnet 2016 may be sufficiently strong enough to be detected by multiple magnetic sensors 2018. Alternatively, or in addition, multiple magnetic sensors 2018 may be sensitive enough to detect a magnetic field generated by the magnet 2016. In some such cases, the determination of whether an edge magnetic sensor 2018 or a central magnetic sensor 2018 within the buffer tube generates a signal responsive to detecting a magnet, or magnetic field, may be based on the strength of the signal generated. In some cases, the decision block 2606 includes determining whether the strength of the signal at the edge buffer tube magnetic sensor exceeds the strength of the signal at the central buffer tube magnetic sensor by a threshold amount.

If a signal is detected as being generated at the edge buffer tube magnetic sensor, or if the signal from the edge buffer tube magnetic sensor is stronger than signals from a central buffer tube magnetic sensor, the hardware processor resets a jam detected flag at the block 3608. In certain embodiments, the block 3608 may be optional or omitted. For example, if the jam detected flag was not previously set, or does not indicate the existence or potential existence of a jam, the block 3608 may be omitted. Further, the block 3608 may include resetting or stopping a jam detection timer initiated at the block 3604.

If a signal is not generated at the edge buffer tube magnetic sensor, or if the signal generated at the edge buffer tube magnetic sensor is lower in strength than a signal generated at a central buffer tube magnetic sensor, the hardware processor determines whether the jam detection timer has expired at the decision block 3610. Determining whether the jam detection timer has expired may include determining whether a passage of time measured by the jam detection timer exceeds a threshold length of time. The threshold length of time may vary based on the type of weapon. In some embodiments, the user may set the threshold length of time. If the jam detection timer has not expired, or has not exceeded the threshold length of time, the process 3600 returns to the decision block 3606 where the hardware processor continues to monitor whether a signal has been generated at the edge buffer tube magnetic sensor.

If it is determined at the decision block 3610 that the jam detection timer has expired, the hardware processor sets a jam detected flag at the block 3612. Setting the jam detected flag may include setting a value of the jam detected flag to indicate that a jam has been detected in the weapon. Further, setting the jam detected flag may include storing at a non-volatile memory of the weapon that the jam has been detected. Further, the hardware processor sets a redraw flag at the block 3614. Setting the redraw flag may trigger performance of the redraw process 3900 associated with the state 3516 as illustrated in the FIG. 35. The redraw process 3900, as described below, may be used to output an indication to a user that the weapon is jammed. In certain embodiments, the blocks 3612 and/or 3614 may be optional or omitted. For example, in some embodiments, if the jam detection timer has expired, the hardware processor may cause an output of an indication that the weapon is jammed without setting any internal flags within the weapon.

Example Chamber Count Display Process

Figure 37:
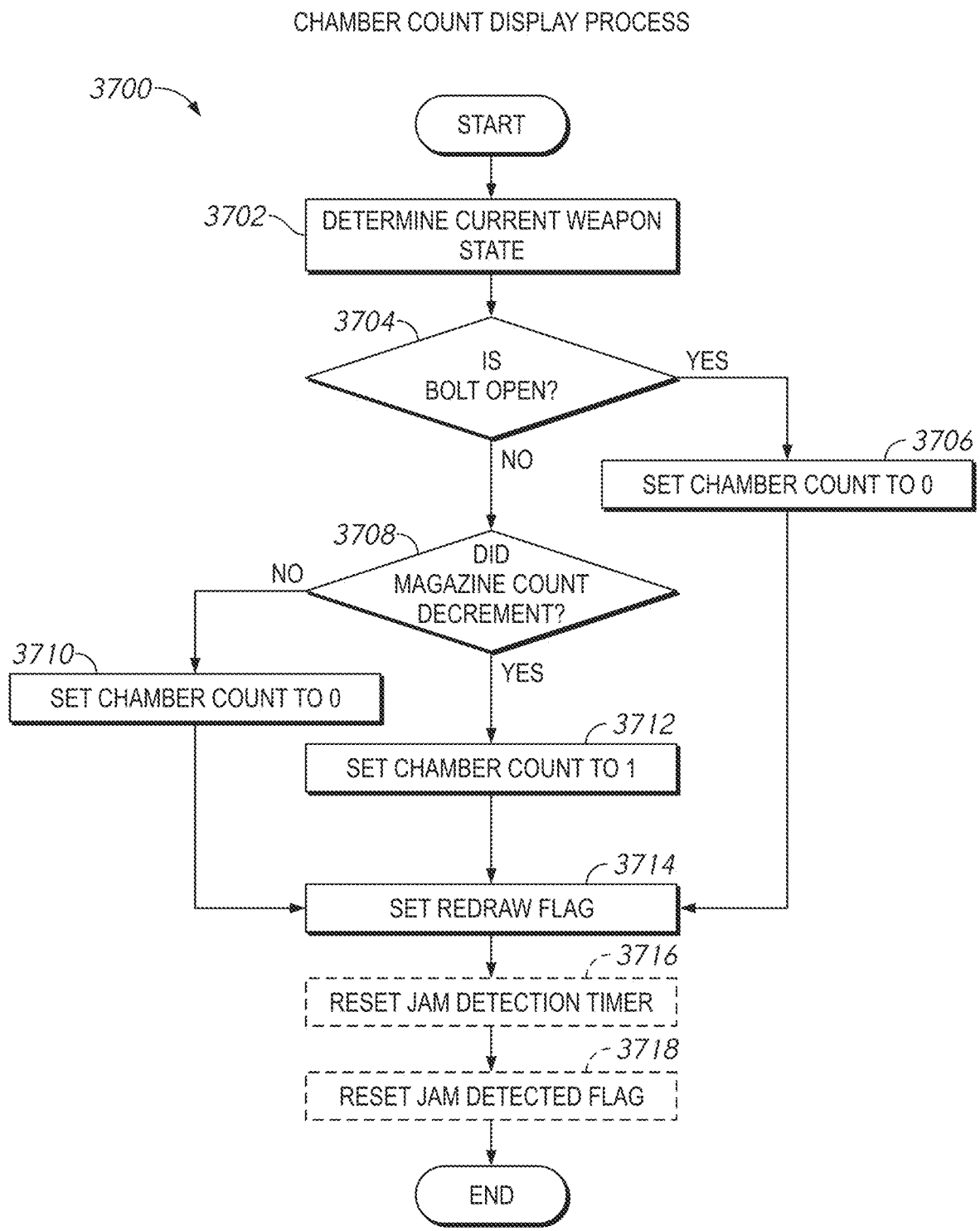
FIG. 37 presents a flowchart of an embodiment of a chamber count display process.

FIG. 37 presents a flowchart of an embodiment of a chamber count display process 3700. The process 3700 can be implemented by any system that can determine whether a cartridge is in a chamber of a weapon. For example, the process 3700, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3700 will be described with respect to particular systems, such as the electronic circuitry 122 or 2002. However, it should be understood that operations of the process 3700 may be performed by other systems. For example, one or more operations of the process 3700 may be performed by a computing device that is configured to communicate with a weapon 1300 or one or more magazines.

The process 3700 begins at block 3702 where, for example, a hardware processor included in the electronic circuitry 2002 determines a current weapon state of a weapon. Determining the current weapon state of the weapon may include determining the configuration of a bolt of the weapon, whether a magazine is inserted into the weapon, a count of cartridges within the magazine inserted into the weapon, or any other status information for the weapon may be used to determine whether a cartridge is loaded into a chamber of the weapon. As indicated by the process 3500 illustrated by the flowchart in FIG. 35, the process 3700 may be initiated when a signal is received from an edge buffer tube magnetic sensor. Accordingly, in certain embodiments, the current weapon state of the weapon is a state other than a jam state.

At decision block 3704, the hardware processor determines whether a bolt of the weapon is open. Determining whether the bolt of the weapon is open may be based at least in part on the current weapon state of the weapon. Further, determining whether the bolt of the weapon is open may be based at least in part on one or more signals generated by one or more magnetic sensors within the buffer tube. For example, if a signal is generated by the magnetic sensor 2018 that is closest to the butt or back end of the stock or buffer tube, it may be determined that the bolt is open. If instead the signal is generated by the magnetic sensor 2018 that is closest to the chamber or magazine, it may be determined that the bolt is closed. Further, if the signal is generated by a magnetic sensor other than the magnetic sensor closest to the butt of the stock, and may be determined that the bolt is not open. In some cases, determining which magnetic sensor generated a signal may include determining which signal generated by a plurality of magnetic sensors is strongest.

If it is determined at decision block 3704 that the bolt is open, the hardware processor sets the chamber count to zero at block 3706. Setting the chamber count to zero indicates that there is not a cartridge within a chamber of the weapon.

If it is determined at the decision block 3704 that the bolt is not open, the hardware processor determines whether the magazine count decremented at the decision block 3708. Determining whether the magazine count was decremented may include obtaining a count of the number of cartridges within a magazine that is inserted into the weapon. The count of the number of cartridges within the magazine inserted that is into the weapon may be compared to a previously determined count of the number of cartridges within the magazine to determine whether the count of cartridges in the magazine decremented.

If it is determined at the decision block 3708 that the magazine count did not decrement, the hardware processor sets the chamber count to zero at block 3710. Setting the chamber count to zero indicates that the cartridge is not loaded within the chamber of the weapon.

If it is determined at the decision block 3708 that the magazine count did decrement, the hardware processor sets the chamber count to one at block 3712. Setting the chamber count to one indicates that a cartridge is loaded within the chamber of the weapon.

After setting the chamber count at one of the blocks 3706, 3710, or 3712, the hardware processor sets the redraw flag at block 3714. Setting the redraw flag may trigger performance of the redraw process 3900 associated with the state 3516 as illustrated in the FIG. 35. This redraw process may be used to output to a user an indication of whether a cartridge is loaded into a chamber. Further, the redraw process may be used to output to a user and updated count of cartridges within a magazine that is inserted into the weapon.

Optionally, at block 3716, the hardware processor resets a jam detection timer. Further, the hardware processor optionally resets the jam detected flag at block 3718. In certain embodiments, because the hardware processor is able to determine whether a cartridge was loaded into the chamber and was able to determine whether a cartridge count of a magazine inserted into the weapon decremented, the hardware processor is able to confirm that the weapon is not in a jam state or is no longer in a jam state. Accordingly, the blocks 3716 and 3718 may be used to reset a previous identification of a jam state and/or to reset the process used to determine whether the weapon is a jam state. Blocks 3716 and 3718 may be optional or omitted because, for example, a jam was not detected or a jam detection timer was not active.

Example Magazine Display Process

Figure 38:
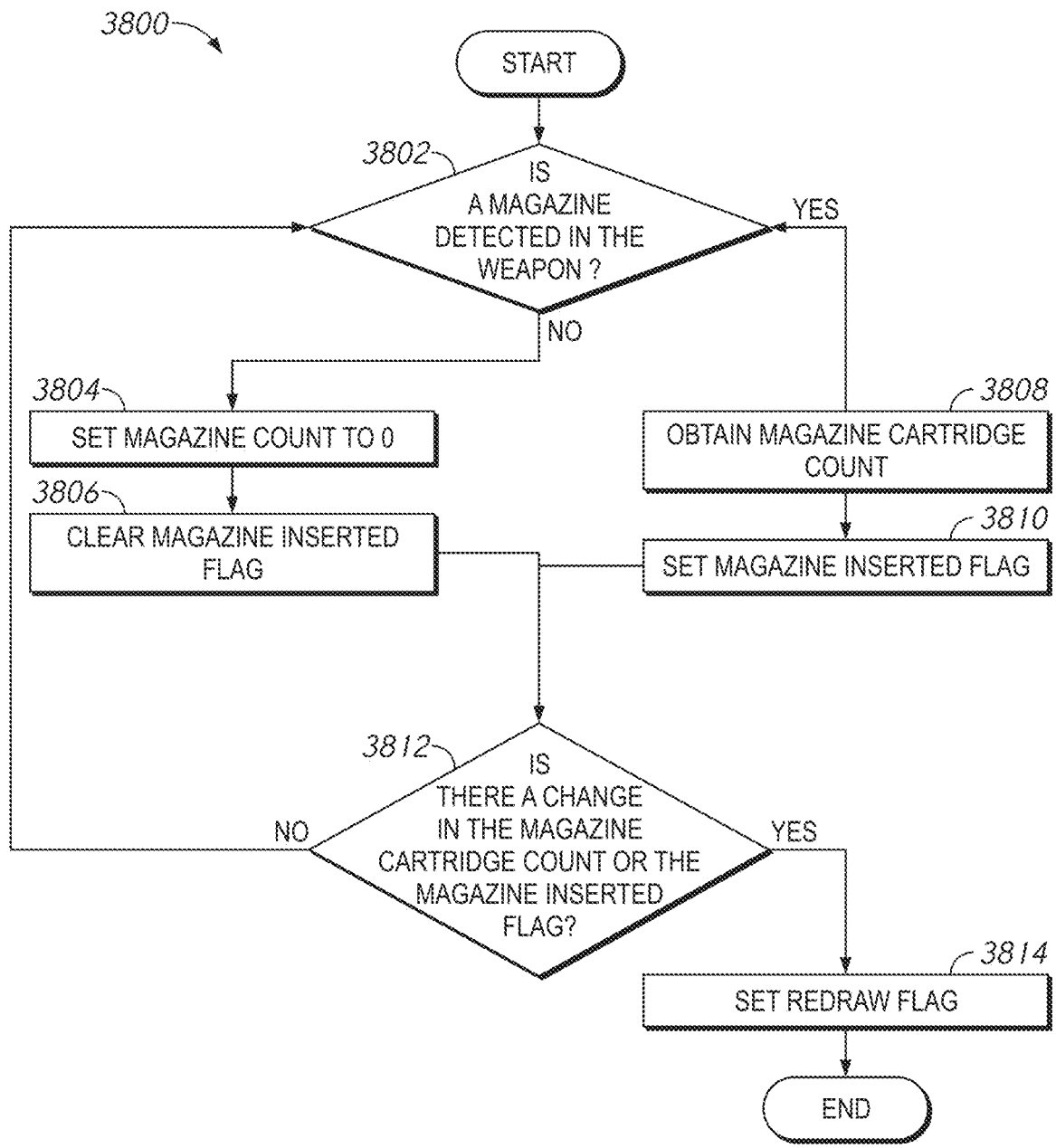
FIG. 38 presents a flowchart of an embodiment of a magazine display process.

FIG. 38 presents a flowchart of an embodiment of a magazine display process 3800. The process 3800 can be implemented by any system that can determine and display the status of a magazine with respect to a weapon. For example, the process 3800, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3800 will be described with respect to particular systems, such as the electronic circuitry 122 or 2002. However, it should be understood that operations of the process 3800 may be performed by other systems. For example, one or more operations of the process 3800 may be performed by a computing device that is configured to communicate with a weapon 1300 or one or more magazines.

The process 3800 begins at decision block 3802 where, for example, a hardware processor included in the electronic circuitry 2002 determines whether a magazine is detected in the weapon. Determining whether the magazine is inserted into the weapon may include communicating with the magazine via an optical connection. Alternatively, or in addition, determining whether the magazine is inserted in the weapon may include determining whether a mechanical switch or other physical indicator has been triggered. Advantageously, in certain embodiments, by including a physical mechanism that is triggered when the magazine is inserted into the weapon enables the weapon to determine that a magazine is inserted even if the magazine is a conventional magazine that does not include the embodiments of the present disclosure.

If it is determined at the decision block 3802 that a magazine is not detected in the weapon, the hardware processor sets the magazine count to zero at the block 3804. Setting the magazine count to zero indicates to the weapon that there are no cartridges available to the weapon. In some embodiments, setting the magazine count to zero indicates that a weapon that there are no cartridges available to the weapon other than the cartridge that may be within a chamber of the weapon. It should be understood that, in certain embodiments, the operations of the block 3804 are associated with a counter for cartridges currently available for the weapon to fire and may be distinct from the count of cartridges available to the user, for example, in magazines registered to the weapon, the not inserted into the weapon.

At the block 3806, hardware processor clears the magazine inserted flag or sets the magazine inserted flag to a value indicating that a magazine is not inserted into the weapon. Clearing the magazine inserted flag may include modifying a register or memory of the weapon to indicate that a magazine is not inserted.

If it is determined at the decision block 3802 that a magazine is detected in the weapon, the hardware processor obtains the magazine cartridge count at the block 3808. Obtaining the magazine cartridge count may include performing the process 3100 or portions thereof. In some embodiments, the block 3808 may be optional or omitted. For example, if a conventional magazine is inserted into the weapon that does not include the embodiments disclosed herein, the hardware processor of the weapon may be unable to determine the cartridge count for the inserted magazine. In certain embodiments, if a conventional magazine is inserted into the weapon, the hardware processor may set a status unknown flag indicating that the weapon is unable to determine the number of cartridges loaded within the magazine.

At the block 3810, the hardware processor sets the magazine inserted flag indicating that a magazine is inserted into the weapon. Setting the magazine inserted flag may include setting a register or memory address to a value that indicates that a magazine is inserted into the weapon. In some embodiments, the magazine inserted flag is set to a value indicating a count of the cartridges within the magazine as obtained at the block 3808.

At the decision block 3812, the hardware processor determines whether a change in the magazine cartridge count or a change in the magazine inserted flag has occurred. If it is determined at the decision block 3812 that a change in the magazine cartridge count or in the magazine inserted flag has not occurred, the process 3800 returns to the decision block 3802 where the hardware processor may continuously or intermittently determine whether a magazine is detected in the weapon.

If it is determined at the decision block 3812 that there is a change in the magazine cartridge count. Or in the magazine inserted flag, hardware processor sets the redraw flag at the block 3814. Setting the redraw flag may trigger performance of the redraw process 3900 associated with the state 3516 as illustrated in the FIG. 35.

Example Redraw Process

Figure 39:
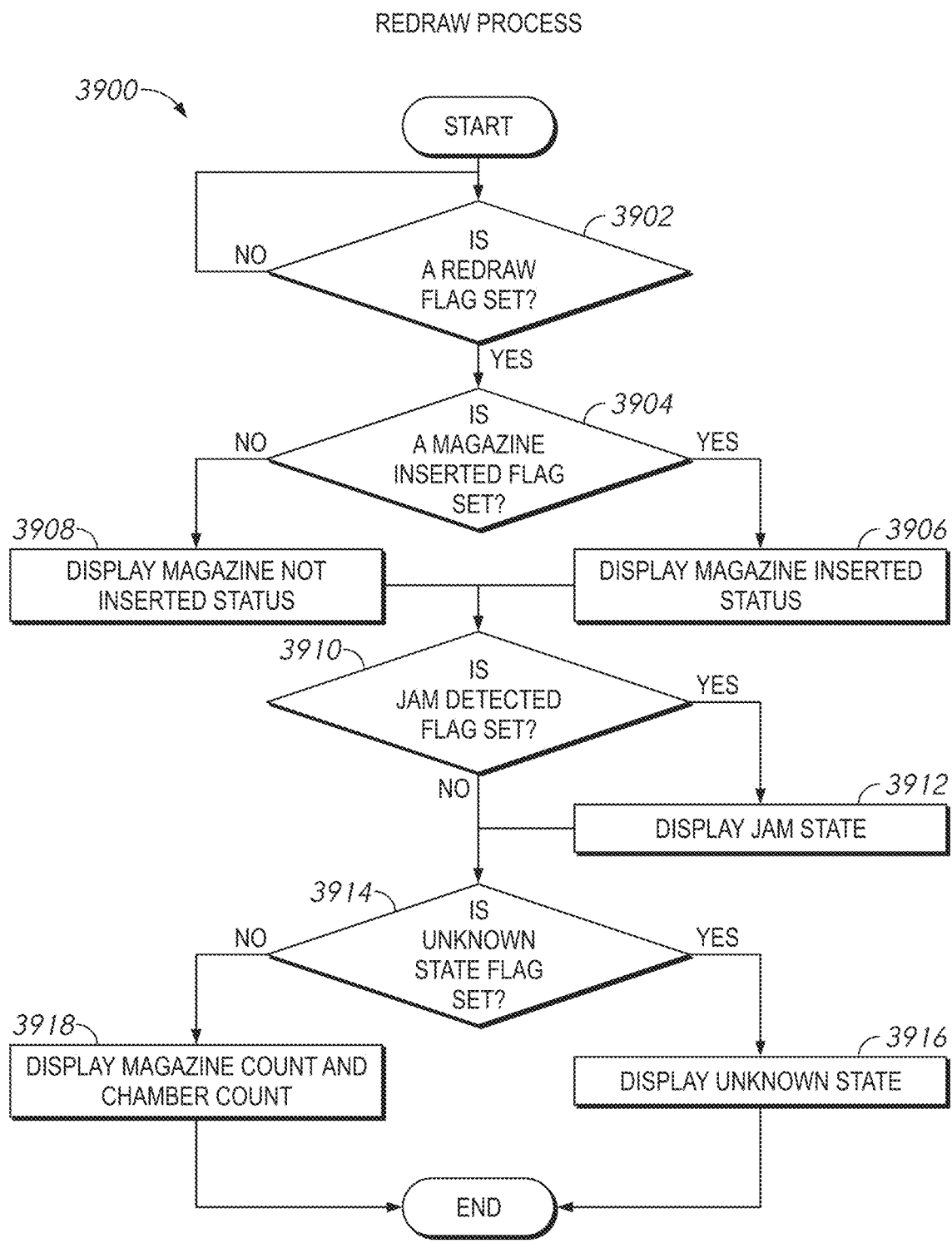
FIG. 39 presents a flowchart of an embodiment of a redraw process.

FIG. 39 presents a flowchart of an embodiment of a redraw process 3900. The process 3900 can be implemented by any system that can output weapon system status information for a weapon. For example, the process 3900, in whole or in part, can be implemented by electronic circuitry included in the magazine 100, such as the electronic circuitry 122, and/or electronic circuitry in the weapon 1300, such as the electronic circuitry 2002. To simplify discussion and not to limit the disclosure, portions of the process 3900 will be described with respect to particular systems, such as the electronic circuitry 122 or 2002. However, it should be understood that operations of the process 3900 may be performed by other systems. For example, one or more operations of the process 3900 may be performed by a computing device that is configured to communicate with a weapon 1300 or one or more magazines.

The process 3900 begins at decision block 3902 where, for example, a hardware processor included in the electronic circuitry 2002 determines whether a redraw flag has been set. Determining whether the redraw flag has been set may include accessing a memory location in a memory of the weapon that stores the redraw flag or a state of the redraw flag. An indication that a redraw flag has been set may be used to cause a display of the weapon, or displaying truncation with the weapon, to display information about a state of the weapon, such as whether the weapon is jammed, and/or information about the number of cartridges available to the user. The number of cartridges available to the user may indicate the number of cartridges in the magazine inserted into the weapon, whether a cartridge is within a chamber of the weapon, and/or the number of cartridges inserted in a set of one or more magazines registered to the weapon whether or not a magazine is inserted into the weapon.

If it is determined at the decision block 3902 that a redraw flag has not been set, the process 3900 returns to the decision block 3902 where the hardware processor continuously or intermittently determines whether the redraw flag has been set. In certain embodiments, the determination that the redraw flag has not been set may indicate that a change in status of the weapon or of cartridges available to the weapon has not changed. Moreover, in certain embodiments, instead of the hardware processor continuously or intermittently determining whether the redraw play has been set, the hardware processor receives an interrupt signal or a push notification alerting the hardware processor that the redraw play has been set.

If it is determined at the decision block 3902 that a redraw flag has been set, the hardware processor determines at the decision block 3904 whether a magazine inserted flag has been set. Determining whether the redraw inserted flag has been set may include accessing a memory location in a memory of the weapon that stores the magazine inserted flag or a state of the magazine inserted flag.

If it is determined at the decision block 3904 that a magazine inserted flag has been set, the magazine inserted status is displayed on a user interface or display of the weapon system at block 3906. Displaying the magazine inserted status may include displaying a symbol corresponding to the magazine inserted status. In some embodiments, the display of the weapon system may be within the scope of the weapon or may be projected onto a scope of the weapon. Alternatively, or in addition, the magazine inserted status may be displayed on a user interface or display that is separate from the weapon, such as on a heads up display of a helmet or any other visual system carried or used by the user.

If it is determined at the decision block 3904 that a magazine inserted flag is not set, the magazine not inserted status is displayed on the user interface or the display of the weapon system at the block 3908. The block 3908 may include one or more of the embodiments described with respect to the block 3906, but with the output of the display corresponding to the magazine not inserted status.

At decision block 3910, the hardware processor determines whether a jam detected flag is set. Determining whether the jam detected flag has been set may include accessing a memory location in a memory of the weapon that stores the jam detected flag or a state of the jam detected flag.

If a jam detected flag is set, a jam state notification is displayed on the user interface or the display of the weapon system at the block 3912. The block 3912 may include one or more of the embodiments described with respect to the block 3906, but with respect to displaying the jam state of the weapon.

At decision block 3914, the hardware processor determines whether an unknown state flag is set. Determining whether the unknown state flag has been set may include accessing a memory location in a memory of the weapon that stores the unknown state flag or a state of the unknown state flag. In some embodiments, determining whether the unknown state flag has been set may include accessing or attempting to access the magazine count for the inserted magazine. If the hardware processor is unable to determine the magazine state for the inserted magazine, the hardware processor may determine that the weapon system is in an unknown state.

In some embodiments, a weapon may be in an unknown state when first powered or initialized because, for example, it may be undetermined whether a cartridge is in a chamber. Once a user has cycled the bolt, the weapon can determine its state. If the weapon has a cartridge in the chamber, cycling the bolt may eject the cartridge. Further, if a magazine is inserted into the weapon, cycling the bolt may load a cartridge into the chamber if the magazine is not empty. One or more of the processes disclosed herein can be used to determine the ammunition or cartridge count loaded into a chamber of the weapon and/or a magazine inserted into the weapon. Accordingly, in certain embodiments, once a user has cycled the bolt, a weapon in an unknown state may transition to a known state and the unknown state flag may be reset or otherwise set to a value indicating a known weapon state. In certain embodiments, once the weapon is transitioned from an unknown state to a known state via, for example, the cycling of the bolt, the weapon may remain in a known state by performing the one or more embodiments disclosed herein for determining ammunition count and weapon state. In some embodiments, a display of the weapon may instruct the user to cycle the bolt upon turning on or powering the electronic circuitry of the weapon enabling the weapon to determine its state before the user takes further action with the weapon.

In some embodiments, a weapon may be unable to determine a number of cartridges within a magazine because, for example, the magazine may be a conventional magazine that does not include the ammunition count capabilities disclosed herein. In some such embodiments, the weapon may indicate an unknown ammunition count or an unknown state. In other such embodiments, the weapon may indicate a state of the chamber (e.g., loaded or not loaded), but may indicate that a state of a magazine is unknown. In some cases, the weapon may indicate whether or not a magazine is inserted, but may not display a cartridge count due, for example, to the magazine being a conventional magazine.

If it is determined at the decision block 3914 that an unknown state flag is set, an unknown state notification is displayed on the user interface or the display of the weapon system at the block 3916. The block 3916 may include one or more of the embodiments described with respect to the block 3906, but with respect to displaying the unknown state.

If it is determined at the decision block 3914 that an unknown state flag is not set, a magazine count and a chamber count is displayed on the user interface or the display of the weapon system at the block 3918. Determining the magazine count and/or the chamber count for cartridges or ammunition available to the user may include performing one or more of the processes 2800, 3100, or 3300. In some embodiments, determining the magazine count and/or the chamber count may include accessing a memory location in a memory of the weapon that stores the magazine count and/or the chamber count. Further, the block 3918 may include one or more of the embodiments described with respect to the block 3906, but with respect to displaying the ammunition available to the user or included in magazines registered to the weapon.

Weapon System Overview

Figure 40:
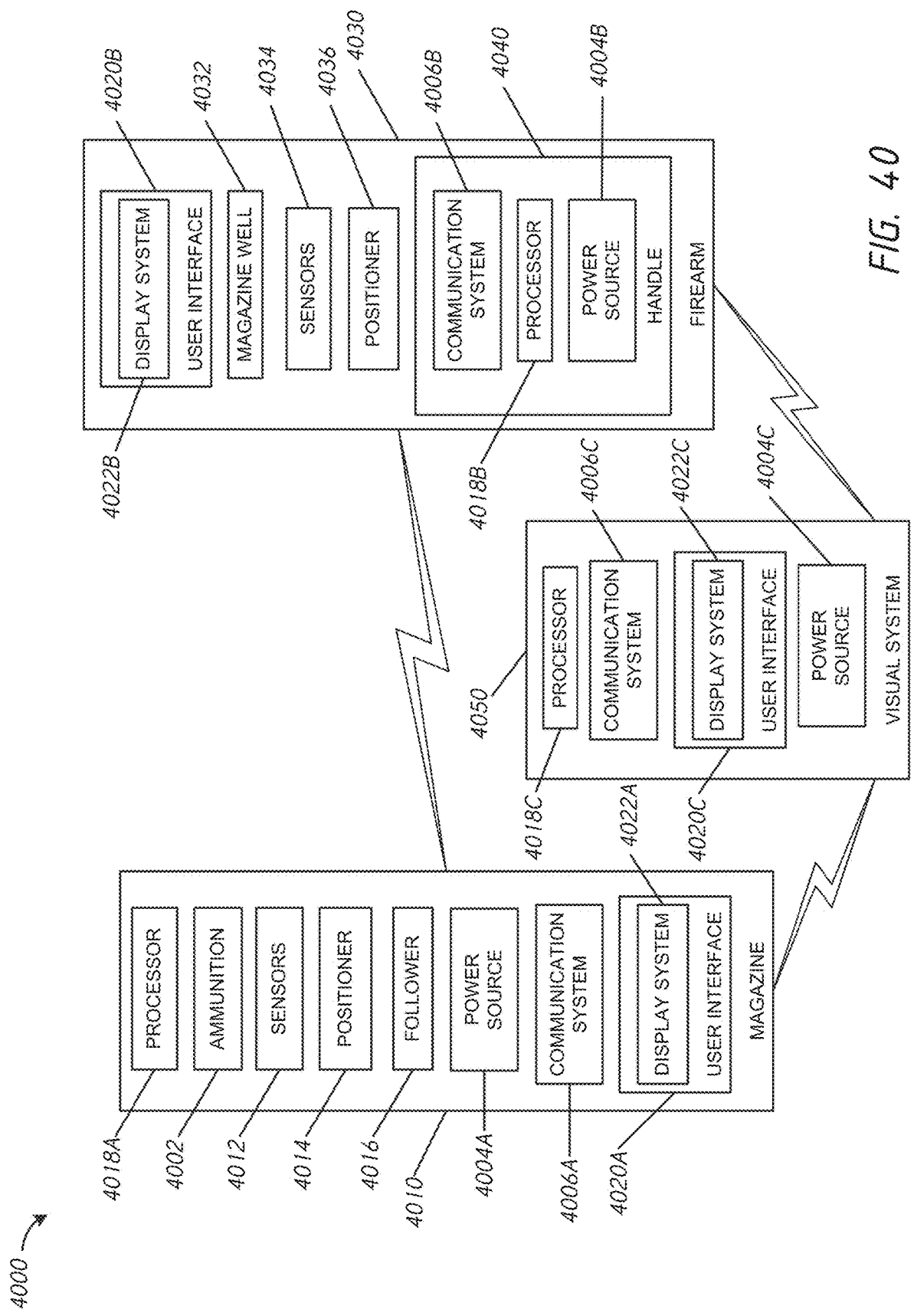
FIG. 40 presents a block diagram of an example weapon system in accordance with certain embodiments.

FIG. 40 presents a block diagram of an example weapon system 4000 in accordance with certain embodiments. The weapon system 4000 may include a magazine 4010 that is configured to hold ammunition 4002 of one or more types, a firearm 4030 that is configured to receive the magazine 4010 via insertion of the magazine 4010 into a magazine well 4032 of the firearm 4030, and, optionally, a visual system 4050 capable of displaying via a display system 4022C status information of the magazine 4010 and/or the firearm 4030. It should be understood that the magazine 4010 may include one or more embodiments previously described herein with respect to a magazine (e.g., the magazine 100). Similarly, it should be understood that the firearm 4030 may include one or more embodiments previously described herein with respect to a firearm or weapon (e.g., the weapon 1300). Moreover, although the visual system 4050 is not limited to a scope, it should be understood that in certain embodiments the visual system 4050 may include one or more embodiments previously described herein with respect to a scope or mounted display system (e.g., the scope 1302 or display system 1304).

The magazine 4010 may hold or otherwise store ammunition 4002 for firing by a firearm 4030. The ammunition 4002 is not limited in type and may include any type of ammunition that may be inserted into a magazine, such as the magazine 4010. For example, the ammunition 4002 may include handgun ammunition, rifle ammunition, shotgun ammunition, 9 mm ammunition, .22LR ammunition, .380 ACP ammunition, 5.56 mm ammunition, Full Metal Jacket ammunition, Hollow Point ammunition, etc. In some cases, the magazine 4010 is capable of use with multiple different types of ammunition. Similarly, the magazine 4010 may include any type or size of magazine capable of holding or storing the ammunition 4002 and/or capable of use with the firearm 4030. For example, the magazine 4010 may be capable of use with a handgun, a rifle, or a shotgun, and may include a box magazine, a drum magazine, a single column or single-stack magazine, a staggered or double-stack magazine, a horizontal magazine, a casket magazine, a rotary magazine, or any other type of magazine. Further, the magazine 4010 may hold 10, 15, 20, 30, 40, or any other number of cartridges. Moreover, the firearm 4030 may include any type of firearm that is capable of receiving the magazine 4010 and firing ammunition stored in the magazine 4010. For example, the firearm 4030 may be a handgun, a rifle, a shotgun, etc.

As previously described, it may be desirable to determine the amount of ammunition in the magazine 4010 at any particular point in time. To facilitate determining the amount of ammunition or the number of cartridges in the magazine 4010, the magazine 4010 may include one or more sensors 4012 and a positioner 4014. The positioner 4014 may include any device or element whose location may change based on the number of cartridges in the magazine 4010 and that can be detected by one or more sensors of the sensors 4012 so as to determine the location of the positioner 4014 within the magazine 4010. Further, the sensors 4012 may include any type of sensor or switch that can detect the location of the positioner 4014, or that may generate a signal based at least in part on the location of the positioner 4014. This signal may then be used to determine the location of the positioner 4014. For example, the positioner 4014 may include one or more magnets that can generate a magnetic field and the sensors 4012 may include one or more magnetic sensors or switches (e.g., Hall effect sensors, Hall effect switches, anisotropic magnetoresistive sensors, etc.) that can detect the magnetic field. As another example, the positioner 4014 may include one or more visible or non-visible light generators (e.g., LEDs, lasers, infrared, etc.) and the sensors 4012 may include one or more light detection sensors. In another example, the positioner 4014 may include a capacitive plate or an inductive coil, and the one or more sensors 4012 may include a second capacitive plate or inductive coil that may generate a signal when aligned or partially aligned with the positioner 4014. In yet another example, the positioner 4014 and/or sensors 4012 may include resistive elements that change resistance when at least partially aligned. In some cases, the positioner 4014 and/or sensors 4012 may include conductive elements that may couple power from the positioner 4014 to one or more sensors 4012 to detect the positioner 4014.

The magazine 4010 may include more sensors 4012 than the maximum capacity of ammunition 4002 (e.g., cartridges) that may be inserted into the magazine 4010. As previously described, including more sensors 4012 than the ammunition 4002 capacity of the magazine 4010 enables accurate determination of the quantity of ammunition 4002 in the magazine 4010 regardless of wear or metal fatigue of the magazine 4010, insertion status of the magazine 4010 into the firearm 4030, manufacturing discrepancies or tolerances in creating the magazine 4010, type of ammunition inserted into the magazine 4010, or any other factors that may introduce variance into the position of cartridges and/or the positioner 4014 or follower 4016 when the magazine is loaded with a particular number of cartridges.

In some implementations, the magazine 4010 may include an equal number of sensors 4012 as or less sensors 4012 than the maximum capacity of ammunition 4002 included in the magazine 4010. In such cases, the problems detailed above that are solved by having more sensors 4012 than the ammunition capacity of the magazine may be solved by including a plurality of positioner 4014 elements (e.g., magnets) that can be detected by the sensors 4012. By including multiple positioner 4014 elements, the location of the positioner 4014 (and/or the follower 4016 that may include the positioner 4014) can be accurately determined. Determining the location of the positioner 4014 may include determining a location of different elements or parts of the positioner 4014. For example, if the positioner 4014 includes two magnets, determining the location of the positioner 4014 may include determining the location of each of the two magnets within the magazine 4010. Further, the location of the positioner 4014 may be determined by triangulating or using a triangulation process based on the sensor values of a plurality of sensors included in the sensors 4012. The location of the positioner 4014 may serve as an index to a calibration table to accurately determine the number of cartridges within the magazine 4010.

As stated above, the positioner 4014 may change location based on the number of cartridges in the magazine 4010. In some cases, the positioner 4014 may be attached to the follower 4016. For example, the positioner 4014 may be a set of one or more magnets that are attached to one or more points of the follower 4016. The follower 4016 may move towards the bottom (e.g., the opposite end from the exit or egress point of the magazine) of the magazine 4010 as cartridges are inserted into the magazine 4010. As cartridges are removed (e.g., fired or unloaded) from the magazine 4010, the follower 4016 may move towards the top (e.g., towards the exit or egress point of the magazine) of the magazine 4010. As the follower 4016 changes location, so may the positioner 4014 attached to the follower 4016. In some cases, the positioner 4014 and the follower 4016 may be the same element. For example, the follower 4016 may be formed from magnetic material.

The magazine 4010 may further include a processor 4018A. The processor 4018A may include any type of general purpose or special purpose processor that can determine a location of the positioner 4014 based at least in part on one or more signals received from the one or more sensors 4012. Using the location of the positioner 4014, the processor 4018A may determine the number of cartridges, or amount of ammunition 4002, within the magazine 4010. In some cases, determining the number of cartridges may include accessing a calibration table stored in a memory (not shown) of the magazine 4010. In some cases, the processor 4018A may be optional or omitted. For example, the magazine 400 may, using the communication system 4006A, provide sensor signals generated by the sensors 4012 and/or values corresponding to the sensor signals generated by the sensors 4012 to another device, such as the firearm 4030 or the visual system 4050. The firearm 4030 and/or the visual system 4050 may determine the quantity of ammunition 4002 within the magazine 4010 based at least in part on the sensor signals and/or values corresponding to the sensor signals communicated by the magazine 4010.

The magazine 4010 may be inserted into a magazine well 4032 of a firearm 4030. The magazine well 4032 may include any ingress port or structure of a firearm 4030 configured to accept a magazine 4010 loaded with ammunition 4002 capable of being fired by the firearm 4030. Further, the magazine 4010, using the communication system 4006A, may communicate with communication system 4006B of the firearm 4030.

In some embodiments, the firearm 4030 may include a positioner 4036 and one or more sensors 4034. The positioner 4036 may be of the same type as the positioner 4014 or may be a different type. For example, while the positioner 4014 may be a set of one or more magnets, the positioner 4014 may be an LED, a focused light beam, or an infrared emitter. The positioner 4036 and the one or more sensors 4034 may be used to facilitate determining whether a cartridge is located within the firearm 4030 (e.g., within a chamber of the firearm 4030) and/or whether the firearm 4030 is in a jam state as previously described above. The one or more sensors 4034 and/or the positioner 4036 may be located within a buffer tube of the firearm 4030.

The firearm 4030 may further include a processor 4018B. The processor 4018B may determine the presence of a cartridge in a chamber of the firearm 4030 and/or a jam state of the firearm 4030 based on signals obtained from the one or more sensors 4034. Further, the processor 4018B may determine an amount of ammunition 4002 within the magazine 4010 based at least in part on sensor signals generated by the sensors 4012 or values corresponding to the sensor signals 4012 received by the communication system 4006B from the magazine 4010.

A visual system 4050 may be used to display the number of cartridges within the magazine 4010 to a user. The visual system 4050 may include any system that may display information to a user. Further, the visual system 4050 may be an accessory for the firearm 4030, or any other type of system that can communicate with one or both of the magazine 4010 or the firearm 4030. For example, the visual system 4050 may be a scope that can display an ammunition count to the user. The scope may be any type of scope capable of displaying information to a user. For example, the scope may include one or more embodiments of the scopes disclosed in U.S. Provisional Patent Application No. 62/978, 718; U.S. application Ser. No. 17/178,990; and/or U.S. Provisional Patent Application No. 63/234,671, which were previously incorporated by reference above and may be referred to as the "scope references" herein.

The ammunition count may be displayed in addition to other firearm status data (e.g., jam state, battery level, etc.), a direct view of a target scene viewed through the scope, a video of the target scene, a thermal image, symbology, a red dot display or other target reticle, or any other information that may be viewable via a scope. As another example, the visual system 4050 may be a pair of goggles, a helmet, or a heads-up display. In some cases, the visual system 4050 may be a smartphone, a smartwatch, a tablet, a computer, or any other electronic system that can display an amount of ammunition 4002 within the magazine 4010. In some cases, the visual system 4050 may include a processor 4018C that can determine the quantity of ammunition 4002 within the magazine 4010 based at least in part on sensor signals generated by the sensors 4012 and/or values corresponding to the sensor signals generated by the sensors 4012.

The visual system 4050 may include a communication system 4006C enabling communication with one or more of the magazine 4010 or the firearm 4030. In some cases, the firearm 4030 may provide the visual system 4050 with a count of the ammunition 4002 to display to a user. Alternatively, or in addition, the magazine 4010 may provide the visual system 4050 with a count of the ammunition 4002 to display to a user. Although FIG. 40 illustrates (via the lightning bolts) that the magazine 4010, the firearm 4030, and the visual system 4050 may each communication with one another, in some cases, the communication may be limited. For example, in some cases, the magazine 4010 may communicate with the firearm 4030, but not directly with the visual system 4050. However, the firearm 4030 may communicate with the visual system 4050.

The determined number of cartridges or the amount of ammunition 4002 within the magazine 4010 may be displayed on a display system 4022A, 4022B, and/or 4022C. The display systems 4022A, 4022B, and 4022C may collectively and/or individually be referred to as display systems 4022, or a display system 4022. The display system 4022 may include any type of display that can indicate a number of cartridges within a magazine 4010. For example, the display system 4022 may be an LED display, an LCD display, a numeric display, a holographic waveguide display, or any other type of display that can display the number of cartridges within the magazine 4010.

The display system 4022 may be always on or may be activated by interacting with a user interface 4020A, 4020B, and/or 4020C. The user interfaces 4020A, 4020B, and 4020C may collectively and/or individually be referred to as user interfaces 4020 or a user interface 4020. In some cases, the display system 4022 may be part of the user interface 4020. In other cases, the display system 4022 may be separate from the user interface 4020. Moreover, one or more of the display system 4022 or the user interface 4020 may be omitted. For example, the magazine 4010 may have a user interface 4020A that enables activation of the sensors 4012 but may omit a display system 4022A. In some such cases, the number of cartridges within the magazine 4010 may be displayed on the display system 4022B and/or 4022C. It should be understood that other distributions of the user interface 4020 and display system 4022 within the weapon system 4000 are possible and considerations such as weight, battery life, redundancy, and detection of the user (e.g., a soldier) by others (e.g., enemy combatants) may dictate the distribution of the user interface 4020 and display system 4022 among elements of the weapon system 4000. For instance, to avoid detection, the display system may be limited to the display system 4022C of a visual system 4050 (e.g., a scope, goggles, or helmet) to prevent detection of stray light be an enemy combatant.

As indicated above, each of the magazine 4010, the firearm 4030, and the visual system 4050 may include a processor 4018A, 4018B, or 4018C, respectively. The processors 4018A, 4018B, and 4018C may collectively or individually be referred to as processors 4018 or a processor 4018. In some implementations, one or more of the processors 4018 may be omitted. For example, the magazine 4010 may not include the processor 4018A. In such cases, sensor data obtained from the sensors 4012 may be provided to the processor 4018B of the firearm 4030 or to the processor 4018C of the visual system 4050 to determine the count of ammunition 4002 in the magazine 4010. As another example, the firearm 4030 may not include the processor 4018B. In some such cases, the magazine 4010 may use the processor 4018A to determine the count of ammunition 4002. Further, the magazine 4010 may display the count of ammunition 4002 using the display system 4022A, and/or may transmit the count of ammunition 4002 to the firearm 4030 to display at the display system 4022B and/or to the visual system 4050 to display using the display system 4022C.

The processor 4018 can include any electronic circuitry that can be used to determine a quantity of cartridges or an amount of ammunition 4002 within a magazine 4010. The determination of the quantity of cartridges may be based on a detected position of the positioner 4014. The detected position of the positioner 4014 may be determined from one or more signals obtained from one or more of the sensors 4012. The processor 4018 may access a calibration table. The calibration table may be stored in a memory (not shown) of the magazine 4010, the firearm 4030, or the visual system 4050. The calibration table may be one of a plurality of calibration tables that indicate the number of cartridges in the magazine 4010 based at least in part on an identified location of the positioner 4014. There may be different calibration tables based on the type of ammunition in the magazine 4010, whether the magazine 4010 is inserted into the firearm 4030, or whether the bolt of the firearm 4030 is open or closed.

The processor 4018 may include any type of processor or electronic circuitry. For example, the processor 4018 may be a general purpose processor, a special purpose processor, a programmable gate array (e.g., a FPGA), or any other type of processing circuitry that can execute instructions or perform processing to determine a count of ammunition 4002 in the magazine 4010.

Each of the magazine 4010, the firearm 4030, and the visual system 4050 may include a power source 4004A, 4004B, and 4004C, respectively. The power sources 4004A, 4004B, and 4004C may collectively or individually be referred to as power sources 4004 or a power source 4004. The power source 4004 may include any type of power source that may be used to power the electronic systems and/or sensors of the magazine 4010, firearm 4030, or visual system 4050. For example, the power source 4004 may include a battery, a rechargeable battery, a capacitor, or any other type of power source that can store a charge. In some cases, one or more of the magazine 4010, the firearm 4030, or the visual system 4050 may omit a power source 4004. In some such cases, the element(s) that omit the power source 4004 may be powered by another element that includes the power source 4004. For example, the magazine 4010 may omit the power source 4004A and the sensors 4012 may be powered by power received from the power source 4004B of the firearm 4030 when the magazine is inserted into the magazine well 4032 and/or when the communication system 4006A of the magazine 4010 is aligned with the communication system 4006B of the firearm 4030. Alignment of the communication systems 4006A and 4006B, in some cases, may enable power transfer or power coupling between the magazine 4010 and the firearm 4030. For example, the communication system 4006A may include a capacitive plate or an inductive coil that can align with a capacitive plate of an inductive coil of the communication system 4006B enabling capacitive or inductive power transfer. In some cases, the capacitive plate and/or inductive coil may also be used for data transfer. In other cases, the capacitive plate and/or inductive coil may be separate form the communication systems 4006A, 4006B.

As has been described above, each of the magazine 4010, the firearm 4030, and the visual system 4050 may include a communication system 4006A, 4006B, or 4006C, respectively. The communication systems 4006A, 4006B, and 4006C may collectively or individually be referred to as communication systems 4006 or a communication system 4006. The communication systems 4006 may include any type of communication system. However, typically the communication systems 4006 are a near field or short range communication system to reduce snooping by malicious users. For example, the communication systems 4006 may be implemented using near field communication (NFC) protocols or short-range communication protocols (e.g., Bluetooth protocols, ZigBee protocols, or infrared data association protocols, etc.). Further, in some cases, the communication systems 4006 may use ultra-wideband (UWB) communication protocols. In other cases, the communication systems 4006 may include optical communication systems, such as those described above (e.g., with respect to FIG. 9B). In some such cases, the magazine 4010, the firearm 4030, and/or the visual system 4050 may include an optical transmitter, an optical receiver, or an optical transceiver. In some cases, the communication systems 4006 may include contactless communication capabilities. In other cases, the communication systems 4006 may communicate using contact-based transmission lines. In the cases of contact-based transmission, the communication system 4006A may be configured to be in physical contact with the communication system 4006B when the magazine 4010 is inserted into the magazine well 4032 of the firearm 4030.

Figure 17:
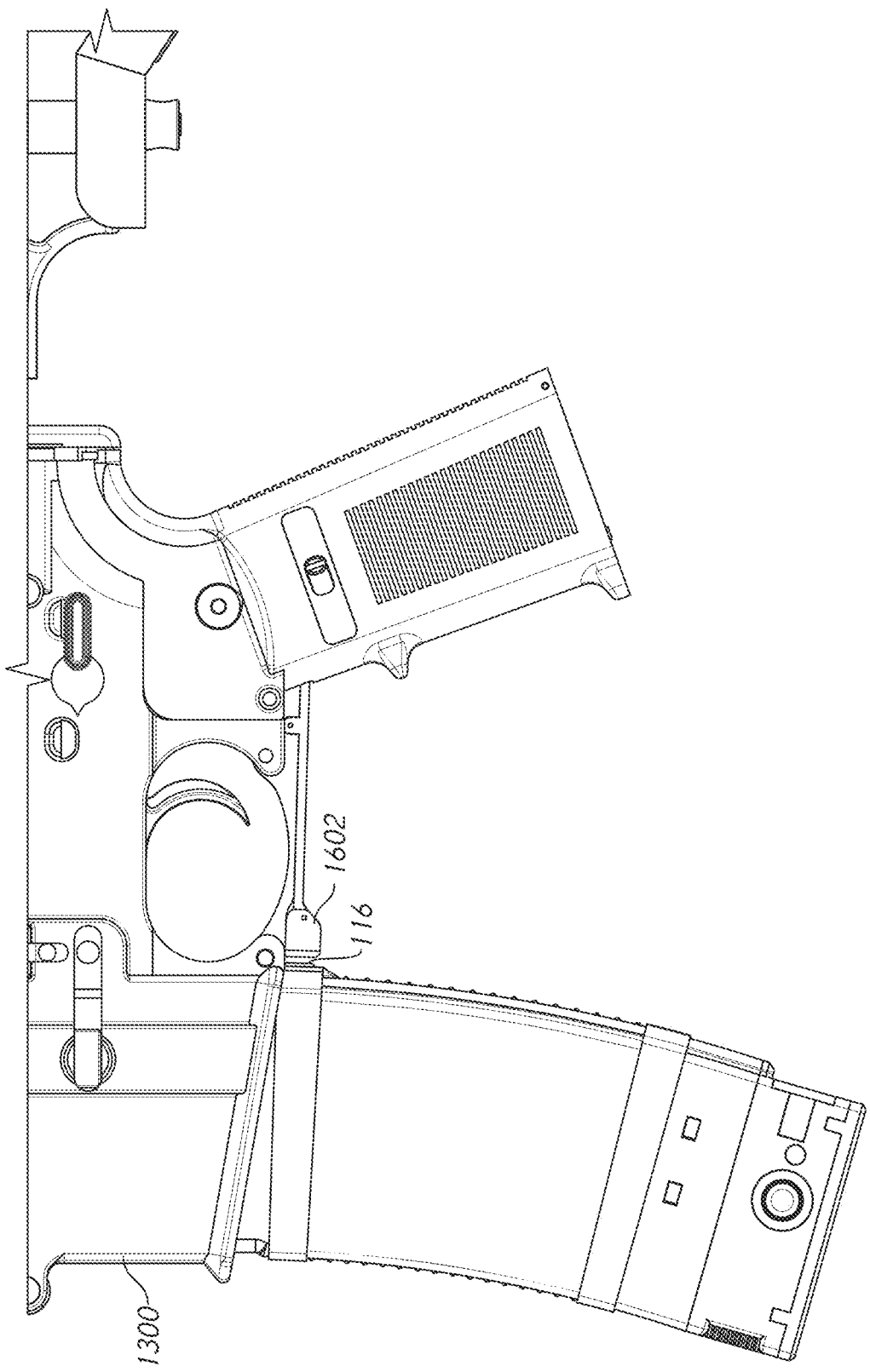
FIG. 17 illustrates an embodiment of the weapon handle and magazine.

In some implementations, a portion of the communication system 4006A (e.g., an antenna or an optical window) may be positioned on the magazine 4010 at a position that enables at least partial alignment with a corresponding portion of the communication system 4006B when inserted into the firearm 4030. For example, an antenna or optical window of the magazine 4010 may be positioned at a location of the magazine 4010 that aligns with a trigger guard of the firearm 4030 as illustrated in FIG. 17 with respect to the optical transceivers. Further, in some cases, the corresponding portion of the firearm 4030 that mates to the antenna or optical window of the magazine 4010 may be positioned on a portion of the trigger guard or other element of the firearm 4030 that may be part of the handle 4040 enabling retrofit of a firearm to include the features disclosed herein by replacing the firearm handle with the handle 4040.

In some implementations, one or more of the communication systems 4006A may be unidirectional. For example, the communication system 4006A may transmit sensor data obtained from the sensors 4012 to the firearm 4030 but may not include a receiver capable of receiving a signal.

In some implementations, the magazine 4010, the firearm 4030, and the visual system 4050 may each include a user interface 4020A, 4020B, or 4020C, respectively. The user interfaces 4020A, 4020B, and 4020C may collectively or individually be referred to as user interfaces 4020 or a user interface 4020. In some cases, the user interfaces 4020 may include a display system 4022. In other cases, at least one of the user interfaces 4020 may omit a display system 4022. The user interfaces 4020 may include any system for activating, deactivating, or controlling the determination of the amount of ammunition 4002 in the magazine 4010. For example, the user interface 4020A may include a physical, capacitive, or resistive user interface for triggering a count determination process (e.g., the process 2800, the process 4100, or the process 4800 described below). In some cases, the user interface 4020A is accessible and/or useable when the magazine 4010 is not inserted into the firearm 4030 and inaccessible and/or unusable when inserted into the firearm 4030. Interacting with the user interface 4020 may cause determination of an amount of ammunition 4002 in the magazine 4010. Alternatively, or in addition, interacting with the user interface 4020 may cause display of the amount of ammunition 4002 in the magazine 4010.

As illustrated in FIG. 40, the power source 4004B, the communication systems 4006B, and the processor 4018B may be included in a handle 4040 of the firearm 4030. Advantageously, by placing elements in the handle 4040 used to determine an amount of ammunition 4002 in the magazine 4010, existing firearms and/or firearms not configured to determine ammunition count can be retrofitted to include at least some of the features disclosed herein by replacing the handle of the firearm with the handle 4040. Further, in some cases, the handle 4040 may include the user interface 4020B and/or the display system 4022B. Moreover, in some cases, the sensors 4034 and the positioner 4036 may be omitted from the firearm 4030.

Second Example Ammunition Count Determination Process

Figure 41:
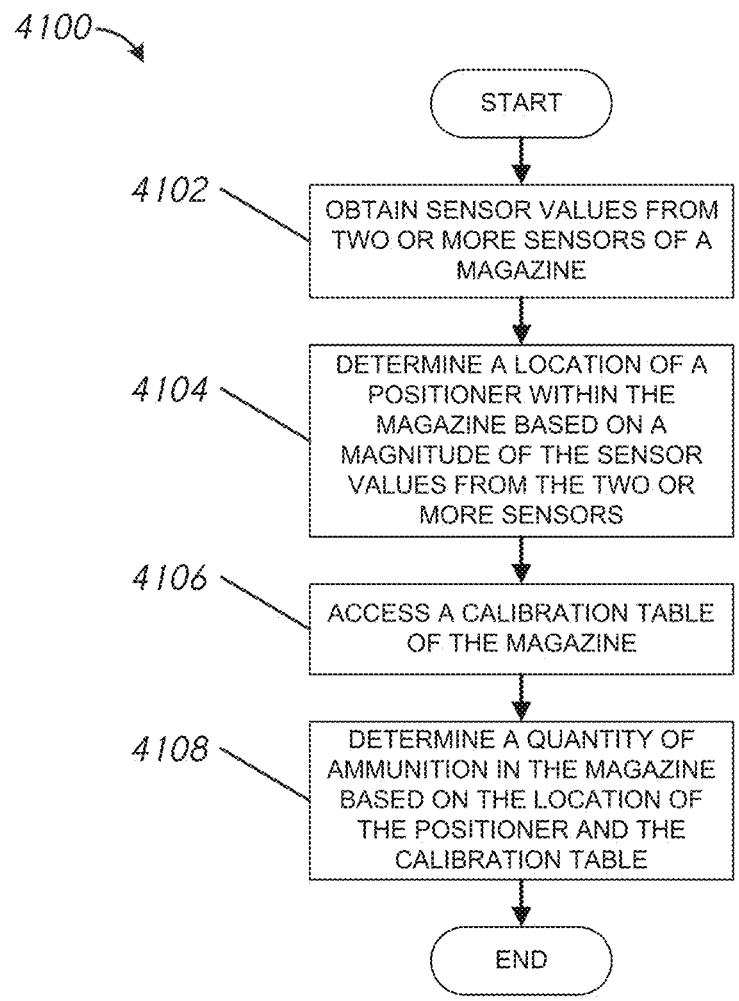
FIG. 41 presents a flowchart of a second embodiment of an ammunition count determination process in accordance with certain embodiments.

FIG. 41 presents a flowchart of a second embodiment of an ammunition count determination process 4100 in accordance with certain embodiments. The process 4100 can be implemented by any system that can determine a count of the number of cartridges within a magazine. For example, the process 4100, in whole or in part, can be implemented by a processor 4018, one or more sensors 4012, or a positioner 4014, among other systems. Further, it should be understood that the processor 4018 may refer to one or more of the processor 4018A, the processor 4018B, or the processor 4018C. To simplify discussion and not to limit the disclosure, portions of the process 4100 will be described with respect to particular systems. However, it should be understood that operations of the process 4100 may be performed by other systems including, for example, the systems described above as implementing the process 2800. Further, the process 4100 can include one or more of the embodiments previously described with respect to the process 2800.

The process 4100 begins at block 4102 where, for example, a processor 4018 (e.g., the processor 4018A, the processor 4018B, or the processor 4018C) obtains sensor values from two or more sensors 4012 of the magazine 4010. The processor 4018 may obtain sensor values for each sensor included in the sensors 4012 or a subset of sensors included in the sensors 4012. For example, sensors that are more than a threshold distance from the positioner 4014 may not produce data or may produce a signal too low to be accurately measured. In some cases, sensors that generate sensor data below a threshold magnitude may be omitted from the remainder of the process 4100.

At block 4104, the processor 4018 determines a location of a positioner 4014 within the magazine 4010 based at least in part on a magnitude of the sensor values obtained at the block 4102. Determining the location of the positioner 4014 may include determining a location of one or more positioner elements that form the positioner 4014. For example, suppose the positioner 4014 is formed from one or more magnets, determining the location of the positioner 4014 may include determining a position of at least one of the one or more magnets. In some cases, the distance between positioner elements (e.g., magnets) is fixed and known. Thus, determining the position of one magnet may be sufficient to determine the position of each of the magnets. In some cases, it may be necessary to identify the position of at least one magnet and the identity of the magnet in order to determine the position of the remainder of the magnets included as part of the positioner 4014. Although magnets are used as an example of the elements of the positioner 4014, it should be understood that the positioner 4014 may include other elements that can be detected by sensors. For example, the positioner 4014 may include light sources that are detectable by photo sensors (e.g., photoresistors).

In some cases, determining the location of the positioner 4014 determines the position of the follower 4016. In some such cases, the follower 4016 is the positioner 4014. In other cases, the positioner 4014 is attached to the follower 4016 such that as the follower 4016 moves, the positioner 4014 moves. Determining the location of the positioner 4014 may include determining a magnitude of measurements obtained by one or more of the sensors 4012. For example, as will be described in more detail below with respect to FIGS. 45-52, when a positioner 4014 element (e.g., a magnet or light source) is directly opposite a sensor from the sensors 4012, the magnitude of the measured signal may be at maximum, or at least relatively high compared to when the positioner 4014 element moves away from the sensor. When the positioner 4014 element is at a mid-point between two sensors, the magnitude of the measured signal of each of the two sensors may be relatively equal. Further, the magnitude of the measured signal of each of the two sensors may be relatively high compared to other sensors, but relatively low compared to when the positioner 4014 element is directly in front of a sensor. Similarly, when the positioner 4014 element is between two sensors but is moving towards one sensor and away from another sensor, the magnitude of measured signal from the two sensors may adjust to reflect the movement of the positioner 4014 element (e.g., a higher magnitude by the closer sensor and a lower magnitude by the farther sensor).

In the aforementioned examples, the sensors 4012 may be analog sensors that are capable of continuously measuring a changing magnitude of a phenomenon (e.g., a magnetic field, a visible light field, or an infrared light). By obtaining measurements from a plurality of sensors and by obtaining analog rather than digital measurements, it is possible to obtain precise information regarding the location of the positioner 4014 while using less than N sensors where N refers to the maximum number of cartridges that may be inserted into the magazine 4010.

At block 4106, the processor 4018 accesses a calibration table of the magazine 4010. Accessing the calibration table may include accessing a memory (not shown) at the magazine 4010, the firearm 4030, or the visual system 4050 that stores one or more calibration tables. In some cases, a single calibration table may exist for the magazine 4010. This calibration table may be calibrated specifically for the magazine 4010 and may indicate the number of cartridges within the magazine 4010 as determined based on the determined location of the positioner 4014. In some cases, multiple calibration tables may exist for the magazine 4010. The multiple calibration tables may include one or more of the following: a calibration table for when the magazine is inserted into the firearm 4030, a calibration table for when the magazine is not inserted into the firearm 4030, or one or more calibration tables for particular types of ammunition 4002 loaded into the magazine 4010. The processor 4018 may identify the calibration table to access based on user input obtained via the user interface 4020 and/or by detecting whether the magazine 4010 is inserted into the firearm 4030. The processor 4018 may detect whether the magazine 4010 is inserted into the firearm 4030 based on whether the communication system 4006A can communicate with the communication system 4006B (or vice versa), based on a signal obtained from a switch that is activated (or deactivated) when the magazine 4010 is inserted into (or removed from) the firearm 4030, or based on any other trigger that may alert the processor 4018 to the insertion status of the magazine 4010.

At block 4108, the processor 4018 determines a quantity of ammunition 4002 in the magazine 4010 based at least in part on the location of the positioner 4014 and the calibration table. The processor 408 may determine the quantity of ammunition by accessing an entry in the calibration table associated with the location of the positioner 4014. In some cases, accessing the entry may include accessing the entry associated with an index or key value that is closest to the location of the positioner 4014. For example, suppose that the positioner 4014 is determined to be at a location 35.32 mm from the bottom of the magazine 4010, and suppose that two successive entries in the calibration table are associated with 35.2 mm and 35.7 mm, the processor may access the entry associated with 35.2 mm as being the closest entry. Alternatively, the processor 4018 may be configured to access the entry that is below or, alternatively, to access the entry above the identified location regardless of which location is closer to the determined location of the positioner 4014.

Second Example Magazine

Figure 42:
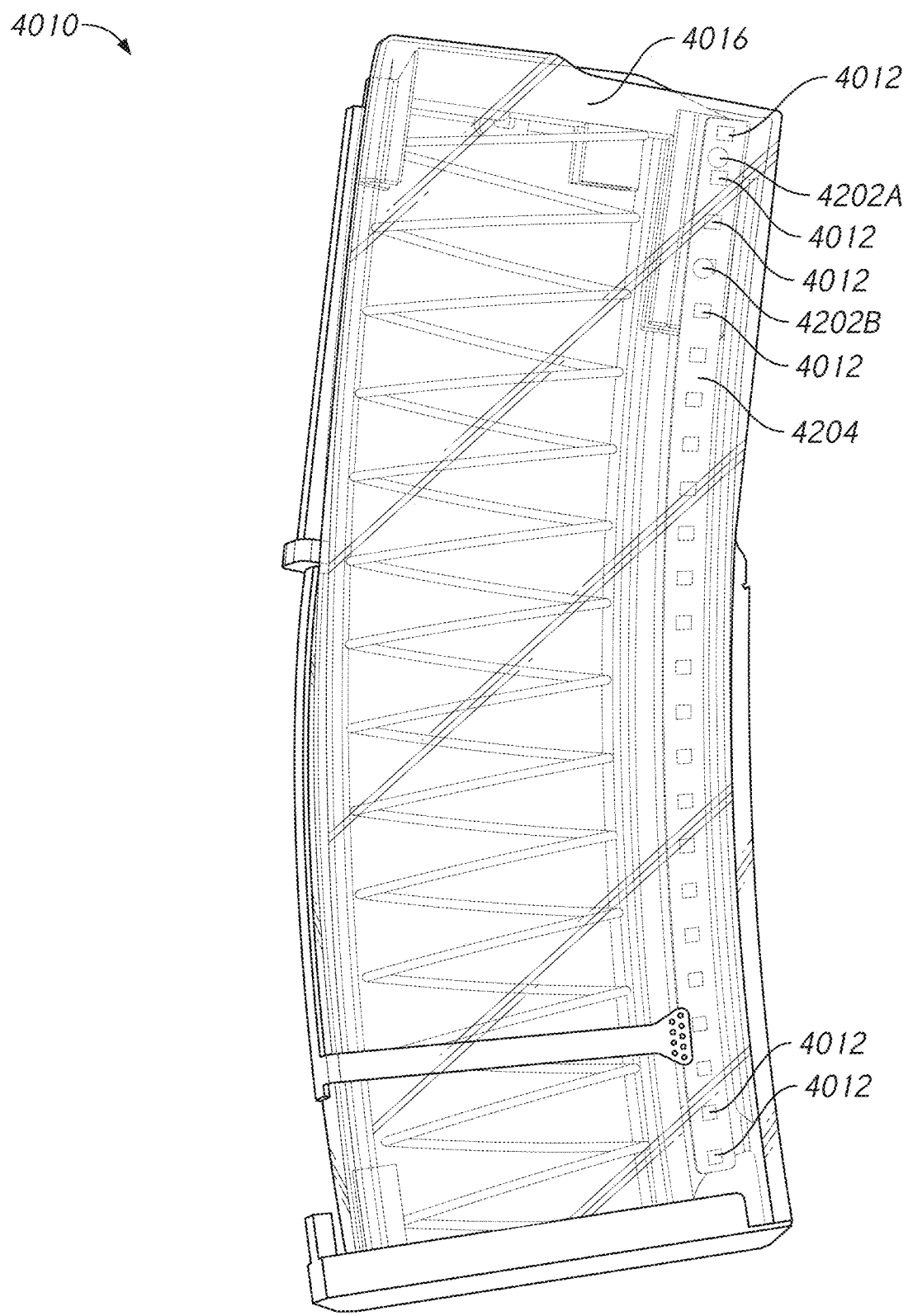
FIG. 42 illustrates a vertical cross-section of an example magazine in accordance with certain embodiments.
Figure 43:
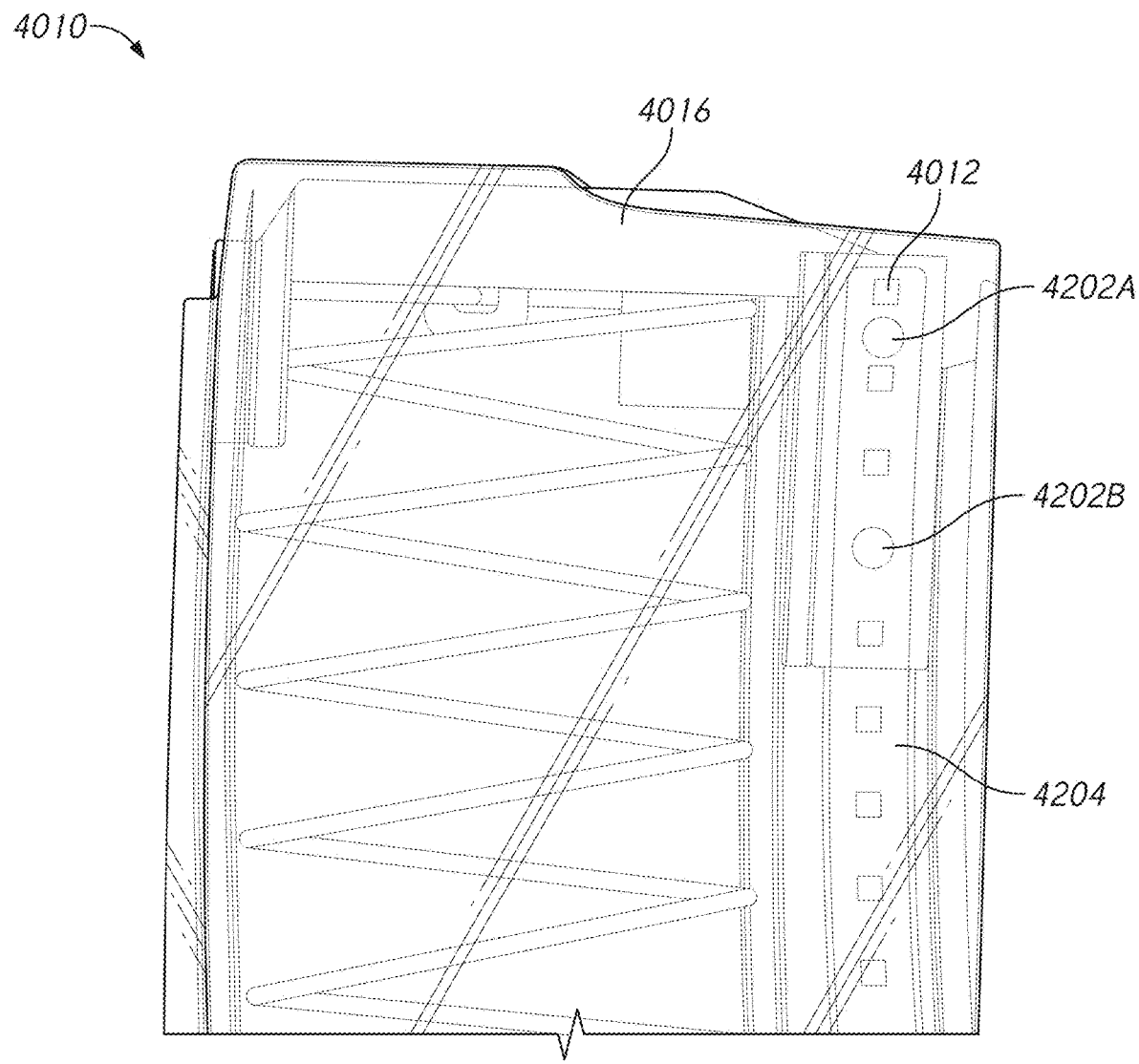
FIG. 43 illustrates a top portion of the magazine of FIG. 42 in accordance with certain embodiments.

FIG. 42 illustrates a vertical cross-section of an example magazine 4010 in accordance with certain embodiments. FIG. 43 illustrates a top portion of the magazine of FIG. 42 in accordance with certain embodiments. In the example illustrated in FIG. 42, the positioner 4014 is formed from a pair of magnets 4202A and 4202B that are attached to the follower 4016. The magnets 4202A and 4202B may collectively or individually be referred to as magnet(s) 4202. As previously described, the positioner 4014 may be formed from elements other than magnets (e.g., light sources, capacitive plates, inductive coils, etc.). Further, the positioner 4014 may be formed from more or fewer elements (e.g., one magnet, three magnets, etc.). To simplify discussion and not to limit the present disclosure, the positioner 4014 is primarily described below as being formed from the two magnets 4202A and 4202B.

As illustrated in FIG. 42, the magnets 4202A and 4202B may be attached to a side of the follower 4016. For example, the magnets 4202A and 4202B may be attached to a groove or indentation in the follower. It should be understood that the placement of the magnets 4202 are not limited to the illustrated embodiment. For example, the magnets 4202 may be placed on the opposite side of the follower 4016, on the back of the follower 4016, on the front of the follower 4016, on another portion of the side of the follower 4016, closer together, farther apart, or any portion of the follower 4016 that may be aligned with at least some of a set of sensors 4012 as the follower 4016 moves within the magazine 4010.

The magazine 4010 may further include a set of sensors 4012. The sensors 4012 may be magnetic sensors capable of detecting a magnetic field. For example, the sensors 4012 may be Hall effect sensors, Hall effect switches, anisotropic magnetoresistive sensors, or any other type of sensor that may generate a signal based at least in part on the proximity or distance of the sensor 4012 from the magnets 4202. Further, as previously explained, the sensors 4012 may be other types of sensors (e.g., infrared detection sensors, light detection sensors, etc.) that are selected to detect elements of the positioner 4014. To simplify discussion and not to limit the present disclosure, the sensors 4012 are primarily described below as being Hall effect sensors. Further, to simplify the illustration of FIG. 42, only some of the sensors 4012 are labelled. However, it should be understood that, depending on the embodiment, the magazine 4010 may have N sensors, <N sensors (e.g., N/2, N/3, N/4, N−1, N−2, etc.) or >N sensors, wherein N represents the maximum ammunition 4002 capacity of the magazine 4010. Further, the number of sensors that may be included may depend on the number of elements (e.g., magnets) used to form the positioner 4014. For example, the use of 3 magnets may enable a further reduction in the number of sensors 4012 compared to the use of 2 magnets or 1 magnet.

The sensors 4012 may be attached to a printed wiring board (PWB) 4204 or a printed circuit board (PCB). The PWB 4204 may be a rigid or flexible circuit board that can supply power to the sensors 4012 and that can provide sensor signals to a processor 4018 and/or communication system 4006.

As the follower 4016 moves (e.g., in response to the addition or removal of ammunition, or the insertion or removal of the magazine into a firearm), the magnets 4202 may move thereby changing which sensors 4012 detect the magnets and/or the measurements of each sensor 4012. In some cases, the magnet 4202A may be aligned or opposite a sensor 4012 resulting in a relatively high magnitude measurement by the sensor 4012 closest to the magnet 4202A (and possibly lower magnitude measurements by sensors 4012 that are farther from the magnet 4202A) while the magnet 4202B may be aligned between a pair of sensors 4012 resulting in lower magnitude measurements by the pair of sensors 4012 that are closest to the magnet 4202B compared to the sensor 4012 aligned opposite the magnet 4202A. As the follower 4016 moves, the relative position of the magnets 4202A and 4202B to the sensors 4012 may change. Thus, the magnet 4202A may move from being aligned directly in front of a sensor 4012 to being between a pair of sensors 4012. The magnet 4202B may remain between (albeit at a different relative position) the pair of sensors 4012, or may move to be aligned with a sensor 4012.

As the magnets 4202 are attached to the follower 4016, the relative location of the magnets 4202 to each other may remain fixed. For example, in the illustrated embodiment, the magnet 4202A is roughly a distance of 2.5 sensors 4012 from the magnet 4202B. In some cases, the distance between the magnet 4202A and the magnet 4202B may be or may be measured as a non-integer number of sensors (e.g., 2.5 sensors, 2.7 sensors, 3.3 sensors, etc.). In other cases, the distance may be an integer number of sensors (e.g., 2, 3, or 4 sensors). Similarly, the distance between magnets may be measured as an integer or non-integer number of cartridges. For example, the distance between the magnet 4202A and 4202B may be 2, 2.5, 3, or 3.3 cartridges of ammunition, etc.

Moreover, as the sensors 4012 may be evenly distributed, a measurement based on the distance between sensors 4012 may be converted to another measurement unit, such as mm or cm. It should be understood that the distance between the magnets 4202 may be more or less than the distance between 2.5 sensors 4012. Further, the distance between sensors 4012 may be selected based on the number of sensors 4012, the size of the magazine 4010, the type of the magazine, the type of ammunition included in the magazine 4010, the sensitivity of the sensors 4012, the distance between a sensor 4012 and a magnet 4202 when the sensor 4012 and the magnet 4202 are aligned across from each other, or any other factor that may affect the accuracy of determining the location of the positioner 4014 and/or follower 4016.

Figure 44:
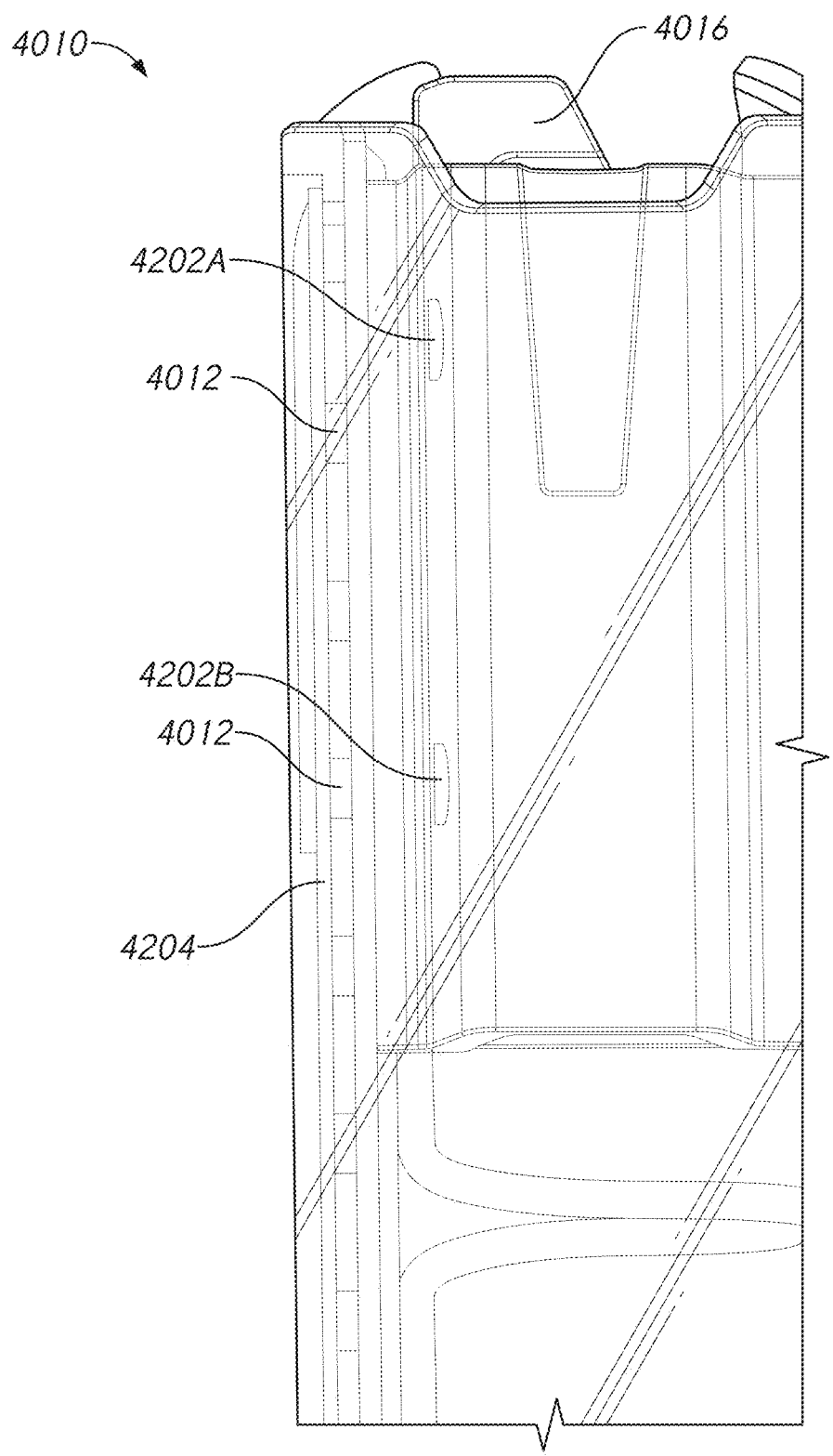
FIG. 44 illustrates the back face of the top portion of the magazine of FIG. 42 in accordance with certain embodiments.

FIG. 44 illustrates the back face of the top portion of the magazine of FIG. 42 in accordance with certain embodiments. It should be understood that the specification of the back, front, side, top, and bottom of the magazine 4010 is not limiting. In the illustrated example, the back face refers to the portion of the magazine that faces the user when inserted into a firearm aimed away from the user. As can be seen in FIG. 44, the sensors 4012 may be positioned a particular distance away from the magnets 4202. Further, the follower 4016 is tapered towards the back providing a space to attached the magnets 4202 within the cavity of the magazine 4010.

Figure 45:
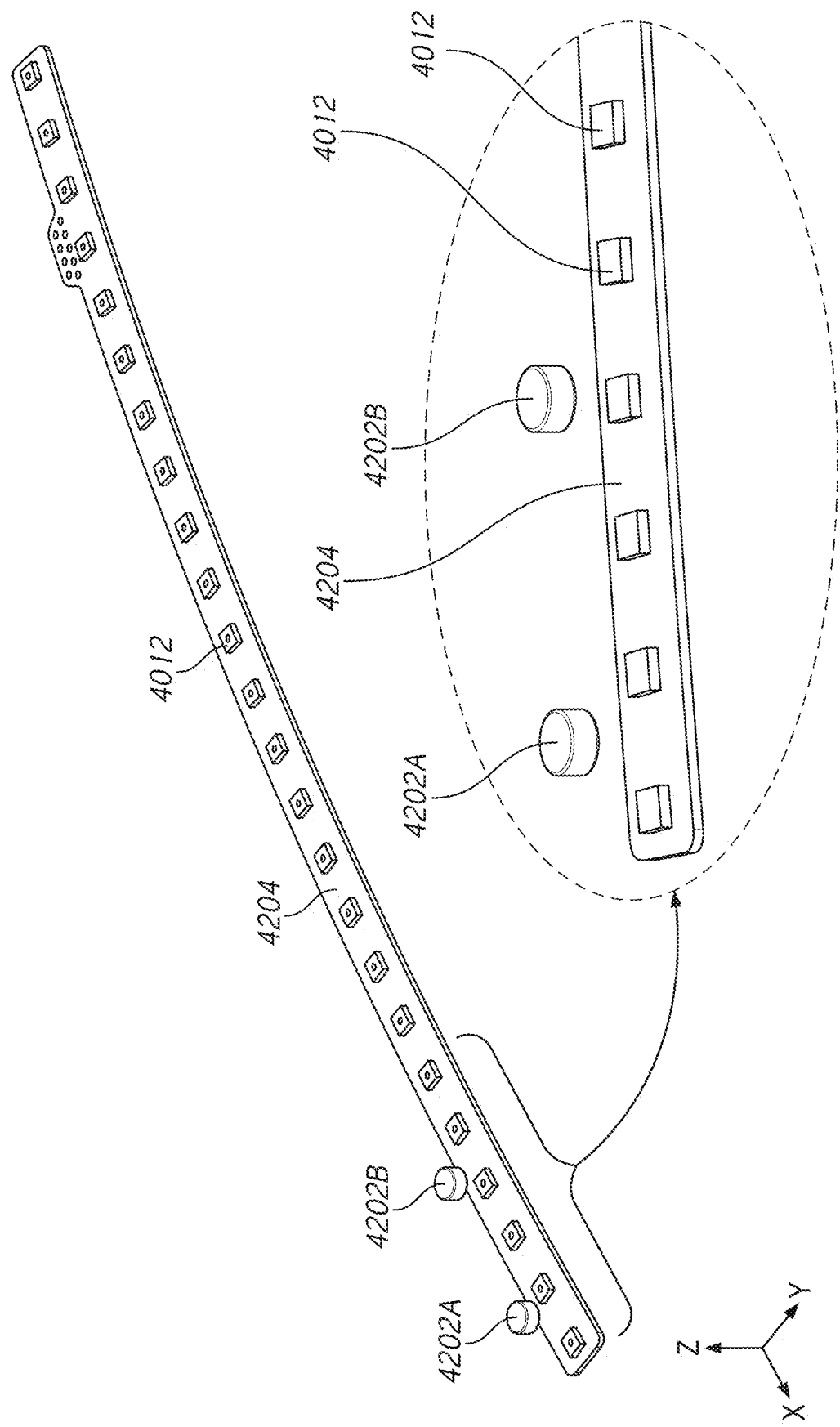
FIG. 45 illustrates a printed wiring board of a magazine in accordance with certain embodiments.

FIG. 45 illustrates a printed wiring board 4204 of a magazine 4010 in accordance with certain embodiments. The PWB 4204 may include any type of circuit board that can connect the sensors 4012 to a processor 4018A. In some cases, the PWB 4204 may directly connect to a communication systems 4006A enabling communication of sensor signals to another device (e.g., the firearm 4030). Further, the PWB 4204 may be created using a rigid or flexible circuit board. Further, the PWB 4204 may be shaped based on the shape of the magazine 4010. Thus, as illustrated in FIG. 45, the PWB 4204 may have a curvature to match the curvature of a magazine 4010.

The combination of the magnets 4202 and the sensors 4012 can be used to create a linear position sensor (linear encoder) to determine the number of rounds or cartridges remaining in the magazine 4010. The linear encoder can function by sampling the magnetic field created by one or more magnets 4202 embedded in or otherwise attached to the follower 4016 using Hall effect sensor integrated circuits (ICs) 4012 mounted on a printed wiring board (PWB) 4204. As the follower 4016 moves through the magazine 4010, the magnetic field moves along the array of sensors 4012. The Hall effect sensors 4012 and a center-of-mass algorithm can be used to determine how far the follower 4016 has moved and therefore, the number of rounds remaining in the magazine 4010.

In some cases, there are more sensors 4012 than the ammunition capacity of the magazine 4010. Although adding additional sensors 4012 improves the accuracy of the ammunition count, it can also add cost. To reduce the number of Hall effect sensors 4012, a second magnet 4202B can be added at a particular fixed distance from the first magnet 4202A. This distance can be 2.5× the pitch or distance between consecutive sensors 4012. It should be understood that there may be more than two magnets 4202 and that the distance between magnets may be more or less 2.5× the pitch between sensors 4012. The additional magnets 4202 may be added to improve the center-of-mass calculation accuracy. This improvement can be accomplished by combining the data from the two or more magnets 4202 before performing the centroiding calculation as described in more detail below.

Example Centroiding Calculation Process

Figure 46:
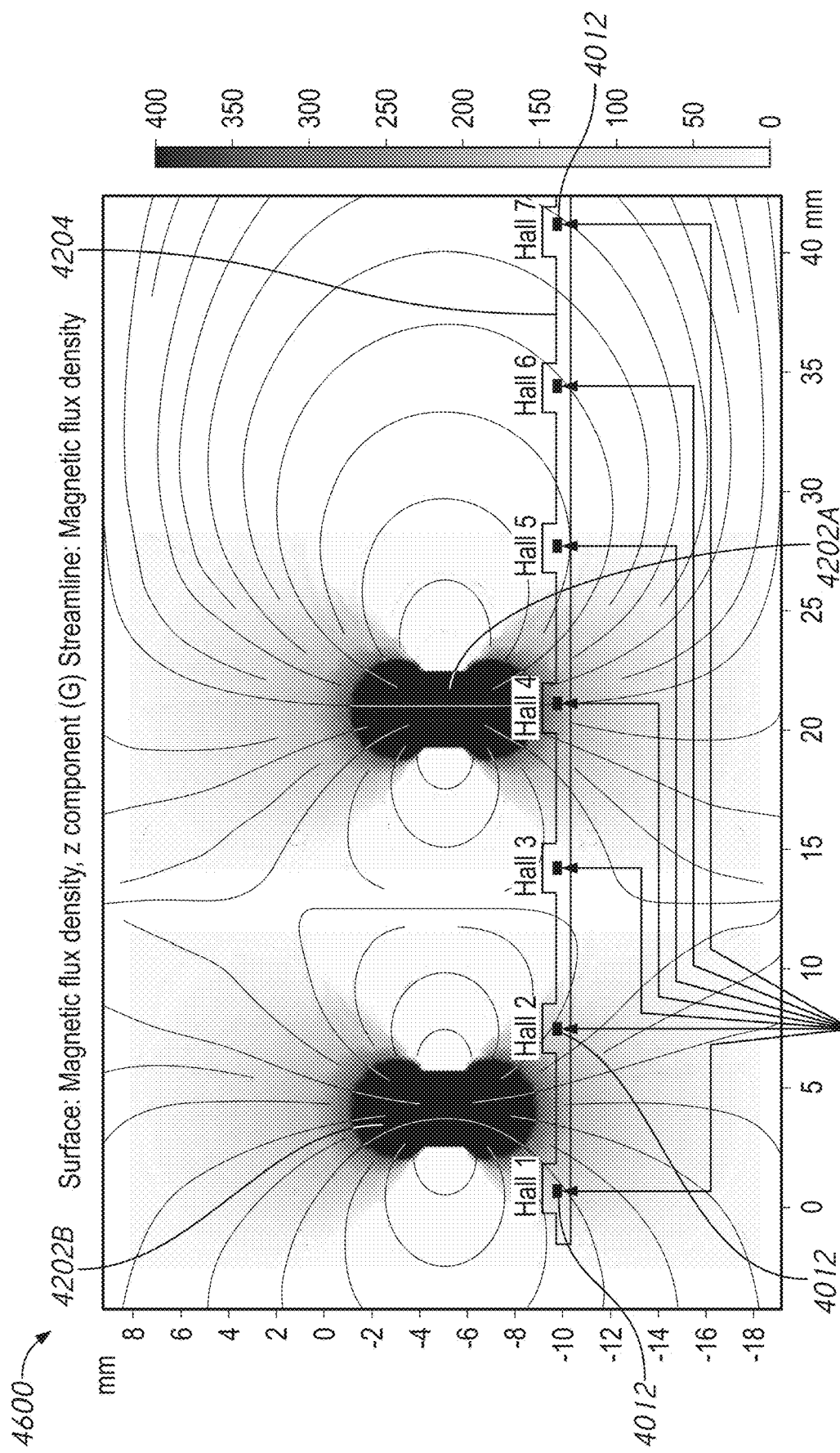
FIG. 46 illustrates a graph depicting the magnetic fields of a pair of magnets positioned with respect to a set of magnetic sensors in accordance with certain embodiments.

FIG. 46 illustrates a graph 4600 depicting the magnetic fields of a pair of magnets 4202 positioned with respect to a set of magnetic sensors 4012 in accordance with certain embodiments. In the example illustrated by FIG. 46, the magazine 4010 may include 7 sensors 4012. However, it should be understood that the graph 4600 may represent only a portion of the magazine 4010. In other words, the sensors 4012 may represent a subset of the sensors included in a magazine 4010 and the magazine may include more than 7 sensors 4012. In some cases, additional sensors may exist to the right of Hall effect sensor 7. The graph 4600 illustrates the magnetic flux density, or the magnitude of the magnetic field generated by the magnets 4202. The larger the magnetic flux density, the closer the sensor 4012 is to the magnet. By determining the magnetic flux density, it is possible to determine the location of the magnet relative to the sensor 4012.

In the example corresponding to the graph 4600, the magnet 4202A is positioned over Hall effect sensor 4 and the magnet 4202B is located between Hall effect sensor 1 and Hall effect sensor 2. The sensors 4012 from left to right (e.g., from Hall 1 to Hall 7) are positioned from the bottom of the magazine 4010 to the top of the magazine 4010 (e.g., Hall 7 is closer to the ingress/egress point of the magazine 4010 than Hall 1).

Figure 47:
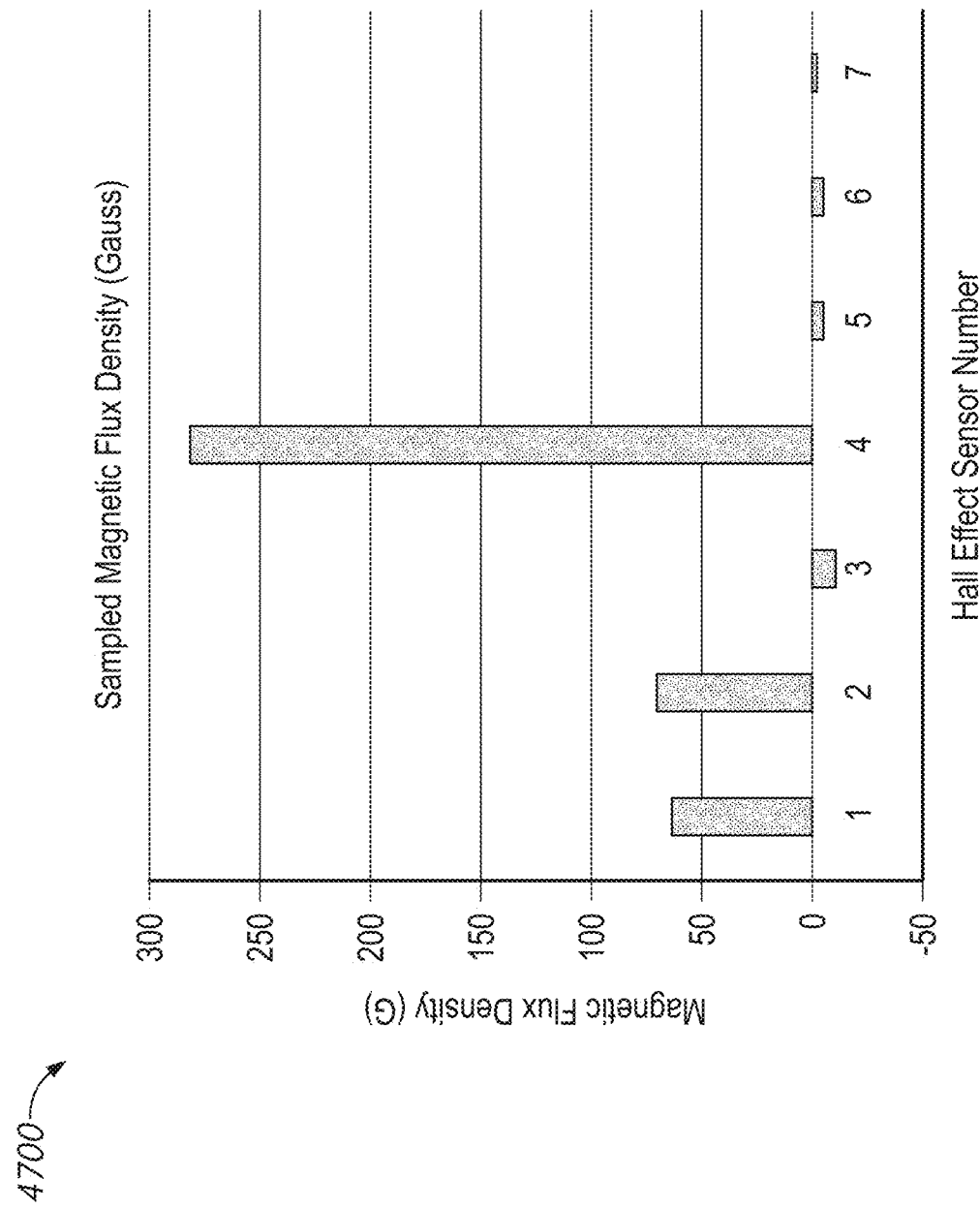
FIG. 47 illustrates a graph depicting the measurement of the magnetic fields illustrated in the graph of FIG. 46 by the set of magnetic sensors in accordance with certain embodiments.

FIG. 47 illustrates a graph 4700 depicting the measurement of the magnitude of the magnetic fields, or the magnetic flux density, illustrated in the graph 4600 of FIG. 46 by the set of magnetic sensors 4012 in accordance with certain embodiments. The Hall effect sensors listed in the graph 4700 correspond to the sensors depicted in the graph 4600. As can be seen by the Hall effect sensor 4 of the graph 4700, the measurement of magnetic flux density is highest (~280 Gauss, or more specifically 281.81 G) when a magnet (the magnet 4202A in the depicted example) is aligned across from the sensor. Sensors 4012 that are at least a pitch distance away from a magnet (e.g., Hall effect sensors 5, 6, and 7) may obtain much smaller magnetic flux density measurements (e.g., ~0 or less). It should be understood that larger or stronger magnets may produce larger or stronger magnetic fields, which may result in larger magnetic flux density values. Conversely, smaller or weaker magnets may produce smaller or weaker magnetic fields. Thus, the size or strength of the magnet may affect not only the magnetic flux density value measured by a sensor 4012, but also the distance at which the sensor 4012 can obtain a measurement or meaningful measurement of the magnetic field. Likewise, the size and/or sensitivity of the sensors 4012 may affect the measurement of the magnetic field and/or the distance at which the magnetic field can be measured.

As illustrated in FIG. 46, the magnet 4202B is positioned between Hall effect sensors 1 and 2. Returning to FIG. 47, it can be seen that the measurement of the magnetic flux density is smaller than that of the Hall effect sensor 4 that is approximately aligned with the magnet 4202A. However, the magnetic flux density measured by both the Hall effect sensors 1 and 2 is significantly larger than measured by sensors 4012 that are not positioned next to or aligned with a magnet. Using the measured magnetic flux densities, it is possible to determine the location of the two magnets 4202 (e.g., through triangulation or a center-of-mass calculation) and consequently, the location of the follower 4016 enabling determination of the ammunition 4002 within the magazine 4010. The determination of the follower position 4016 can be based on a center-of-mass calculation of the magnetic flux densities measured by the Hall effect sensors.

Figure 48:
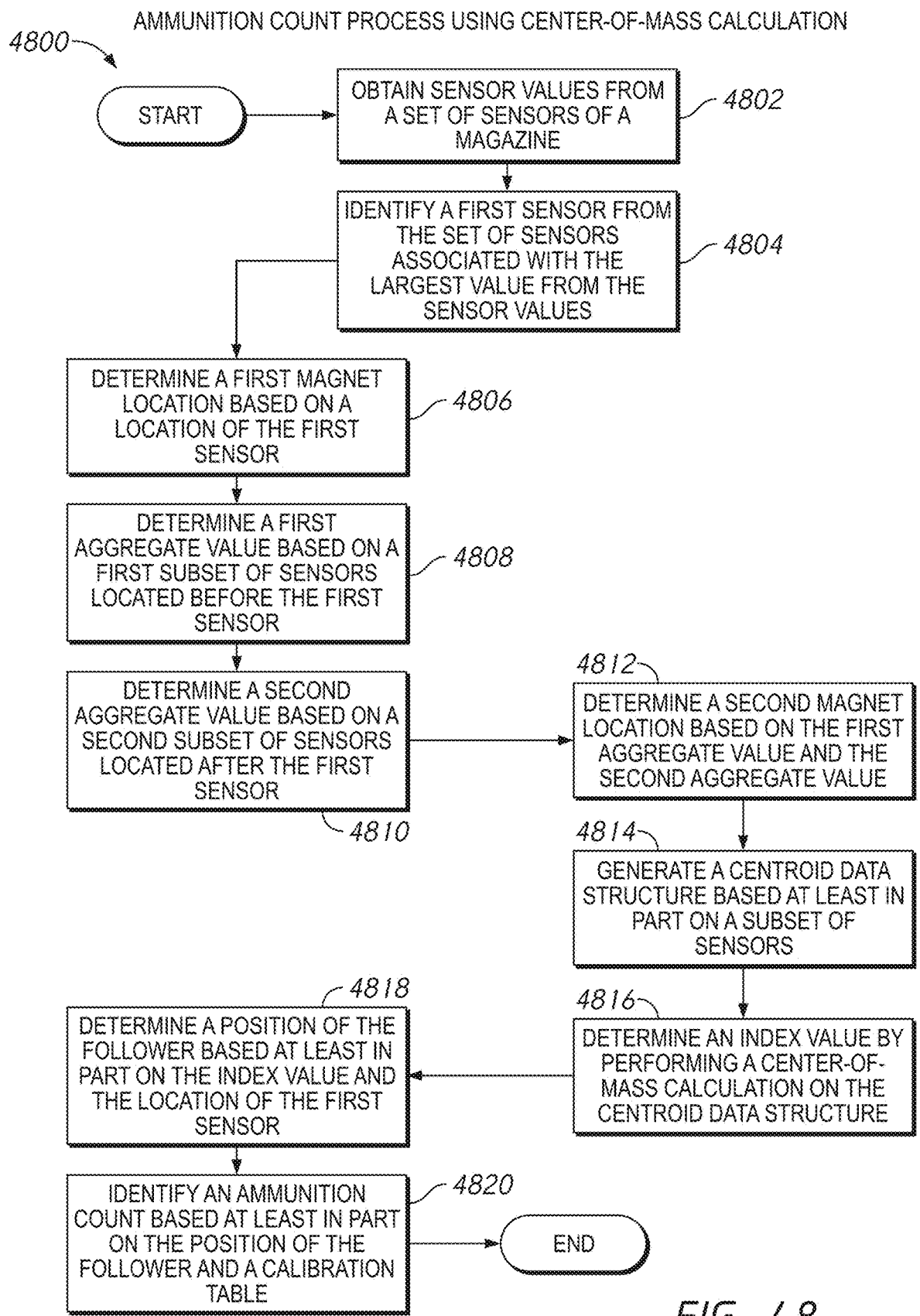
FIG. 48 presents a flowchart of an embodiment of an ammunition count determination process using a center-of-mass calculation in accordance with certain embodiments.

FIG. 48 presents a flowchart 4800 of an embodiment of an ammunition count determination process using a center-of-mass calculation in accordance with certain embodiments. The process 4800 can be implemented by any system that can determine a count of the number of cartridges or ammunition 4002 within a magazine 4010. For example, the process 4800, in whole or in part, can be implemented by a processor 4018 (e.g., the processor 4018A), one or more sensors 4012, or the positioner 4014, and the like. Alternatively, or in addition, the process 4800, in whole or in part, can be implemented by one or more of the systems previously described as implementing the process 2800. To simplify discussion and not to limit the disclosure, portions of the process 4800 will be described with respect to particular systems. However, it should be understood that operations of the process 4800 may be performed by other systems. For example, operations described as being performed by the processor 4018A may be performed by the processor 4018B, electronic circuitry 122, or the electronic circuitry 2002.

The process 4800 begins at block 4802 where, for example, a processor 4018 (e.g., the processor 4018A, 4018B, or 4018C) obtains sensor values from a set of sensors 4012 of a magazine 4010. As previously described, the sensors 4012 may include any type of sensor that may generate a signal based on the detection of an element used to implement the positioner 4014. For example, the sensors 4012 may be magnetic sensors that can generate a signal in response to detecting a magnetic field generated by one or more magnets included as part of the positioner 4014. In some cases, the magnetic sensors may be switches (e.g., Hall effect switches) that turn on/off in the presence of a magnetic field that satisfies a particular field strength. The use of switches may provide for digital sensing and can be used to detect whether a magnet is present or not within a particular range of the switch. However, in some cases, it is desirable to use analog sensing as can be achieved using magnetic sensors to implement a linear encoder. In some cases, the linear encoder can provide more granular sensing than the use of a digital system implemented using switches.

In some cases, the set of sensors includes all the sensors 4012 of the magazine 4010. Sensors that are distant from the positioner 4014 may generate relatively weak signals compared to sensors that are relatively close to the positioner 4014. In some cases, the processor 4018 may filter values below a particular magnitude (e.g., the signals that are more distant from the positioner 4014) and process sensor values that satisfy the particular magnitude threshold.

Alternatively, the block 4802 may obtain sensor values from sensors 4012 that generate a signal of a minimum value. Generally, the sensors 4012 that generate a signal of a minimum strength of magnitude may be assumed to be a minimum distance from the positioner 4014. Other sensors may be ignored. In some cases, the processor 4018 may determine a sensor that generates the largest value (e.g., as in the block 4804 below) and may obtain the sensor values of a particular number of additional sensors that are within a particular distance or pitch of the sensor that generates the highest value. For example, referring to FIG. 47, Hall effect sensor 4 generates the highest value. In such an example, the processor 4018 may obtain sensor values for 2, 3, 4, or any other number of sensors before and/or after the Hall effect sensor 4 and may disregard other sensors. In some cases, the processor 4018 obtains sensor values from any number of sensors less than a particular distance from the sensor that generates the highest value. For example, the processor 4018 may obtain sensors values from sensors that are within 1, 2, or 3 centimeters from Hall effect sensor 4. It should be understood that the sensor values generated by any particular number of sensors 4012 may be obtained as part of the block 4802 based, for example, on the number of sensors 4012 in the magazine 4010, the size or type of positioner 4014, the type of ammunition 4002, or any other factor that may affect the accuracy of a linear encoder or ammunition count system.

The values obtained from the sensors 4012 may be magnetic flux density values as illustrated in FIG. 47. Alternatively, the values may be any other type of value that can correspond to a magnetic field or other measurable characteristic of a positioner 4014, such as light intensity.

At block 4804, the processor 4018 identifies a first sensor from the set of sensors 4012. The first sensor may be associated with the largest value from the set of sensor values. In the example, illustrated in FIG. 47, the processor 4018 identifies Hall effect sensor 4 has having the highest magnetic flux density value.

At block 4806, the processor 4018 determines a first magnet location based at least in part on a location of the first sensor. The first magnet may be either the magnet 4202A or the magnet 4202B. Further, while the first magnet may be the magnet 4202A when a particular amount of ammunition 4002 is in the magazine 4010, the first magnet may change to the magnet 4202B as the amount of ammunition 4002 in the magazine 4010 changes causing movement of the follower 4016, which correspondingly causes the positioner 4014 formed, at least in part, from the magnets 4202 to move. In the example illustrated in FIG. 46, the first magnet corresponds to the magnet 4202A as the Hall effect sensor 4 would generate the largest value being closer to a magnet 4202 than any of the remaining sensors 4012.

The first magnet location may be determined by determining the identity of the sensor that is associated with the largest sensor value (e.g., the sensor identified at the block 4804), and accessing a mapping (or other data structure) that stores an absolute or relative location within the magazine 4010 associated with the identified sensor. Returning to the example of FIG. 46, it may be determined that the first sensor corresponds to Hall effect sensor 4. The processor 4018 can determine the location of the Hall effect sensor 4 by accessing a data structure that stores absolute and/or relative sensor locations.

At block 4808, the processor 4018 determines a first aggregate value based at least in part on a first subset of sensors 4012 located before the first sensor. The first aggregate value may be determined using any type of aggregation. For example, the first aggregate value may be a sum or a weighted sum.

The first subset of sensors 4012 may be a subset of a subset of sensors. For example, the sensor values obtained at the block 4802 may be obtained from an initial subset of sensors of the sensors 4012. The first subset of sensors of the block 4808 may be a subset of the initial subset of sensors 4012. The first subset of sensors may include a contiguous group of sensors immediately preceding the first sensor. Alternatively, the first subset of sensors may be a group of sensors located a particular distance from the first sensor or a particular number of sensors away from the first sensor. In the example illustrated in FIG. 46, the first subset of sensors may be the N−2 and N−3 sensors with N being the first sensor, or the sensors associated with the highest sensor value. Thus, the first subset of sensors may be Hall effect sensor 2 and Hall effect sensor 1. However, the first subset of sensors is not limited as such and may include any number of sensors. Further, the first subset of sensors may be a different set of sensors (e.g., N−2 and N−1 sensors, or N−1, N−2, and N−3, etc.). The first subset of sensors may be determined by accessing a data structure that stores relative and/or absolute locations of the sensors within the magazine 4010. Continuing with the example of FIG. 46, Hall effect sensor 4 is determined to be the first sensor of the block 4804. Accessing the data structure that stores locations of the Hall effect sensors, it can be determined which Hall effect sensor correspond to Hall effect sensors 1 and 2. It should be understood that other methods may be used to identify sensors and/or sensor locations. For example, sensor locations may be transmitted by the sensor along with sensor values to the processor 4018.

At block 4810, the processor 4018 determines a second aggregate value based at least in part on a second subset of sensors 4012 located after the first sensor. The block 4810 may include one or more of the embodiments described with respect to the block 4810, but for a second subset of sensors 4012. It should be understood that the designation of which sensors are "before" and which sensors are "after" the first sensor in blocks 4808 and 4810 is for convenience. It is possible for the designation of "before" or "after" to be reversed without materially changing the disclosure herein. As with the block 4808, the second subset of sensors may include a group or sensors a particular distance from the first sensor or a particular number of sensors away from the first sensor. In the example illustrated in FIG. 46, the second subset of sensors may be the N+2 and N+3 sensors with N being the first sensor. Thus, the second subset of sensors may be Hall effect sensor 6 and Hall effect sensor 7. In some cases, the first and second subset of sensors may include more or fewer sensors. Further, as the indication of "before" or "after" are selected for convenience, the first and second subset of sensors may be switched with the first subset including Hall effect sensor 6 and Hall effect sensor 7 and the second subset including Hall effect sensor 2 and Hall effect sensor 1. The values and/or aggregate values may be determined based at least in part on the proximity of the sensors 4012 to one or more of the magnets 4202.

At block 4812, the processor 4018 determines a second magnet location based at least in part on the first aggregate value and the second aggregate value determined at the blocks 4808 and 4810, respectively. The second magnet location may correspond to a location determined by the larger of the first aggregate value and the second aggregate value. While the location of the first magnet may be directly across from a Hall effect sensor, or less than a threshold distance from the closest Hall effect sensor, the second magnet may be located between two Hall effect sensors or more than a threshold distance from the closest Hall effect sensor. As such, the sensor values obtained for the Hall effect sensors closest to the second magnet may be lower than the Hall effect sensor located closest to the first magnet. For example, as illustrated in FIG. 46, the first magnet may be located across from, or less than a threshold distance away from, Hall effect sensor 4. The resultant sensor value from Hall effect sensor 4 is approximately 281.81 G. The first aggregate value associated with Hall effect sensors 1 and 2 may be approximately 134.257 G and the second aggregate value associated with Hall effect sensors 6 and 7 may be approximately −7.1956 G. As the first aggregate value is larger than the second aggregate value, the second magnet may be determined to be somewhere between Hall effect sensor 1 and Hall effect sensor 2. In some cases, the difference between the sensor values of Hall effect sensor 1 and Hall effect sensor 2 may be used to further determine the location of the second magnet. For example, if the difference between sensor values is small or close to 0, the second magnet may be determined to be equidistant between the Hall effect sensor 1 and Hall effect sensor 2. In contrast, if the difference is non-0, the second magnet may be determined to be closer to the Hall effect sensor associated with the larger value.

In some cases, the first magnet may be referred to as a peak magnet because the first magnet is associated with the Hall effect sensor that generates the largest or strongest signal (e.g., Hall effect sensor 4 in the example of FIG. 46). Further, the second magnet may be referred to as a non-peak magnet because the second magnet is associated with Hall effect sensors that generate strong signals, but with lower amplitudes than the Hall effect sensor that detects the first magnet.

Although the peak magnet and non-peak magnet may be located a fixed distance away from each other, and although the Hall effect sensors may be located at fixed positions, a number of factors previously described may result in measurement discrepancies. For example, manufacturing tolerances, wear and tear or degradation over time of the magazine, insertion or removal of the magazine from a firearm, differences in the amount of pressure applied to the magazine by different firearms, differences in types of ammunition, etc. may all affect the relative location of the positioner 4014 to the sensors 4012, which may affect ammunition counts. Further, although increasing the number of sensors 4012 can reduce or negate the impact of the above factors, the addition of more sensors can increase cost and power requirements. The use of a center-of-mass calculation that can use the strength of the signals generated responsive to the second magnet to determine the exact location of the first magnet enables a reduction in the number sensors 4012 while maintaining the ability to use linear encoding to accurately determine ammunition count of ammunition 4002 in the magazine 4010.

At block 4814, the processor 4018 generates a centroid data structure based at least in part on sensors values from a subset of the sensors 4012. The centroid data structure may comprise an array that includes a subset of sensor values. This subset of sensors may include at least the first sensor and sensors from at least one of the first subset of sensors or the second subset of sensors. The centroid data structure may be formed based on the sensor value associated with the first sensor and the sensor values associated with the sensors used to obtain the larger of the first aggregate value and the second aggregate value. Accordingly, in the example of FIG. 46, the centroid data structure may include at least Hall effect sensor 4, and Hall effect sensors 1 and 2. Thus, at a minimum, the centroid data structure may be a 3×1 array in the example FIG. 46.

In some cases, the centroid data structure may be larger enabling the use of additional sensor values. In some cases, the centroid data structure size may be selected based at least in part on the number of sensors between the magnets. For example, the distance between magnets in the example illustrated in FIG. 46 is approximately 2.5× the pitch or distance between sensors. The size of the centroid data structure may be selected to include sensor values up to 2.5× distance in either direction from the first sensor (e.g., the one with the highest sensor value). Thus, the centroid data structure may be formed as a 5×1 array. It should be understood that other size arrays may be used. For example, the centroid array may be 7×1, 9×1, or any other size array. In some cases, the centroid array may be equal in size to the number of sensors 4012 included in the magazine 4010. Although described as an array, it should be understood that the sensor values may be stored in any type of data structure or directly in registers associated with particular positions in an array structure.

Figure 49:
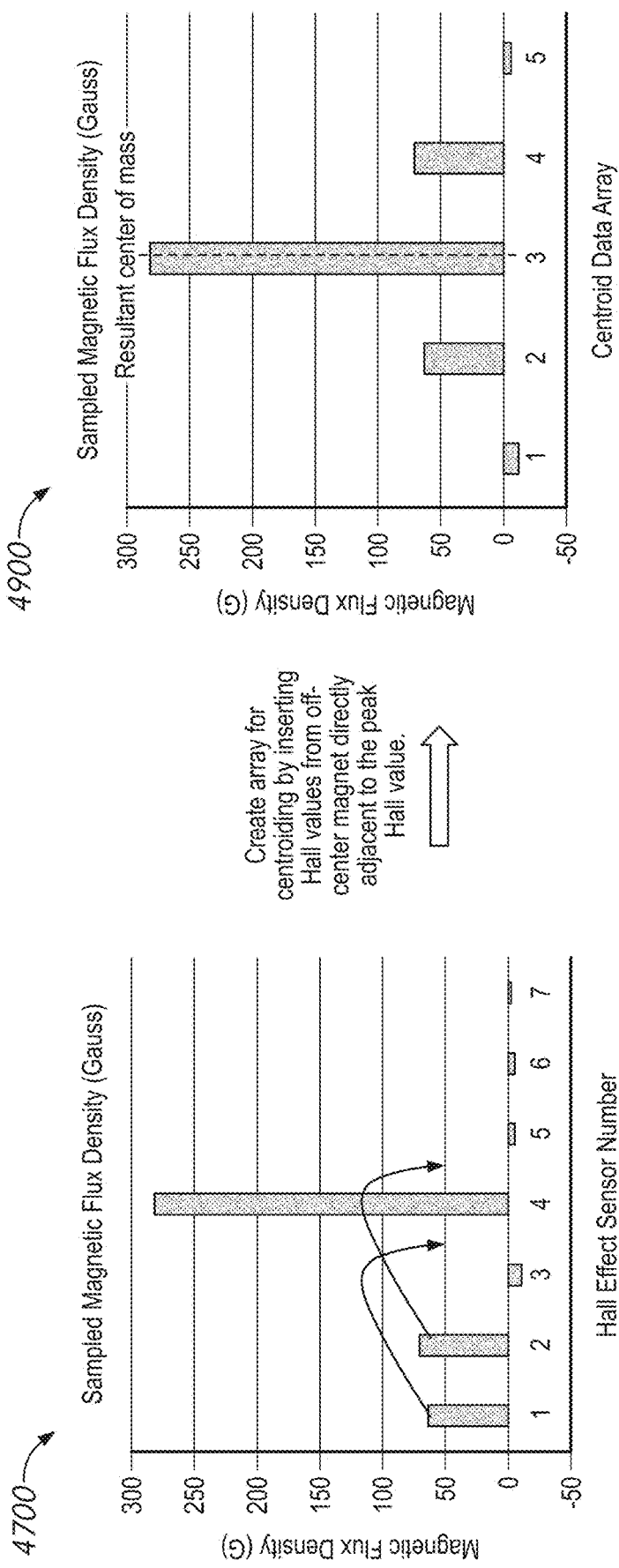
FIG. 49 illustrates a non-limiting example of creating a 5×1 centroid data array based on the measurement of magnetic fields illustrated in FIG. 47 in accordance with certain embodiments.

FIG. 49 illustrates a non-limiting example of creating a 5×1 centroid data array 4900 using the example sensor values illustrated in FIG. 47 in accordance with certain embodiments. The centroid data array 4900, as represented by the graph on the right-side of FIG. 49, may be created by placing the highest sensor value in the center of the array. In the example of FIG. 49, the sensor value associated with the Hall effect sensor 4 is the highest value and is placed or stored in position 3 of the centroid data array 4900.

The sensor values associated with the sensors used to create the larger of the first aggregate value or the second aggregate value (e.g., the sensors determined to be closest to the second magnet, which may be referred to as the off-center magnet as the magnet is located between sensors rather than centered or approximately centered on a sensor) may be placed or stored in the array positions 2 and 4 with the relative positions between the sensors used to create the aggregate value being maintained in the centroid data array 4900. In other words, in the example illustrated by graph 4700, the first aggregate value associated with Hall effect sensors 1 and 2 is larger than the second aggregate value associated with Hall effect sensors 6 and 7, and accordingly, the relative position of Hall effect sensor 1 and 2 is maintained when the values are stored at the centroid data array 4900 with the sensor value of Hall effect sensor 1 stored in position 2 of the centroid data array 4900 and the sensor value of Hall effect sensor 2 stored in position 4 of the centroid data array 4900. If instead the second aggregate value was larger, then the sensor value of Hall effect sensor 6 would be stored in position 2 of the centroid data array 4900 and the sensor value of Hall effect sensor 7 would be stored in position 4 of the centroid data array 4900 maintaining the relative positions of Hall effect sensors 6 and 7 to each other. The remainder of the positions in the centroid data array, if any, may include one or more additional sensor values obtained from one or more sensors surrounding the sensor that generates the highest sensor value, which in this case is Hall effect sensor 4. Thus, the sensor value of Hall effect sensor 3 may be stored at position 1 of the centroid data array 4900 and the sensor value of Hall effect sensor 5 may be stored at position 5 of the centroid data array 4900.

In some cases, the sensor associated with the highest sensor value may be an edge sensor (e.g., Hall effect sensor 1). The sensors and magnets may be positioned such that both magnets may be detected by the sensors. Thus, if the highest sensor value is an edge sensor (e.g., is aligned directly or close to one magnet), then the second magnet may be positioned such that Hall effect sensors to the right of Hall effect sensor 1 detects the second magnet (e.g., Hall effect sensors 5, 6, or 7) such that both magnets are detected. When generating the centroid data array 4900, array entries associated with non-existent sensor positions may be set to the value 0. For example, assuming a magnet aligned with Hall effect 1, the value from Hall effect 1 would be stored in position 3 of the centroid data array 4900. Positions 2 and 4, assuming the second magnet is positioned between Hall effect sensors 3 and 4, would have the values from Hall effects 3 and 4, respectively. Position 5 would have the value of Hall effect sensor 2. And position 1 would have the value 0 as there is no sensor −1 or no sensor before Hall effect sensor 1 in this example. Alternatively, or in addition, the position of the magnets and sensors may be such that the left-most magnet (using the orientation illustrated in FIG. 49) never proceeds below sensor 3 or 4 ensuring that there are values to insert in a 5-position centroid array, or assuring that there is a −1 and/or −2 position Hall effect sensor. In yet other embodiments, a 3-position centroid array may be used reducing the occurrence of positions in the array that are not associated with a sensor value.

At block 4816, the processor 4018 determines an index value by performing a center-of-mass calculation using the sensor values included in the centroid data structure 4900. A center-of-mass calculation may determine a point in a system that responds to external forces as if the total mass of the system were concentrated at the point. In the present case, the center-of-mass calculation may determine the center of the centroid array in index space, which may be used to determine the precise position of the first magnet. The center-of-mass calculation can be performed using the following formula:

$$\text{Index} = \frac{m1x1 + m2x2 + m3x3 + m4x4 + m5x5}{m1 + m2 + m3 + m4 + m5} \tag{1}$$

where the values m1-m5 refer to the mass values and x1-x5 refer to the position of the mass values in the system. In this particular case, m1-m5 may refer to the magnetic flux density values stored in the centroid data structure 4900 and the values x1-x5 may refer to the index values, 1-5 respectively, within the centroid data structure. In the non-limiting example of FIGS. 47 and 49, the magnetic flux density values measured by the Hall effect sensors 1-7 respectively are: 63.796 G, 70.461 G, −11.854 G, 281.81 G, −5.4139 G, −5.0801 G, and −2.1155 G. Accordingly, the values stored in positions 1-5 of the centroid data structure 4900 are: −11.854 G, 63.796 G, 281.81 G, 70.461 G, and −5.4139 G. Applying the values of the centroid data structure 4900 to the center-of-mass formula, the Index value is approximately 3.049. It should be understood that formula (1) above is just one example of a center-of-mass calculation. It should be understood that the calculation of center-of-mass of the centroid array may be performed using other calculations or techniques. For example, a triangle may be created between the magnet corresponding to the peak sensor value, the corresponding sensor associated with the peak sensor value, and the sensors corresponding to the second magnet position. A centroid value may then be calculated using the triangle. Thus, although the above calculation indicates an index value of 3.049, other values are possible using different types of centroid analysis. For example, the index value may be 3.0245.

When, the first magnet is aligned such that the center of the first magnet is directly opposite or aligned across from the center of a Hall effect sensor (e.g., the Hall effect sensor 4) and the second magnet is equidistant from a pair of sensors (e.g., the Hall effect sensors 1 and 2), the determination of the index calculated using the center-of-mass formula may be equivalent to the central index value (e.g., 3 in a 5×1 centroid array). However, the first magnet is not always aligned perfectly (e.g., there may be an offset in the alignment) with a Hall effect sensor and the second magnet is not always aligned equidistant between two Hall effect sensors. Alignment between one or more of the magnets and one or more of the sensors may vary due to manufacturing tolerances of the magazine, differences in ammunition types or sizes, differences in spring pressure of a spring that is connected to the magazine follower, wear and tear or degradation over time of material used to create the magazine, insertion or non-insertion of the magazine into the firearm, and the like.

Further, the inclusion of different numbers of sensors in the magazine may affect the frequency of alignment between a magnet and a sensor in the magazine. For example, in a case where the magazine includes N/2 sensors or more, wherein N refers to the maximum ammunition that can be inserted into the magazine, the positioning of the positioner 4014 and the sensors 4012 may be such that at least one magnet of a pair of magnets 4202 may be aligned with a sensor 4012 and one magnet may be positioned between a pair of sensors 4012 regardless of the position of the follower 4016. However, in cases where the magazine includes less than N/2 sensors and a pair of magnets 4202, there may be instances where neither magnet of the pair of magnets 4202 is aligned opposite of a sensor in a plane, but instead each of the magnets 4202 may be aligned between a pair of sensors 4012.

Thus, the index value may often indicate a relative position of a magnet, such as the peak magnet or the magnet nearest the sensor 4012 associated with the largest value from the sensor values. For instance, the index value may indicate that the peak magnet is slightly above or slightly below the sensor 4012 that is associated with the largest value from the sensor values. Returning to the example of FIGS. 47 and 49, the index of 3.049 indicates that the peak magnet 4202A is slightly (0.049) to the right (or towards the top of the magazine where the top of the magazine is the point or location at which ammunition is loaded or unloaded) of the sensor to which it is closest. It should be understood that the indication of whether the magnet 4202A is to the right or left, or above or below the sensor is not limiting and that it is possible for the directions to be reversed.

At block 4818, the processor 4018 determines a position of the follower 4016 based at least in part on the index value and the location of the first sensor. Determining the position of the follower 4016 may include converting the output of the center-of-mass centroid calculation to a distance value. For example, the index may be converted to mm or cm.

The position of the follower 4016 may be determined by using a difference between the index value and the center or center index value of the centroid data array 4900 to determine a position of the magnet across from the first sensor (e.g., the magnet 4202A in the example illustrated in FIG. 46). The position of each sensor 4012 within the magazine 4010 may be known in advance (e.g., at the time of manufacture). Thus, determining the first sensor at the block 4806 provides a rough or coarse location of the follower 4016. As such, the first magnet or peak magnet may also be referred to as a "coarse positioning magnet." As the magnet that corresponds to or causes the largest sensor value to be generated differs based on the position of the positioner 4014 relative to the magnets, it should be understood that the coarse positioning magnet may change from one magnet 4202A to another magnet 4202B and vice versa as ammunition is added or removed from the magazine 4010. The larger of the first and second aggregate values adjusts the index value using the center-of-mass calculation. In other words, an initial position of the coarse positioning magnet is determined based on the location of the first sensor. The corresponding sensor value is stored in the middle of the centroid data structure 4900 (e.g., at index value 3). The larger of the values determined at the blocks 4808 and 4810 makes a relatively small adjustment, or a fine adjustment, in the calculation of the center-of-mass of the centroid data structure 4900. This fine adjustment can be translated into an adjustment of the position of the first magnet, or the coarse positioning magnet. As such, the magnet (e.g., the non-peak magnet) that causes the signal values associated with the larger of the first and second aggregate values may be referred to as a "fine positioning magnet." Further, as the distance or pitch between each sensor may be known in advance (e.g., at the time of manufacture), the difference between the calculated index (e.g., 3.049 in the example of FIG. 49) and the middle of the centroid data structure 4900 (e.g., index value 3) may correspond to a known or calculatable distance. This distance may be added or subtracted to the distance from a reference point or zero point (e.g., the bottom or top of the magazine 4010) and the position of the first sensor. For example, using the examples illustrated in FIGS. 46 and 49, the Hall effect sensor 4, which corresponds to the first sensor (e.g., the sensor associated with the value at index 3 of the centroid data array 4900) may be located at a particular distance from the bottom of the magazine, such as 25 mm, 30 mm, 35 mm, etc. If the Hall effect sensor 4 is located 30 mm from the bottom or zero-point of the magazine, then the center of the peak magnet may be positioned at about 30 mm when aligned with the first sensor of the Hall effect sensor 4. However, as the calculated index is 3.049 and not 3, the peak magnet is slightly higher or off-center from the 30 mm location. In some cases, the position can be determined by multiplying the difference between the calculated index and the center index value (e.g., 0.049) and a distance between sensors. Thus, if the distance between sensors is 7 mm, the position of the magnet may be adjusted by 0.049*7 mm. Accordingly, in this non-limiting example, the position of the peak magnet may be determined to be 30.343 mm from the zero point. It should be understood that the zero point may not be the very bottom or top of the magazine but may be any position designated as the zero point. For example, the zero point may be set a particular distance from the bottom inner edge of the magazine to account for the length of the spring and/or follower 4016. In some cases, the zero point or reference point may be the bottom edge of the magazine or any other location and the impact on the ammunition count of mechanical or other elements in the magazine may be accounted for in the calibration table for the magazine.

Further, by using the first and second aggregate values, it can be determined whether the magnet is the magnet 4202A or 4202B. If the first aggregate value is higher than the second aggregate value, it can be determined that the magnet 4202A is associated with the value generated by the first sensor. In contrast, if the second aggregate value is higher than the first aggregate value, it can be determined that the magnet 4202B is associated with the value generated by the first sensor. In some embodiments, a calibration table or lookup table may be used to determine the amount of ammunition in the magazine. The calibration or lookup table may be indexed by the location of one of the magnets 4202A or 4202B. Accordingly, it may be desirable to determine the location of the magnet 4202A or 4202B that is used to index or access the calibration table. As explained above, the first magnet may sometimes be magnet 4202A and may sometimes be 4202B. Accordingly, in cases where the first magnet corresponds to the magnet used to index the calibration table the location of the magnet may be used directly to index the calibration table. However, in cases where the second magnet corresponds to the magnet used to index the calibration table, the distance from the zero-point to the second magnet may be determined by subtracting or adding the distance between the first magnet and the second magnet to the distance of the peak magnet from the zero-point. For example, continuing the prior example, the distance between the magnets 4202A and 4202B is 2.5× where x is the distance between sensors 4012. In the prior example the distance between sensors is roughly 7 mm. Thus, the distance between magnets in this non-limiting example may be 17.5 mm. Accordingly, if the first magnet is used to index the calibration table, the index of 30.343 may be used to index the calibration table. However, if the second magnet is used to index the calibration table, the index of 12.843 (or 30.343-17.5) may be used to index the calibration table.

In some cases, the index determined at the block 4816 is converted to a distance by identifying the sensor associated with the highest magnetic flux density and adjusting the position based on the resultant center of mass determined at the block 4816. The determined position may then be multiplied by the sensor pitch to determine the distance of the follower from the reference point (e.g., the first sensor 4012). In some cases, the determined position may be normalized or adjusted based on a selected reference point other than the first sensor 4012. For example, if the index is determined to be 3.049, then the position of the positioner 4014 may be determined by first determining the first sensor (e.g., Hall effect sensor 4). Each sensor may be treated as a unit of distance. Thus, the first sensor is at position 4, which may be modified to be 4.049 using the center of mass calculation result. The 4.049 value may then be multiplied by the sensor pitch (e.g., 7 mm) to obtain the distance from the Hall effect sensor 1. In this example, the distance would be 28.343. This calculated distance may be adjusted based on a distance from the bottom of the magazine to the Hall effect sensor 1. Thus, for example, if the distance from the bottom to Hall effect sensor 1 is 2 mm, the distance to the follower may be 30.343.

In some cases, determining the position of the follower 4016 involves determining the position of the first magnet and second magnet as described above. In some cases, the position of the follower 4016 is determined based on the position of the first and/or second magnet. For example, the position of the follower 4016 may be determined as the position of one of the first or second magnets, as a position between the first and second magnets, or as some fixed distance from one of the first or second magnets. In some cases, the position of the follower 4016 is equivalent to or related to the position of the positioner 4014, or one or more elements of the positioner 4014 (e.g., the magnets 4202). In some cases, determining the position of the follower may involve determining a position range (e.g., 30.343 may be associated with the range 30.3-30.4 mm) or rounding the position up or down to a particular significant unit (e.g., 30.343 may be rounded to hundredths place, or 30.34 mm). In some cases, a value is selected for the position of the follower 4016 as an index to the calibration table. This value may be used for any position within the position range. For example, the value 30.35 may be used to index the calibration table when the position of the follower 4016 is determined to be any position between 30.25 and 30.4. It should be noted by the previous example that the index value is not necessarily in the middle of the position range, although in some cases it may be the middle value.

At block 4820, the processor 4018 identifies an ammunition count based at least in part on the position of the follower 4016 and a calibration table. The calibration table may be stored at and accessed from a memory of the magazine 4010. Alternatively, or in addition, the processor 4018, using the communication system 4006, accesses the calibration table from the firearm 4030, which may store one or more calibration tables in a memory. In some implementations, the processor 4018, using the communication system 4006, may access the calibration table from another electronic device in communication with the magazine 4010, such as the visual system 4050, a tablet, a data hub of the user, a server, or any other device that may store one or more calibration tables.

As described above, the calibration table may be indexed by a location of a magnet 4202. Alternatively, or in addition, the calibration table may be indexed by a position of the positioner 4014 or the follower 4016. Further, in some cases, the calibration table may be indexed by one or more other values derived from the position identified at the block 4818. The block 4820 may use the index value or a value determined based on the position of the follower (or the positioner 4014) determined at the block 4818 to access the calibration table. Accessing the calibration table may include accessing an entry in the calibration table associated with the index value, the position of the follower 4016, the position of the positioner 4014, or any value derived therefrom using the center-of-mass calculation. The entry accessed from the calibration table may be associated with a count of ammunition indicating the amount of ammunition 4002 within the magazine 4010.

In some embodiments, the calibration table is selected from a plurality of calibration tables. The calibration table may be selected based on whether the magazine 4010 is inserted into the firearm 4030. Whether the magazine 4010 is inserted into the firearm 4030 may be determined based on the activation or deactivation of a sensor or switch in response to the insertion or removal of the magazine 4010 from the firearm 4030. Further, the calibration table may be selected based on the type of ammunition 4002 inserted into the magazine 4010. For example, a different calibration table may be selected from the plurality of calibration tables based on whether the ammunition is of a particular size (e.g., 9 mm, 22 mm, .223 caliber, .30 caliber, etc.), has a particular case type (e.g., brass, steel, nickel, etc.), or a particular bullet type (e.g., full metal jacket, jacketed hollow-points, etc.).

The process 4800 is primarily described with respect to the example illustrated in FIGS. 46, 47, and 49 where the right (or top magnet 4202A when the magazine is standing with the base pointing down and the entry/exit point pointing up) is aligned with a sensor 4012 and the left or bottom magnet 4202B is located between a pair of sensors. However, as previously mentioned, as ammunition is added or removed, the relative position of the magnets 4202 may change such that the magnet 4202A and the magnet 4202B are both between sensors 4012. Further, when the ammunition is added or removed from the magazine, the magnet 4202A may be between a pair of sensors 4012 and the magnet 4202B may be aligned with a sensor 4012.

Figure 50:
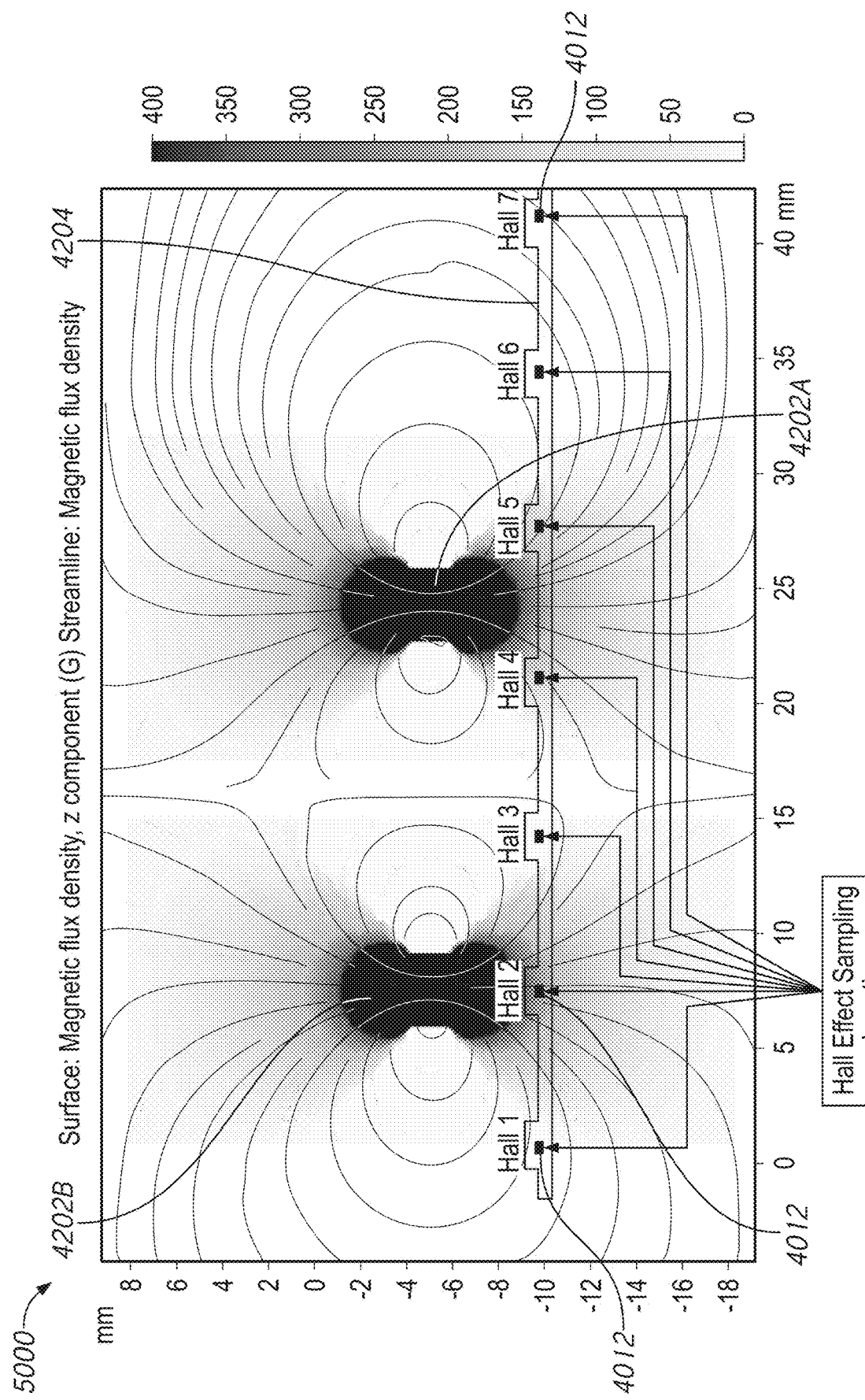
FIG. 50 illustrates a second graph depicting the magnetic fields of a pair of magnets positioned with respect to a set of magnetic sensors in accordance with certain embodiments.
Figure 51:
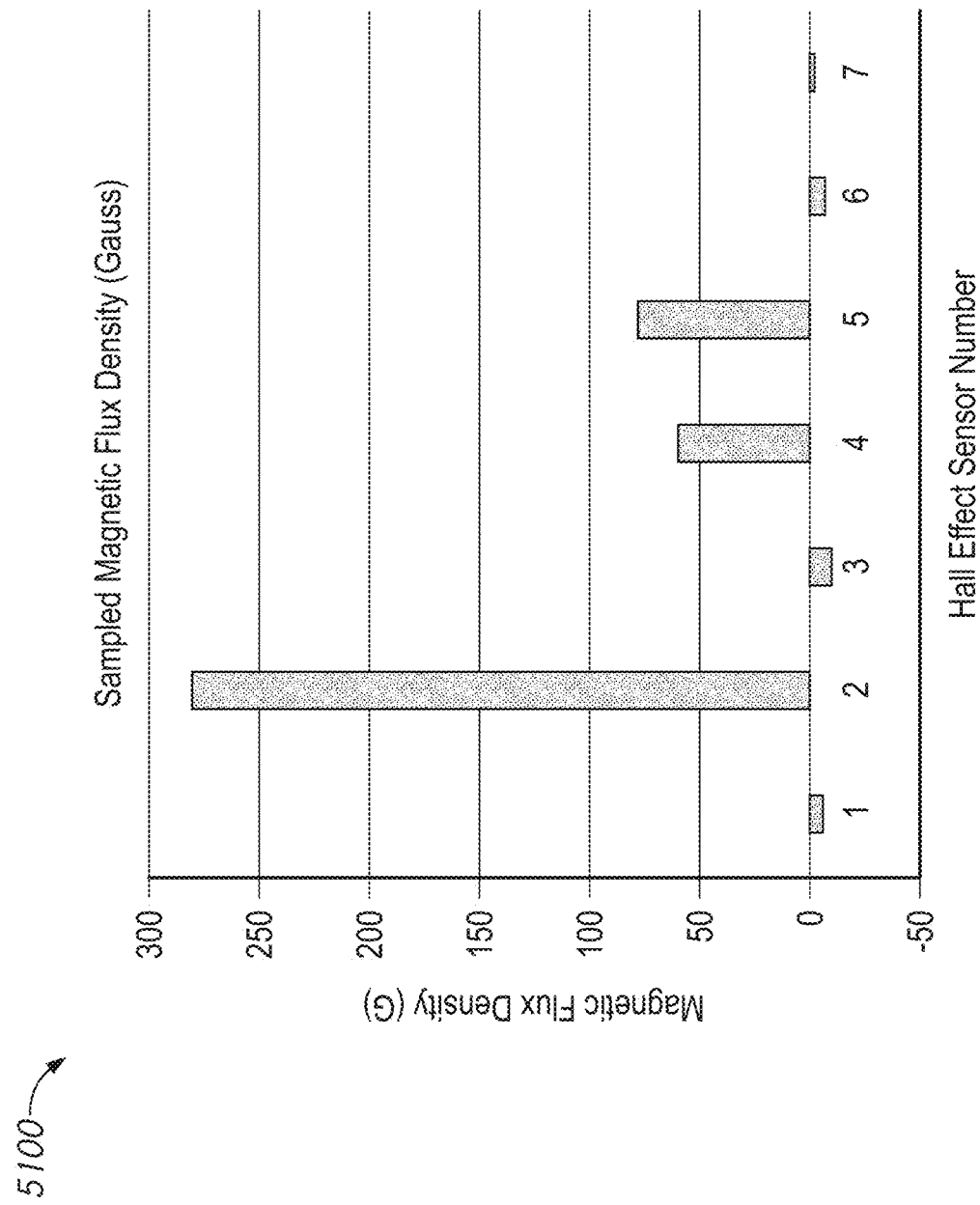
FIG. 51 illustrates a graph depicting the measurement of the magnetic fields illustrated in the graph of FIG. 50 by the set of magnetic sensors in accordance with certain embodiments.
Figure 52:
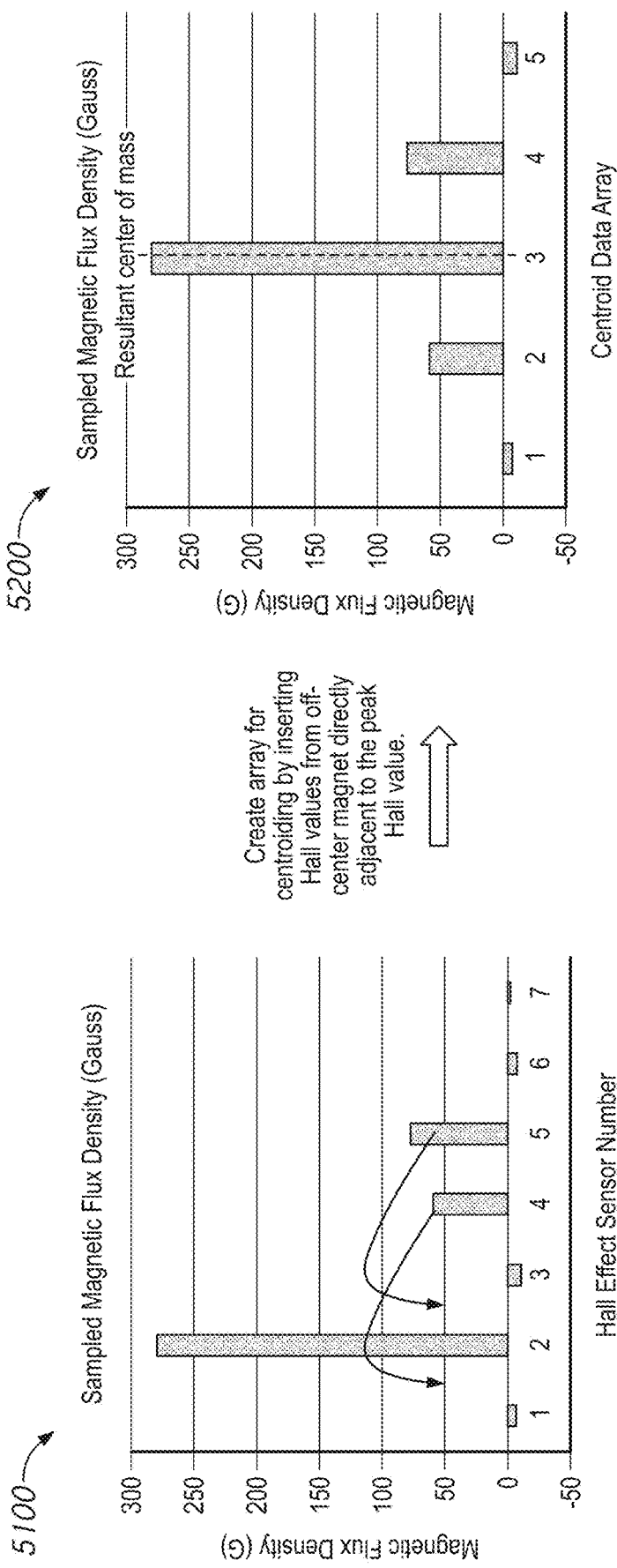
FIG. 52 illustrates a non-limiting example of creating a 5×1 centroid data array based on the measurement of magnetic fields illustrated in FIG. 51 in accordance with certain embodiments.

FIGS. 50-52 illustrate an example of performing the process 4800 where the magnet 4202A is between a pair of sensors 4012 and the magnet 4202B is be aligned with a sensor 4012. FIG. 50 illustrates a second graph 5000 depicting the magnetic fields of a pair of magnets 4202 positioned with respect to a set of magnetic sensors 4012 in accordance with certain embodiments. In the example of FIG. 50, the magnet 4202A is located between Hall effect sensors 4 and 5, and the magnet 4202B is located across from, or roughly aligned with, Hall effect sensor 2.

FIG. 51 illustrates a graph 5100 depicting the measurement of the magnetic fields illustrated in the graph 5000 of FIG. 50 by the set of magnetic sensors 4012 in accordance with certain embodiments. As can be seen in FIG. 51, the largest value is measured by Hall effect sensor 2 (280.23 G). Thus, in this non-limiting example, when performing the process 4800, the first sensor identified at the block 4804 would be Hall effect sensor 2 in the example of FIG. 51. Accordingly, contrary to the example illustrated in FIG. 46 where the first magnet was magnet 4202A, the first magnet in the example of FIG. 51 would be the magnet 4202B. Accordingly, the first magnet location (block 4806) would be identified as the location of Hall effect sensor 2.

Continuing applying the example illustrated in FIG. 51 to the process 4800, the processor 4018 may aggregate values generated by a first subset of sensors (block 4808). As previously explained, the first subset of sensors may be the N−2 and N−3 sensors, where N is the sensor associated with the highest value, or Hall effect sensor 2. However, in this example, there are no N−2 and N−3 sensors. Accordingly, the first aggregate value may be set to 0. Further, the processor 4018 may aggregate values generated by a second subset of sensors (block 4810). As previously explained, the second subset of sensors may be the N+2 and N+3 sensors, where N is the sensor associated with the highest value, or Hall effect sensor 2. The sensor N+2 (or Hall effect sensor 4) generated a value 59.263 based on the magnetic field of the second magnet 4202A in the illustrated example of FIG. 51. Further, the sensor N+3 (or Hall effect sensor 5) generated a value 76.784 based on the magnetic field of the second magnet 4202A in the illustrated example of FIG. 51. Accordingly, in some non-limiting examples, the second aggregate value is 136.047, which is significantly higher than 0. As the second aggregate value is higher than the first aggregate value, the second magnet is determined to be the magnet 4202A and it is roughly determined to be located at a location between Hall effect sensor 4 and Hall effect sensor 5 (block 4812).

As previously described, the process 4800 may further include generating a centroid data structure based on at least some of the sensor values (block 4814). FIG. 52 illustrates a non-limiting example of creating a 5×1 centroid data array 5200 based on the measurement of magnetic fields illustrated in FIG. 51 in accordance with certain embodiments and as described with respect to the block 4814. Comparing the sensor array measurements of the graph 5100 to the centroid data structure or data array 5200, it can be seen that the operations associated with the block 4814 can include storing the highest sensor signal or value (e.g., the sensor value 280.23 G associated with the Hall effect sensor 2) at the center of the centroid data array 5200 (e.g., entry 3 in the illustrated array 5200). Further, the sensor values associated with the sensors that were used to generate the larger of the aggregate sensor values (e.g., as part of the operations associated with blocks 4808 and 4810) may be stored in entries 2 and 4, or the entries surrounding the central entry, of the centroid data array 5200. In this non-limiting example of FIG. 52, the sensor values associated with the Hall effect sensors 4 and 5 are stored in positions or entries 2 and 4 of the centroid data array 5200. The sensor value entries may "slide" over such that the sensor value associated with Hall effect sensor 4 (e.g., 59.263 G) remains in the same relative position to (e.g., remains to the left of) the sensor value (e.g., 76.784) associated with Hall effect sensor 5 when comparing the graphs 5100 and 5200. The last two entries in the centroid data array may be the sensor values for the sensors that are closest to the sensor with the highest value (e.g., Hall effect sensor 2). Thus, in this non-limiting example case, the last two entries are the sensor values (e.g., −6.8025 G and −10.849 G) associated with the Hall effect sensor 1 (entry or array value [1] in the centroid data array 5200) and Hall effect sensor 3 (entry or array value [5] in the centroid data array 5200). If instead the highest value was from Hall effect sensor 1, then the value 0 may be stored in array value [1]. Once the centroid data array 5200 is generated, or the values associated with the centroid data array are determined (as the centroid data array itself is not necessarily required), a center-of-mass calculation is performed (block 4816) using equation 1. The center-of-mass calculation in the example of FIG. 52 results in a value (e.g., an index value) of 3.0237 indicating that the position of the peak or coarse magnet (e.g., the magnet 4202B in this non-limiting example) is slightly to the right or above the position of the associated sensor 4012 (e.g., Hall effect sensor 2 in this non-limiting example).

The operations associated with the blocks 4818 and 4820 may be performed using the calculated index value 3.0237, or a value derived or determined using the calculated index value 3.0237 using one or more of the previously described embodiments. For example, the index value 3.0237 may be converted to a distance (e.g., in mm or cm). This distance may indicate the distance or position of the follower 4016 relative to a reference position, such as a position of the first sensor 4012 or a position of the follower 4014 when the magazine 4010 is fully loaded, etc. In some cases, a distance between the two magnets 4202 may be subtracted from the identified location of the peak magnet. The location derived at the block 4818 (e.g., a position of the positioner 4014, a position of the follower 4016, or a position of a portion of the positioner 4014 (e.g., the peak magnet)) may be used to index a data structure, such as a calibration table, to determine the amount of ammunition 4002 in the magazine 4010 at the block 4820. Assuming the Hall effect sensor 1 is positioned at the bottom of the magazine 4010, or closer to the bottom than the Hall effects sensor 2, the ammunition within the magazine 4010 will generally be less in the example illustrated in FIG. 50 compared to the example illustrated in FIG. 46. However, it is possible in some cases for the examples of FIG. 46 and FIG. 50 to illustrate a magazine with the same amount of ammunition. The insertion of the magazine 4010 into the firearm 4030 may cause additional pressure on the ammunition, and consequently the follower 4016, which may cause the positioner 4014 to move relative to the sensors 4012. As such, although the positioner 4014 is positioned at a different location in FIG. 46 compared to FIG. 50, it is possible for the magazine to be holding the same quantity of ammunition 4002. The determination of the ammunition 4002 at the block 4820 may be based on different calibration tables dependent on whether the magazine 4010 is determined to be inserted into the firearm 4030.

In some embodiments, the determination of the distance between the positioner 4014 or follower 4016 may indicate an error, such as a misfeed of the ammunition into the firearm 4030. For example, if the determined location of the follower 4016 is roughly between two positions associated with two consecutive ammunition counts (e.g., between 16 and 17 cartridges), it may be determined that a cartridge was not properly loaded from the magazine 4010 into the firearm 4030 indicating a possible misfeed. Alternatively, the prior example may indicate an error in the detection of whether the magazine was inserted into the firearm 4030. For example, the processor 4018 may have erroneously determined that the magazine 4010 was not inserted into the firearm 4030 and may therefore have used a calibration table associated with an uninserted magazine instead of the calibration table associated with the magazine being inserted into the firearm 4030. Although the use of two separate calibration tables is described for when the magazine is inserted/uninserted into the firearm, it should be understood that a single calibration table may be used with different values selected and/or calculated based on the determination of whether the magazine 4010 is inserted into the firearm 4030. Further, in some cases, different calibration tables and/or values may be used when the bolt of the firearm is closed or open.

As previously explained, in some cases, one of the magnets 4202 may serve as a coarse positioning magnet providing an initial determination or estimate of the position of the follower 4016 based on the location of the sensor 4012 that generates the highest magnitude signal in response to detecting the magnetic fields produced by the magnets 4202. The other magnets 4202 may serve as fine positioning magnets that can provide an adjustment to or that can be used to adjust the determined position of the follower 4016 based on the location of the sensors 4012 that the other magnets are located between. Further, the number of magnets 4202 and sensors 4012 included in the magazine 4010 may be selected such that one magnet 4202 (which may not always be the same magnet) is positioned across from, or less than a threshold distance from, a sensor 4012, and at least one other magnet 4202 (which may not always be the same magnet) is positioned between two sensors 4012 or more than a threshold distance from the closest sensor 4012. Further, in some implementations, one magnet 4202 may always be closer to the closest sensor 4012 than one or more other magnets 4202. This closer magnet may be the coarse positioning or peak magnet, and the one or more other magnets may be fine positioning or non-peak magnets.

Moreover, the distance between the magnets 4202 may differ in different implementations. For example, the magnet 4202A and 4202B may be positioned 1.5, 1.67, 2.33, 2.5, 2.67, or 3.5 sensor pitches apart, or other distances apart. Although the magnets can be placed at varying distances from each other, generally the magnets are positioned at a sufficient distance from each other that the magnetic fields from the magnets can be distinguished by the sensors. Moreover, the distance between magnets may differ based on the size or strength of the magnets and/or the size or strengths of the sensors.

Additional Communication Details

As previously described, communication may be transmitted between the magazine 4010 and the firearm 4030 using, for example, the communication systems 4006. Further, as described above, the communication systems 4006 may transmit/receive data through an optical connection using optical transceivers 116 and 1602. However, the present disclosure is not limited as such. In some cases, wireless communication may be used. This wireless communication may include using near field communication (NFC), short-range communication (e.g., communication using Bluetooth®, ZigBee®, or LoRa® communication protocols, etc.), narrowband communication, ultra-wideband communication, 4G LTE, 5G, or any other type of wireless communication.

To enable wireless communication, the magazine 4010, the firearm 4030, and/or the visual system 4050 may include an antenna. In some implementations, the optical transceivers 116 and 1602 may be replaced with antennas that can communicate with elements of the communication systems 4006. The antennas may be positioned at the same location as the optical transceivers as illustrated in FIG. 17. Alternatively, the antennas may be located elsewhere on the magazine 4010 and/or on the firearm 4030. For example, an antenna may be placed on a handle of the firearm, or on the inside of the trigger guard. As another example, an antenna may be positioned on the bottom of the magazine or on a side of the magazine. In some implementations, the magazine 4010, the firearm 4030, and/or the visual system 4050 may support multiple communication systems or protocols enabling usage with different supported systems. For example, the magazine 4010 may include both an optical communication system enabling support for communication with firearms that also include an optical communication system, and an NFC antenna enabling communication with firearms that support NFC communication.

In some implementations, the magazine 4010 and/or the firearm 4030 may use disposable or replaceable batteries (e.g., alkaline AA or AAA batteries) to power the systems described herein. Alternatively, or in addition, the magazine and/or firearm 4030 may use rechargeable batteries (e.g., lithium-ion batteries). In some such cases, the batteries may be removed and charged externally enabling other batteries to be used while charging the depleted battery. Alternatively, or in addition, the rechargeable battery may be charged while inserted into the magazine and/or firearm. In some cases, the batteries may be charged via a wired connected (e.g., a USB charger). Alternatively, or in addition, the batteries may be charged using wireless charging. In some implementations, the firearm 4030 may charge a battery of the magazine 4010, or vice versa.

In some cases, the magazine 4010 may not include a battery or power source and may be powered by the firearm 4030 when inserted into the firearm 4030. Alternatively, the magazine 4010 may provide power to the firearm 4030. In some cases, both power and data may be communicated via the same wired or wireless connection. In other cases, power and data may be communicated via separate wired or wireless connections. Power may be communicated between the magazine and the firearm using capacitive or inductive power transfer.

Example Data Hub

As stated previously, in some embodiments, one or more magazines 4010 may be registered with a weapon (e.g., the firearm 4030). Alternatively, or in addition, the one or more magazines 4010 may be registered with a data hub. The data hub can include any type of electronic device that can present data, including ammunition data, to a user. The visual system 4050 can be an example of a data hub. However, the data hub is not limited to the visual system 4050. The data hub may include a scope (such as one of the scopes described in the scope references), a heads-up-display system, a helmet display, a set of smartglasses or goggles, a tablet, a laptop, a smartphone, application-specific hardware, or any other system that may be used to present magazine information to a user. The ammunition data may include any data relating to the ammunition in one or more magazines including, ammunition count, ammunition type, ammunition size, etc. Further, the data may include any other type of data relating to one or more magazines, such as identification information, insertion status, battery charge level, etc.

Figure 53:
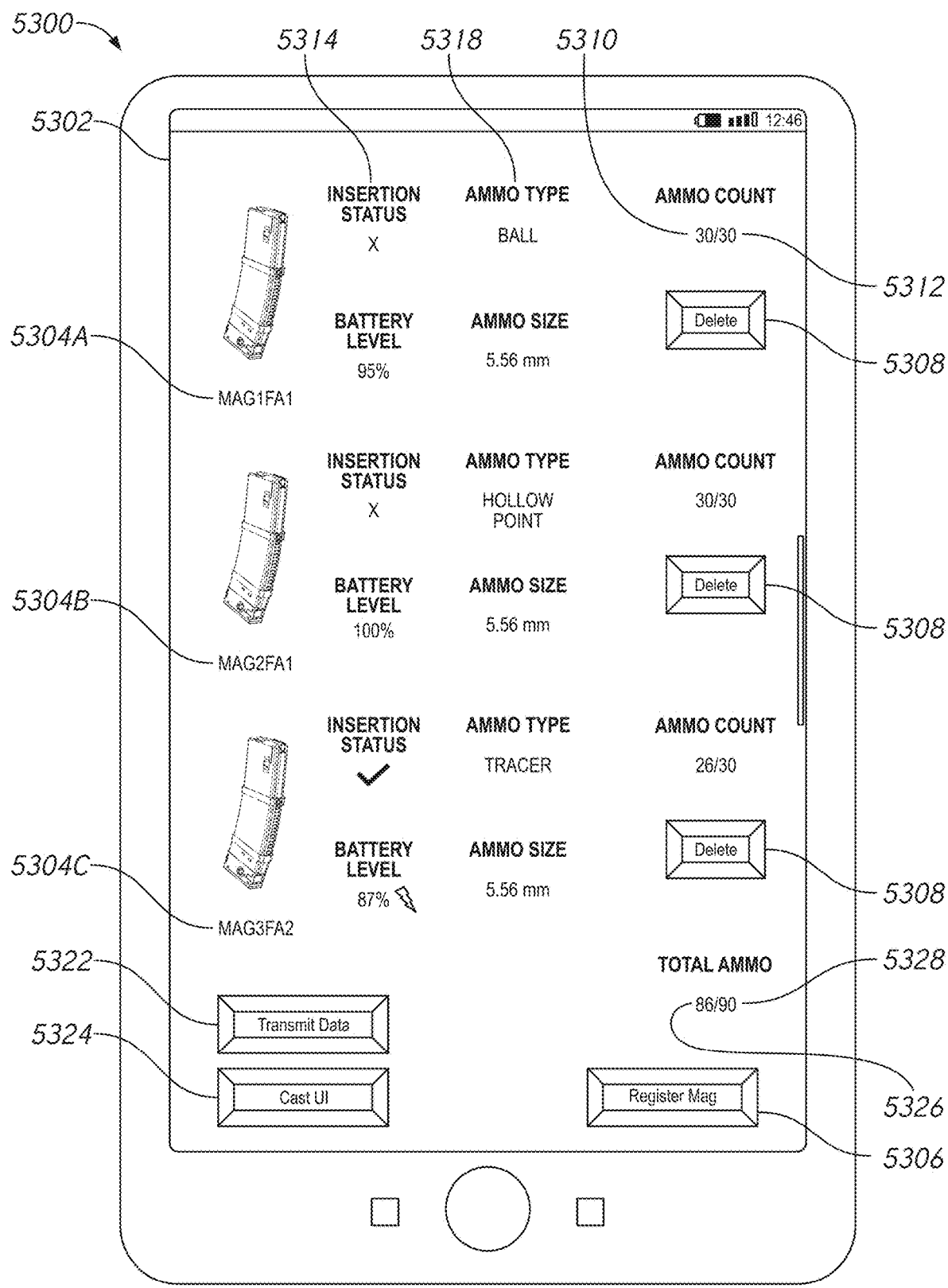
FIG. 53 illustrates an example user interface of a data hub configured to provide ammunition information to a user in accordance with certain embodiments.

FIG. 53 illustrates an example user interface 5302 of a data hub 5300 configured to provide ammunition information to a user in accordance with certain embodiments. The data hub 5300 may include any of the aforementioned devices of the previous paragraph or any of the devices that may implement the visual system 4050. Further, the user interface 5302 may represent a software application executing on the data hub 5300. For example, the user interface 5302 may be a screen of a smartphone or tablet application. The user interface 5302 may list one or more magazines that have been registered with a user and/or with a firearm (e.g., the firearm 4030). Each of the listed magazines may have an identifier 5304A, 5304B, or 5304C (which may individually or collectively be referred to as an identifier 5304). This identifier 5304 may be unique to the magazine. Further, the identifier 5304 may be a combination of an identifier associated with the magazine and an identifier (which may also be unique) associated with a firearm with which the magazine is registered. In some cases, a user may have multiple firearms. The user interface 5302 may indicate the magazines associated with each firearm. For example, the identifier 5304A (e.g., MAG1FA1) may be a combination of a magazine identifier (e.g., MAG1) and a firearm identifier (e.g., FA1). For example, the identifier 5304A (e.g., MAG1FA1) may be a combination of a magazine identifier (e.g., MAG1) and a firearm identifier (e.g., FA1). The identifier 5304B (e.g., MAG2FA) may be a combination of a magazine identifier (e.g., MAG2) and the firearm identifier (e.g., FA1). As both identifier 5304A and 5304B have the same firearm identifier, it can be determined that both magazines are registered to the same firearm. In contrast, the identifier 5304C (e.g., MAG3FA2) formed from a combination of a magazine identifier (e.g., MAG3) and a firearm identifier (e.g., FA2) indicates that the magazine associated with identifier 5304C is associated with a different firearm. While the example identifiers presented are relatively simple, it should be understood that the identifiers are not limited as such and may include any type of unique identifier including, for example, IP addresses, MAC addresses, or any other type of identifier that may facilitate in communicating with the magazine. Further, the identifier presented to the user may be a simplifier shadow identifier to make reading or remembering the identifier easier for the user, while a more complex identifier may be utilized by the data hub 5300 to facilitate communication with the magazine.

As indicated from the above examples, a user may register magazines with different firearms of the user. Alternatively, the magazines may be registered with the user and not a firearm. Advantageously, registering the magazine with the user rather than a firearm enables a user to use the magazines with any firearm of the user. In some cases, magazines may be registered with both a user and a specific firearm. Advantageously, registering the magazine with the firearm enables the user, via the data hub 5300, to display the total ammunition available or registered to a firearm instead of or as well as the total ammunition available or registered to a user. Ammunition may be registered to the user and/or firearm by virtue of registration of magazine(s) to the user to firearm.

Registering magazine(s) to the data hub 5300 may include any process for registering an item with a computing system. For example, a user may register the magazine with the data hub 5300 by manually entering information via a user interface 5302 of the data hub 5300. The manually entered information may include at least a minimum amount of information to enable the data hub 5300 to communicate with the magazine to obtain ammunition information. For example, the information may include an IP address, a MAC address, a unique magazine identifier, a verification or authentication code, and the like.

Alternatively, a user may register the magazine by scanning a code located on the magazine. This code may be a two-dimensional barcode, such as a QR code, or any other type of machine-readable code. The code may include any of the information described above as examples of manually entered information. In some cases, the user may register the magazine by bringing the magazine within a threshold distance of the data hub 5300 enabling a wireless communication link to be, at least temporarily, established using a wireless communication technology, such as NFC, Bluetooth®, ultrawideband communication, or any other type of wireless communication. In certain embodiments, the wireless communication technology is encrypted and/or uses one or more secure communication protocols to prevent snooping or interference by malicious actors. In some cases, registering the magazine may include a combination of scanning a code, using wireless communication, and/or manually entering information.

In some embodiments, registering the magazine with the data hub 5300 may include authenticating a user. Further, registering the magazine with the data hub 5300 may include confirming that the data hub 5300 can communicate with the magazine. Confirming that the data hub 5300 can communicate with the magazine may include establishing, at least temporarily, a communication connection between the data hub 5300 and the magazine.

In some cases, a user may indicate a desire to register a magazine with the data hub 5300 by interacting with a user interface element, such as the "Register Mag" button 5306. Similarly, the user may deregister or remove access to a magazine by interacting with a user interface element, such as a "Delete" button 5308. In some cases, a magazine may automatically deregister or be deleted upon the magazine being registered with a different system (e.g., another data hub) and/or upon the magazine being a at least a particular distance away from the firearm and/or the data hub.

In some cases, a firearm may be registered with the data hub 5300 using any of the previously described embodiments for registering the magazine with the data hub 5300. In some such cases, the data hub 5300 may register some or all of the magazines registered with the data hub 5300 with one or more firearms registered with the data hub 5300.

As illustrated in FIG. 53, the data hub 5300 may determine and/or output for display to a user information about the magazine. This information is not limited and may include any information about the magazine and/or the ammunition included in the magazine. For example, the information may include ammunition count (e.g., ammo count 5310), ammunition capacity (e.g., ammo capacity 5312), insertion status 5314 (e.g., whether the magazine is inserted into a firearm), ammunition size 5316 of the ammunition in the magazine, ammunition type 5318 of the ammunition in the magazine, battery status (e.g., charge level 5320, charging state (such as a lightning bolt to indicate that the battery is being charged), type of battery, etc.) of a battery included in the magazine, and the like. Moreover, the information may include a total ammunition count 5326 or a total ammunition capacity 5328. In some cases, the total ammunition count 5326 and/or the total ammunition capacity 5328 may be for a user, a firearm, or a set of firearms. Alternatively, or in addition, the total ammunition count 5326 and/or the total ammunition capacity 5328 may be for all ammunition, particular types of ammunition, all magazines, or particular types of magazines carried by or available to the user. In other words, the data hub 5300 may determine and/or output to a user aggregated information across a plurality of magazines. In some cases, the aggregated information may be across all magazines. Alternatively, or in addition, the aggregated information may be across a subset of magazines. For example, the aggregated information may include a count of total ammunition across all magazines registered to the user and/or a firearm, or a count of total ammunition across a subset of magazines, such as magazines with a particular type of ammunition or registered to a particular firearm of the user, which may be one firearm of a plurality of firearms registered to the user. In some cases, the data hub 5300 may display information associated with one or more magazines registered to a single firearm. In other cases, the data hub 5300 may display information associated with magazines registered with multiple firearms. Each magazine may be registered with one firearm or multiple firearms.

In some cases, a magazine is registered with only one firearm. Thus, when information is displayed for different firearms, the information is obtained from different magazines. In other words, when the data hub 5300 displays information for a first firearm, information associated with a first set of one or more magazines may be displayed. And when the data hub 5300 displays information for a second firearm, information associated with a second set of one or more magazines may be displayed. Further, the data hub 5300 may display information for both the first and second firearm independently (e.g., on separate screens, windows, tabs, etc.) or together. When the information is displayed together, some of the information may be cumulative (e.g., total number of magazines registered to the user or total ammunition available to the user) and/or some of the information may be displayed independently (e.g., total number of magazines per firearm, or total ammunition available for each firearm or each magazine).

As may be readily apparent to most, military users are often placed in high stress, high pressure situations. Often, a soldier must determine important information quickly with minimal loss of concentration of his or her surroundings. Thus, in some cases, different information and/or information associated with different magazines and/or firearms may be highlighted, colored differently, or otherwise annotated to visually distinguish information in a manner that makes it easy for a user to quickly distinguish magazine and/or ammunition availability of different types and/or for different firearms. Moreover, although the data hub 5300 is illustrated as a tablet, as described above, the data hub 5300 may include and/or may display information on other types of electronic devices or display systems, including firearm scopes and helmet displays enabling the user to quickly obtain information while maintaining awareness of his or her surroundings.

In some cases, some or all of the information included in the data hub 5300 may be transmitted to other computing systems and/or visual systems 4050. For example, the information of the data hub 5300 may be transmitted to another computing system of a user or to a different user (e.g., a soldier's commander). This computing system may be any type of computing system including a tablet, laptop, smartphone, server, or a computing system included as part of a firearm 4030. Further, the user can control the transmission of the information displayed by the data hub. For example, the user may interact with a transmit data button 5322 to cause at least some of the information displayed on the data hub 5300 to be transmitted to another device. Further, the user may select particular data to transmit or particular devices to which to transmit the data. For example, interacting with the transmit data button 5322 may cause a second window or a pop-up to be displayed that enables a user to select data to transmit or devices as target recipients of the data.

Further, some or all of the data of the data hub 5300 may be displayed on another device simultaneously with or instead of being displayed on the data hub 5300. For example, the data hub 5300 may cast the display of the data hub 5300 to another device, such as a scope of a firearm 4030 or another visual system 4050. The user may cause the display of the data hub 5300 to be cast to another device by interacting with the cast UI button 5324.

In some cases, a magazine may be registered with multiple firearms of the user. For example, a user may have two firearms capable of using 5.56 mm ammunition. In such cases, the user may be able to view total ammunition of a particular type, total ammunition useable with each firearm, total ammunition useable with multiple firearms, or any other delineation of ammunition available. Moreover, ammunition or magazines useable with or registered to multiple firearms may be displayed differently (e.g., highlighted or otherwise annotated) so a user can easily distinguish such information.

In some cases, the data hub 5300 enables a user to filter information and/or select particular information to display. For example, a user may filter out or display magazines that are empty, have less or more than a threshold amount of ammunition remaining, have a below or above threshold battery life remaining, are useable or not useable with particular firearms, have or don't have a particular type of ammunition, or based on any other characteristic that may be used to filter data relating to the ammunition, magazine(s), or firearm(s) registered with the user and/or data hub 5300.

In some embodiments, the data hub 5300 may pair one or more magazines with the visual system 4050. For example, the data hub 5300 may pair one or more magazines with a scope, which may display information relating to the one or more magazines (e.g., ammunition count, battery status, etc.). Pairing magazines with the visual system 4050 may include registering the magazines with the visual system 4050, which may enable the visual system 4050 to receive and/or display data associated with the registered magazines from the data hub 5300 and/or directly from the magazines. Advantageously, by pairing magazines with the data hub

5300, a plurality of magazines may automatically be registered with a scope or other visual system 4050 without pairing each magazine individually with the visual system 4050 (e.g., a scope). Further, a plurality of magazines can be deregistered from the visual system 4050 or registered with another visual system 4050 (e.g., another scope) as a batch process rather than individually using the data hub 5300. In other words, in some embodiments, one or more magazines and one or more scopes may be registered with the data hub 5300. Similarly, the data hub 5300 may be used to pair one or more magazines with one or more scopes or other visual systems 4050.

ADDITIONAL EMBODIMENTS

A number of additional embodiments are possible based on the disclosure herein. For example, embodiments of the present disclosure can be described in view of the following clauses:

1. A magazine configured to hold ammunition, the magazine comprising:
   a housing comprising an ammunition chamber, wherein the ammunition chamber is configured to store one or more cartridges of a particular ammunition type;
   an ammunition counter configured to determine a quantity of cartridges of the particular ammunition type within the ammunition chamber; and
   an optical transceiver configured to transmit a count of the quantity of cartridges of the particular ammunition type within the ammunition chamber to a weapon system when the magazine is installed in the weapon system.
2. The magazine of clause 1, wherein the ammunition counter comprises:
   a magnet configured to generate a magnetic field that is at least partially within the ammunition chamber; and
   a Hall effect sensor positioned within the housing, the Hall effect sensor positioned with respect to the housing and the magnet, wherein the Hall effect sensor generates a signal when the magnet is within a particular distance of the Hall effect sensor.
3. The magazine of clause 2, wherein the ammunition counter further comprises electronic circuitry configured to determine the quantity of cartridges of the particular ammunition type within the ammunition chamber based at least in part on one or more signals generated by the Hall effect sensor.
4. The magazine of any one of the preceding clauses, further comprising a digital to optical signal adapter configured to convert a digital signal corresponding to the count of the quantity of cartridges to an optical signal for transmission by the optical transceiver.
5. A weapon system comprising:
   a magazine configured to hold one or more cartridges; and
   a weapon comprising:
     an insertion port configured to accept the magazine, wherein the magazine is configured to be inserted into the insertion port of the weapon and to provide the one or more cartridges to the weapon for firing; and
     an optical transceiver configured to receive a count of the one or more cartridges within the magazine when the magazine is installed in the weapon system.
6. The weapon system of clause 5, wherein the magazine comprises:
   a first magnet configured to generate a first magnetic field that is at least partially within an ammunition chamber of a housing of the magazine; and
   a first set of Hall effect sensors positioned along the housing, at least some of the first set of Hall effect sensors aligned with respect to the first magnet when the ammunition chamber includes a particular number of cartridges.
7. The weapon system of any one of the preceding clauses, wherein the weapon further comprises a plurality of light-emitting diodes controllable to display the count of the one or more cartridges within the magazine.
8. The weapon system of any one of the preceding clauses, wherein the weapon further comprises a plurality of light-emitting diodes controllable to display a jam state of a weapon when the magazine is loaded into the weapon.
9. The weapon system of any one of the preceding clauses, wherein the weapon further comprises a second magnet configured to generate a second magnetic field, the second magnet located within a buffer tube of the weapon.
10. The weapon system of any one of the preceding clauses as modified by clause 9, wherein the weapon further comprises a second set of Hall effect sensors positioned along the buffer tube and configured to detect a position of the bolt based at least in part on the second magnetic field.
11. The weapon system of any one of the preceding clauses as modified by clause 10, wherein the weapon further comprises electronic circuitry configured to determine a count of cartridges within the weapon system.
12. The weapon system of any one of the preceding clauses as modified by clause 11, wherein the electronic circuitry determines the count of cartridges within the weapon system based at least in part on one or more signals generated by the second set of Hall effect sensors and a signal received at the optical transceiver.
13. The weapon system of any one of the preceding clauses, wherein the weapon further comprises an optical to digital signal adapter configured to convert an optical signal received from the magazine by the optical transceiver to a digital signal, the optical signal corresponding to the count of the one or more cartridges within the magazine.
14. A weapon system comprising:
    a weapon comprising:
      an insertion port configured to accept a first magazine from one or more magazines, wherein the first magazine is configured to be inserted into the insertion port of the weapon and to provide one or more cartridges to the weapon for firing; and
      a transceiver configured to receive one or more magazine status signals corresponding to the one or more magazines, each magazine status signal corresponding to a different magazine from the one or more magazines.
15. The weapon system of clause 14, further comprising the one or more magazines.
16. The weapon system of any one of the preceding clauses, wherein each magazine status signal corresponds to a number of cartridges within the corresponding magazine.

17. The weapon system of any one of the preceding clauses, wherein each magazine status signal corresponds to a use state of the corresponding magazine indicating whether the corresponding magazine has been used with the weapon.
18. The weapon system of any one of the preceding clauses, further comprising a registration system configured to register the one or more magazines with the weapon system.
19. The weapon system of any one of the preceding clauses as modified by clause 18, wherein the registration system comprises an optical scanner configured to scan a machine-readable code associated with the first magazine from the one or more magazines.
20. The weapon system of any one of the preceding clauses as modified by clause 19, wherein the machine-readable code includes a unique identifier associated with the first magazine.
21. The weapon system of any one of the preceding clauses as modified by clause 19, wherein the machine-readable code includes a unique identifier associated with the first magazine.
22. The weapon system of any one of the preceding clauses as modified by clause 18, wherein the weapon further comprises the registration system.
23. The weapon system of any one of the preceding clauses, wherein the weapon further comprises a user interface system configured to display a count of the number of cartridges within the first magazine when the first magazine is inserted into the weapon.
24. The weapon system of any one of the preceding clauses, wherein the weapon further comprises a user interface system configured to display a count of the number of cartridges within the one or more magazines.
25. The weapon system of any one of the preceding clauses, wherein the weapon further comprises a user interface system configured to display a count of the one or more magazines.
26. The weapon system of any one of the preceding clauses as modified by clause 25, wherein the user interface system is further configured to display the count of the one or more magazines that include one or more cartridges.
27. The weapon system of any one of the preceding clauses, wherein the transceiver is further configured to transmit a status of the one or more magazines to an external system that is separate from the weapon system.
28. The weapon system of any one of the preceding clauses as modified by clause 27, wherein the external system comprises a headgear system.
29. The weapon system of any one of the preceding clauses as modified by clause 27, wherein the external system comprises a computing system.
30. The weapon system of any one of the preceding clauses as modified by clause 27, wherein the status is transmitted via a network to a central command center.
31. The weapon system of any one of the preceding clauses, wherein the transceiver comprises an optical transceiver.
32. The weapon system of any one of the preceding clauses, wherein the transceiver comprises a wireless transceiver.
33. A magazine configured to hold ammunition, the magazine comprising:
a housing comprising an ammunition chamber, wherein the ammunition chamber is configured to store one or more cartridges of a particular ammunition type;
a magnet configured to generate a magnetic field that is at least partially within the ammunition chamber;
a Hall effect sensor positioned within the housing, the Hall effect sensor positioned with respect to the housing and the magnet, wherein the Hall effect sensor generates a signal when the magnet is within a particular distance of the Hall effect sensor; and
electronic circuitry configured to determine a quantity of cartridges of the particular ammunition type within the ammunition chamber based at least in part on one or more signals generated by the Hall effect sensor.
34. The magazine of clause 33, wherein the Hall effect magnet is positioned in the follower.
35. The magazine of any one of the preceding clauses, wherein the one or more signals are generated based on a location of the magnet with respect to the Hall effect sensor.
36. The magazine of any one of the preceding clauses, further comprising a plurality of Hall effect sensors within the housing, the plurality of Hall effect sensors including the Hall effect sensor, the plurality of Hall effect sensors positioned along the housing.
37. The magazine of any one of the preceding clauses, further comprising a plurality of light-emitting diodes controllable to display the quantity of cartridges of the particular ammunition type.
38. The magazine of any one of the preceding clauses as modified by clause 37, wherein the plurality of light-emitting diodes are further controllable to display a jam state of a weapon when the magazine is loaded into the weapon.
39. The magazine of any one of the preceding clauses, further comprising an optical transceiver configured to transmit the quantity of cartridges of the particular ammunition type to a user interface device that is separate from the magazine.
40. The magazine of any one of the preceding clauses as modified by clause 39, wherein the optical transceiver is further configured to receive a jam state of a weapon when the magazine is loaded into the weapon.
41. The magazine of any one of the preceding clauses, further comprising an alignment pin configured to align a circuit board that includes the Hall effect sensor.
42. The magazine of any one of the preceding clauses, further comprising a spring-loaded plunger positioned below the ammunition chamber and configured to control the position of the plurality of cartridges within the ammunition chamber.
43. The magazine of any one of the preceding clauses as modified by clause 42, further comprising a gap between a sealing cap of the magazine and the spring-loaded plunger, the gap configured to house at least some of the electronic circuitry.
44. The magazine of any one of the preceding clauses, further comprising a power source in electrical communication with the electronic circuitry.
45. A weapon system comprising:
a magazine configured to hold one or more cartridges; and
a weapon comprising an insertion port configured to accept the magazine, a buffer tube, and a bolt, wherein the magazine is configured to be inserted into the insertion port of the weapon and to provide the one or more cartridges to the weapon for firing, the magazine comprising:
  a first magnet configured to generate a first magnetic field that is at least partially within an ammunition chamber of a housing of the magazine; and
  a first set of Hall effect sensors positioned along the housing, at least some of the first set of Hall effect sensors aligned with respect to the first magnet when the ammunition chamber includes a particular number of cartridges.

46. The weapon system of clause 45, wherein the weapon further comprises a second magnet configured to generate a second magnetic field, the second magnet located within the buffer tube of the weapon.

47. The weapon system of clause 46, wherein the weapon further comprises a second set of Hall effect sensors positioned along the buffer tube and configured to detect a position of the bolt based at least in part on the second magnetic field.

48. The weapon system of any one of the preceding clauses, further comprising electronic circuitry configured to determine an amount of cartridges within the ammunition chamber based at least in part on one or more signals generated by the first set of Hall effect sensors.

49. The weapon system of any one of the preceding clauses as modified by clause 48, wherein the electronic circuitry is further configured to determine a total amount of available cartridges based at least in part on the amount of cartridges within the magazine and a determination of whether a cartridge is in a chamber of the weapon.

50. The weapon system of any one of the preceding clauses as modified by clause 48, wherein the electronic circuitry comprises an application-specific integrated circuit.

51. The weapon system of any one of the preceding clauses as modified by clause 48, wherein the electronic circuitry is further configured to determine a jam state of the weapon.

52. The weapon system of any one of the preceding clauses as modified by clause 48, wherein at least a portion of the electronic circuitry is within the magazine.

53. The weapon system of any one of the preceding clauses as modified by clause 48, wherein at least a portion of the electronic circuitry is within a handle of the weapon.

54. The weapon system of any one of the preceding clauses, further comprising a mountable display mounted on a barrel of the weapon, the mountable display configured to at least display an available count of cartridges within the magazine.

55. The weapon system of any one of the preceding clauses as modified by clause 54, wherein the mountable display is further configured to display a number of loaded magazines available to a user.

56. The weapon system of any one of the preceding clauses as modified by clause 54, wherein the mountable display is further configured to display a number of cartridges fired.

57. The weapon system of any one of the preceding clauses as modified by clause 54, wherein the mountable display is further configured to display a jam state of the weapon.

58. A method of determining a number of available cartridges, the method comprising:
  generating a magnetic field using a magnet located in a magazine;
  detecting, using a set of sensors, a location of the magnet within the magazine, wherein each of the set of sensors is configured to generate a voltage based at least in part on the magnetic field, and wherein the location of the magnet is determined based at least in part on one or more voltage values generated by one or more of the sensors from the set of sensors; and
  determining a number of cartridges of ammunition within a magazine based at least in part on the location of the magnet.

59. The method of clause 58, further comprising displaying a count of the number of cartridges on a display interface included with the magazine.

60. The method of any one of the preceding clauses, further comprising transmitting count data corresponding to the number of cartridges to a separate display interface that is separate from the magazine.

61. The method of any one of the preceding clauses as modified by clause 60, wherein the count data is transmitted using an optical transceiver.

62. The method of any one of the preceding clauses, further comprising:
  generating a second magnetic field using a second magnet located in a weapon;
  detecting, using at least one sensor, a location of the second magnet within the weapon, the at least one sensor separate from the set of sensors; and
  determining whether a cartridge is within a chamber of the weapon based at least in part on the location of the second magnet.

63. The method of any one of the preceding clauses as modified by clause 62, further comprising determining whether the weapon is jammed based at least in part on the location of the second magnet within the weapon.

64. The method of any one of the preceding clauses, further comprising:
  determining a number of magazines assigned to a user;
  determining a number of cartridges within each of the number of magazines;
  summing the number of cartridges within each of the number of magazines and the number of cartridges of ammunition within the magazine to obtain a total number of available cartridges; and
  causing the total number of available cartridges to be displayed to the user.

65. A non-transitory computer-readable storage medium storing computer executable instructions that, when executed by one or more computing devices, configure the one or more computing devices to perform operations comprising:
  generating a magnetic field using a magnet located in a magazine;
  detecting, using a set of sensors, a location of the magnet within the magazine, wherein each of the set of sensors is configured to generate a voltage based at least in part on the magnetic field, and wherein the location of the magnet is determined based at least in part on one or more voltage values generated by one or more of the sensors from the set of sensors; and
  determining a number of cartridges of ammunition within a magazine based at least in part on the location of the magnet.

66. The non-transitory computer-readable storage medium of clause 65, wherein the operations further comprise displaying a count of the number of cartridges on a display interface included with the magazine.

67. The non-transitory computer-readable storage medium of any one of the preceding clauses, wherein the operations further comprise transmitting count data corresponding to the number of cartridges to a separate display interface that is separate from the magazine.

68. The non-transitory computer-readable storage medium of any one of the preceding clauses as modified by clause 67, wherein the count data is transmitted using an optical transceiver.

69. The non-transitory computer-readable storage medium of any one of the preceding clauses, wherein the operations further comprise:
generating a second magnetic field using a second magnet located in a weapon;
detecting, using at least one sensor, a location of the second magnet within the weapon, the at least one sensor separate from the set of sensors; and
determining whether a cartridge is within a chamber of the weapon based at least in part on the location of the second magnet.

70. The non-transitory computer-readable storage medium of any one of the preceding clauses as modified by clause 69 wherein the operations further comprise determining whether the weapon is jammed based at least in part on the location of the second magnet within the weapon.

71. The non-transitory computer-readable storage medium of any one of the preceding clauses, wherein the operations further comprise:
determining a number of magazines assigned to a user;
determining a number of cartridges within each of the number of magazines;
summing the number of cartridges within each of the number of magazines and the number of cartridges of ammunition within the magazine to obtain a total number of available cartridges; and
causing the total number of available cartridges to be displayed to the user.

Additional embodiments of the present disclosure can be described in the following clauses:

1. A system configured to determine a count of ammunition within a magazine, the system comprising:
a data interface configured to receive a signal from a linear encoder comprising a magnet and a plurality of magnetic sensors within an ammunition chamber of the magazine configured to store a plurality of cartridges of a first ammunition type, wherein the magnet is configured to generate a magnetic field that is at least partially within the ammunition chamber;
a hardware processor configured to determine a count of an amount of cartridges of the first ammunition type within the ammunition chamber based at least in part on the signal generated by the linear encoder; and
a memory comprising specific computer-executable instructions executable by the hardware processor to at least:
receive, via the data interface, the signal comprising sensor values from the plurality of magnetic sensors;
identify a first sensor from the plurality of sensors associated with a largest value from the sensor values;
estimate a magnet location of the magnet based at least in part on a location of the first sensor;
refine the estimate of the magnet location based at least in part on sensor values from a subset of two or more of the plurality of sensors; and
determine, using the refined estimate of the magnet location, the count of ammunition within the magazine.

2. The system of clause 1, wherein a total number of sensors included in the plurality of sensors is less than a total number of cartridges storable in the ammunition chamber.

3. The system as in clause 1 or clause 2, wherein the linear encoder further comprises a second magnet configured to generate a magnetic field that is at least partially within the ammunition chamber.

4. The system of clause 3, wherein a spacing between the magnet and the second magnet is equal to a non-integer number of cartridges.

5. The system of clause 3, wherein a spacing between the magnet and the second magnet is equal to a non-integer number of sensors of the plurality of sensors.

6. The system as in any one of clauses 3-5, wherein the subset of two or more of the plurality of sensors are selected from the plurality of sensors based at least in part on sensor values corresponding to a proximity of the subset of two or more of the plurality of sensors to the second magnet.

7. The system as in any one of clauses 3-6, wherein the sensor values from the subset of two or more of the plurality of sensors are generated in response to the magnetic field of the second magnet.

8. The system as in any one of clauses 1-7, wherein the refined estimate of the magnet location comprises an index to a calibration table of the magazine.

9. The system of clause 8, wherein the calibration table comprises a lookup table that indicates the count of ammunition within the magazine based at least in part on the refined estimate of the magnet location.

10. The system as in any one of clauses 1-9, wherein the hardware processor is further configured to at least determine the count of ammunition within the magazine by using the refined estimate of the magnet location as an index to a calibration table of the magazine.

11. The system as in any one of clauses 1-10, wherein the hardware processor is further configured to:
determine an index value to a calibration table of the magazine based at least in part on the refined estimate of the magnet location; and
access the calibration table using the index value to determine the count of ammunition within the magazine.

12. The system of clause 11, wherein the hardware processor is further configured to determine the index value by at least rounding the refined estimate of the magnet location to a closest index value of a plurality of index values.

13. The system of clause 11, wherein the hardware processor is further configured to determine the index value by at least normalizing the refined estimate of the magnet location to a set of index values.

14. The system of clause 11, wherein the hardware processor is further configured to determine the index value by performing a center-of-mass calculation on a centroid data structure comprising at least the largest value from the sensor values and the sensor values from the subset of two or more of the plurality of sensors.

15. The system as in any one of clauses 1-14, wherein the magazine includes the data interface, the hardware processor, and the memory.

16. A firearm comprising the system as in any one of clauses 1-15.

17. The firearm of clause 16, further comprising an antenna positioned on a trigger guard of the firearm.

18. The firearm of clause 17, wherein the antenna comprises a near field communications antenna.

19. The firearm as in clause 17 or clause 18, wherein the antenna is configured to align with an antenna on the magazine when the magazine is inserted into the firearm.

20. The firearm as in any one of clauses 17-19, wherein the data interface receives the signal from the linear encoder via the antenna.

21. The firearm of clause 16, further comprising an antenna positioned on a handle of the firearm.

22. A system configured to determine a count of ammunition within a magazine, the system comprising:
a memory comprising specific computer-executable instructions; and
a hardware processor in communication with the memory and configured to execute the specific computer-executable instructions to at least:
obtain sensor values from a set of sensors of the magazine;
identify a first sensor from the set of sensors associated with a largest value from the sensor values;
determine a first magnet location based at least in part on a location of the first sensor;
determine a first aggregate value based on a first subset of sensors located on a first side of the first sensor;
determine a second aggregate value based on a second subset of sensors located on a second side of the first sensor;
determine a second magnet location based at least in part on the first aggregate value and the second aggregate value;
determine a position of a follower of the magazine based at least in part on the first magnet location and the second magnet location; and
determine the count of the ammunition within the magazine based at least in part on the position of the follower.

23. The system of clause 22, wherein the hardware processor is further configured to execute the specific computer-executable instructions to at least generate a centroid data structure based at least in part on a subset of sensors from the set of sensors.

24. The system of clause 23, wherein the hardware processor is further configured to execute the specific computer-executable instructions to at least determine an index value by performing a center-of-mass calculation on the centroid data structure.

25. The system of clause 24, wherein the hardware processor is further configured to execute the specific computer-executable instructions to at least determine the position of the follower based at least in part on the index value and the location of the first sensor.

26. The system as in clause 24 or clause 25, wherein the index value comprises a position within the centroid data structure.

27. The system as in clause 24 or clause 25, wherein the index value comprises a non-integer value.

28. The system as in any one of clauses 23-27, wherein the centroid data structure comprises a five-value array.

29. The system as in any one of clauses 23-28, wherein the subset of sensors includes at least the first sensor, and one of the first subset of sensors or the second subset of sensors.

30. The system of clause 29, wherein the largest value from the sensor values is stored at a center of the centroid data structure, and wherein sensor values of the one of the first subset of sensors or the second subset of sensors are stored in positions adjacent to the center of the centroid data structure.

31. The system as in any one of clauses 22-30, wherein the hardware processor is further configured to determine the count of the ammunition within the magazine by accessing a calibration table by at least using the position of the follower to index the calibration table.

32. The system as in any one of clauses 22-31, wherein the set of sensors are less in number than a maximum ammunition capacity of the magazine.

33. The system as in any one of clauses 22-32, wherein the set of sensors comprises N/2 sensors or N/2+1 sensors where N is a maximum ammunition capacity of the magazine.

34. A system configured to register a magazine with a firearm, the system comprising:
a memory comprising specific computer-executable instructions; and
a hardware processor in communication with the memory and configured to execute the specific computer-executable instructions to at least:
receive an identifier of a firearm;
receive an identifier of a first magazine;
register the first magazine with the firearm by at least associating the identifier of the first magazine with the identifier of the firearm;
determine one or more characteristic values of the first magazine; and
output the one or more characteristic values of the first magazine for display to a user.

35. The system of clause 34, wherein the one or more characteristic values of the first magazine comprise: a count of ammunition within the magazine, a maximum amount of ammunition the magazine can hold, a type of ammunition within the magazine, an insertion status of the magazine, a battery level of a battery of the magazine, or an identifier of the magazine.

36. The system as in clause 34 or clause 35, wherein the hardware processor is further configured to execute the specific computer-executable instructions to at least:
receive an identifier of a second magazine; and
register the second magazine with the firearm by at least associating the identifier of the second magazine with the identifier of the firearm.

37. The system of clause 36, wherein the hardware processor is further configured to execute the specific computer-executable instructions to at least determine one or more characteristic values of the second magazine, and wherein outputting the one or more characteristic values of the first magazine comprises outputting at least one aggregate characteristic value of the first magazine and the second magazine.

38. The system of clause 37, wherein the at least one aggregate characteristic value comprises an aggregate ammunition count or an aggregate ammunition capacity.
39. The system as in any one of clauses 34-38, wherein the identifier of the first magazine is received using a near field communication protocol or a short-range communication protocol.
40. The system as in any one of clauses 34-38, wherein the identifier of the first magazine is received by scanning a two-dimensional barcode.
41. The system as in any one of clauses 34-40, wherein the identifier of the first magazine comprises a combination of a first magazine identifier and a user identifier.
42. The system as in any one of clauses 34-40, wherein the identifier of the first magazine comprises a combination of a first magazine identifier and a firearm identifier.
43. The system as in any one of clauses 34-42, wherein the hardware processor is further configured to execute the specific computer-executable instructions to at least:
    receive an identifier of a firearm accessory; and
    register the firearm accessory with the firearm by at least associating the identifier of the firearm accessory with the identifier of the firearm.
44. The system of clause 43, wherein the firearm accessory comprises a scope configured to display a target scene to a user.
45. The system of clause 44, wherein the hardware processor is further configured to output the one or more characteristic values of the first magazine by at least causing the one or more characteristic values to be transmitted to the scope.
46. The system of clause 45, wherein the scope is further configured to display at least one of the one or more characteristic values to the user.
47. The system as in any one of clauses 43-46, wherein registering the firearm accessory with the firearm enables the firearm to communicate directly with the firearm accessory.
48. The system as in any one of clauses 43-47, wherein the identifier of the firearm accessory is received using a near field communication protocol or a short-range communication protocol.
49. The system as in any one of clauses 43-47, wherein the identifier of the firearm accessory is received by scanning a two-dimensional barcode.
50. A method of determining a count of ammunition within a magazine, the method comprising:
    obtaining a set of sensor values from a set of sensors of the magazine, wherein the set of sensor values comprises a sensor value for each sensor in the set of sensors;
    identifying a first sensor from the set of sensors associated with a largest value from the set of sensor values;
    determining a first magnet location based at least in part on a location of the first sensor;
    determining a first aggregate value based on a first subset of sensors located on a first side of the first sensor;
    determining a second aggregate value based on a second subset of sensors located on a second side of the first sensor;
    determining a second magnet location based at least in part on the first aggregate value and the second aggregate value;
    determining a position of a follower of the magazine based at least in part on the first magnet location and the second magnet location; and
    determining the count of the ammunition within the magazine based at least in part on the position of the follower.
51. The method of clause 50, further comprising generating a centroid data structure based at least in part on a subset of sensors from the set of sensors.
52. The method of clause 51, further comprising determining an index value by performing a center-of-mass calculation on the centroid data structure.
53. The method of clause 52, further comprising determining the position of the follower based at least in part on the index value and the location of the first sensor.
54. The method of clause 52, wherein the index value comprises a position within the centroid data structure.
55. The method of clause 52, wherein the index value comprises a non-integer value.
56. The method of clause 51, wherein the centroid data structure comprises a five-value array.
57. The method of clause 51, wherein the subset of sensors includes at least the first sensor, and one of the first subset of sensors or the second subset of sensors.
58. The method of clause 57, wherein the largest value from the set of sensor values is stored at a center of the centroid data structure, and wherein sensor values of the one of the first subset of sensors or the second subset of sensors are stored in positions adjacent to the center of the centroid data structure.
59. The method of clause 50, further comprising determining the count of the ammunition within the magazine by accessing a calibration table by at least using the position of the follower to index the calibration table.
60. The method of clause 50, wherein a maximum ammunition capacity of the magazine is greater than a total number of sensors included in the set of sensors.
61. The method of clause 50, wherein the set of sensors comprises N/2 sensors or N/2+1 sensors where N is a maximum ammunition capacity of the magazine.

Terminology

The embodiments described herein are exemplary. Modifications, rearrangements, substitute processes, etc. may be made to these embodiments and still be encompassed within the teachings set forth herein. One or more of the steps, processes, or methods described herein may be carried out by one or more processing and/or digital devices, suitably programmed.

Depending on the embodiment, certain acts, events, or functions of any of the algorithms described herein can be performed in a different sequence, can be added, merged, or left out altogether (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a processor configured with specific instructions, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The elements of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. A software module can comprise computer-executable instructions which cause a hardware processor to execute the computer-executable instructions.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. A magazine system configured to determine a count of ammunition within the magazine system, the magazine system comprising:
   a magazine comprising a housing, a follower, a set of sensors, a first magnet, and a second magnet, wherein the magazine is configured to house ammunition;
   a memory comprising specific computer-executable instructions; and
   a hardware processor in communication with the memory and configured to execute the specific computer-executable instructions to at least:
      obtain sensor values from a set of sensors of the magazine;
      identify a first sensor from the set of sensors associated with a largest value from the sensor values;
      determine a first magnet location based at least in part on a location of the first sensor;
      determine a first aggregate value based on a first subset of sensors located on a first side of the first sensor;
      determine a second aggregate value based on a second subset of sensors located on a second side of the first sensor;
      determine a second magnet location based at least in part on the first aggregate value and the second aggregate value;
      generate a centroid data structure based at least in part on a subset of sensors from the set of sensors;

determine a position of a follower of the magazine based at least in part on the centroid data structure, the first magnet location, and the second magnet location; and determine the count of the ammunition within the magazine based at least in part on the position of the follower.

2. The magazine system of claim 1, wherein the hardware processor is further configured to execute the specific computer-executable instructions to at least determine an index value by performing a center-of-mass calculation on the centroid data structure.

3. The magazine system of claim 2, wherein the hardware processor is further configured to execute the specific computer-executable instructions to at least determine the position of the follower based at least in part on the index value and the location of the first sensor.

4. The magazine system of claim 2, wherein the index value comprises a position within the centroid data structure.

5. The magazine system of claim 2, wherein the index value comprises a non-integer value.

6. The magazine system of claim 1, wherein the centroid data structure comprises a five-value array.

7. The magazine system of claim 1, wherein the subset of sensors includes at least the first sensor, and one of the first subset of sensors or the second subset of sensors.

8. The magazine system of claim 7, wherein the largest value from the sensor values is stored at a center of the centroid data structure, and wherein sensor values of the one of the first subset of sensors or the second subset of sensors are stored in positions adjacent to the center of the centroid data structure.

9. The magazine system of claim 1, wherein the hardware processor is further configured to determine the count of the ammunition within the magazine by accessing a calibration table by at least using the position of the follower to index the calibration table.

10. The magazine system of claim 1, wherein the set of sensors are less in number than a maximum ammunition capacity of the magazine.

11. The magazine system of claim 1, wherein the set of sensors comprises N/2 sensors or N/2+1 sensors where N is a maximum ammunition capacity of the magazine.

* * * * *